US012684765B2

(12) United States Patent
Kunitake et al.

(10) Patent No.:    US 12,684,765 B2
(45) Date of Patent:        Jul. 14, 2026

(54) SEMICONDUCTOR DEVICE

(71) Applicant: Semiconductor Energy Laboratory Co., Ltd., Atsugi (JP)

(72) Inventors: Hitoshi Kunitake, Machida (JP); Yuki Ito, Nagoya (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 436 days.

(21) Appl. No.: 18/559,083

(22) PCT Filed: Apr. 25, 2022

(86) PCT No.: PCT/IB2022/053801
§ 371 (c)(1),
(2) Date: Nov. 6, 2023

(87) PCT Pub. No.: WO2022/238794
PCT Pub. Date: Nov. 17, 2022

(65) Prior Publication Data
US 2024/0260257 A1     Aug. 1, 2024

(30) Foreign Application Priority Data

May 12, 2021    (JP) ................................. 2021-081237
May 21, 2021    (JP) ................................. 2021-086042
(Continued)

(51) Int. Cl.
H10B 12/00        (2023.01)
H10D 30/67        (2025.01)
(52) U.S. Cl.
CPC ......... H10B 12/50 (2023.02); H10D 30/6734 (2025.01); H10D 30/6755 (2025.01)

(58) Field of Classification Search
CPC ........ H10B 41/70; H10B 12/50; H10B 12/00; H10D 30/67
See application file for complete search history.

(56) References Cited

U.S. PATENT DOCUMENTS 8,675,382 B2     3/2014   Kurokawa
8,891,281 B2     11/2014  Kurokawa
(Continued)

FOREIGN PATENT DOCUMENTS

JP        2004171742 A  *  6/2004  ............. H10D 89/10
JP        2011-151383 A        8/2011
(Continued)

OTHER PUBLICATIONS

Taiwanese Office Action (Application No. 111116620) Dated Aug. 12, 2025.
(Continued)

*Primary Examiner* — Evren Seven
(74) *Attorney, Agent, or Firm* — Eric J. Robinson; Robinson Intellectual Property Law Office, P.C.

(57)        ABSTRACT

A semiconductor device that can be subjected to multipoint measurement is provided. The semiconductor device includes a first layer and a second layer over the first layer. The first layer includes a first multiplexer, a second multiplexer, m (m is an integer of 1 or more) analog switches electrically connected to the first multiplexer, and n (n is an integer of 1 or more) analog switches electrically connected to the second multiplexer. The second layer includes m×n transistors. Each of the m analog switches is electrically connected to n transistors, and each of the n analog switches is electrically connected to m transistors.

18 Claims, 77 Drawing Sheets

(30) Foreign Application Priority Data

| Jun. 16, 2021 | (JP) | ................................ | 2021-100127 |
| Jul. 8, 2021 | (JP) | ................................ | 2021-113387 |
| Jul. 27, 2021 | (JP) | ................................ | 2021-122705 |
| Oct. 28, 2021 | (JP) | ................................ | 2021-176861 |
| Nov. 30, 2021 | (JP) | ................................ | 2021-194212 |

(56) References Cited

U.S. PATENT DOCUMENTS

| 9,305,612 | B2 | 4/2016 | Kurokawa | |
| 9,385,713 | B2 | 7/2016 | Uesugi et al. | |
| 9,647,132 | B2 | 5/2017 | Tsubuku et al. | |
| 9,704,882 | B2 | 7/2017 | Uesugi et al. | |
| 9,911,756 | B2 | 3/2018 | Yamazaki et al. | |
| 10,153,301 | B2 | 12/2018 | Uesugi et al. | |
| 10,446,583 | B2 | 10/2019 | Yamazaki et al. | |
| 10,453,863 | B2 | 10/2019 | Uesugi et al. | |
| 10,553,589 | B2 | 2/2020 | Yamazaki et al. | |
| 10,825,836 | B2 | 11/2020 | Uesugi et al. | |
| 11,107,929 | B2 | 8/2021 | Yamazaki et al. | |
| 11,177,792 | B2 | 11/2021 | Koyama | |
| 11,374,023 | B2 | 6/2022 | Uesugi et al. | |
| 12,057,451 | B2 | 8/2024 | Uesugi et al. | |
| 2005/0024949 | A1* | 2/2005 | Hokari | G11C 11/4097 257/E27.088 |
| 2009/0243906 | A1 | 10/2009 | Miyashita | |
| 2011/0110145 | A1* | 5/2011 | Yamazaki | H10B 41/70 365/182 |
| 2012/0033487 | A1* | 2/2012 | Inoue | G11C 11/405 257/296 |
| 2013/0293263 | A1* | 11/2013 | Kurokawa | H10D 84/903 326/41 |
| 2015/0255139 | A1* | 9/2015 | Atsumi | H10B 69/00 257/43 |
| 2016/0225772 | A1 | 8/2016 | Tsubuku et al. | |
| 2017/0062482 | A1 | 3/2017 | Yamazaki et al. | |
| 2017/0338349 | A1 | 11/2017 | Tsubuku et al. | |
| 2019/0238134 | A1* | 8/2019 | Lee | H03K 19/1776 |
| 2022/0271168 | A1 | 8/2022 | Yamazaki et al. | |
| 2023/0244842 | A1* | 8/2023 | Lin | G06F 30/34 |
| 2023/0397410 | A1* | 12/2023 | Jain | G11C 11/4091 |
| 2024/0130101 | A1* | 4/2024 | Matsuzaki | H10B 12/482 |
| 2024/0395825 | A1 | 11/2024 | Uesugi et al. | |

FOREIGN PATENT DOCUMENTS

| JP | 2012-257187 | A | | 12/2012 | | |
| JP | 2016-174352 | A | | 9/2016 | | |
| JP | 2017-085082 | A | | 5/2017 | | |
| TW | 201248835 | | | 12/2012 | | |
| TW | 202044768 | | | 12/2020 | | |
| WO | WO-2016/055913 | | | 4/2016 | | |
| WO | WO-2017103723 | A1 | * | 6/2017 | ............ | H10D 30/67 |
| WO | WO-2018092007 | A1 | * | 5/2018 | ............ | H10D 30/67 |
| WO | WO-2018135194 | A1 | * | 7/2018 | ............ | G11C 5/06 |
| WO | WO-2018142239 | A1 | * | 8/2018 | ............ | H10D 30/67 |
| WO | WO-2020170067 | A1 | * | 8/2020 | ............ | H10D 30/67 |

OTHER PUBLICATIONS

International Search Report (Application No. PCT/IB2022/053801) Dated Aug. 9, 2022.

Written Opinion (Application No. PCT/IB2022/053801) Dated Aug. 9, 2022.

Okada.K et al., "Statistical Modeling of MOS Transistors with Intra-chip Variability", Journal of Information Processing Society of Japan, May 15, 2002, vol. 43, No. 5, pp. 1330-1337.

Okada.K, "Researches on performance variability analysis in integrated circuit", Kyoto University Doctoral thesis, Mar. 24, 2003, p. 132pages.

* cited by examiner

FIG. 1A
FIG. 1C
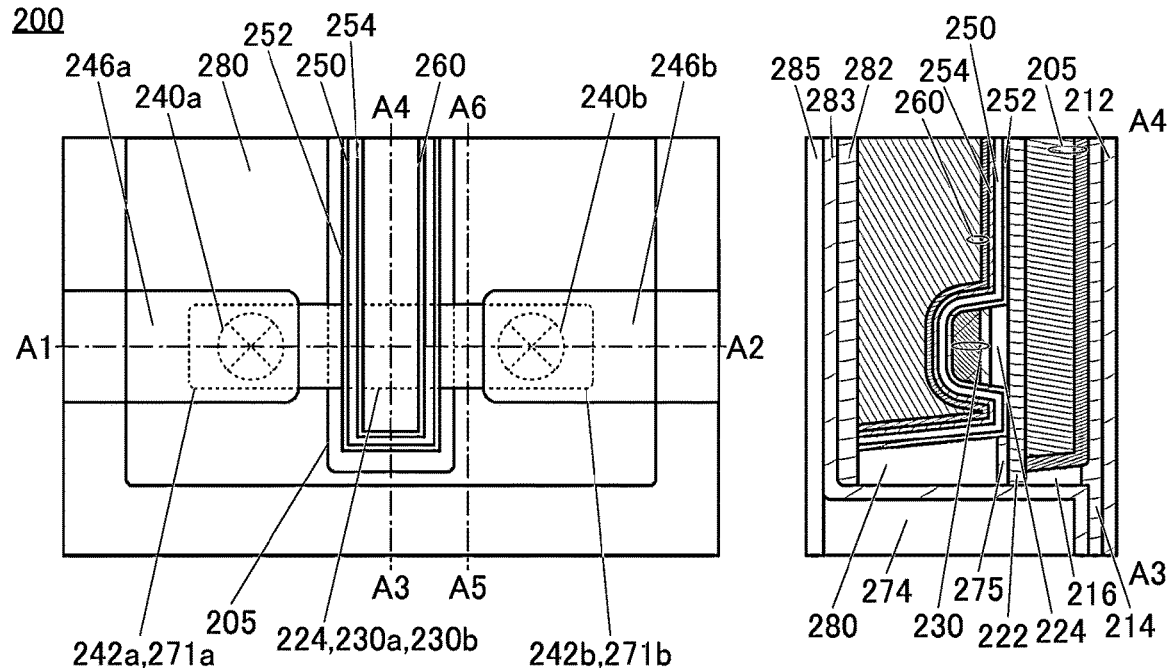
FIG. 1B
FIG. 1D
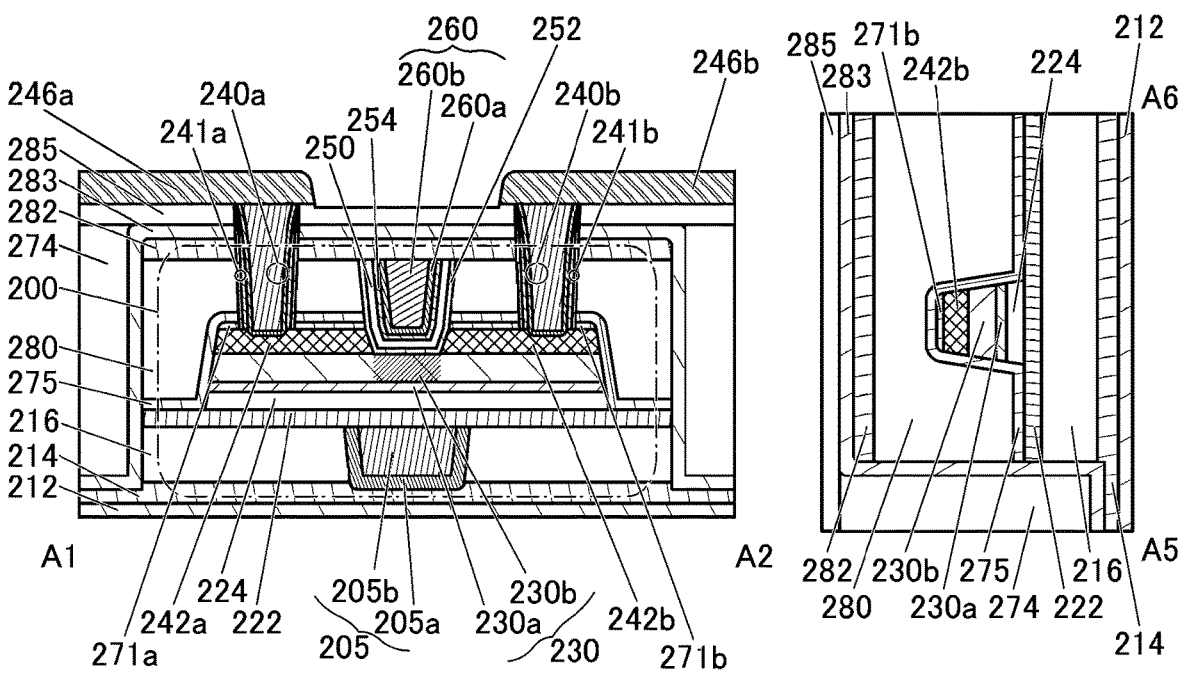

FIG. 3A
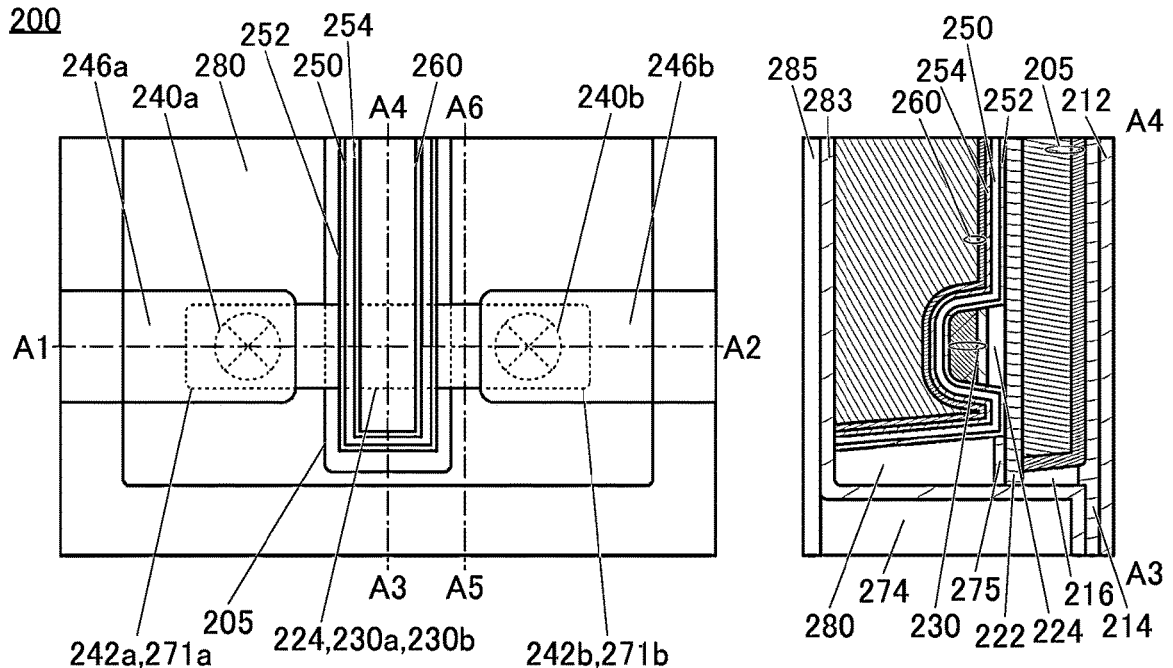
FIG. 3C
FIG. 3B
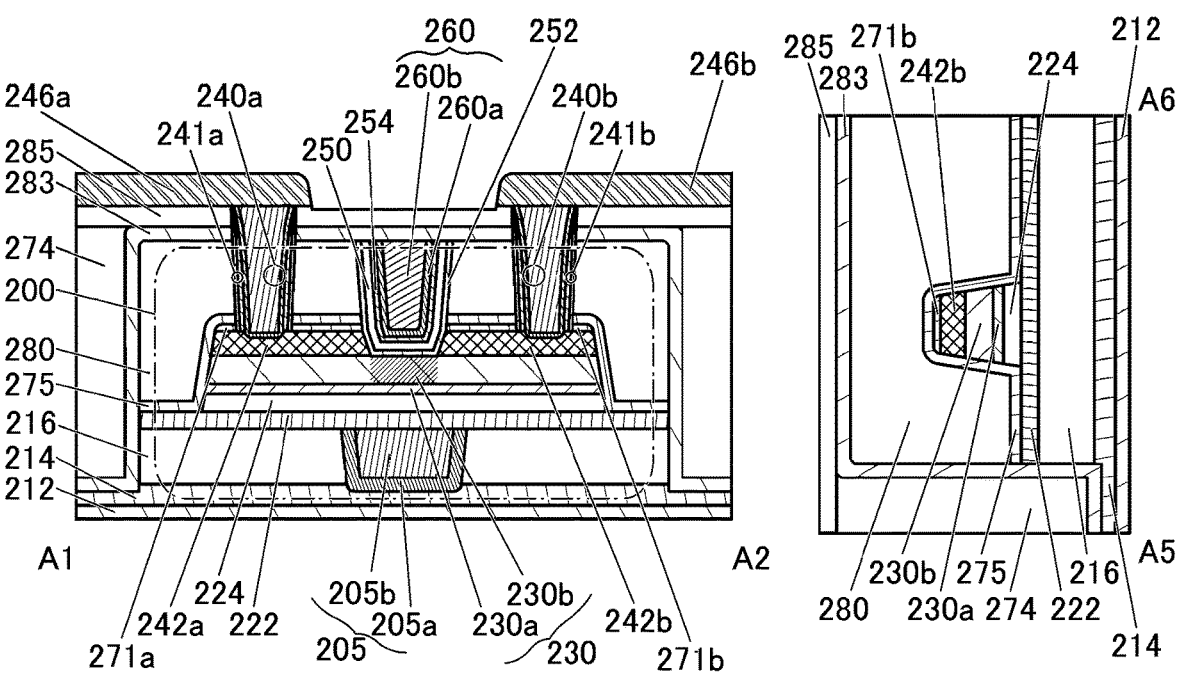
FIG. 3D

FIG. 4A
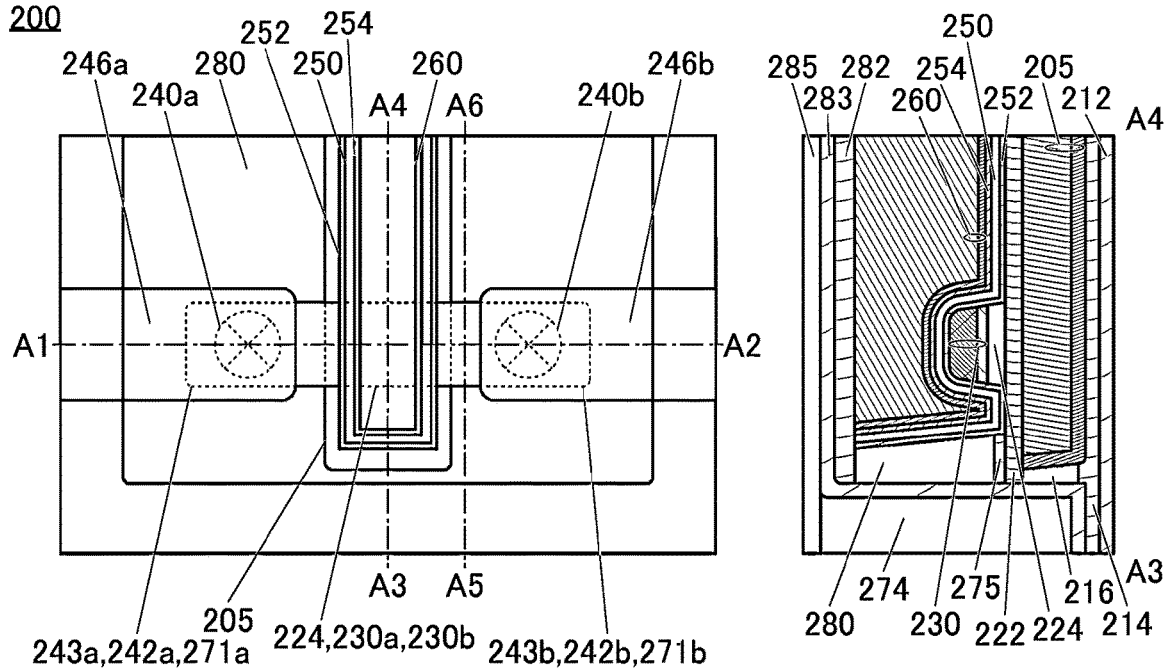
FIG. 4C
FIG. 4B
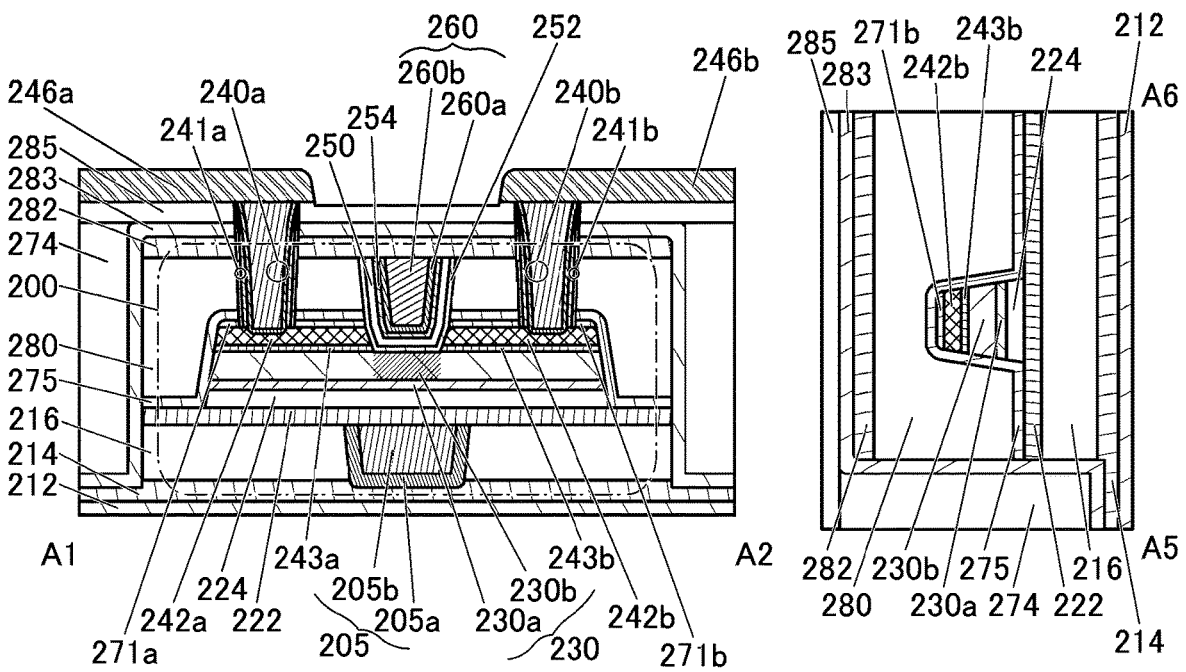
FIG. 4D

FIG. 5A
FIG. 5C
FIG. 5B
FIG. 5D
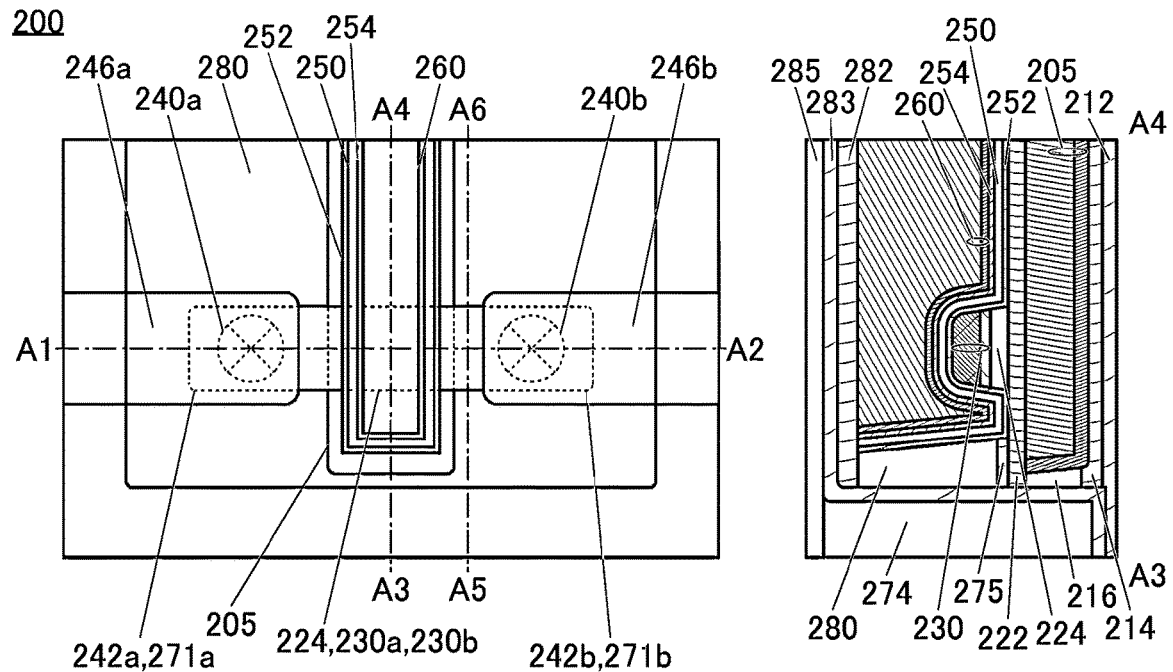
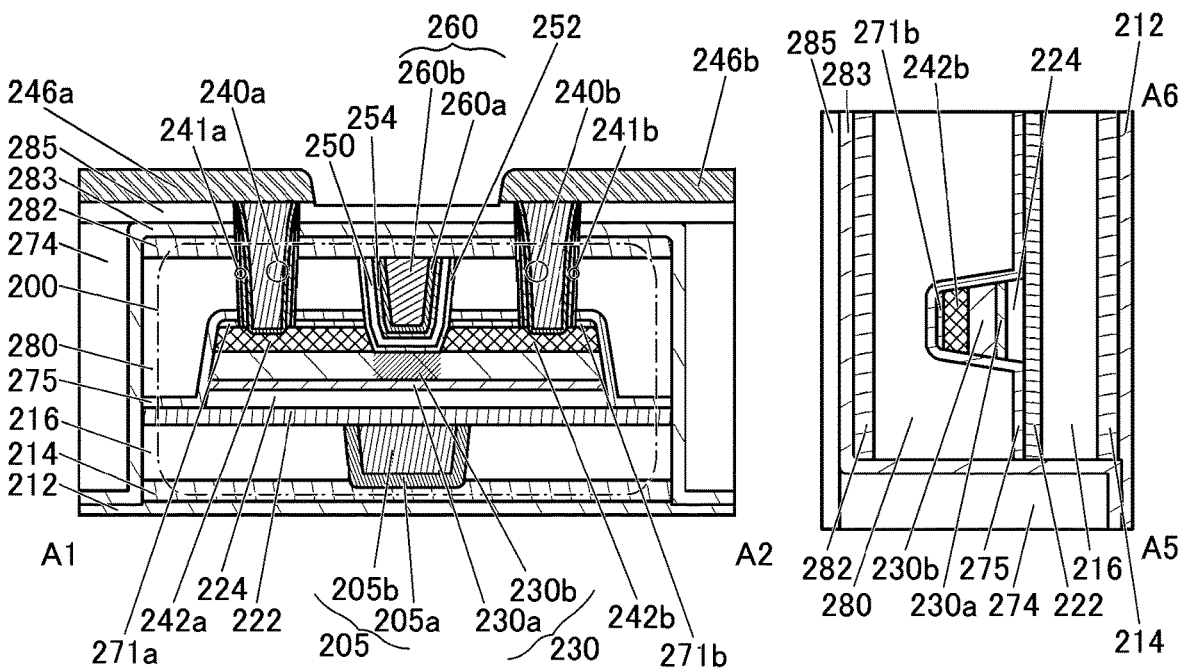

205a,205b 205
222,224A,230A,230B,242A,271A

FIG. 8A
FIG. 8C
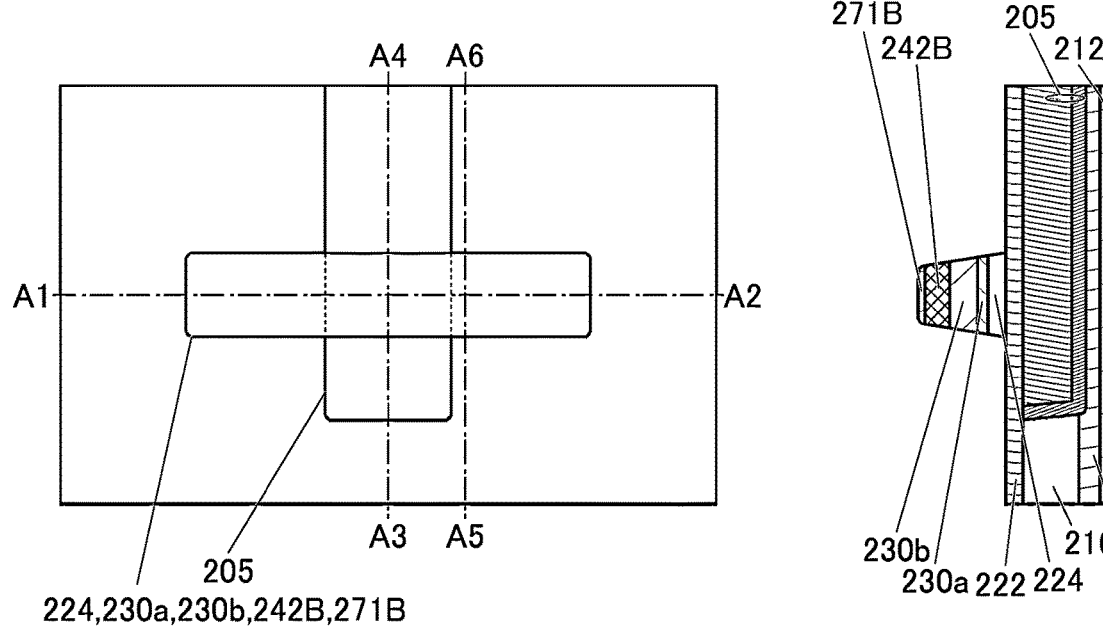
FIG. 8B
FIG. 8D
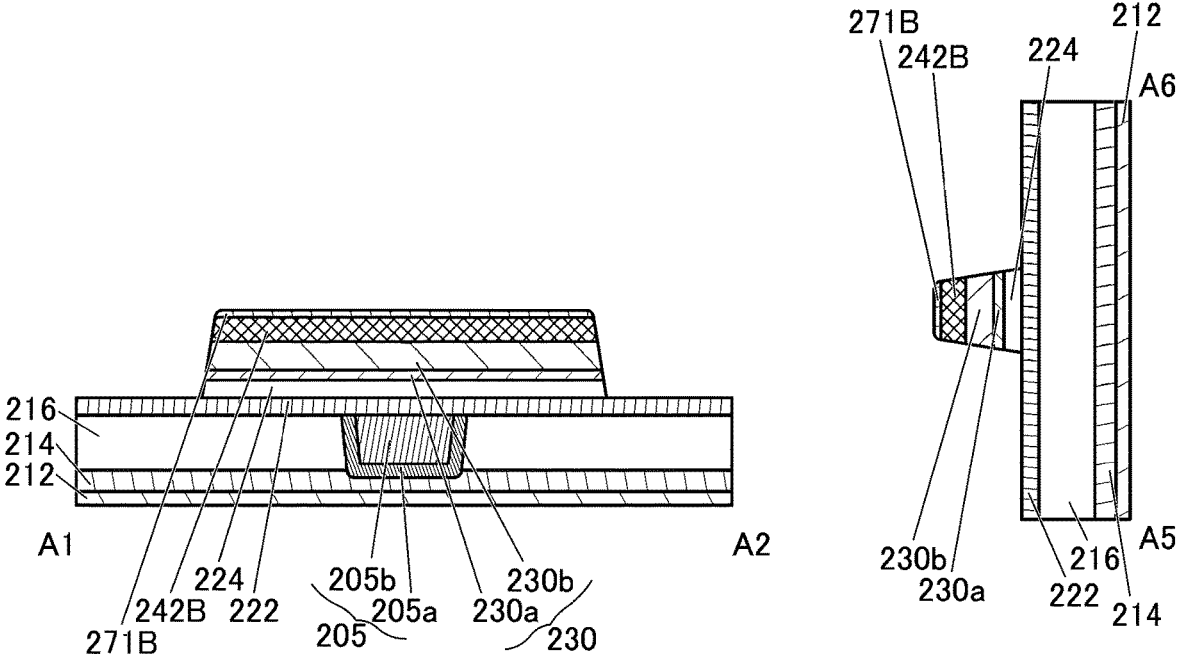

FIG. 11A
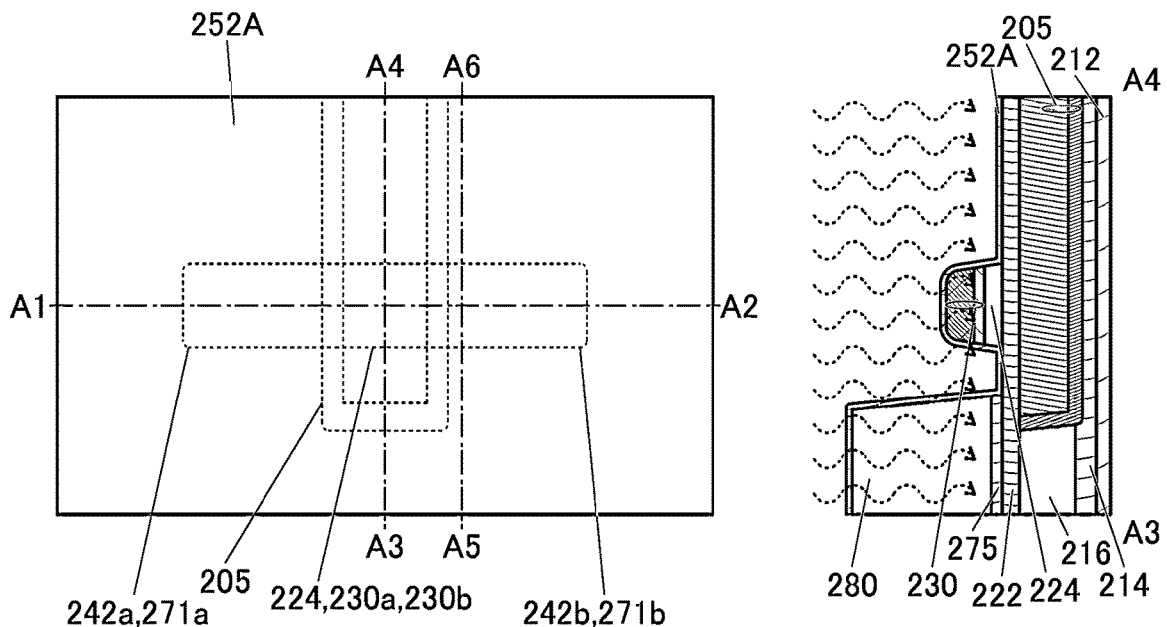
252A
A4   A6
A1 — — — — — — — — — — — — — — A2
A3   A5
242a,271a   205   224,230a,230b   242b,271b
FIG. 11C
205
252A   212   A4
280   230   222 224   214
275      216   A3
FIG. 11B
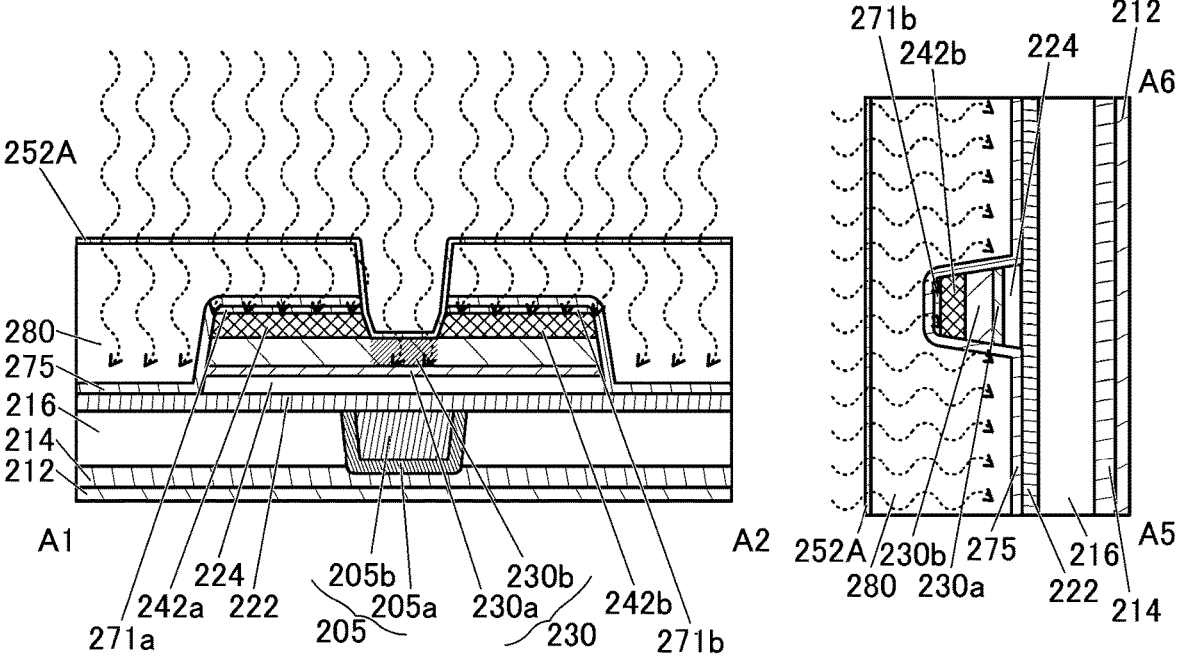
252A
280
275
216
214
212
A1
271a   242a   222   205   205a   230a   242b   271b
         224      205b   230b   230
FIG. 11D
271b   212
242b   224   A6
252A   230b   275   216   214
280   230a      222   A5
A2

FIG. 12A
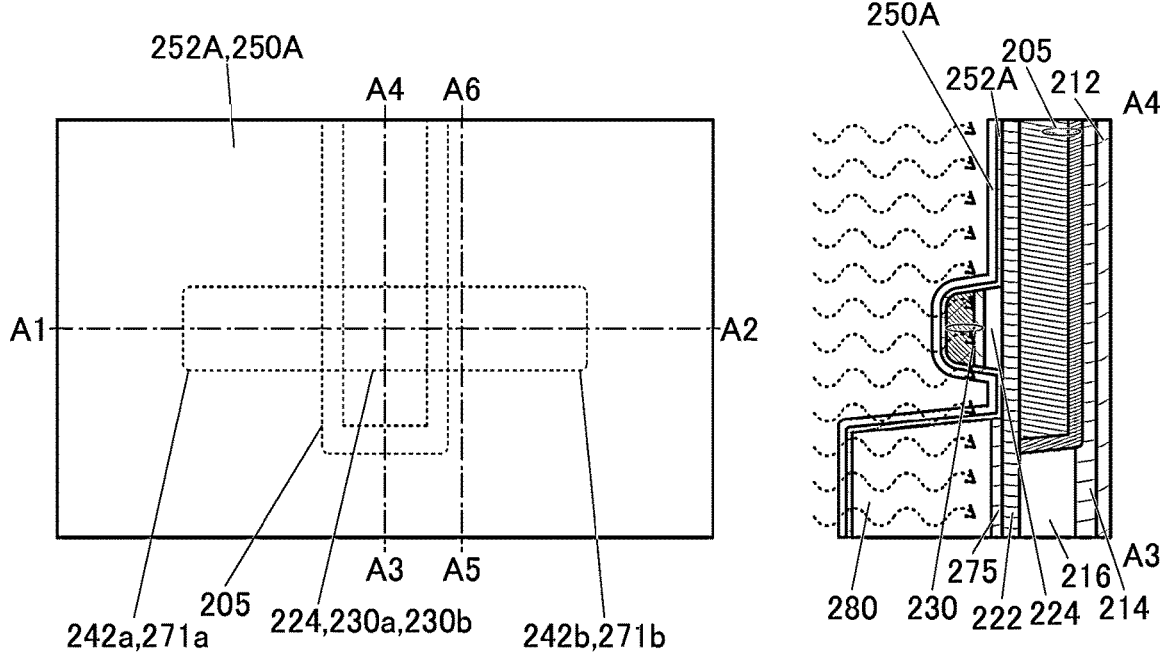
FIG. 12C
FIG. 12B
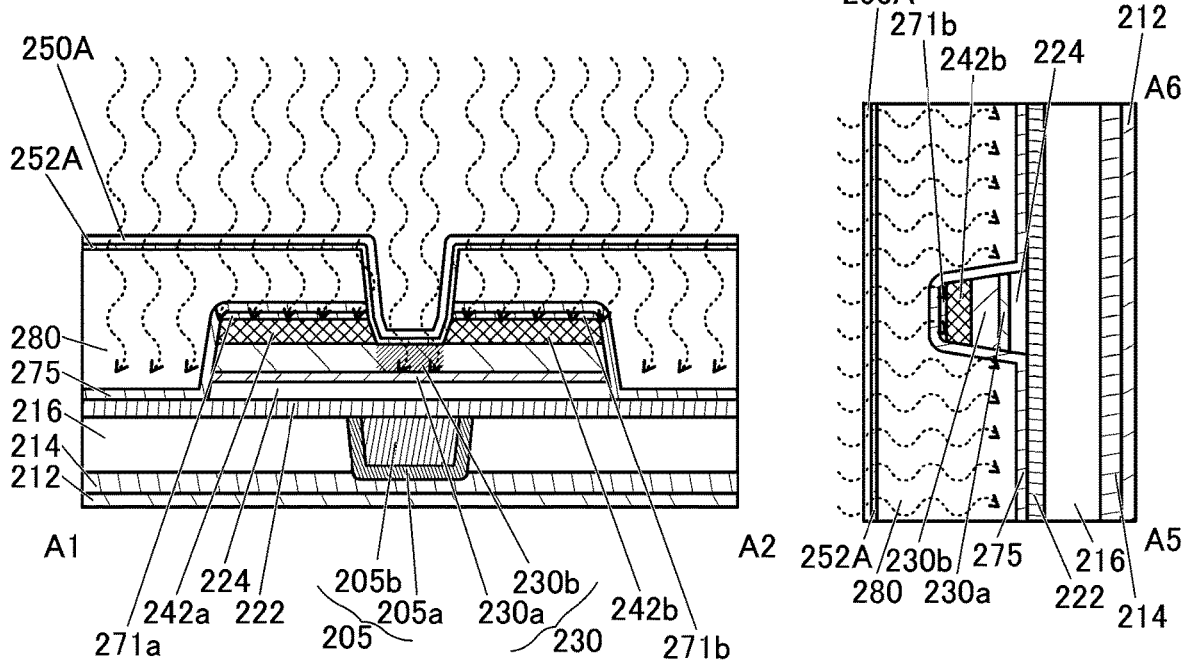
FIG. 12D

FIG. 13A
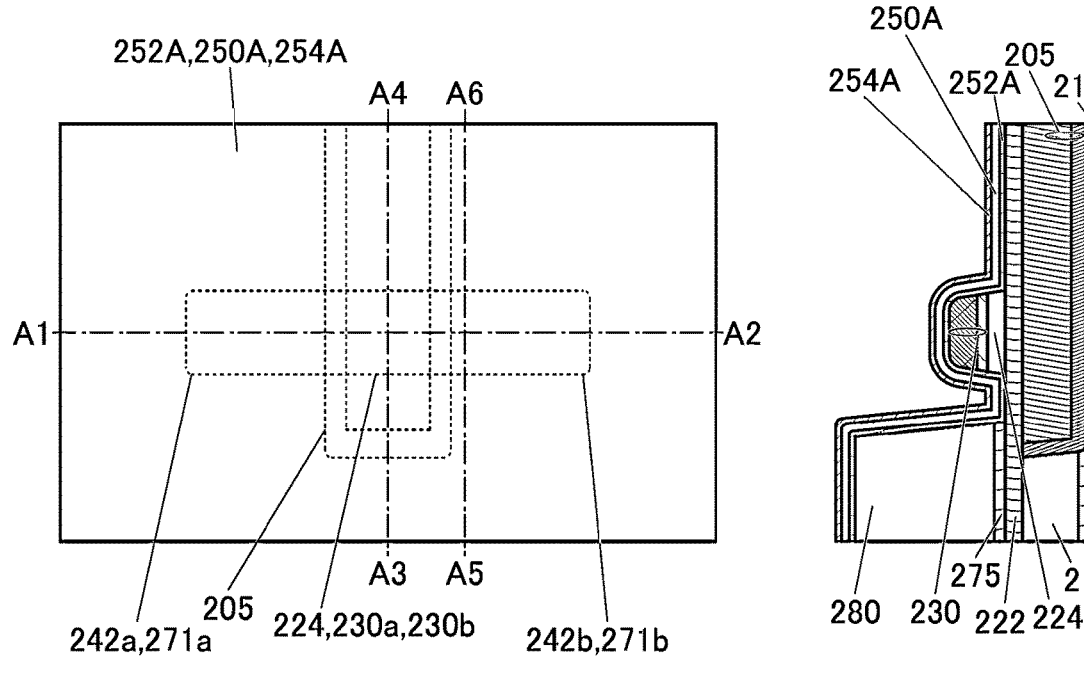
FIG. 13C
FIG. 13B
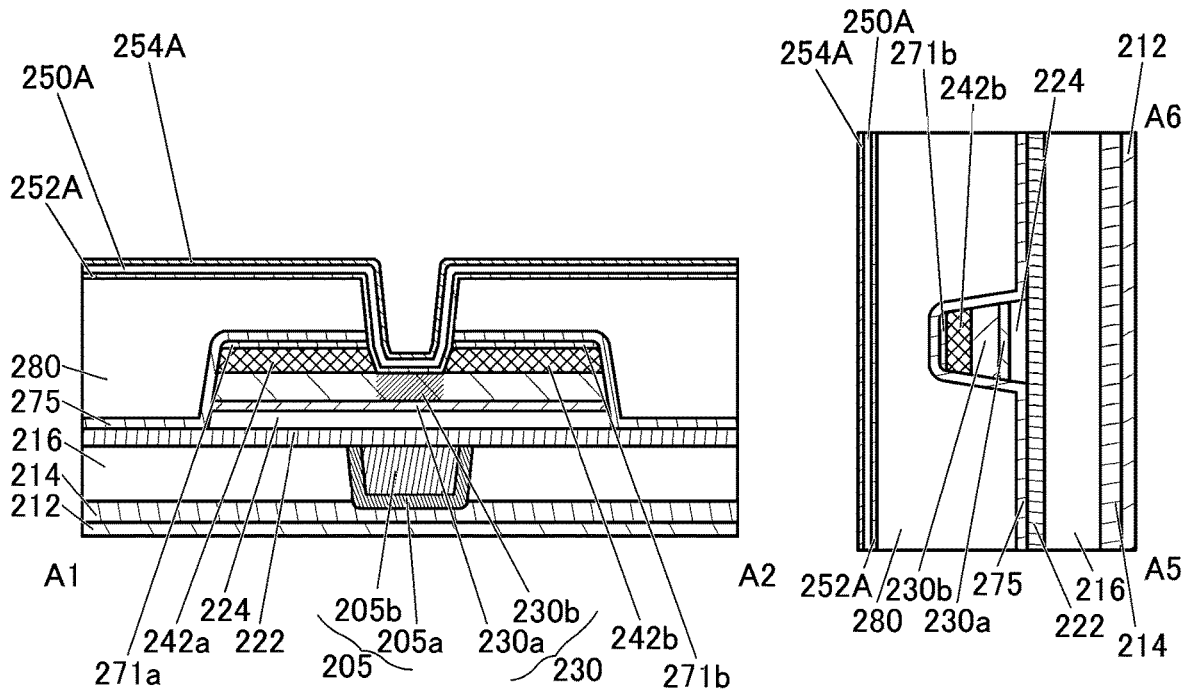
FIG. 13D

FIG. 14A
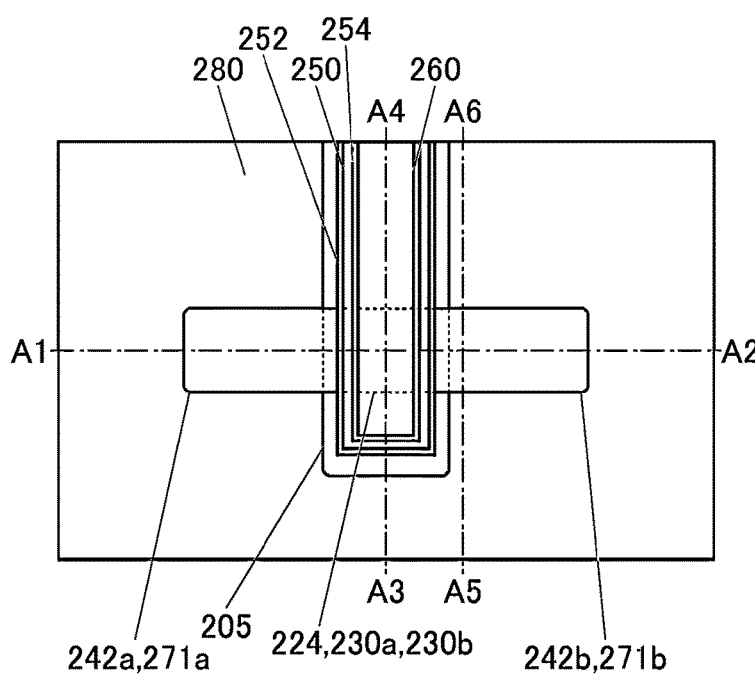
FIG. 14C
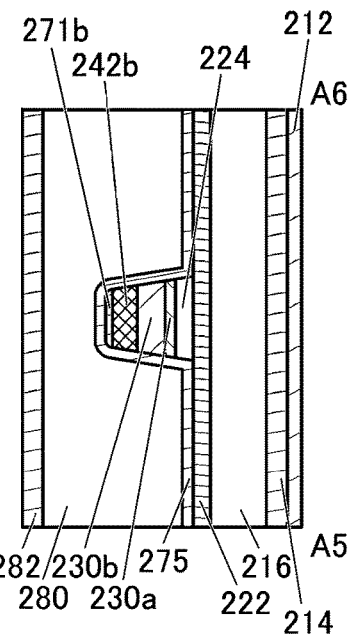
FIG. 14B
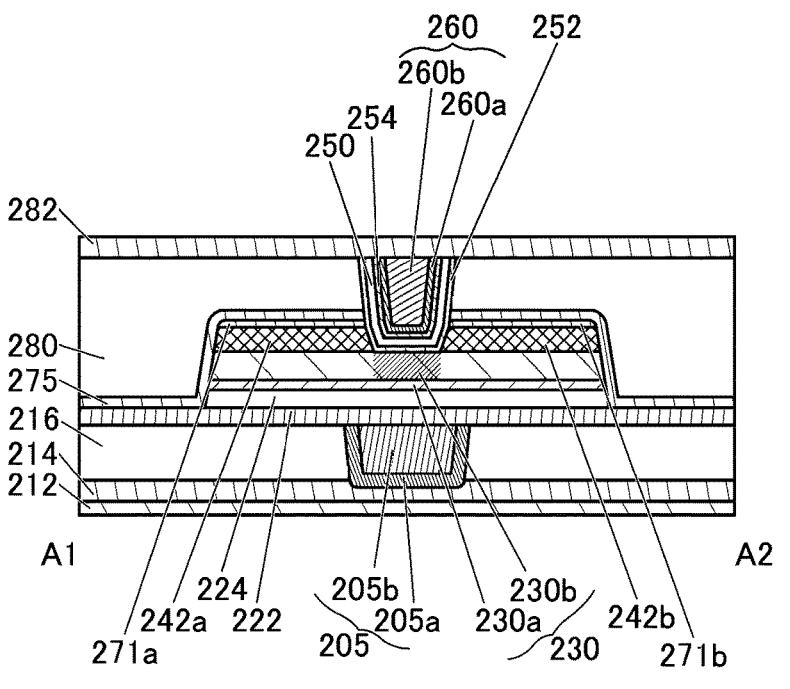
FIG. 14D

FIG. 15A
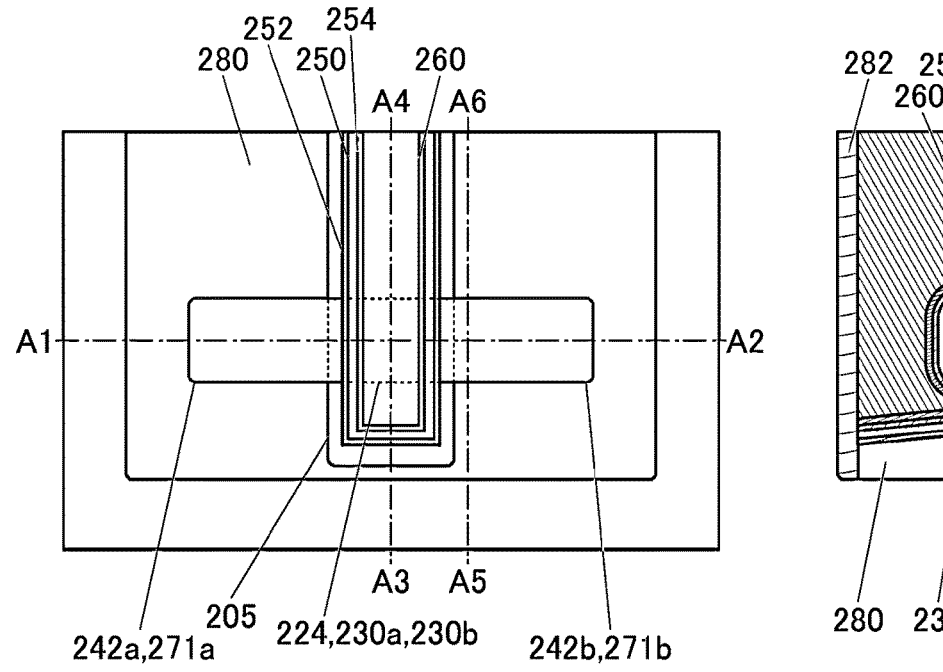
FIG. 15C
FIG. 15B
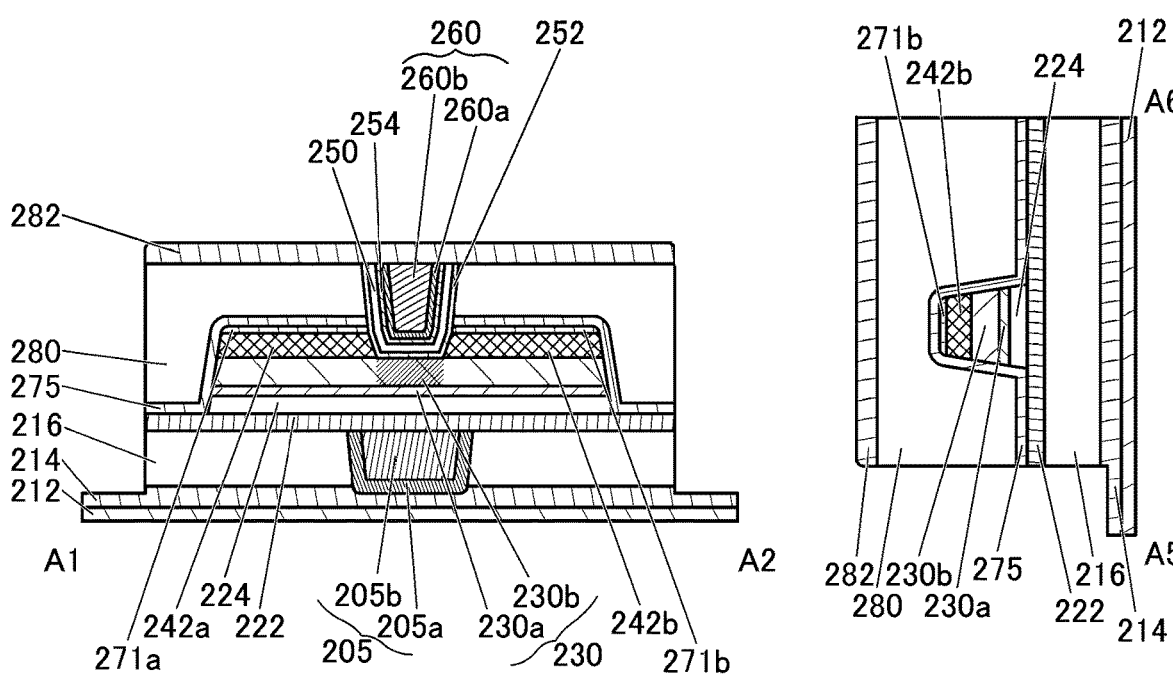
FIG. 15D

FIG. 16A
FIG. 16C
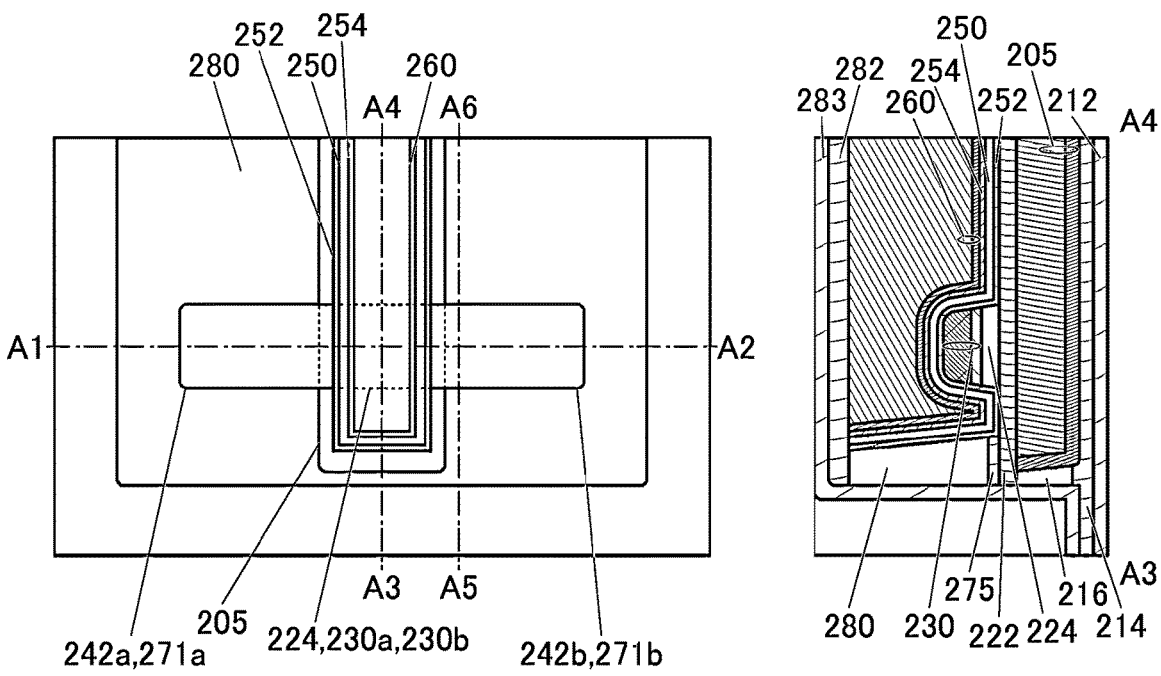
FIG. 16B
FIG. 16D
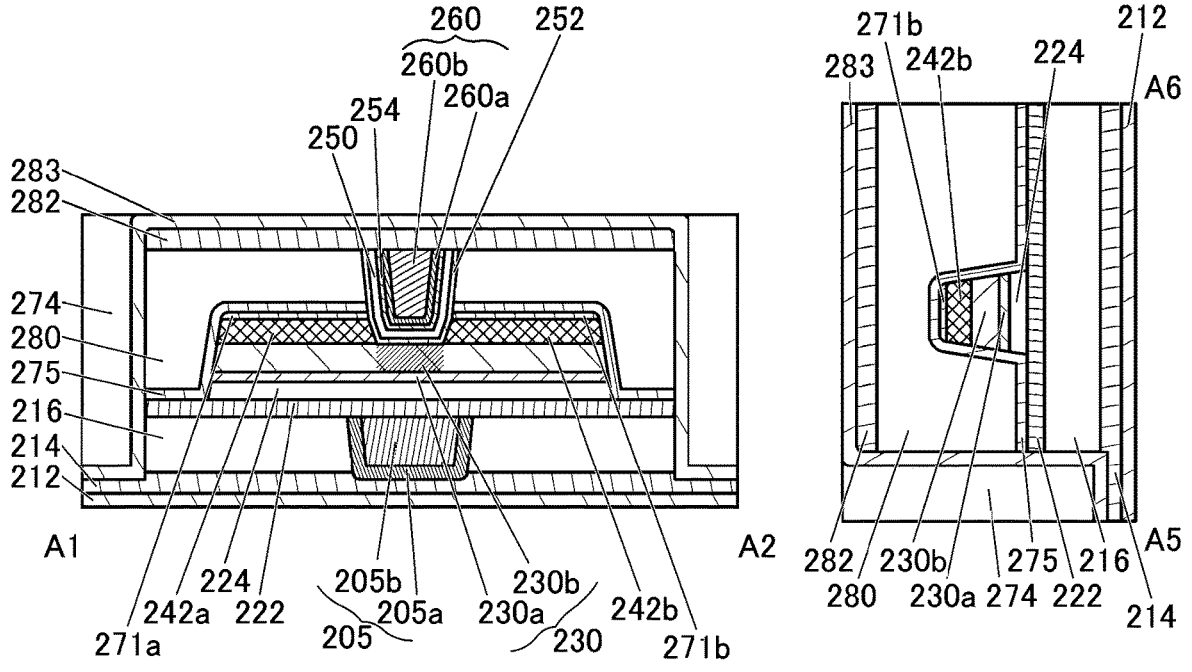

FIG. 17A
FIG. 17C
FIG. 17B
FIG. 17D
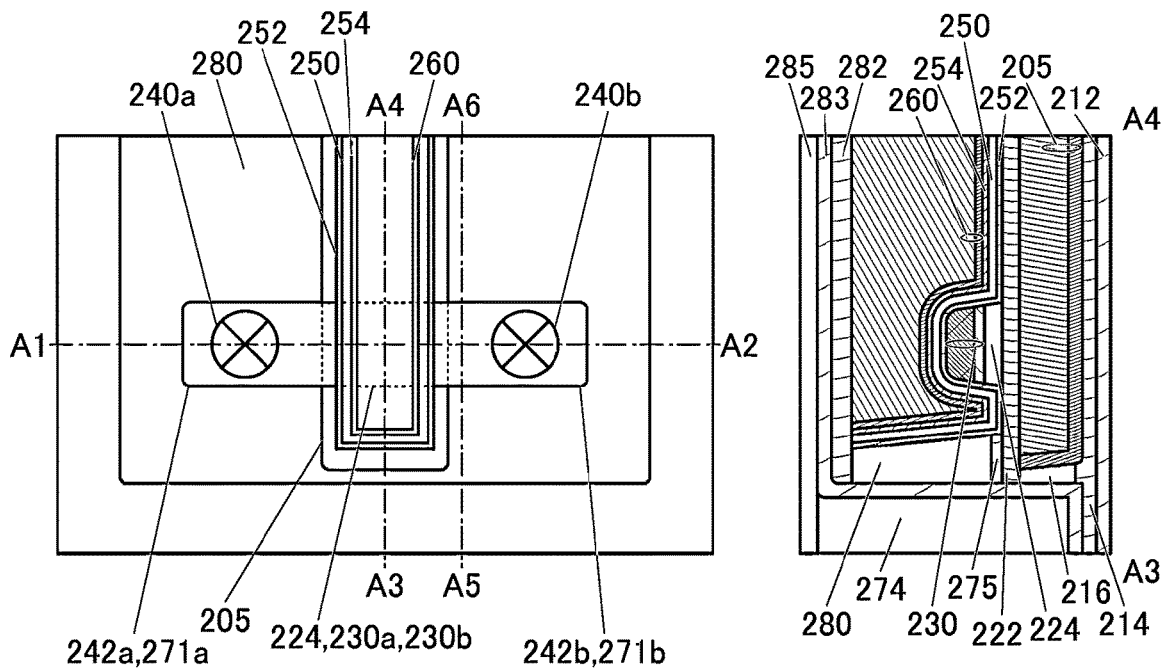
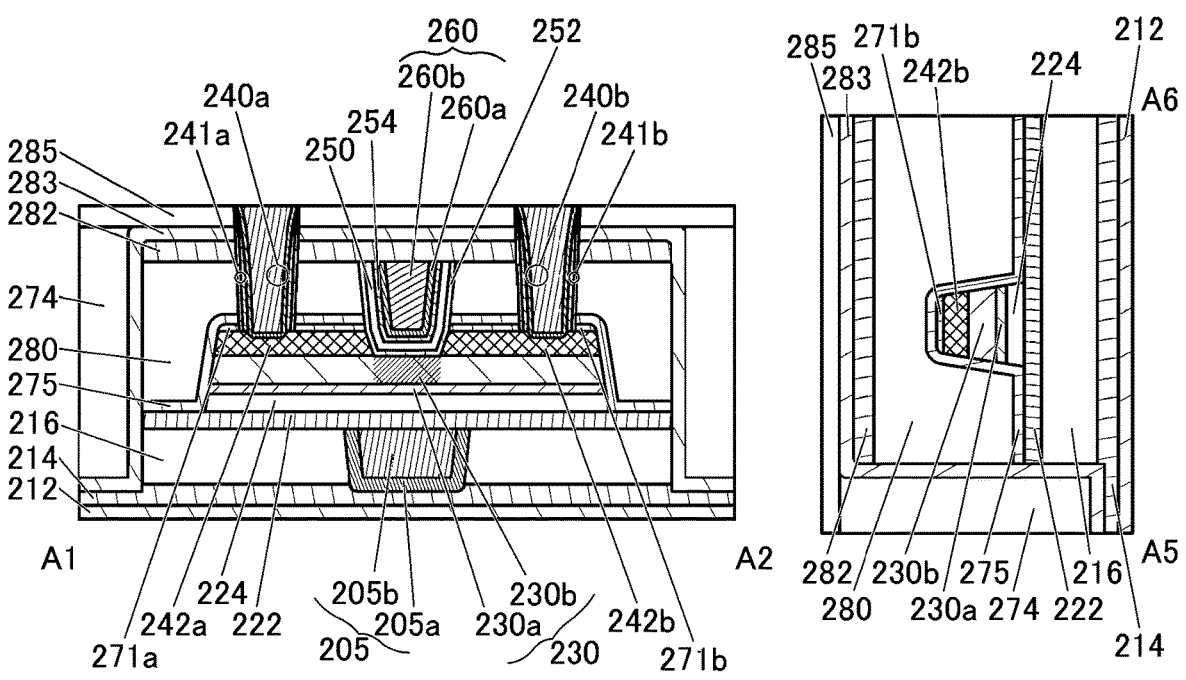

900

920
910

900

TRA
Tr
920
910
PC

1400

VDD  VIL

1470

1411

ADDR

CE

WE

RES

1420

1460

MC ........ MC

MC ........ MC

1430

1440

WDATA

VSS

RDATA

1400

1470

1411

FIG. 35A
1471
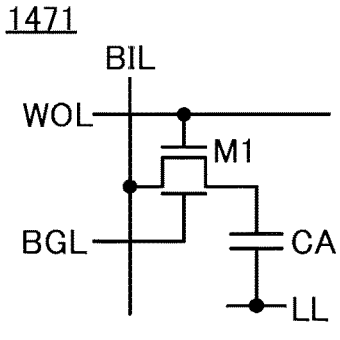
FIG. 35B
1472
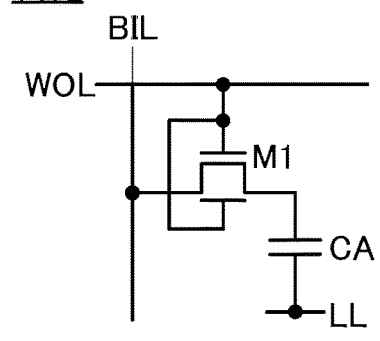
FIG. 35C
1473
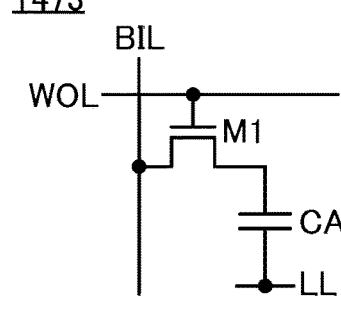
FIG. 35D
1474
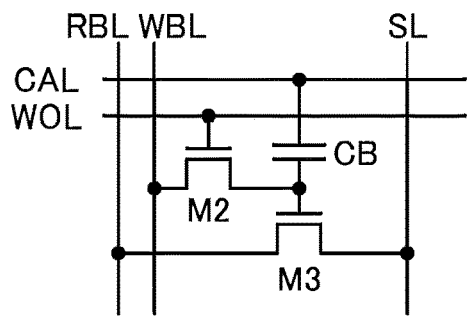
FIG. 35E
1475
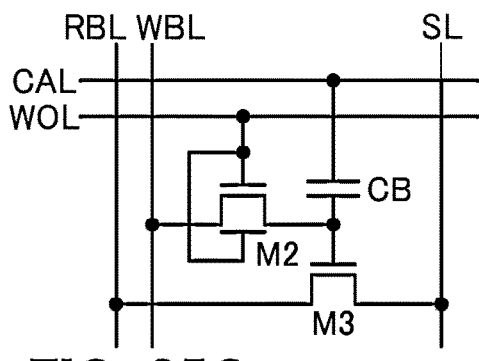
FIG. 35F
1476
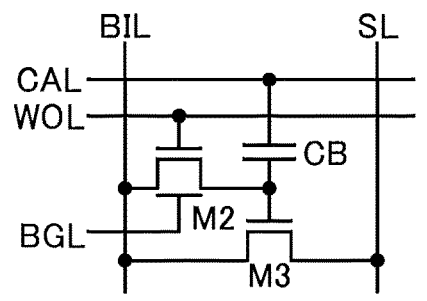
FIG. 35G
1477
FIG. 35H
1478
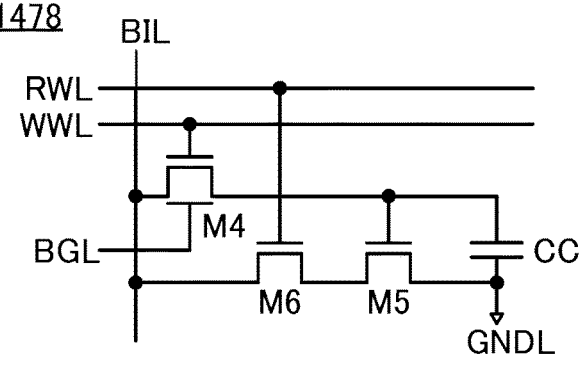

FIG. 41A
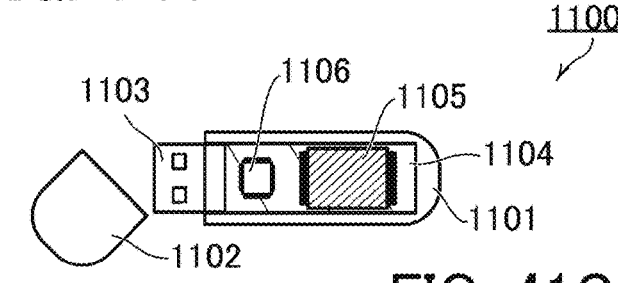
FIG. 41B          FIG. 41C
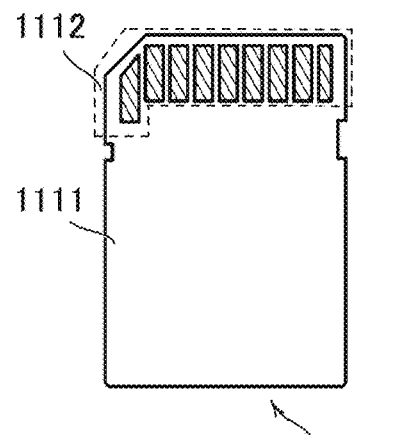 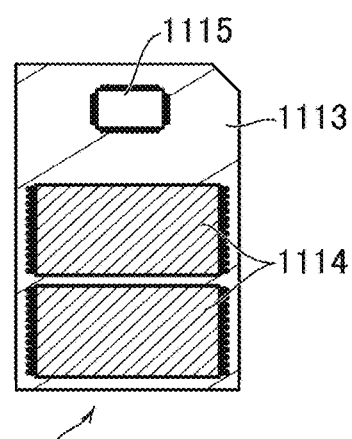
FIG. 41D          FIG. 41E
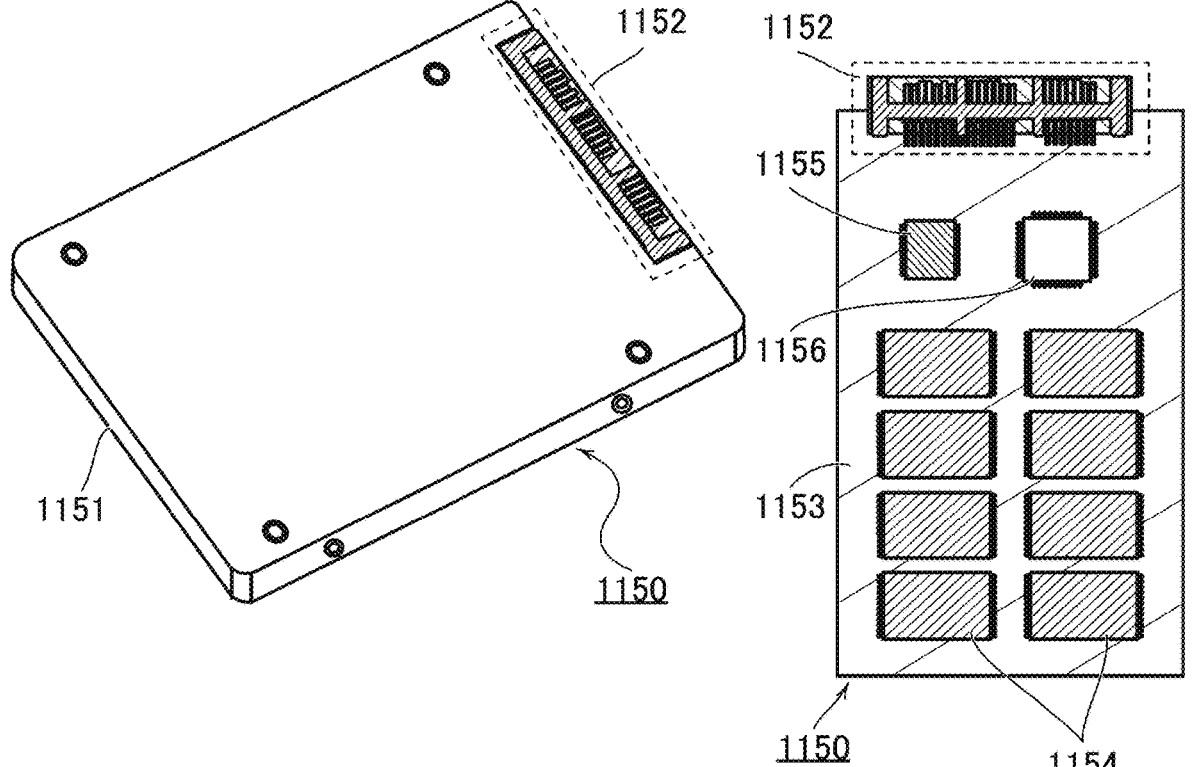

5100

5102

5101

5200

5202

5201

5203

5300

5301

5304

5303

5302

5306　5305

5400

5402

5500

5501

5502

5502

5504

5703　5704　5701

5702

5800

5801

5802

5803

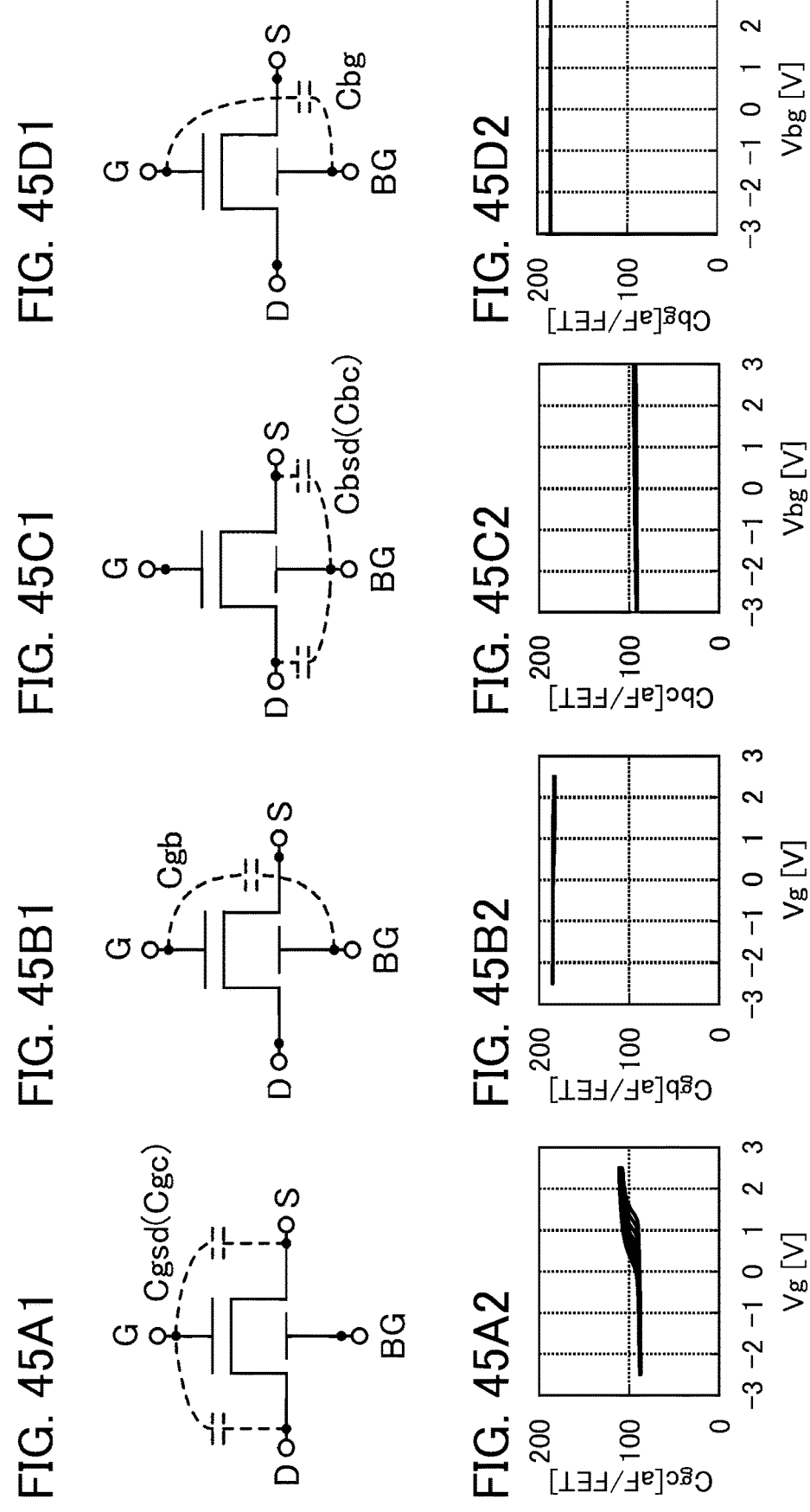

FIG. 48

| | | |
|---|---|---|
| 900[1] | 900[2] | 900[3] |
| 900[4] | 900[5] | 900[6] |
| 900[7] | 900[8] | 900[9] |
| 900[10] | 900[11] | 900[12] |

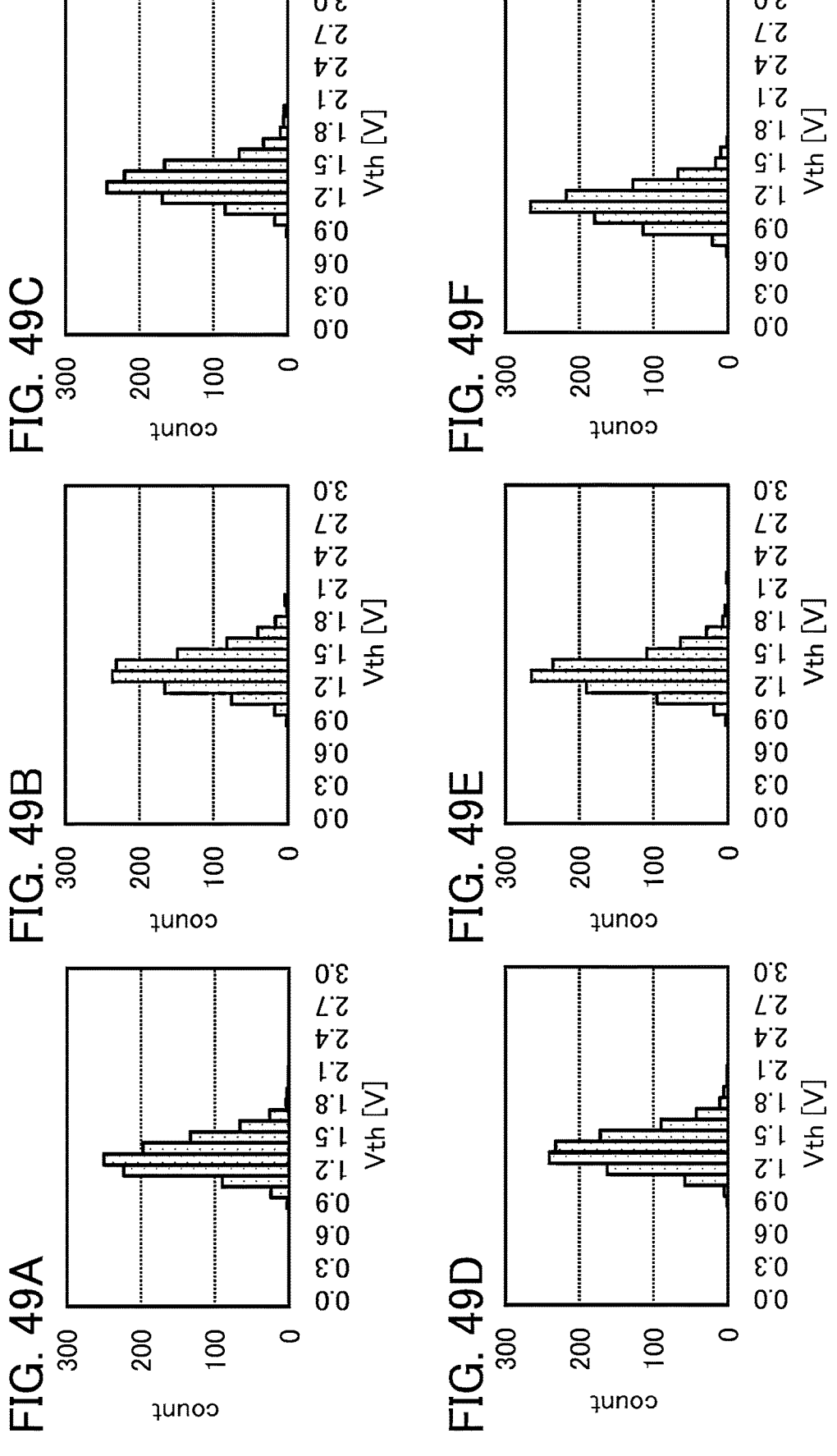

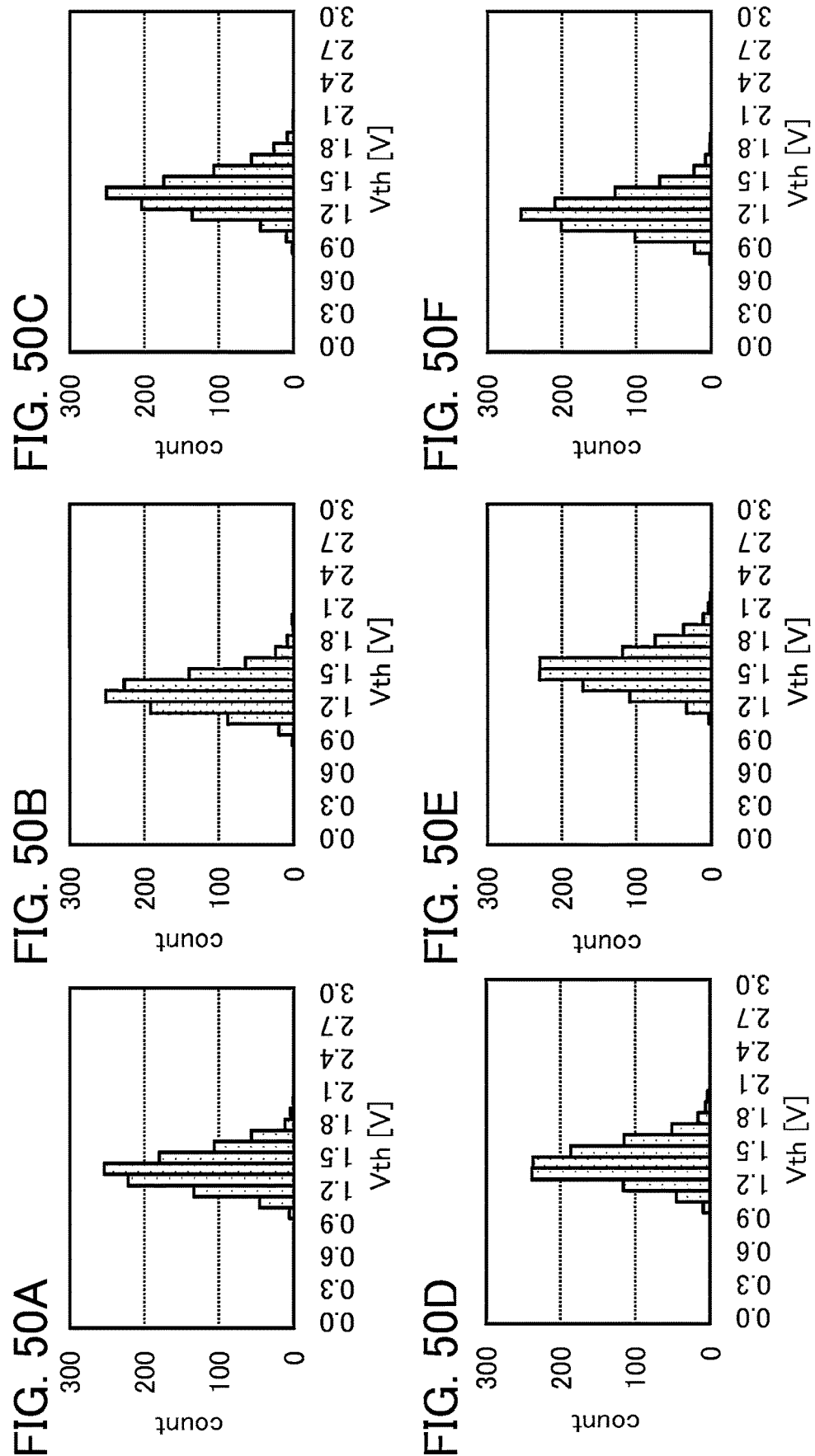

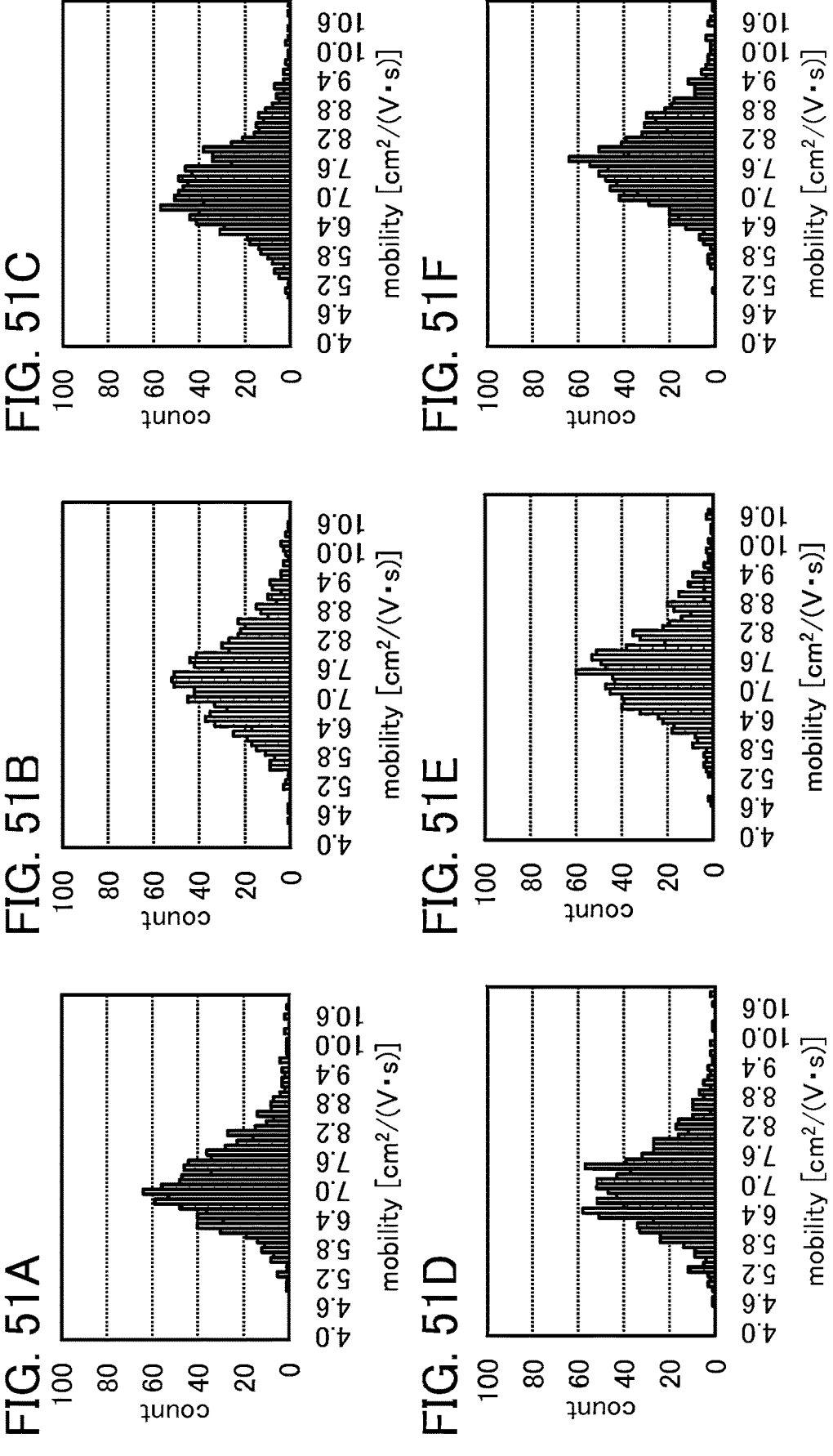

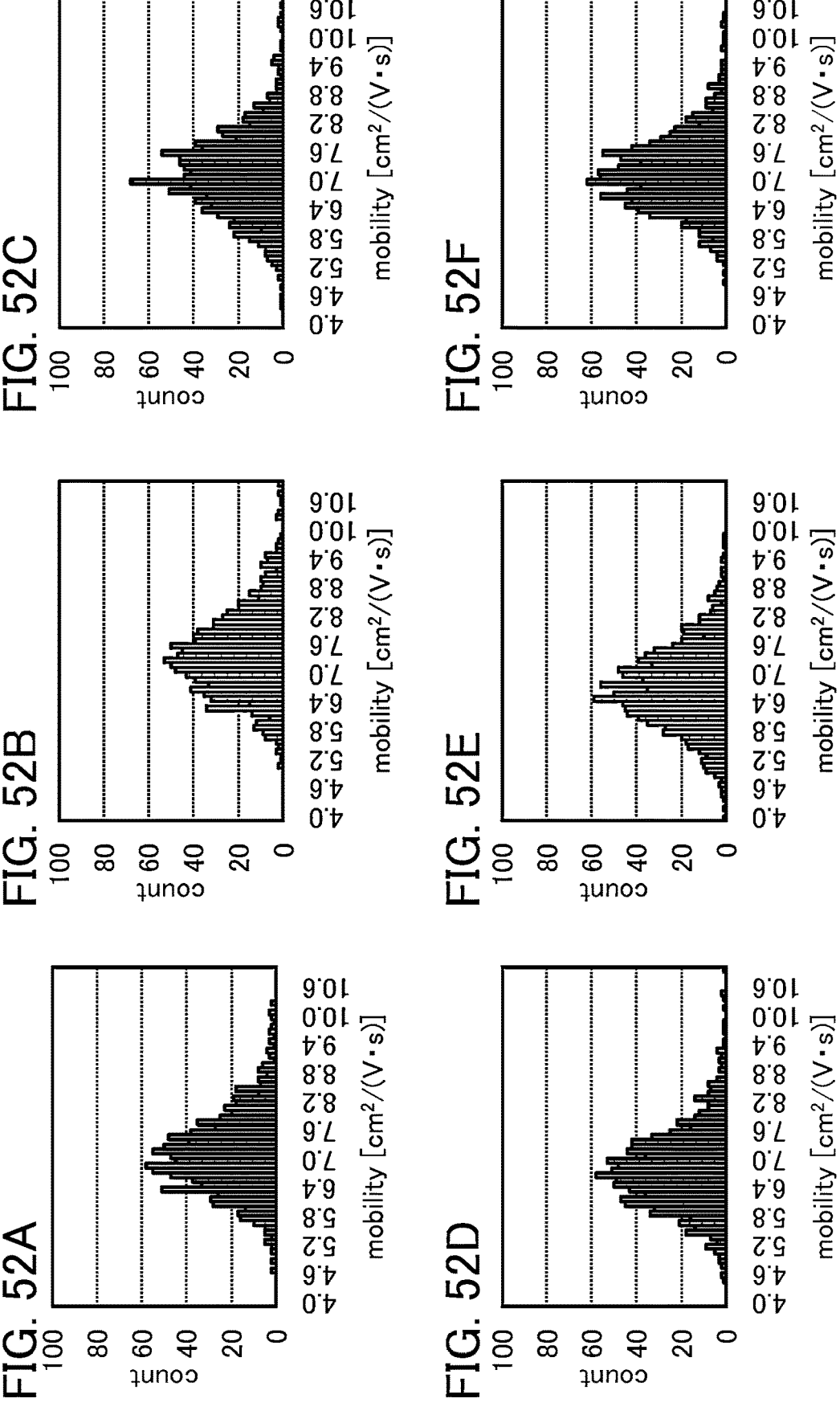

TRAa

TRAb

FIG. 56A
FIG. 56C
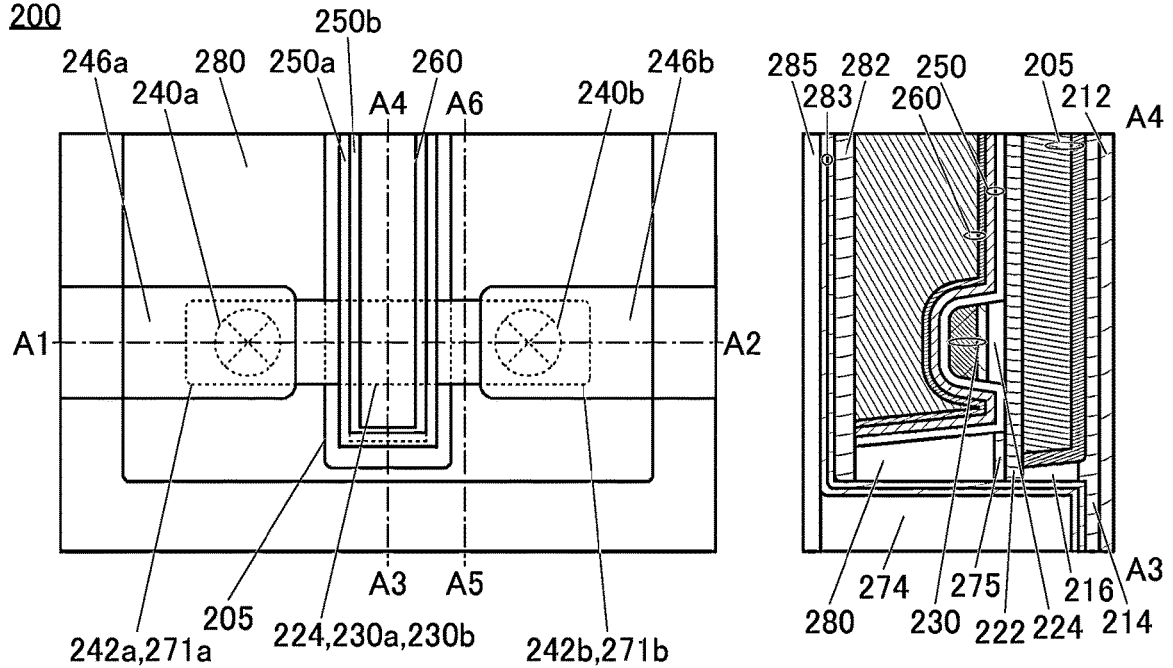
FIG. 56B
FIG. 56D
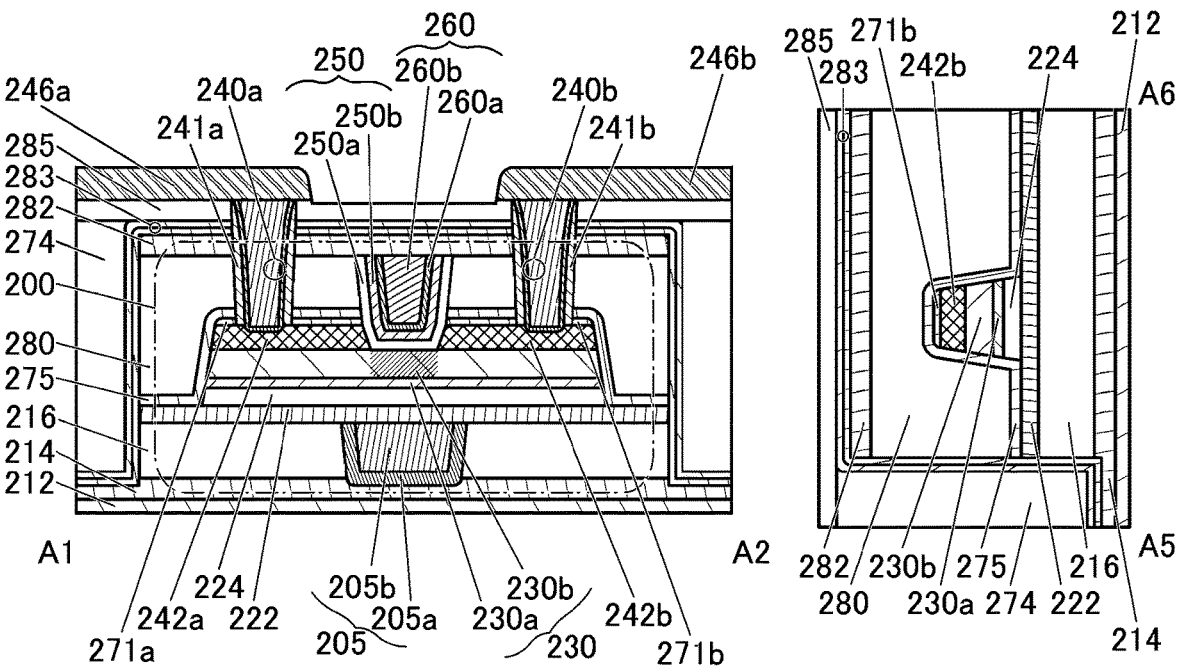

FIG. 61A
852 850 854 860
875b
875a
871a2
871a1
842a
871b2
871b1
842b
830b ⎱ 830
830a ⎰
824
822
805
FIG. 61B
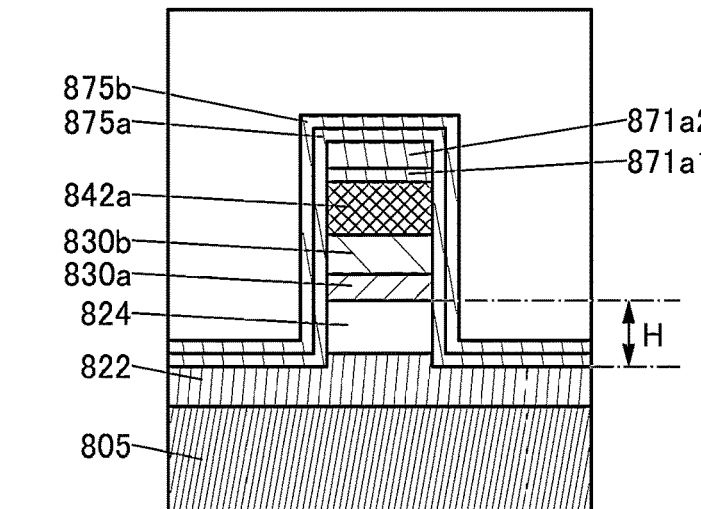
875b
875a
842a
830b
830a
824
822
871a2
871a1
H
805
FIG. 61C
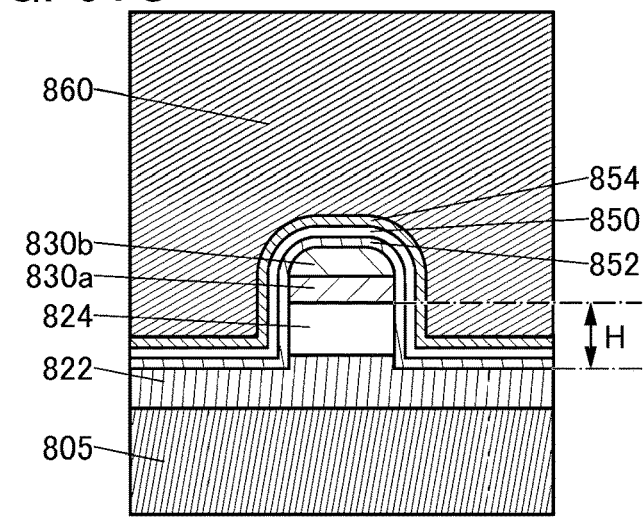
860
854
850
852
830b
830a
824
822
H
805

OSFF

SEMICONDUCTOR DEVICE

TECHNICAL FIELD

One embodiment of the present invention relates to a method for manufacturing a metal oxide. Another embodiment of the present invention relates to a transistor, a semiconductor device, and an electronic device. Another embodiment of the present invention relates to a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. It can be sometimes said that a display device (a liquid crystal display device, a light-emitting display device, and the like), a projection device, a lighting device, an electro-optical device, a power storage device, a storage device, a semiconductor circuit, an image capturing device, an electronic appliance, and the like include a semiconductor device.

Note that one embodiment of the present invention is not limited to the above technical field. One embodiment of the invention disclosed in this specification and the like relates to an object, a method, or a manufacturing method. One embodiment of the present invention relates to a process, a machine, manufacture, or a composition of matter.

BACKGROUND ART

In recent years, semiconductor devices have been developed, and LSIs, CPUs, memories, and the like are mainly used as the semiconductor devices. A CPU is an aggregation of semiconductor elements; the CPU includes a semiconductor integrated circuit (including at least a transistor and a memory) formed into a chip by processing a semiconductor wafer, and is provided with an electrode that is a connection terminal.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is used in a wide range of electronic devices such as an integrated circuit (IC) and an image display device (also simply referred to as a display device). A silicon-based semiconductor material is widely known as a semiconductor thin film applicable to the transistor and further, an oxide semiconductor has been attracting attention as another material.

It is known that a transistor using an oxide semiconductor has an extremely low leakage current in a non-conduction state. For example, Patent Document 1 discloses a low-power-consumption CPU utilizing a feature of a low leakage current of the transistor using an oxide semiconductor. Furthermore, for example, Patent Document 2 discloses a storage device that can retain stored contents for a long time by utilizing a feature of a low leakage current of the transistor using an oxide semiconductor.

In recent years, demand for an integrated circuit with higher density has risen with reductions in size and weight of electronic devices. Furthermore, the productivity of a semiconductor device including an integrated circuit is desired to be improved.

REFERENCE

Patent Document

[Patent Document 1] Japanese Published Patent Application No. 2012-257187
[Patent Document 2] Japanese Published Patent Application No. 2011-151383

SUMMARY OF THE INVENTION

Problems to be Solved by the Invention

An object of one embodiment of the present invention is to provide a semiconductor device that can be subjected to multipoint measurement. Another object of one embodiment of the present invention is to provide a semiconductor device with a small variation in electrical characteristics of transistors. Another object of one embodiment of the present invention is to provide a semiconductor device with favorable reliability. Another object of one embodiment of the present invention is to provide a semiconductor device with favorable electrical characteristics. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not need to achieve all these objects. Other objects will be apparent from the description of the specification, the drawings, the claims, and the like, and other objects can be derived from the description of the specification, the drawings, the claims, and the like.

Means for Solving the Problems

One embodiment of the present invention is a semiconductor device including a first layer, a second layer over the first layer, a first wiring, a second wiring, and a third wiring. The first layer includes a first multiplexer, a second multiplexer, and first to fourth analog switches, and the second layer includes first to fourth transistors. Each of the first to fourth transistors includes a source, a drain, and a first gate. The first wiring is electrically connected to one of the source and the drain of each of the first to fourth transistors. A first terminal of each of the first analog switch and the second analog switch is electrically connected to the first multiplexer, and a second terminal of each of the first analog switch and the second analog switch is electrically connected to the second wiring. A third terminal of the first analog switch is electrically connected to the other of the source and the drain of each of the first transistor and the second transistor, and a third terminal of the second analog switch is electrically connected to the other of the source and the drain of each of the third transistor and the fourth transistor. A first terminal of each of the third analog switch and the fourth analog switch is electrically connected to the second multiplexer, and a second terminal of each of the third analog switch and the fourth analog switch is electrically connected to the third wiring. A third terminal of the third analog switch is electrically connected to the first gate of each of the first transistor and the third transistor, and a third terminal of the fourth analog switch is electrically connected to the first gate of each of the second transistor and the fourth transistor.

It is preferable that the above semiconductor device further include a fourth wiring, each of the first to fourth transistors further include a second gate, and the fourth wiring be electrically connected to the second gate of each of the first to fourth transistors.

In the above semiconductor device, each of the first to fourth transistors preferably includes a metal oxide in a channel formation region.

In the above semiconductor device, the metal oxide preferably contains indium, gallium, and zinc.

In the above semiconductor device, each of the first to fourth analog switches preferably includes a CMOS circuit In the above semiconductor device, a transistor included in the CMOS circuit preferably includes silicon in a channel formation region.

Another embodiment of the present invention is a semiconductor device including a first layer, a second layer over the first layer, a first wiring, a second wiring, and a third wiring. The first layer includes a first multiplexer, a second multiplexer, and first to third analog switches, and the second layer includes a first transistor and a third transistor. Each of the first transistor and the third transistor includes a source, a drain, and a first gate. The first wiring is electrically connected to one of the source and the drain of each of the first transistor and the third transistor. A first terminal of each of the first analog switch and the second analog switch is electrically connected to the first multiplexer, and a second terminal of each of the first analog switch and the second analog switch is electrically connected to the second wiring. A third terminal of the first analog switch is electrically connected to the other of the source and the drain of the first transistor, and a third terminal of the second analog switch is electrically connected to the other of the source and the drain of the third transistor. A first terminal of the third analog switch is electrically connected to the second multiplexer, a second terminal of the third analog switch is electrically connected to the third wiring, and a third terminal of the third analog switch is electrically connected to the first gate of each of the first transistor and the third transistor.

It is preferable that the above semiconductor device further include a fourth wiring, each of the first transistor and the third transistor further include a second gate, and the fourth wiring be electrically connected to the second gate of each of the first transistor and the third transistor.

In the above semiconductor device, each of the first transistor and the third transistor preferably includes a metal oxide in a channel formation region.

In the above semiconductor device, the metal oxide preferably contains indium, gallium, and zinc.

In the above semiconductor device, each of the first to third analog switches preferably includes a CMOS circuit.

In the above semiconductor device, a transistor included in the CMOS circuit preferably includes silicon in a channel formation region.

Another embodiment of the present invention is a semiconductor device including a first layer, a second layer over the first layer, a first wiring, a second wiring, and a third wiring. The first layer includes a first multiplexer, a second multiplexer, a first analog switch, a third analog switch, and a fourth analog switch, and the second layer includes a first transistor and a second transistor. Each of the first transistor and the second transistor includes a source, a drain, and a first gate. The first wiring is electrically connected to one of the source and the drain of each of the first transistor and the second transistor. A first terminal of the first analog switch is electrically connected to the first multiplexer, a second terminal of the first analog switch is electrically connected to the second wiring, and a third terminal of the first analog switch is electrically connected to the other of the source and the drain of each of the first transistor and the second transistor. A first terminal of each of the third analog switch and the fourth analog switch is electrically connected to the second multiplexer, and a second terminal of each of the third analog switch and the fourth analog switch is electrically connected to the third wiring. A third terminal of the third analog switch is electrically connected to the first gate of the first transistor, and a third terminal of the fourth analog switch is electrically connected to the first gate of the second transistor.

It is preferable that the above semiconductor device further include a fourth wiring, each of the first transistor and the second transistor further include a second gate, and the fourth wiring be electrically connected to the second gate of each of the first transistor and the second transistor.

In the above semiconductor device, each of the first transistor and the second transistor preferably includes a metal oxide in a channel formation region.

In the above semiconductor device, the metal oxide preferably contains indium, gallium, and zinc.

In the above semiconductor device, each of the first analog switch, the third analog switch, and the fourth analog switch preferably includes a CMOS circuit.

In the above semiconductor device, a transistor included in the CMOS circuit preferably includes silicon in a channel formation region.

Effect of the Invention

According to one embodiment of the present invention, a semiconductor device that can be subjected to multipoint measurement can be provided. According to another embodiment of the present invention, a semiconductor device with a small variation in electrical characteristics of transistors can be provided. According to another embodiment of the present invention, a semiconductor device with high reliability can be provided. According to another embodiment of the present invention, a semiconductor device with favorable electrical characteristics can be provided. According to another embodiment of the present invention, a semiconductor device with a high on-state current can be provided. According to another embodiment of the present invention, a semiconductor device that can be miniaturized or highly integrated can be provided. According to another embodiment of the present invention, a semiconductor device with low power consumption can be provided.

Note that the description of these effects does not preclude the existence of other effects. One embodiment of the present invention does not have to have all these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 1A is a top view of a semiconductor device of one embodiment of the present invention.

FIG. 1B to FIG. 1D are cross-sectional views of the semiconductor device of one embodiment of the present invention.

FIG. 3A is a top view of a semiconductor device of one embodiment of the present invention.

FIG. 3B to FIG. 3D are cross-sectional views of the semiconductor device of one embodiment of the present invention.

FIG. 4A is a top view of a semiconductor device of one embodiment of the present invention.

FIG. 4B to FIG. 4D are cross-sectional views of the semiconductor device of one embodiment of the present invention.

FIG. 5A is a top view of a semiconductor device of one embodiment of the present invention.

FIG. 5B to FIG. 5D are cross-sectional views of the semiconductor device of one embodiment of the present invention.

FIG. 8A is a top view illustrating the method for manufacturing a semiconductor device of one embodiment of the present invention. FIG. 8B and FIG. 8D are cross-sectional views illustrating the method for manufacturing a semiconductor device of one embodiment of the present invention.

FIG. 11A is a top view illustrating the method for manufacturing a semiconductor device of one embodiment of the present invention. FIG. 11B and FIG. 11D are cross-sectional views illustrating the method for manufacturing a semiconductor device of one embodiment of the present invention.

FIG. 12A is a top view illustrating the method for manufacturing a semiconductor device of one embodiment of the present invention. FIG. 12B and FIG. 12D are cross-sectional views illustrating the method for manufacturing a semiconductor device of one embodiment of the present invention.

FIG. 13A is a top view illustrating the method for manufacturing a semiconductor device of one embodiment of the present invention. FIG. 13B and FIG. 13D are cross-sectional views illustrating the method for manufacturing a semiconductor device of one embodiment of the present invention.

FIG. 14A is a top view illustrating the method for manufacturing a semiconductor device of one embodiment of the present invention. FIG. 14B and FIG. 14D are cross-sectional views illustrating the method for manufacturing a semiconductor device of one embodiment of the present invention.

FIG. 15A is a top view illustrating the method for manufacturing a semiconductor device of one embodiment of the present invention. FIG. 15B and FIG. 15D are cross-sectional views illustrating the method for manufacturing a semiconductor device of one embodiment of the present invention.

FIG. 16A is a top view illustrating the method for manufacturing a semiconductor device of one embodiment of the present invention. FIG. 16B and FIG. 16D are cross-sectional views illustrating the method for manufacturing a semiconductor device of one embodiment of the present invention.

FIG. 17A is a top view illustrating the method for manufacturing a semiconductor device of one embodiment of the present invention. FIG. 17B and FIG. 17D are cross-sectional views illustrating the method for manufacturing a semiconductor device of one embodiment of the present invention.

FIG. 35A to FIG. 35H are circuit diagrams each illustrating a structure example of a storage device of one embodiment of the present invention.

FIG. 41A to FIG. 41E are schematic views of storage devices of one embodiment of the present invention.

FIG. 45A1, FIG. 45B1, FIG. 45C1, and FIG. 45D1 are diagrams illustrating capacitance.

FIG. 45A2, FIG. 45B2, FIG. 45C2, and FIG. 45D2 are diagrams showing top gate voltage-capacitance characteristics of a fabricated transistor.

FIG. 48 is a diagram illustrating the layout of a TEG.

FIG. 49A to FIG. 49F are diagrams showing variations in threshold voltages of transistors.

FIG. 50A to FIG. 50F are diagrams showing variations in threshold voltages of transistors.

FIG. 51A to FIG. 51F are diagrams showing variations in field-effect mobilities of transistors.

FIG. 52A to FIG. 52F are diagrams showing variations in field-effect mobilities of transistors.

FIG. 56A is a top view of a semiconductor device of this example. FIG. 56B to FIG. 56D are cross-sectional views of the semiconductor device of this example.

FIG. 61A to FIG. 61C are diagrams illustrating a transistor structure used for calculation.

MODE FOR CARRYING OUT THE INVENTION

Figure 2A:
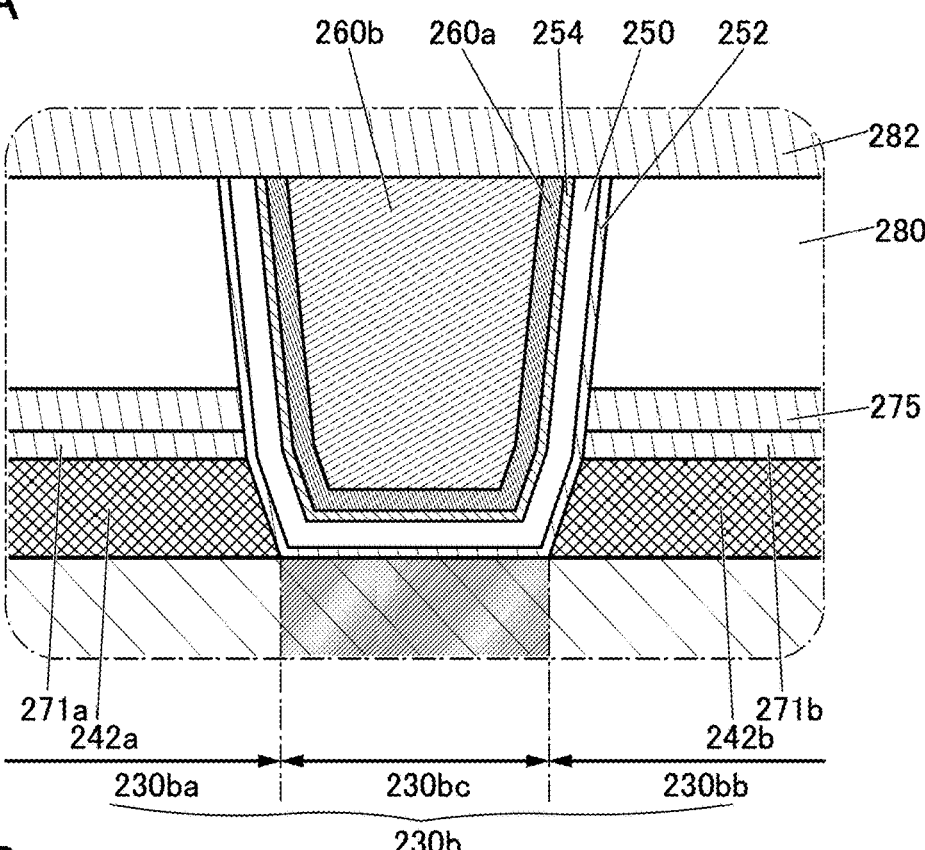
FIG. 2A and FIG. 2B are cross-sectional views of a semiconductor device of one embodiment of the present invention.

Embodiments will be described below with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In addition, in the drawings, the size, the layer thickness, or the region is exaggerated for clarity in some cases. Therefore, the size, the layer thickness, or the region is not necessarily limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be illustrated.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

Moreover, in this specification and the like, terms for describing arrangement, such as "over" and "under", are used for convenience for describing the positional relationship between components with reference to drawings. The positional relation between components is changed as appropriate in accordance with the direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relationship, e.g., a connection relationship shown in drawings or texts, a connection relationship other than one shown in drawings or texts is regarded as being disclosed in the drawings or the texts. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter, also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain are sometimes interchanged with each other when transistors having different polarities are used or when the direction of a current is changed in a circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where a current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, the length of a channel formation region in a direction perpendicular to a channel length direction in a region where a semiconductor (or a portion where a current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on the transistor structure, a channel width in a region where a channel is actually formed (hereinafter also referred to as an effective channel width) is different from a channel width shown in a top view of a transistor (hereinafter also referred to as an apparent channel width) in some cases. For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, oxygen vacancies (also referred to as $V_O$) are formed in an oxide semiconductor in some cases by entry of impurities, for example.

Note that in this specification and the like, silicon oxynitride is a material that contains more oxygen than nitrogen in its composition. Moreover, silicon nitride oxide is a material that contains more nitrogen than oxygen in its composition. Similarly, aluminum oxynitride refers to a material that contains more oxygen than nitrogen in its composition. Moreover, aluminum nitride oxide refers to a material that contains more nitrogen than oxygen in its composition. Similarly, hafnium oxynitride refers to a material that contains more oxygen than nitrogen in its composition. Moreover, a hafnium nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to $-10°$ and less than or equal to $10°$. Accordingly, the case where the angle is greater than or equal to $-5°$ and less than or equal to $5°$ is also included. Furthermore, "substantially parallel" indicates a state where two straight lines are placed at an angle greater than or equal to $-30°$ and less than or equal to $30°$. Moreover, "perpendicular" indicates a state where two straight lines are placed at an angle greater than or equal to $80°$ and less than or equal to $100°$. Accordingly, the case where the angle is greater than or equal to $85°$ and less than or equal to $95°$ is also included. Furthermore, "substantially perpendicular" indicates a state where two straight lines are placed at an angle greater than or equal to $60°$ and less than or equal to $120°$.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be referred to as a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

In this specification and the like, "voltage" and "potential" can be replaced with each other as appropriate. "Voltage" refers to a potential difference from a reference potential, and when the reference potential is a ground potential, for example, "voltage" can be replaced with "potential". Note that the ground potential does not necessarily mean 0 V. Moreover, potentials are relative values, and a potential supplied to a wiring, a potential applied to a circuit and the like, and a potential output from a circuit and the like, for example, change with a change of the reference potential.

In this specification and the like, when a plurality of components are denoted with the same reference numerals, and in particular need to be distinguished from each other, an identification sign such as "_1", "[n]", or "[m,n]" is sometimes added to the reference numerals.

Embodiment 1

In this embodiment, an example of a semiconductor device including a transistor 200 of one embodiment of the present invention and a manufacturing method thereof are described with reference to FIG. 1A to FIG. 22C.

Structure Example of Semiconductor Device

A structure of a semiconductor device including the transistor 200 is described with reference to FIG. 1. FIG. 1A to FIG. 1D are a top view and cross-sectional views of the semiconductor device including the transistor 200. FIG. 1A is a top view of the semiconductor device. FIG. 1B to FIG. 1D are cross-sectional views of the semiconductor device. Here, FIG. 1B is a cross-sectional view of a portion indicated by dashed-dotted line A1-A2 in FIG. 1A, and is a cross-sectional view of the transistor 200 in the channel length direction. FIG. 1C is a cross-sectional view of a portion indicated by dashed-dotted line A3-A4 in FIG. 1A, and is a cross-sectional view of the transistor 200 in the channel width direction. FIG. 1D is a cross-sectional view of a portion indicated by dashed-dotted line A5-A6 in FIG. 1A. Note that for clarity of the drawing, some components are omitted in the top view of FIG. 1A.

The semiconductor device of one embodiment of the present invention includes an insulator 212 over a substrate (not illustrated), an insulator 214 over the insulator 212, the transistor 200 over the insulator 214, an insulator 280 over the transistor 200, an insulator 282 over the insulator 280, an insulator 283 over the insulator 282, an insulator 274 over the insulator 283, and an insulator 285 over the insulator 283 and the insulator 274. The insulator 212, the insulator 214, an insulator 216, the insulator 280, the insulator 282, the insulator 283, the insulator 285, and the insulator 274 each function as an interlayer film. In addition, the semiconductor device also includes a conductor 240 (a conductor 240a and a conductor 240b) that is electrically connected to the transistor 200 and functions as a plug. Note that an insulator 241 (an insulator 241a and an insulator 241b) is provided in contact with the side surface of the conductor 240 functioning as a plug. A conductor 246 (a conductor 246a and a conductor 246b) electrically connected to the conductor 240 and functioning as a wiring is provided over the insulator 285 and the conductor 240. The insulator 283 is in contact with part of the top surface of the insulator 214, the side surface of the insulator 216, the side surface of an insulator 222, the side surface of an insulator 275, the side surface of the insulator 280, and the side surface and the top surface of the insulator 282.

The insulator 241a is provided in contact with an inner wall of an opening formed in the insulator 280, the insulator 282, the insulator 283, and the insulator 285, and the conductor 240a is provided in contact with the side surface of the insulator 241a. The insulator 241b is provided in contact with an inner wall of an opening formed in the insulator 280, the insulator 282, the insulator 283, and the insulator 285, and the conductor 240b is provided in contact with the side surface of the insulator 241b. The insulator 241 has a structure in which a first insulator is provided in contact with the inner wall of the opening and a second insulator is provided on the inner side of the first insulator. The conductor 240 has a structure in which a first conductor is provided in contact with the side surface of the insulator 241 and a second conductor is provided on the inner side of the first conductor. The top surface of the conductor 240 can be substantially level with the top surface of the insulator 285 in a region overlapping with the conductor 246.

Although the first insulator of the insulator 241 and the second insulator of the insulator 241 are stacked in the transistor 200, the present invention is not limited thereto. For example, the insulator 241 may have a single-layer structure or a stacked-layer structure of three or more layers. Although the first conductor of the conductor 240 and the second conductor of the conductor 240 are stacked in the transistor 200, the present invention is not limited thereto. For example, the conductor 240 may have a single-layer structure or a stacked-layer structure of three or more layers.

In the case where a component has a stacked-layer structure, layers may be distinguished by ordinal numbers corresponding to the formation order.

[Transistor 200]

As illustrated in FIG. 1A to FIG. 1D, the transistor 200 includes the insulator 216 over the insulator 214, a conductor 205 (a conductor 205a and a conductor 205b) placed to be embedded in the insulator 216, the insulator 222 over the insulator 216 and the conductor 205, an insulator 224 over the insulator 222, an oxide 230a over the insulator 224, an oxide 230b over the oxide 230a, a conductor 242a over the oxide 230b, an insulator 271a over the conductor 242a, a conductor 242b over the oxide 230b, an insulator 271b over the conductor 242b, an insulator 252 over the oxide 230b, an insulator 250 over the insulator 252, an insulator 254 over the insulator 250, a conductor 260 (a conductor 260a and a conductor 260b) positioned over the insulator 254 and overlapping with part of the oxide 230b, and the insulator 275 placed over the insulator 222, the insulator 224, the oxide 230a, the oxide 230b, the conductor 242a, the conductor 242b, the insulator 271a, and the insulator 271b. Here, as illustrated in FIG. 1B and FIG. 1C, the insulator 252 is in contact with the top surface of the insulator 222, the side surface of the insulator 224, the side surface of the oxide 230a, the side surface and the top surface of the oxide 230b, the side surface of the conductor 242, the side surface of the insulator 271, the side surface of the insulator 275, the side surface of the insulator 280, and the bottom surface of the insulator 250. The top surface of the conductor 260 is placed to be substantially level with the uppermost portion of the insulator 254, the uppermost portion of the insulator 250, the uppermost portion of the insulator 252, and the top surface of the insulator 280. The insulator 282 is in contact with at least parts of the top surfaces of the conductor 260, the insulator 252, the insulator 250, the insulator 254, and the insulator 280.

Hereinafter, the oxide 230a and the oxide 230b are collectively referred to as the oxide 230 in some cases. The conductor 242a and the conductor 242b are collectively referred to as the conductor 242 in some cases. The insulator 271a and the insulator 271b are collectively referred to as the insulator 271 in some cases.

An opening reaching the oxide 230b is provided in the insulator 280 and the insulator 275. The insulator 252, the insulator 250, the insulator 254, and the conductor 260 are placed in the opening. The conductor 260, the insulator 252, the insulator 250, and the insulator 254 are provided between the insulator 271a and the conductor 242a, and the insulator 271b and the conductor 242b in the channel length direction of the transistor 200. The insulator 254 includes a region in contact with the side surface of the conductor 260 and a region in contact with the bottom surface of the conductor 260.

The oxide 230 preferably includes the oxide 230a placed over the insulator 224 and the oxide 230b placed over the oxide 230a. Including the oxide 230a under the oxide 230b makes it possible to inhibit diffusion of impurities into the oxide 230b from components formed below the oxide 230a.

Although a structure in which two layers, the oxide 230a and the oxide 230b, are stacked as the oxide 230 in the transistor 200 is described, the present invention is not limited thereto. For example, the oxide 230 may be provided as a single layer of the oxide 230b or to have a stacked-layer structure of three or more layers, or the oxide 230a and the oxide 230b may each have a stacked-layer structure.

The conductor 260 functions as a first gate (also referred to as a top gate) electrode, and the conductor 205 functions as a second gate (also referred to as a back gate) electrode. The insulator 252, the insulator 250, and the insulator 254 function as a first gate insulator, and the insulator 222 and the insulator 224 function as a second gate insulator. Note that the gate insulator is also referred to as a gate insulating layer or a gate insulating film in some cases. The conductor 242a functions as one of a source electrode and a drain electrode, and the conductor 242b functions as the other of the source electrode and the drain electrode. At least part of a region of the oxide 230 overlapping with the conductor 260 functions as a channel formation region.

FIG. 2A is an enlarged view of the vicinity of the channel formation region in FIG. 1B. Supply of oxygen to the oxide 230b forms the channel formation region in a region between the conductor 242a and the conductor 242b. As illustrated in FIG. 2A, the oxide 230b includes a region 230bc functioning as the channel formation region of the transistor 200 and a region 230ba and a region 230bb that are provided to sandwich the region 230bc and function as a source region and a drain region. At least part of the region 230bc overlaps with the conductor 260. In other words, the region 230bc is provided between the conductor 242a and the conductor 242b. The region 230ba is provided to overlap with the conductor 242a, and the region 230bb is provided to overlap with the conductor 242b.

The region 230bc functioning as the channel formation region has a smaller amount of oxygen vacancies or a lower impurity concentration than those of the region 230ba and the region 230bb, and thus is a high-resistance region with a low carrier concentration. Thus, the region 230bc can be regarded as being i-type (intrinsic) or substantially i-type.

The region 230ba and the region 230bb functioning as the source region and the drain region include a large amount of oxygen vacancies or have a high concentration of an impurity such as hydrogen, nitrogen, or a metal element, and thus are each a low-resistance region with an increased carrier concentration. In other words, the region 230ba and the region 230bb are each an n-type region having a higher carrier concentration and a lower resistance than the region 230bc.

The carrier concentration in the region 230bc functioning as the channel formation region is preferably lower than or equal to $1 \times 10^{18}$ cm$^{-3}$, further preferably lower than $1 \times 10^{17}$ cm$^{-3}$, still further preferably lower than $1 \times 10^{16}$ cm$^{-3}$, yet further preferably lower than $1 \times 10^{13}$ cm$^{-3}$, yet still further preferably lower than $1 \times 10^{12}$ cm$^{-3}$. Note that the lower limit of the carrier concentration in the region 230bc functioning as the channel formation region is not particularly limited and can be, for example, $1 \times 10^{-9}$ cm$^{-3}$ Between the region 230bc and the region 230ba or the region 230bb, a region having a carrier concentration that is lower than or substantially equal to the carrier concentrations in the region 230ba and the region 230bb and higher than or substantially equal to the carrier concentration in the region 230bc may be formed. That is, the region functions as a junction region between the region 230bc and the region 230ba or the region 230bb. The hydrogen concentration in the junction region is lower than or substantially equal to the hydrogen concentrations in the region 230ba and the region 230bb and higher than or substantially equal to the hydrogen concentration in the region 230bc in some cases. The amount of oxygen vacancies in the junction region is smaller than or substantially equal to the amounts of oxygen vacancies in the region 230ba and the region 230bb and larger than or substantially equal to the amount of oxygen vacancies in the region 230bc in some cases.

Although FIG. 2A illustrates an example where the region 230ba, the region 230bb, and the region 230bc are formed in the oxide 230b, the present invention is not limited thereto. For example, the above regions may be formed not only in the oxide 230b but also in the oxide 230a.

In the oxide 230, the boundaries between the regions are difficult to detect clearly in some cases. The concentration of a metal element and an impurity element such as hydrogen or nitrogen, which is detected in each region, may be gradually changed not only between the regions but also in each region. That is, the region closer to the channel formation region preferably has a lower concentration of a metal element and an impurity element such as hydrogen or nitrogen.

In the transistor 200, a metal oxide functioning as a semiconductor (such a metal oxide is hereinafter also referred to as an oxide semiconductor) is preferably used for the oxide 230 (the oxide 230a and the oxide 230b) including the channel formation region.

The metal oxide functioning as a semiconductor preferably has a band gap of 2 eV or higher, further preferably 2.5 eV or higher. With use of a metal oxide having a wide bandgap, the off-state current of the OS transistor can be reduced.

As the oxide 230, it is preferable to use, for example, a metal oxide such as an In-M-Zn oxide containing indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like). Alternatively, an In—Ga oxide, an In—Zn oxide, or an indium oxide may be used as the oxide 230.

The oxide 230 preferably has a stacked-layer structure of a plurality of oxide layers with different chemical compositions. For example, the atomic ratio of the element M to a metal element that is a main component of the metal oxide used as the oxide 230a is preferably greater than the atomic ratio of the element M to a metal element that is a main component of the metal oxide used as the oxide 230b. Moreover, the atomic ratio of the element M to In in the metal oxide used as the oxide 230a is preferably greater than the atomic ratio of the element M to In in the metal oxide used as the oxide 230b. With this structure, impurities and oxygen can be inhibited from diffusing into the oxide 230b from the components formed below the oxide 230a.

Furthermore, the atomic ratio of In to the element M in the metal oxide used as the oxide 230b is preferably greater than the atomic ratio of In to the element M in the metal oxide used as the oxide 230a. With this structure, the transistor 200 can have high on-state current and high frequency characteristics.

When the oxide 230a and the oxide 230b contain a common element as the main component besides oxygen, the density of defect states at an interface between the oxide 230a and the oxide 230b can be made low. Since the density of defect states at the interface between the oxide 230a and the oxide 230b can be made low, the influence of interface scattering on carrier conduction is small, and a high on-state current can be obtained.

Specifically, as the oxide 230a, a metal oxide with a composition of In:M:Zn=1:3:4 [atomic ratio] or in the neighborhood thereof, or a composition of In:M:Zn=1:1:0.5 [atomic ratio] or in the neighborhood thereof is used. As the oxide 230b, a metal oxide with a composition of In:M:Zn=1:1:1 [atomic ratio] or in the neighborhood thereof, a composition of In:M:Zn=1:1:2 [atomic ratio] or in the neighborhood thereof, or a composition of In:M:Zn=4:2:3 [atomic ratio] or in the neighborhood thereof can be used. Note that a composition in the neighborhood includes the range of ±30% of an intended atomic ratio. Gallium is preferably used as the element M. In the case where a single layer of the oxide 230b is provided as the oxide 230, a metal oxide that can be used as the oxide 230a may be used as the oxide 230b.

When the metal oxide is deposited by a sputtering method, the above atomic ratio is not limited to the atomic ratio of the deposited metal oxide and may be the atomic ratio of a sputtering target used for depositing the metal oxide.

The oxide 230b preferably has crystallinity. It is particularly preferable to use a CAAC-OS (c-axis aligned crystalline oxide semiconductor) as the oxide 230b.

The CAAC-OS is a metal oxide having a dense structure with high crystallinity and a small amount of impurities and defects (for example, oxygen vacancies (e.g., Vo)). In particular, after the formation of a metal oxide, heat treatment is performed at a temperature at which the metal oxide does not become a polycrystal (e.g., higher than or equal to 400° C. and lower than or equal to 600° C.), whereby a CAAC-OS having a dense structure with higher crystallinity can be obtained. When the density of the CAAC-OS is increased in such a manner, diffusion of impurities or oxygen in the CAAC-OS can be further reduced.

A clear crystal grain boundary is difficult to observe in the CAAC-OS; thus, it can be said that a reduction in electron mobility due to the crystal grain boundary is less likely to occur. Thus, a metal oxide including a CAAC-OS is physically stable. Therefore, the metal oxide including a CAAC-OS is resistant to heat and has high reliability.

When an oxide having crystallinity, such as CAAC-OS, is used as the oxide 230b, oxygen extraction from the oxide 230b by the source electrode or the drain electrode can be inhibited. This can reduce oxygen extraction from the oxide 230b even when heat treatment is performed; thus, the transistor 200 is stable with respect to high temperatures in a manufacturing process (what is called thermal budget).

If impurities and oxygen vacancies exist in a region of an oxide semiconductor where a channel is formed, a transistor using the oxide semiconductor might have variable electrical characteristics and poor reliability. In some cases, hydrogen in the vicinity of an oxygen vacancy forms a defect that is the oxygen vacancy into which hydrogen enters (hereinafter sometimes referred to as VoH), which generates an electron serving as a carrier. Therefore, when the region of the oxide semiconductor where a channel is formed includes oxygen vacancies, the transistor tends to have normally-on characteristics (even when no voltage is applied to the gate electrode, the channel exists and current flows through the transistor). Thus, impurities, oxygen vacancies, and VoH are preferably reduced as much as possible in the region of the oxide semiconductor where a channel is formed. In other words, it is preferable that the region of the oxide semiconductor where a channel is formed have a reduced carrier concentration and be of an i-type (intrinsic) or substantially i-type.

As a countermeasure to the above, an insulator containing oxygen that is released by heating (hereinafter, sometimes referred to as excess oxygen) is provided in the vicinity of the oxide semiconductor and heat treatment is performed, so that oxygen can be supplied from the insulator to the oxide semiconductor to reduce oxygen vacancies and VoH. However, supply of an excess amount of oxygen to the source region or the drain region might cause a decrease in the on-state current or field-effect mobility of the transistor 200. Furthermore, a variation of the amount of oxygen supplied to the source region or the drain region in the substrate plane leads to a variation in characteristics of the semiconductor device including the transistor.

Therefore, the region 230bc functioning as the channel formation region in the oxide semiconductor is preferably an i-type or substantially i-type region with reduced carrier concentration, whereas the region 230ba and the region 230bb functioning as the source region and the drain region are preferably n-type regions with high carrier concentrations. That is, it is preferable that oxygen vacancies and VoH in the region 230bc of the oxide semiconductor be reduced and the region 230ba and the region 230bb not be supplied with an excess amount of oxygen.

Thus, in this embodiment, microwave treatment is performed in an oxygen-containing atmosphere in a state where the conductor 242a and the conductor 242b are provided over the oxide 230b so that oxygen vacancies and VoH in the region 230bc can be reduced. Here, the microwave treatment refers to, for example, treatment using an apparatus including a power source that generates high-density plasma with the use of a microwave.

The microwave treatment in an oxygen-containing atmosphere converts an oxygen gas into plasma using a high-frequency wave such as a microwave or RF (Radio Frequency) and activates the oxygen plasma. At this time, the region 230bc can be irradiated with the high-frequency wave such as a microwave or RF. By the effect of the plasma, the microwave, or the like, VoH in the region 230bc can be divided into an oxygen vacancy (Vo) and hydrogen (H); the hydrogen can be removed from the region 230bc and the oxygen vacancy can be repaired with oxygen. As a result, the hydrogen concentration, oxygen vacancies and VoH of the region 230bc can be reduced to lower the carrier concentration.

In the microwave treatment in an oxygen-containing atmosphere, the high-frequency wave such as the microwave or RF, the oxygen plasma, or the like is blocked by the conductor 242a and the conductor 242b and does not affect the region 230ba nor the region 230bb. In addition, the effect of the oxygen plasma can be reduced by the insulator 271 and the insulator 280 that are provided to cover the oxide 230b and the conductor 242. Hence, a reduction in VoH and supply of an excess amount of oxygen do not occur in the region 230ba or the region 230bb in the microwave treatment, preventing a decrease in carrier concentration.

Microwave treatment is preferably performed in an oxygen-containing atmosphere after deposition of an insulating film to be the insulator 252 or after deposition of an insulating film to be the insulator 250. By performing the microwave treatment in an oxygen-containing atmosphere through the insulator 252 or the insulator 250 in such a manner, oxygen can be efficiently supplied into the region 230bc. In addition, the insulator 252 is placed to be in contact with the side surface of the conductor 242 and the surface of the region 230bc, thereby inhibiting oxygen more than necessary from being supplied to the region 230bc and inhibiting the side surface of the conductor 242 from being oxidized. Furthermore, the side surface of the conductor 242 can be inhibited from being oxidized when the insulating film to be the insulator 250 is deposited.

The oxygen supplied into the region 230bc has any of a variety of forms such as an oxygen atom, an oxygen molecule, and an oxygen radical (an O radical, an atom or a molecule having an unpaired electron, or an ion). Note that the oxygen supplied into the region 230bc has any one or more of the above forms, particularly preferably an oxygen radical. Furthermore, the film quality of the insulator 252 and the insulator 250 can be improved, leading to higher reliability of the transistor 200.

In the above manner, oxygen vacancies and VoH can be selectively removed from the region 230bc of the oxide semiconductor, whereby the region 230bc can be an i-type or substantially i-type region. Furthermore, supply of an excess amount of oxygen to the region 230ba and the region 230bb functioning as the source region and the drain region can be inhibited and the state of the n-type regions before the microwave treatment is performed can be maintained. As a result, a change in the electrical characteristics of the transistor 200 can be inhibited, and thus a variation in the electrical characteristics of the transistors 200 in the substrate plane can be inhibited.

With the above structure, a semiconductor device with a small variation in transistor characteristics can be provided. A semiconductor device with favorable reliability can also be provided. A semiconductor device having favorable electrical characteristics can be provided.

As illustrated in FIG. 1C, a curved surface may be provided between the side surface of the oxide 230b and the top surface of the oxide 230b in a cross-sectional view of the transistor 200 in the channel width direction. In other words, an end portion of the side surface and an end portion of the top surface may be curved (hereinafter referred to as rounded).

The radius of curvature of the curved surface is preferably greater than 0 nm and less than the thickness of the oxide 230b in a region overlapping with the conductor 242, or less than half of the length of a region that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. Such a shape can improve the coverage of the oxide 230b with the insulator 252, the insulator 250, the insulator 254, and the conductor 260.

As illustrated in FIG. 1C or the like, the insulator 252 formed using aluminum oxide or the like is provided in contact with the top surface and the side surface of the oxide 230, whereby indium contained in the oxide 230 is unevenly distributed, in some cases, at the interface between the oxide 230 and the insulator 252 and in its vicinity. Accordingly, the vicinity of the surface of the oxide 230 comes to have an atomic ratio close to that of an indium oxide or that of an In—Zn oxide. Such an increase in the atomic ratio of indium in the vicinity of the surface of the oxide 230, especially the vicinity of a surface of the oxide 230b, can increase the field-effect mobility of the transistor 200.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

At least one of the insulator 212, the insulator 214, the insulator 271, the insulator 275, the insulator 282, the insulator 283, and the insulator 285 preferably functions as a barrier insulating film, which inhibits diffusion of impurities such as water and hydrogen from the substrate side or above the transistor 200 into the transistor 200. Thus, for at least one of the insulator 212, the insulator 214, the insulator 271, the insulator 275, the insulator 282, the insulator 283, and the insulator 285, it is preferable to use an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (an insulating material through which the impurities are less likely to pass). Alternatively, it is preferable to use an insulating material having a function of inhibiting diffusion of oxygen (e.g., at least one of oxygen atoms, oxygen molecules, and the like) (an insulating material through which the oxygen is less likely to pass).

Note that in this specification, a barrier insulating film refers to an insulating film having a barrier property. A barrier property in this specification means a function of inhibiting diffusion of a targeted substance (also referred to as having low permeability). In addition, a barrier property in this specification means a function of capturing and fixing (also referred to as gettering) a targeted substance.

An insulator having a function of inhibiting diffusion of oxygen and impurities such as water and hydrogen is preferably used for the insulator 212, the insulator 214, the insulator 271, the insulator 275, the insulator 282, the insulator 283, and the insulator 285; for example, aluminum oxide, magnesium oxide, hafnium oxide, gallium oxide, indium gallium zinc oxide, silicon nitride, or silicon nitride oxide can be used. For example, silicon nitride, which has a higher hydrogen barrier property, is preferably used for the insulator 212, the insulator 275, and the insulator 283. For example, aluminum oxide or magnesium oxide, which has a function of capturing or fixing hydrogen well, is preferably used for the insulator 214, the insulator 271, the insulator 282, and the insulator 285. In this case, impurities such as water and hydrogen can be inhibited from diffusing to the transistor 200 side from the substrate side through the insulator 212 and the insulator 214. Impurities such as water and hydrogen can be inhibited from diffusing to the transistor 200 side from an interlayer insulating film and the like which are provided outside the insulator 285. Alternatively, oxygen contained in the insulator 224 and the like can be inhibited from diffusing to the substrate side through the insulator 212 and the insulator 214. Alternatively, oxygen contained in the insulator 280 and the like can be inhibited from diffusing to above the transistor 200 through the insulator 282 and the like. In this manner, it is preferable that the transistor 200 be surrounded by the insulator 212, the insulator 214, the insulator 271, the insulator 275, the insulator 282, the insulator 283, and the insulator 285, which have a function of inhibiting diffusion of oxygen and impurities such as water and hydrogen.

Here, an oxide having an amorphous structure is preferably used for the insulator 212, the insulator 214, the insulator 271, the insulator 275, the insulator 282, the insulator 283, and the insulator 285. For example, a metal oxide such as $AlO_x$ (x is a given number greater than 0) or $MgO_y$ (y is a given number greater than 0) is preferably used. In such a metal oxide having an amorphous structure, an oxygen atom has a dangling bond and sometimes has a property of capturing or fixing hydrogen with the dangling bond. When such a metal oxide having an amorphous structure is used as the component of the transistor 200 or provided around the transistor 200, hydrogen contained in the transistor 200 or hydrogen present around the transistor 200 can be captured or fixed. In particular, hydrogen contained in the channel formation region of the transistor 200 is preferably captured or fixed. The metal oxide having an amorphous structure is used as the component of the transistor 200 or provided around the transistor 200, whereby the transistor 200 and a semiconductor device which have favorable characteristics and high reliability can be manufactured.

Although each of the insulator 212, the insulator 214, the insulator 271, the insulator 275, the insulator 282, the insulator 283, and the insulator 285 preferably has an amorphous structure, a region having a polycrystalline structure may be partly formed. Alternatively, each of the insulator 212, the insulator 214, the insulator 271, the insulator 275, the insulator 282, the insulator 283, and the insulator 285 may have a multilayer structure in which a layer having an amorphous structure and a layer having a polycrystalline structure are stacked. For example, a stacked-layer structure in which a layer having a polycrystalline structure is formed over a layer having an amorphous structure may be employed.

The insulator 212, the insulator 214, the insulator 271, the insulator 275, the insulator 282, the insulator 283, and the insulator 285 can be deposited by a sputtering method, for example. Since a sputtering method does not need to use a molecule containing hydrogen as a deposition gas, the hydrogen concentrations in the insulator 212, the insulator 214, the insulator 271, the insulator 275, the insulator 282, the insulator 283, and the insulator 285 can be reduced. Note that the deposition method is not limited to a sputtering method, and a chemical vapor deposition (CVD) method, a molecular beam epitaxy (MBE) method, a pulsed laser deposition (PLD) method, an atomic layer deposition (ALD) method, or the like may be used as appropriate.

The resistivities of the insulator 212, the insulator 275, and the insulator 283 are preferably low in some cases. For example, by setting the resistivities of the insulator 212, the insulator 275, and the insulator 283 to approximately $1\times10^{13}$ $\Omega$cm, the insulator 212, the insulator 275, and the insulator 283 can sometimes reduce charge up of the conductor 205, the conductor 242, the conductor 260, or the conductor 246 in treatment using plasma or the like in the manufacturing process of a semiconductor device. The resistivities of the insulator 212, the insulator 275, and the insulator 283 are preferably higher than or equal to $1\times10^{10}$ $\Omega$cm and lower than or equal to $1\times10^{15}$ $\Omega$cm.

The insulator 216, the insulator 274, the insulator 280, and the insulator 285 each preferably have a lower permittivity than the insulator 214. When a material with a low permittivity is used for an interlayer film, parasitic capacitance generated between wirings can be reduced. For the insulator 216, the insulator 274, the insulator 280, and the insulator 285, silicon oxide, silicon oxynitride, silicon oxide to which fluorine is added, silicon oxide to which carbon is added, silicon oxide to which carbon and nitrogen are added, porous silicon oxide, or the like is used as appropriate, for example.

The conductor 205 is placed to overlap with the oxide 230 and the conductor 260. Here, the conductor 205 is preferably provided to be embedded in an opening formed in the insulator 216. Part of the conductor 205 is embedded in the insulator 214 in some cases.

The conductor 205 includes the conductor 205a and the conductor 205b. The conductor 205a is provided in contact with the bottom surface and the sidewall of the opening. The conductor 205b is provided to be embedded in a depressed portion formed in the conductor 205a. Here, the top surface of the conductor 205b is substantially level with the top surfaces of the conductor 205a and the insulator 216.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When the conductor 205a is formed using a conductive material having a function of inhibiting diffusion of hydrogen, impurities such as hydrogen contained in the conductor 205b can be prevented from diffusing into the oxide 230 through the insulator 224 and the like. When the conductor 205a is formed using a conductive material having a function of inhibiting diffusion of oxygen, the conductivity of the conductor 205b can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205a may be a single layer or a stacked layer of the above conductive materials. For example, titanium nitride is used for the conductor 205a.

Moreover, the conductor 205b is preferably formed using a conductive material containing tungsten, copper, or aluminum as its main component. For example, tungsten is used for the conductor 205b.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, Vth of the transistor 200 can be higher in the case where a negative potential is applied to the conductor 205, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The electric resistivity of the conductor 205 is designed in consideration of the potential applied to the conductor 205, and the thickness of the conductor 205 is determined in accordance with the electric resistivity. The thickness of the insulator 216 is substantially equal to that of the conductor 205. The conductor 205 and the insulator 216 are preferably as thin as possible in the allowable range of the design of the conductor 205. When the thickness of the insulator 216 is reduced, the absolute amount of impurities such as hydrogen contained in the insulator 216 can be reduced, thereby reducing the amount of the impurities to be diffused into the oxide 230.

As illustrated in FIG. 1A, the conductor 205 is preferably provided to be larger than a region of the oxide 230 that does not overlap with the conductor 242a or the conductor 242b. As illustrated in FIG. 1C, it is particularly preferable that the conductor 205 extend to a region outside end portions of the oxide 230a and the oxide 230b in the channel width direction. That is, the conductor 205 and the conductor 260 preferably overlap with each other with the insulators therebetween on the outer side of the side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, a transistor having the S-channel structure refers to a transistor having a structure in which a channel formation region is electrically surrounded by the electric fields of a pair of gate electrodes. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

When the transistor 200 becomes normally-off and has the above-described S-channel structure, the channel formation region can be electrically surrounded. Accordingly, the transistor 200 can be regarded as having a GAA (Gate All Around) structure or an LGAA (Lateral Gate All Around) structure. When the transistor 200 has the S-channel structure, the GAA structure, or the LGAA structure, the channel formation region that is formed at the interface between the oxide 230 and the gate insulator or in the vicinity of the interface can be formed in the entire bulk of the oxide 230. Accordingly, the density of current flowing in the transistor can be improved, and it can be expected to improve the on-state current of the transistor or increase the field-effect mobility of the transistor.

Furthermore, as illustrated in FIG. 1C, the conductor 205 is extended to function as a wiring as well. However, without limitation to this structure, a structure in which a conductor functioning as a wiring is provided below the conductor 205 may be employed. In addition, the conductor 205 is not necessarily provided in each transistor. For example, the conductor 205 may be shared by a plurality of transistors.

Although the transistor 200 having a structure in which the conductor 205 is a stack of the conductor 205a and the conductor 205b is illustrated, the present invention is not limited thereto. For example, the conductor 205 may be provided to have a single-layer structure or a stacked-layer structure of three or more layers.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of inhibiting diffusion of one or both of hydrogen and oxygen more than the insulator 224.

As the insulator 222, an insulator containing an oxide of one or both of aluminum and hafnium, which is an insulating material, is preferably used. For the insulator, aluminum oxide, hafnium oxide, an oxide containing aluminum and hafnium (hafnium aluminate), or the like is preferably used. Alternatively, an oxide containing hafnium and zirconium, e.g., a hafnium-zirconium oxide is preferably used. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen into the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, the insulator may be subjected to nitriding treatment. A stack of silicon oxide, silicon oxynitride, or silicon nitride over these insulators may be used for the insulator 222.

For example, a single layer or stacked layers of an insulator(s) containing what is called a high-k material such as aluminum oxide, hafnium oxide, tantalum oxide, zirconium oxide, or hafnium-zirconium oxide may be used for the insulator 222. As miniaturization and high integration of transistors progress, a problem such as a leakage current may arise because of a thinner gate insulator. When a high-k material is used for an insulator functioning as the gate insulator, a gate potential at the time when the transistor operates can be reduced while the physical thickness is maintained. Furthermore, a substance with a high permittivity such as lead zirconate titanate (PZT), strontium titanate ($SrTiO_3$), or $(Ba,Sr)TiO_3$ (BST) may be used for the insulator 222.

Silicon oxide or silicon oxynitride, for example, can be used as appropriate for the insulator 224 that is in contact with the oxide 230.

In a manufacturing process of the transistor 200, heat treatment is preferably performed with a surface of the oxide 230 exposed. For example, the heat treatment is performed at higher than or equal to 100° ° C. and lower than or equal to 600° C., preferably higher than or equal to 350° C. and lower than or equal to 550° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies. The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment in a nitrogen gas or inert gas atmosphere. Alternatively, the heat treatment may be performed in a nitrogen gas or inert gas atmosphere successively after heat treatment is performed in an atmosphere containing an oxidizing gas at 10 ppm or more, 1% or more, or 10% or more.

Note that by oxygen adding treatment performed on the oxide 230, oxygen vacancies in the oxide 230 can be repaired with supplied oxygen. Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of VoH.

Note that the insulator 222 and the insulator 224 may each have a stacked-layer structure of two or more layers. In that case, without limitation to a stacked-layer structure formed of the same material, a stacked-layer structure formed of different materials may be employed. The insulator 224 may be formed into an island shape so as to overlap with the oxide 230a. In this case, the insulator 275 is in contact with the side surfaces of the insulator 224 and the top surface of the insulator 222. Note that in this specification and the like, an island shape refers to a state where two or more layers formed using the same material in the same step are physically separated from each other.

The conductor 242a and the conductor 242b are provided in contact with the top surface of the oxide 230b. Each of the conductor 242a and the conductor 242b functions as a source electrode or a drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are each a conductive material that is not easily oxidized or a material that maintains the conductivity even after absorbing oxygen.

Note that hydrogen contained in the oxide 230b or the like diffuses into the conductor 242a or the conductor 242b in some cases. In particular, when a nitride containing tantalum is used for the conductor 242a and the conductor 242b, hydrogen contained in the oxide 230b or the like is likely to diffuse into the conductor 242a or the conductor 242b, and the diffused hydrogen is bonded to nitrogen contained in the conductor 242a or the conductor 242b in some cases. That is, hydrogen contained in the oxide 230b or the like is absorbed by the conductor 242a or the conductor 242b in some cases.

No curved surface is preferably formed between the side surface of the conductor 242 and the top surface of the conductor 242. When no curved surface is formed in the conductor 242, the conductor 242 can have a large cross-sectional area in the channel width direction as illustrated in FIG. 1D. Accordingly, the conductivity of the conductor 242 is increased, so that the on-state current of the transistor 200 can be increased.

When heat treatment is performed in the state where the conductor 242a (conductor 242b) and the oxide 230b are in contact with each other, the sheet resistance of the oxide 230b in a region overlapping with the conductor 242a (conductor 242b) is decreased in some cases. Furthermore, the carrier concentration is sometimes increased. Thus, the resistance of the oxide 230b in the region overlapping with the conductor 242a (conductor 242b) can be lowered in a self-aligned manner.

The insulator 271a is provided in contact with the top surface of the conductor 242a, and the insulator 271b is provided in contact with the top surface of the conductor 242b. The insulator 271 preferably functions as at least a barrier insulating film against oxygen. Thus, the insulator 271 preferably has a function of inhibiting oxygen diffusion. For example, the insulator 271 preferably has a function of inhibiting diffusion of oxygen more than the insulator 280. As the insulator 271, an insulator such as aluminum oxide or magnesium oxide is used, for example.

The insulator 275 is provided to cover the insulator 224, the oxide 230a, the oxide 230b, the conductor 242, and the insulator 271. The insulator 275 preferably has a function of capturing and fixing hydrogen. In that case, the insulator 275 preferably includes silicon nitride, or a metal oxide having an amorphous structure, for example, an insulator such as aluminum oxide or magnesium oxide. Alternatively, for example, a stacked-layer film of aluminum oxide and silicon nitride over the aluminum oxide may be used as the insulator 275.

When the above insulator 271 and the insulator 275 are provided, the conductor 242 can be surrounded by the insulators having a barrier property against oxygen. That is, oxygen contained in the insulator 224 and the insulator 280 can be prevented from diffusing into the conductor 242. As a result, the conductor 242 can be inhibited from being directly oxidized by oxygen contained in the insulator 224 and the insulator 280, so that an increase in resistivity and a reduction in on-state current can be inhibited.

The insulator 252 functions as part of the gate insulator. As the insulator 252, a barrier insulating film against oxygen is preferably used. As the insulator 252, an insulator that can be used as the insulator 282 described above is preferably used. An insulator containing an oxide of one or both of aluminum and hafnium may be used as the insulator 252. As the insulator, aluminum oxide, hafnium oxide, an oxide containing aluminum and hafnium (hafnium aluminate), an oxide containing hafnium and silicon (hafnium silicate), or the like can be used. In this embodiment, aluminum oxide is used for the insulator 252. In this case, the insulator 252 is an insulator containing at least oxygen and aluminum.

As illustrated in FIG. 1C, the insulator 252 is provided in contact with the top surface and the side surface of the oxide 230b, the side surface of the oxide 230a, the side surface of the insulator 224, and the top surface of the insulator 222. That is, the regions of the oxide 230a, the oxide 230b, and the insulator 224 that overlap with the conductor 260 are covered with the insulator 252 in the cross section in the channel width direction. With this structure, the insulator 252 having a barrier property against oxygen can prevent release of oxygen from the oxide 230a and the oxide 230b at the time of heat treatment or the like. This can inhibit formation of oxygen vacancies in the oxide 230a and the oxide 230b. Therefore, oxygen vacancies and VoH formed in the region 230bc can be reduced. Thus, the transistor 200 can have favorable electrical characteristics and higher reliability.

Even when an excess amount of oxygen is contained in the insulator 280, the insulator 250 and the like, oxygen can be inhibited from being excessively supplied to the oxide 230a and the oxide 230b. Thus, the region 230ba and the region 230bb are inhibited from being excessively oxidized by oxygen through the region 230bc; a reduction in on-state current or field-effect mobility of the transistor 200 can be inhibited.

As illustrated in FIG. 1B, the insulator 252 is provided in contact with the side surfaces of the conductor 242, the insulator 271, the insulator 275, and the insulator 280. This can inhibit formation of an oxide film on the side surface of the conductor 242 by oxidization of the side surface. Accordingly, a reduction in on-state current or field-effect mobility of the transistor 200 can be inhibited.

Furthermore, the insulator 252 needs to be provided in an opening formed in the insulator 280 and the like, together with the insulator 254, the insulator 250, and the conductor 260. The thickness of the insulator 252 is preferably thin for miniaturization of the transistor 200. The thickness of the insulator 252 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 252 preferably includes a region having the above-described thickness. The thickness of the insulator 252 is preferably smaller than that of the insulator 250. In this case, at least part of the insulator 252 preferably includes a region having a thickness smaller than that of the insulator 250.

To form the insulator 252 having a small thickness like the above-described thickness, an ALD method is preferably used for deposition. Examples of an ALD method include a thermal ALD method, in which a precursor and a reactant react with each other only by a thermal energy, and a PEALD (Plasma Enhanced ALD) method, in which a reactant excited by plasma is used. The use of plasma in a PEALD method is sometimes preferable because deposition at a lower temperature is possible.

An ALD method, which enables an atomic layer to be deposited one by one using self-limiting characteristics by atoms, has advantages such as deposition of an extremely thin film, deposition on a component with a high aspect ratio, deposition of a film with a small number of defects such as pinholes, deposition with excellent coverage, and low-temperature deposition. Therefore, the insulator 252 can be deposited on the side surface of the opening formed in the insulator 280 and the like to have a small thickness like the above-described thickness and to have favorable coverage.

Note that some of precursors usable in an ALD method contain carbon or the like. Thus, in some cases, a film provided by an ALD method contains impurities such as carbon in a larger amount than a film provided by another deposition method. Note that impurities can be quantified by secondary ion mass spectrometry (SIMS), X-ray photoelectron spectroscopy (XPS), or auger electron spectroscopy (AES).

Note that appropriate adjustment of the deposition condition of the insulating film to be the insulator 250, the microwave treatment condition in an oxygen-containing atmosphere, the amount of oxygen added to the insulator 280 by deposition of the insulator 282, and the like can reduce oxygen vacancies and VoH formed in the region 230bc and inhibit excess oxidation of the region 230ba and the region 230bb in some cases. In such a case, the structure without the insulator 252 enables simplification of the manufacturing process and the improvement in productivity of the semiconductor device.

The insulator 250 functions as part of the gate insulator. The insulator 250 is preferably in contact with the top surface of the insulator 252. The insulator 250 can be formed using silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like. In particular, silicon oxide and silicon oxynitride, which have thermal stability, are preferable. The insulator 250 in this case is an insulator containing at least oxygen and silicon.

As in the insulator 224, the concentration of impurities such as water and hydrogen in the insulator 250 is preferably reduced. The thickness of the insulator 250 is preferably greater than or equal to 1 nm and less than or equal to 20 nm, further preferably greater than or equal to 0.5 nm and less than or equal to 15.0 nm. In this case, it is acceptable that at least part of the insulator 250 has a region with a thickness like the above-described thickness.

Although FIG. 1A to FIG. 1D and the like illustrate a single-layer structure of the insulator 250, the present invention is not limited to this structure, and a stacked-layer structure of two or more layers may be employed. For example, as illustrated in FIG. 2B, the insulator 250 may have a stacked-layer structure including two layers of an insulator 250a and an insulator 250b over the insulator 250a.

Figure 2B:
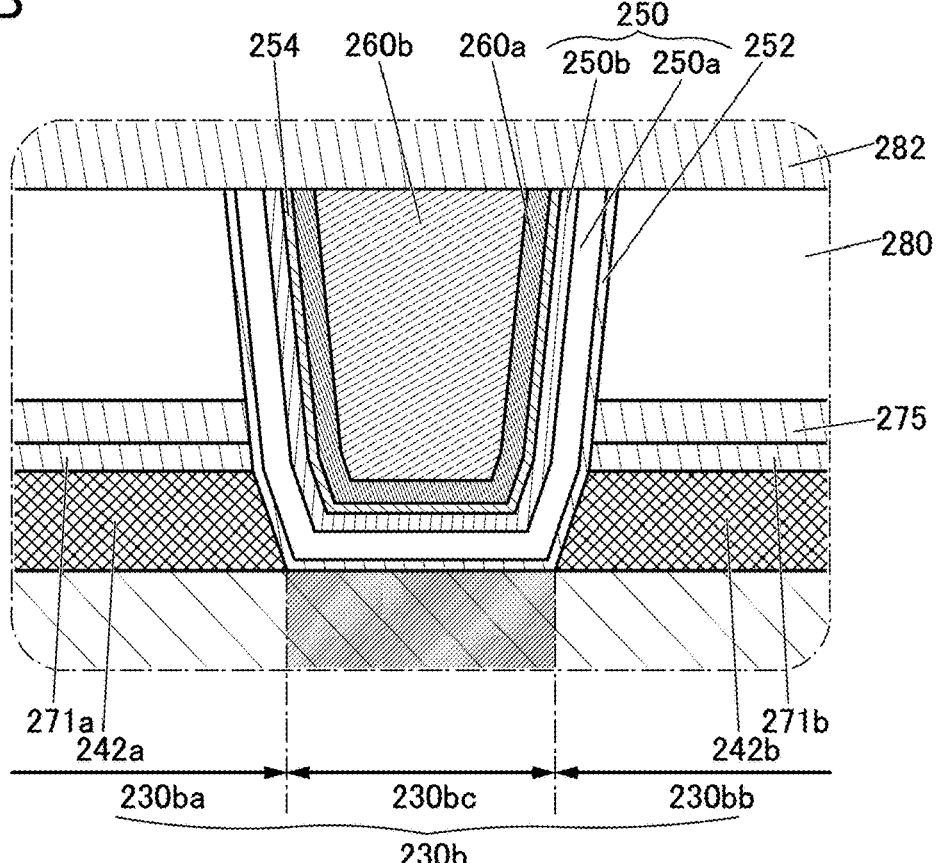
Figure 6A:
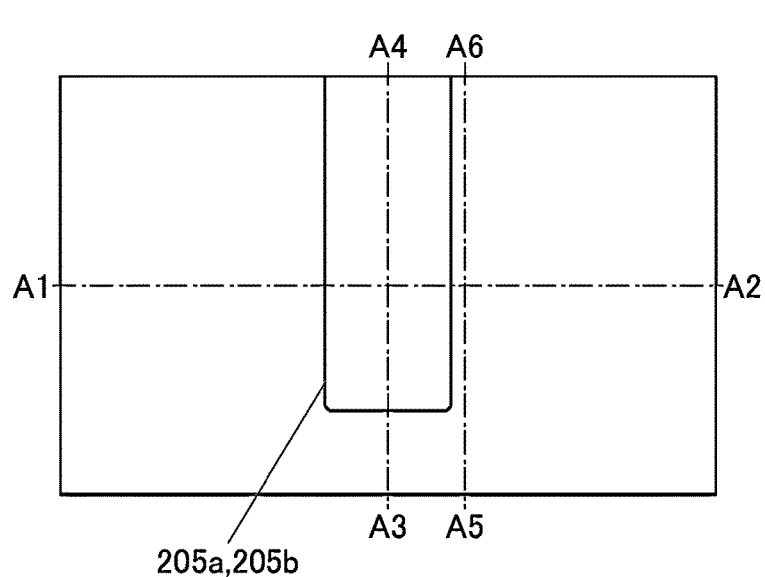
FIG. 6A is a top view illustrating a method for manufacturing a semiconductor device of one embodiment of the present invention.
Figure 6C:
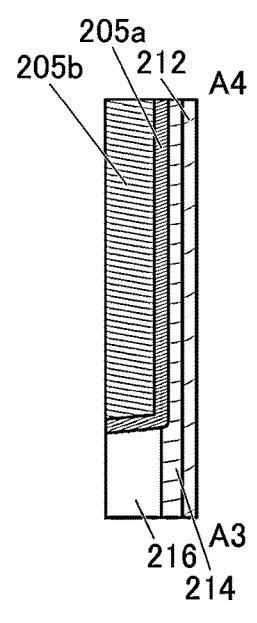
FIG. 6B to FIG. 6D are cross-sectional views illustrating a method for manufacturing the semiconductor device of one embodiment of the present invention.
Figure 6B:
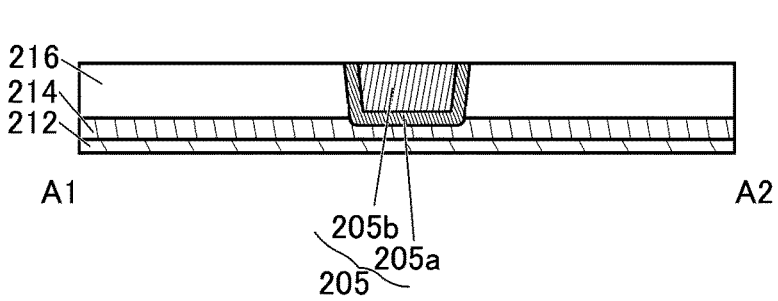
Figure 6D:
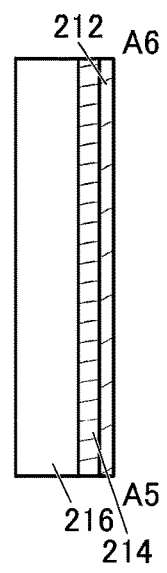
Figure 7A:
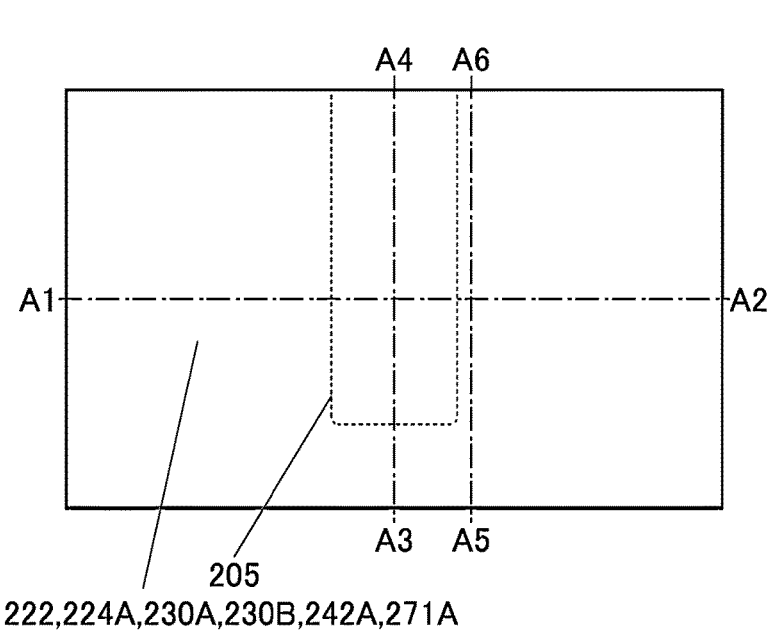
FIG. 7A is a top view illustrating a method for manufacturing a semiconductor device of one embodiment of the present invention.
Figure 7C:
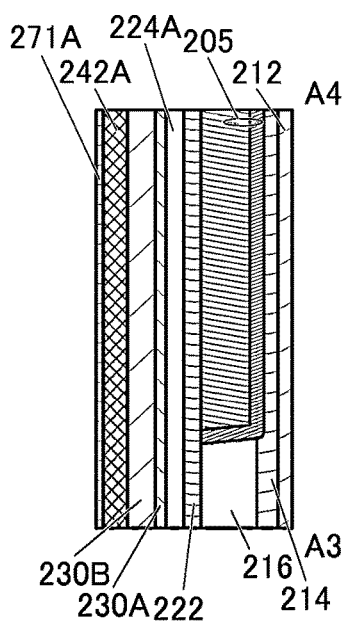
FIG. 7B and FIG. 7D are cross-sectional views illustrating the method for manufacturing a semiconductor device of one embodiment of the present invention.
Figure 7B:
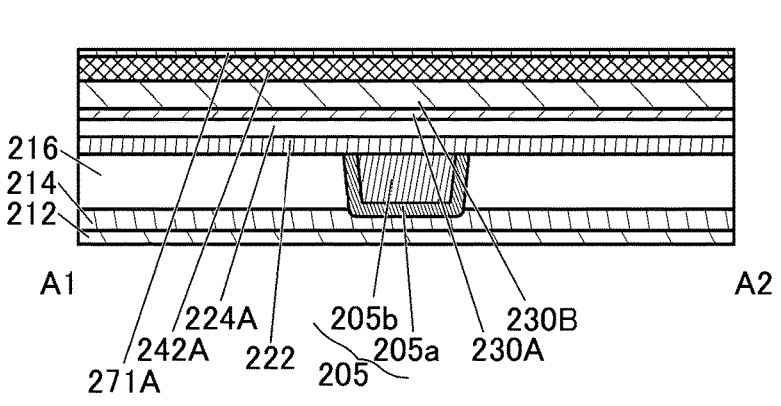
Figure 7D:
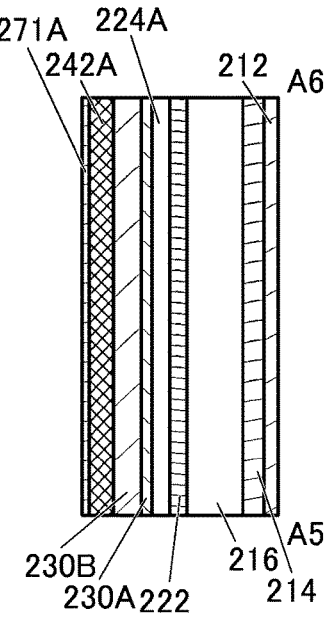
Figure 9A:
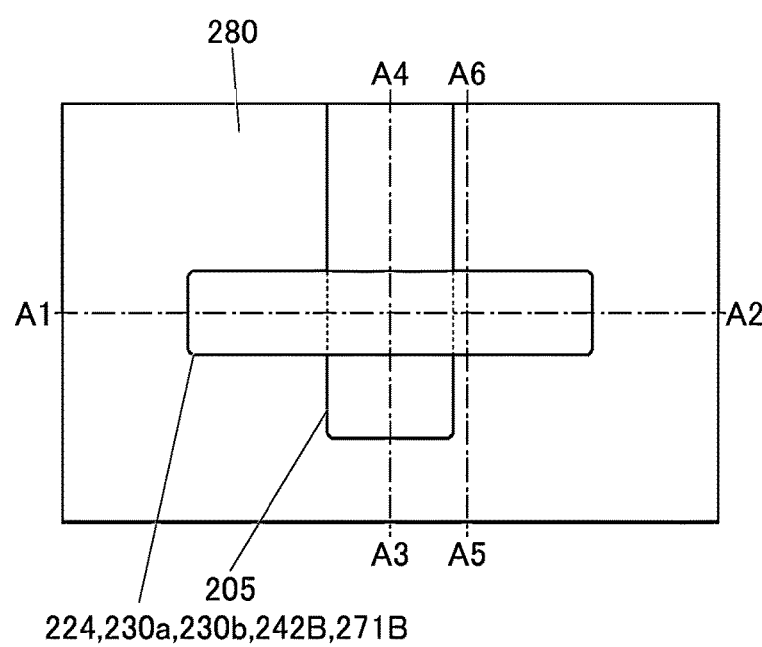
FIG. 9A is a top view illustrating the method for manufacturing a semiconductor device of one embodiment of the present invention.
Figure 9C:
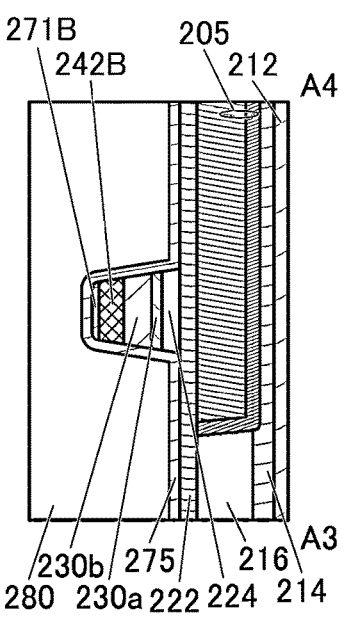
FIG. 9B and FIG. 9D are cross-sectional views illustrating the method for manufacturing a semiconductor device of one embodiment of the present invention.
Figure 9B:
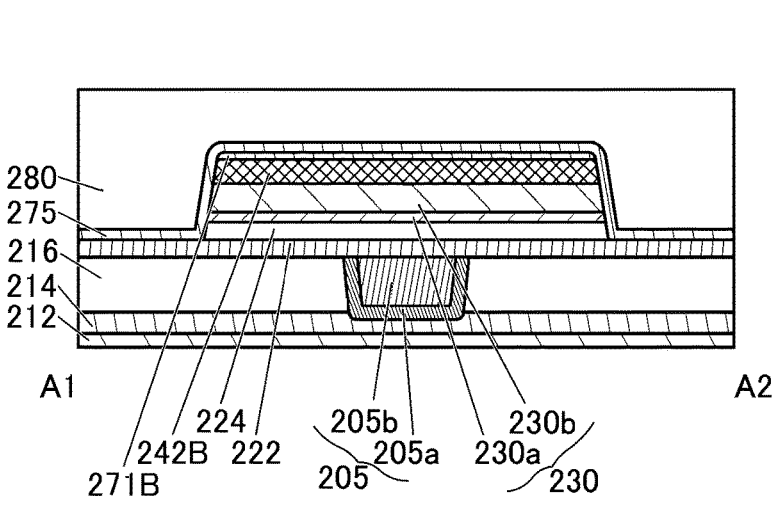
Figure 9D:
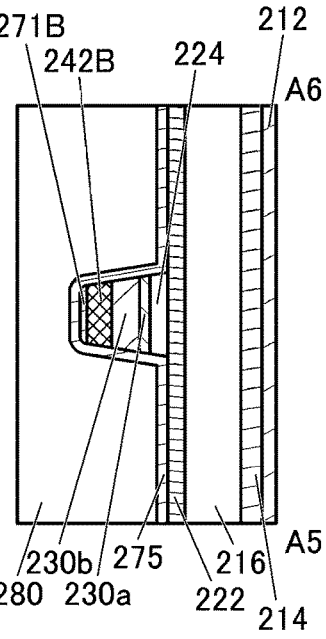

In the case where the insulator 250 has a stacked-layer structure of two layers as illustrated in FIG. 2B, it is preferable that the insulator 250a in a lower layer be formed using an insulator that is likely to transmit oxygen and the insulator 250b in an upper layer be formed using an insulator having a function of inhibiting oxygen diffusion. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. For example, it is preferable that the insulator 250a be provided using any of the above-described materials that can be used for the insulator 250 and the insulator 250b be provided using an insulator containing an oxide of one or both of aluminum and hafnium. As the insulator, aluminum oxide, hafnium oxide, an oxide containing aluminum and hafnium (hafnium aluminate), an oxide containing hafnium and silicon (hafnium silicate), or the like can be used. In this embodiment, hafnium oxide is used as the insulator 250b. In this case, the insulator 250b is an insulator containing at least oxygen and hafnium. The thickness of the insulator 250b is greater than or equal to 0.5 nm and less than or equal to 5.0 nm, preferably greater than or equal to 1.0 nm and less than or equal to 5.0 nm, further preferably greater than or equal to 1.0 nm and less than or equal to 3.0 nm. In that case, at least part of the insulator 250b may include a region having a thickness like the above-described thickness.

In the case where silicon oxide, silicon oxynitride, or the like is used for the insulator 250a, the insulator 250b may be formed using an insulating material that is a high-k material having a high dielectric constant. The gate insulator having a stacked-layer structure of the insulator 250a and the insulator 250b can be thermally stable and can have a high dielectric constant. Thus, a gate potential that is applied during operation of the transistor can be reduced while the physical thickness of the gate insulator is maintained. In addition, the equivalent oxide thickness (EOT) of the insulator functioning as the gate insulator can be reduced. Therefore, the withstand voltage of the insulator 250 can be increased.

The insulator 254 functions as part of a gate insulator. As the insulator 254, a barrier insulating film against hydrogen is preferably used. This can prevent diffusion of impurities such as hydrogen contained in the conductor 260 into the insulator 250 and the oxide 230b. As the insulator 254, an insulator that can be used as the insulator 283 described above may be used. For example, silicon nitride deposited by a PEALD method may be used as the insulator 254. In this case, the insulator 254 is an insulator containing at least nitrogen and silicon.

Furthermore, the insulator 254 may have a barrier property against oxygen. Thus, diffusion of oxygen contained in the insulator 250 into the conductor 260 can be inhibited.

Furthermore, the insulator 254 needs to be provided in an opening formed in the insulator 280 and the like, together with the insulator 252, the insulator 250, and the conductor 260. The thickness of the insulator 254 is preferably thin for miniaturization of the transistor 200. The thickness of the insulator 254 is greater than or equal to 0.1 nm and less than or equal to 5.0 nm, preferably greater than or equal to 0.5 nm and less than or equal to 3.0 nm, further preferably greater than or equal to 1.0 nm and less than or equal to 3.0 nm. In this case, at least part of the insulator 254 preferably includes a region having the above-described thickness. The thickness of the insulator 254 is preferably smaller than that of the insulator 250. In this case, at least part of the insulator 254 may include a region having a thickness that is smaller than that of the insulator 250.

Note that in the case where the insulator 250 has a stacked-layer structure of two layers as illustrated in FIG. 2B, an insulator having a function of inhibiting the passage of oxygen and impurities such as hydrogen, e.g., hafnium oxide, is used as the insulator 250b, whereby the insulator 250b can also have the function of the insulator 254. In such a case, the structure without the insulator 254 enables simplification of the manufacturing process and the improvement in productivity of the semiconductor device.

The conductor 260 functions as the first gate electrode of the transistor 200. The conductor 260 preferably includes the conductor 260a and the conductor 260b placed over the conductor 260a. For example, the conductor 260a is preferably placed to cover the bottom surface and the side surface of the conductor 260b. Moreover, as illustrated in FIG. 1B and FIG. 1C, the top surface of the conductor 260 is substantially level with the top surface of the insulator 250. Although the conductor 260 is illustrated to have a two-layer structure of the conductor 260a and the conductor 260b in FIG. 1B and FIG. 1C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As the conductive material having a function of inhibiting diffusion of oxygen, for example, titanium, titanium nitride, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of the conductive material and titanium or titanium nitride may be employed.

In the transistor 200, the conductor 260 is formed in a self-aligned manner to fill the opening formed in the insulator 280 and the like. The formation of the conductor 260 in this manner allows the conductor 260 to be placed properly in a region between the conductor 242a and the conductor 242b without alignment.

As illustrated in FIG. 1C, in the channel width direction of the transistor 200, with reference to the bottom surface of the insulator 222, the level of the bottom surface of the conductor 260 in a region where the conductor 260 and the oxide 230b do not overlap is preferably lower than the level of the bottom surface of the oxide 230b. When the conductor 260 functioning as the gate electrode covers the side surface and the top surface of the channel formation region of the oxide 230b with the insulator 250 and the like therebetween, the electric field of the conductor 260 can easily act on the entire channel formation region of the oxide 230b. Thus, the on-state current of the transistor 200 can be increased and the frequency characteristics of the transistor 200 can be improved. With a reference to the bottom surface of the insulator 222, the difference between the level of the bottom surface of the conductor 260 in a region where the conductor 260 do not overlap with the oxide 230a or the oxide 230b and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 275, and the opening is formed in a region where the insulator 252, the insulator 250, the insulator 254, and the conductor 260 are to be provided. In addition, the top surface of the insulator 280 may be planarized.

The insulator 280 functioning as an interlayer film preferably has a low permittivity. When a material with a low permittivity is used for an interlayer film, parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen to be released by heating can be easily formed.

The concentration of impurities such as water and hydrogen in the insulator 280 is preferably reduced. Oxide containing silicon such as silicon oxide, silicon oxynitride, or the like is used as appropriate for the insulator 280, for example.

The insulator 282 preferably functions as a barrier insulating film that inhibits impurities such as water and hydrogen from diffusing into the insulator 280 from above and preferably has a function of capturing impurities such as hydrogen. The insulator 282 preferably functions as a barrier insulating film that inhibits passage of oxygen. For the insulator 282, a metal oxide having an amorphous structure, for example, an insulator such as aluminum oxide can be used. In this case, the insulator 282 is an insulator containing at least oxygen and aluminum. The insulator 282, which has a function of capturing impurities such as hydrogen, is provided in contact with the insulator 280 in a region interposed between the insulator 212 and the insulator 283, whereby impurities such as hydrogen contained in the insulator 280 and the like can be captured and the amount of hydrogen in the region can be constant. It is preferable to use, in particular, aluminum oxide having an amorphous structure for the insulator 282, because hydrogen can be captured or fixed more effectively in some cases. Accordingly, the transistor 200 and a semiconductor device which have favorable characteristics and high reliability can be manufactured.

The insulator 283 functions as a barrier insulating film that inhibits impurities such as water and hydrogen from diffusing into the insulator 280 from above. The insulator 283 is placed over the insulator 282. The insulator 283 is preferably formed using a nitride containing silicon such as silicon nitride or silicon nitride oxide. For example, silicon nitride deposited by a sputtering method may be used for the insulator 283. When the insulator 283 is deposited by a sputtering method, a high-density silicon nitride film can be formed. To obtain the insulator 283, silicon nitride deposited by a PEALD method or a CVD method may be stacked over silicon nitride deposited by a sputtering method.

For the conductor 240a and the conductor 240b, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting passage of impurities such as water and hydrogen is preferably used for a first conductor placed in the vicinity of the insulator 285, the insulator 283, the insulator 282, the insulator 280, the insulator 275, and the insulator 271. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. Moreover, impurities such as water and hydrogen contained in a layer above the insulator 283 can be inhibited from entering the oxide 230 through the conductor 240a and the conductor 240b.

For the insulator 241a and the insulator 241b, a barrier insulating film that can be used for the insulator 275 or the like may be used. For the insulator 241a and the insulator 241b, for example, an insulator such as silicon nitride, aluminum oxide, or silicon nitride oxide may be used. Since the insulator 241a and the insulator 241b are provided in contact with the insulator 283, the insulator 282, and the insulator 271, impurities such as water and hydrogen contained in the insulator 280 or the like can be inhibited from entering the oxide 230 through the conductor 240a and the conductor 240b. In particular, silicon nitride is suitable because of its high blocking property against hydrogen. Furthermore, oxygen contained in the insulator 280 can be prevented from being absorbed by the conductor 240a and the conductor 240b.

When the insulator 241a and the insulator 241b each have a stacked-layer structure illustrated in FIG. 1B, a first insulator in contact with an inner wall of the opening formed in the insulator 280 and the like and a second insulator on the inner side of the first insulator are preferably formed using a combination of a barrier insulating film against oxygen and a barrier insulating film against hydrogen.

For example, aluminum oxide deposited by an ALD method may be used as the first insulator and silicon nitride deposited by a PEALD method may be used as the second insulator. With this structure, oxidation of the conductor 240 can be inhibited, and hydrogen can be prevented from entering the conductor 240.

The conductor 246 (the conductor 246a and the conductor 246b) functioning as a wiring may be placed in contact with the top surface of the conductor 240a and the top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and the conductive material, for example. Note that the conductor may be formed to be embedded in an opening provided in an insulator.

<Component Materials of Semiconductor Device>

Component materials that can be used for the semiconductor device are described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate using silicon or germanium as a material and a compound semiconductor substrate including silicon carbide, silicon germanium, gallium arsenide, indium phosphide, zinc oxide, or gallium oxide. Another example is a semiconductor substrate having an insulator region in the semiconductor substrate described above, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor element, a resistor, a switching element, a light-emitting element, and a storage element.

<<Insulator>>

Examples of the insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as a leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low dielectric constant is used for the insulator functioning as an interlayer film, parasitic capacitance generated between wirings can be reduced. Thus, a material is preferably selected depending on the function of an insulator.

Examples of the insulator with a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including a metal oxide is surrounded by an insulator having a function of inhibiting passage of oxygen and impurities such as hydrogen, the transistor can have stable electrical characteristics. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the gate insulator is preferably an insulator including a region containing oxygen to be released by heating. For example, when a structure is employed in which silicon oxide or silicon oxynitride including a region containing oxygen to be released by heating is in contact with the oxide 230, oxygen vacancies included in the oxide 230 can be compensated for.

<<Conductor>>

As a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Alternatively, a semiconductor having high electrical conductivity, typified by polycrystalline silicon containing an impurity element such as phosphorus, or silicide such as nickel silicide may be used.

A stack of a plurality of conductive layers formed of the above materials may be used. For example, a stacked-layer structure combining a material containing the above metal element and a conductive material containing oxygen may be employed. Alternatively, a stacked-layer structure combining a material containing the above metal element and a conductive material containing nitrogen may be employed. Alternatively, a stacked-layer structure combining a material containing the above metal element, a conductive material containing oxygen, and a conductive material containing nitrogen may be employed.

In the case where an oxide is used for the channel formation region of the transistor, the conductor functioning as the gate electrode preferably employs a stacked-layer structure combining a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is preferable to use, in particular, a conductive material containing oxygen and a metal element contained in the metal oxide where the channel is formed. Alternatively, a conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

<<Metal Oxide>>

The oxide 230 is preferably formed using a metal oxide functioning as a semiconductor (an oxide semiconductor). A metal oxide that can be used as the oxide 230 of the present invention is described below.

The metal oxide preferably contains at least indium or zinc. In particular, indium and zinc are preferably contained. Furthermore, aluminum, gallium, yttrium, tin, or the like is preferably contained in addition to them. Furthermore, one kind or a plurality of kinds selected from boron, titanium, iron, nickel, germanium, zirconium, molybdenum, lanthanum, cerium, neodymium, hafnium, tantalum, tungsten, magnesium, cobalt, and the like may be contained.

Here, the case where the metal oxide is an In-M-Zn oxide containing indium, an element M, and zinc is considered. The element M is aluminum, gallium, yttrium, or tin. Examples of other elements that can be used as the element M include boron, titanium, iron, nickel, germanium, zirconium, molybdenum, lanthanum, cerium, neodymium, hafnium, tantalum, tungsten, magnesium, and cobalt. Note that a combination of two or more of the above elements may be used as the element M. In particular, the element M is preferably one or more kinds selected from gallium, aluminum, yttrium, and tin.

It is particularly preferable to use an oxide containing indium (In), gallium (Ga), and zinc (Zn) (also referred to as IGZO) for the semiconductor layer of the transistor. Alternatively, an oxide containing indium (In), aluminum (Al), and zinc (Zn) (also referred to as IAZO) may be used for the semiconductor layer of the transistor. Alternatively, an oxide containing indium (In), aluminum (Al), gallium (Ga), and zinc (Zn) (IAGZO) may be used for the semiconductor layer of the transistor.

Note that in this specification and the like, a metal oxide containing nitrogen is also collectively referred to as a metal oxide in some cases. A metal oxide containing nitrogen may be called a metal oxynitride.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

<Classification of Crystal Structure>

Amorphous (including a completely amorphous structure), CAAC (c-axis-aligned crystalline), nc (nanocrystalline), CAC (cloud-aligned composite), single crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, an XRD spectrum of a quartz glass substrate shows a peak with a substantially bilaterally symmetrical shape. On the other hand, the peak of the XRD spectrum of the In—Ga—Zn oxide film having a crystal structure has a bilaterally asymmetrical shape. The asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—Zn oxide film deposited at room temperature is in an intermediate state, which is neither a single crystal nor polycrystal nor an amorphous state, and it cannot be concluded that In—Ga—Zn oxide film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga, Zn) layer) are stacked. Indium and gallium can be replaced with each other. Therefore, indium may be contained in the (Ga,Zn) layer. In addition, gallium may be contained in the In layer. Note that zinc may be contained in the In layer.

Such a layered structure is observed as a lattice image in a high-resolution TEM (Transmission Electron Microscope) image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, In—Zn oxide and In—Ga—Zn oxide are suitable because they can inhibit generation of a crystal grain boundary as compared with In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the transistor including a metal oxide in its channel formation region (referred to as an OS transistor in some cases) can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis using out-of-plane XRD measurement with an XRD apparatus using $\theta/2\theta$ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter greater than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or less than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has low crystallinity as compared with the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. For example, the first region has higher [In] than the second region and has lower [Ga] than the second region. Moreover, the second region has higher [Ga] than the first region and has lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In addition, in a material composition of a CAC-OS in an In—Ga—Zn oxide that contains In, Ga, Zn, and O, there are regions containing Ga as a main component in part of the CAC-OS and regions containing In as a main component in another part of the CAC-OS. These regions each form a mosaic pattern and are randomly present. Thus, it is suggested that the CAC-OS has a structure in which metal elements are unevenly distributed.

The CAC-OS can be formed by a sputtering method under a condition where a substrate is not heated, for example. Furthermore, in the case where the CAC-OS is formed by a sputtering method, any one or more selected from an inert gas (typically, argon), an oxygen gas, and a nitrogen gas is used as a deposition gas. The proportion of the flow rate of an oxygen gas in the total flow rate of the deposition gas during deposition is preferably as low as possible. For example, the proportion of the flow rate of an oxygen gas in the total flow rate of the deposition gas during deposition is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has higher conductivity than the second region. In other words, when carriers flow through the first region, the conductivity of a metal oxide is exhibited. Accordingly, when the first regions are distributed in a metal oxide like a cloud, high field-effect mobility (u) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current (Ion), a high field-effect mobility (u), and favorable switching operation can be achieved.

A transistor using the CAC-OS has high reliability. Thus, the CAC-OS is the most suitable for a variety of semiconductor devices such as display devices.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for the transistor. For example, the carrier concentration in the oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film also be reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the semiconductor layer is set to $2\times10^{18}$ atoms/cm$^3$ or lower, preferably $2\times10^{17}$ atoms/cm$^3$ or lower.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

<<Other Semiconductor Materials>>

A semiconductor material that can be used for the oxide 230 is not limited to the above metal oxides. A semiconductor material that has a band gap (a semiconductor material that is not a zero-gap semiconductor) may be used for the oxide 230. For example, a single element semiconductor such as silicon, a compound semiconductor such as gallium arsenide, or a layered material functioning as a semiconductor (also referred to as an atomic layer material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, a transistor having a high on-state current can be provided.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically MoS$_2$), molybdenum selenide (typically MoSe$_2$), molybdenum telluride (typically MoTe$_2$), tungsten sulfide (typically WS$_2$), tungsten selenide (typically WSe$_2$), tungsten telluride (typically WTe$_2$), hafnium sulfide (typically HfS$_2$), hafnium selenide (typically HfSe$_2$), zirconium sulfide (typically ZrS$_2$), and zirconium selenide (typically ZrSe$_2$).

<Manufacturing Method of Semiconductor Device>

Next, a method for manufacturing the semiconductor device of one embodiment of the present invention illustrated in FIG. 1A to FIG. 1D is described with reference to FIG. 6A to FIG. 17D.

Note that A of each drawing is a top view. Moreover, B of each drawing is a cross-sectional view corresponding to a portion indicated by the dashed-dotted line A1-A2 in A of each drawing, and is also a cross-sectional view in the channel length direction of the transistor 200. Furthermore, C of each drawing is a cross-sectional view corresponding to a portion indicated by the dashed-dotted line A3-A4 in A of each drawing, and is also a cross-sectional view in the channel width direction of the transistor 200. Furthermore, D of each drawing is a cross-sectional view of a portion indicated by the dashed-dotted line A5-A6 in A of each drawing. Note that for clarity of the drawing, some components are not illustrated in the top view of A of each drawing.

Hereinafter, an insulating material for forming an insulator, a conductive material for forming a conductor, or a semiconductor material for forming a semiconductor can be deposited by a sputtering method, a CVD method, an MBE method, a PLD method, an ALD method, or the like as appropriate.

Examples of the sputtering method include an RF sputtering method in which a high-frequency power source is used as a sputtering power source, a DC sputtering method in which a DC power source is used, and a pulsed DC sputtering method in which a voltage applied to an electrode is changed in a pulsed manner. An RF sputtering method is mainly used in the case where an insulating film is deposited, and a DC sputtering method is mainly used in the case where a metal conductive film is deposited. The pulsed DC sputtering method is mainly used in the case where a compound such as an oxide, a nitride, or a carbide is deposited by a reactive sputtering method.

Note that the CVD method can be classified into a plasma CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

A high-quality film can be obtained at a relatively low temperature by a plasma enhanced CVD method. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In this case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As an ALD method, a thermal ALD method, in which a precursor and a reactant react with each other only by a thermal energy, a PEALD method, in which a reactant excited by plasma is used, and the like can be used.

A CVD method and an ALD method are different from a sputtering method in which particles ejected from a target or the like are deposited. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

By a CVD method, a film with a certain composition can be deposited depending on the flow rate ratio of the source gases. For example, by a CVD method, by changing the flow rate ratio of the source gases during the deposition, a film in which the composition is continuously changed can be deposited. In the case where the film is deposited while the flow rate ratio of the source gases is changed, as compared to the case where the film is deposited using a plurality of deposition chambers, the time taken for the deposition can be shortened because the time taken for transfer or pressure adjustment is omitted. Thus, the productivity of the semiconductor device can be increased in some cases.

In an ALD method, a film with a freely selected composition can be deposited by concurrently introducing different kinds of precursors. In the case where different kinds of precursors are introduced, a film with a freely selected composition can be deposited by controlling the cycle number of each of the precursors.

First, a substrate (not illustrated) is prepared, and the insulator 212 is deposited over the substrate (see FIG. 6A to FIG. 6D). The insulator 212 is preferably deposited by a sputtering method. By using a sputtering method that does not need to use a molecule containing hydrogen as a deposition gas, the hydrogen concentration in the insulator 212 can be reduced. Without limitation to a sputtering method, the insulator 212 may be deposited by a CVD method, an MBE method, a PLD method, an ALD method, or the like as appropriate.

In this embodiment, for the insulator 212, silicon nitride is deposited by a pulsed DC sputtering method using a silicon target in an atmosphere containing a nitrogen gas. The use of the pulsed DC sputtering method can inhibit generation of particles due to arcing on the target surface, achieving more uniform film thickness. In addition, by using the pulsed voltage, rising and falling in discharge can be made steep as compared with the case where a high-frequency voltage is used. As a result, power can be supplied to an electrode more efficiently to improve the sputtering rate and film quality.

The use of an insulator through which impurities such as water and hydrogen are less likely to pass, such as silicon nitride, can inhibit diffusion of impurities such as water and hydrogen contained in a layer below the insulator 212. When an insulator through which copper is less likely to pass, such as silicon nitride, is used for the insulator 212, even in the case where a metal that is likely to diffuse, such as copper, is used for a conductor in a layer (not illustrated) below the insulator 212, upward diffusion of the metal through the insulator 212 can be inhibited.

Next, the insulator 214 is deposited over the insulator 212 (see FIG. 6A to FIG. 6D). The insulator 214 is preferably deposited by a sputtering method. By using a sputtering method that does not need to use a molecule containing hydrogen as a deposition gas, the hydrogen concentration in the insulator 214 can be reduced. Without limitation to a sputtering method, the insulator 214 may be deposited by a CVD method, an MBE method, a PLD method, an ALD method, or the like as appropriate.

In this embodiment, for the insulator 214, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality. Here, RF power may be applied to the substrate. The amount of oxygen supplied to a layer below the insulator 214 can be controlled depending on the amount of the RF power applied to the substrate. The RF power is higher than or equal to 0 $W/cm^2$ and lower than or equal to 1.86 $W/cm^2$. In other words, the supply amount of oxygen can be changed to be appropriate for the characteristics of the transistor, with the RF power used at the time of forming the insulator 214. Accordingly, an appropriate amount of oxygen for improving the reliability of the transistor can be supplied. The RF frequency is preferably 10 MHz or higher. The typical frequency is 13.56 MHz. The higher the RF frequency is, the less damage the substrate gets.

A metal oxide having an amorphous structure and an excellent function of capturing or fixing hydrogen, such as aluminum oxide, is preferably used for the insulator 214. In this case, the insulator 214 captures or fixes hydrogen contained in the insulator 216 and the like and prevents the hydrogen from diffusing into the oxide 230. In particular, it is preferable to use aluminum oxide having an amorphous structure or amorphous aluminum oxide for the insulator 214 because hydrogen can be captured or fixed more effectively in some cases. Accordingly, the transistor 200 and a semiconductor device which have favorable characteristics and high reliability can be manufactured.

Next, the insulator 216 is deposited over the insulator 214. The insulator 216 is preferably deposited by a sputtering method. By using a sputtering method that does not need to use a molecule containing hydrogen as a deposition gas, the hydrogen concentration in the insulator 216 can be reduced. Without limitation to a sputtering method, the insulator 216 may be deposited by a CVD method, an MBE method, a PLD method, an ALD method, or the like as appropriate.

In this embodiment, for the insulator 216, silicon oxide is deposited by a pulsed DC sputtering method using a silicon target in an atmosphere containing an oxygen gas. The use of the pulsed DC sputtering method can achieve more uniform film thickness and improve the sputtering rate and film quality.

The insulator 212, the insulator 214, and the insulator 216 are preferably successively deposited without exposure to the air. For example, a multi-chamber deposition apparatus is used. As a result, the amounts of hydrogen in the deposited insulator 212, insulator 214, and insulator 216 can be reduced, and furthermore, entry of hydrogen into the films in intervals between deposition steps can be inhibited.

Then, an opening reaching the insulator 214 is formed in the insulator 216. Examples of the opening include a groove and a slit. A region where an opening is formed is referred to as an opening portion in some cases. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where silicon oxide or silicon oxynitride is used for the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is deposited. The conductive film desirably includes a conductor having a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, titanium nitride is deposited as the conductive film to be the conductor 205a. When such a metal nitride is used for a layer under the conductor 205b, oxidation of the conductor 205b by the insulator 216 or the like can be inhibited. Furthermore, even when a metal that is likely to diffuse, such as copper, is used for the conductor 205b, the metal can be prevented from diffusing to the outside through the conductor 205a.

Next, a conductive film to be the conductor 205b is deposited. Tantalum, tungsten, titanium, molybdenum, aluminum, copper, a molybdenum-tungsten alloy, or the like can be used for the conductive film. The conductive film can be deposited by a plating method, a sputtering method, a CVD method, an MBE method, a PLD method, an ALD method, or the like. In this embodiment, tungsten is deposited for the conductive film.

Next, by performing CMP (Chemical Mechanical Polishing) treatment, the conductive film to be the conductor 205a and the conductive film to be the conductor 205b are partly removed to expose the insulator 216 (see FIG. 6A to FIG. 6D). As a result, the conductor 205a and the conductor 205b remain only in the opening portion. Note that the insulator 216 is partly removed by the CMP treatment in some cases.

Next, the insulator 222 is deposited over the insulator 216 and the conductor 205 (see FIG. 7A to FIG. 7D). An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. Alternatively, hafnium-zirconium oxide is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like. In this embodiment, for the insulator 222, hafnium oxide is deposited by an ALD method. It is particularly preferable to use a method for forming hafnium oxide with a reduced hydrogen concentration, which is one embodiment of the present invention.

Sequentially, heat treatment is preferably performed. The heat treatment is performed at higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment is performed in a nitrogen gas or inert gas atmosphere.

The gas used in the above heat treatment is preferably highly purified. For example, the amount of moisture contained in the gas used in the above heat treatment is 1 ppb or less, preferably 0.1 ppb or less, further preferably 0.05 ppb or less. The heat treatment using a highly purified gas can prevent entry of moisture or the like into the insulator 222 and the like as much as possible.

In this embodiment, as the heat treatment, treatment is performed with a flow rate ratio of a nitrogen gas and an oxygen gas of 4:1 at 400° C. for one hour after the deposition of the insulator 222. By the heat treatment, impurities such as water and hydrogen contained in the insulator 222 can be removed, for example. In the case where an oxide containing hafnium is used for the insulator 222, the insulator 222 is partly crystallized by the heat treatment in some cases. The heat treatment can also be performed after the deposition of the insulator 224, for example.

Next, an insulating film 224A is deposited over the insulator 222 (see FIG. 7A to FIG. 7D). The insulating film 224A can be deposited by a sputtering method, a CVD method, an MBE method, a PLD method, an ALD method, or the like. In this embodiment, for the insulating film 224A, silicon oxide is deposited by a sputtering method. By using a sputtering method that does not need to use a molecule containing hydrogen as a deposition gas, the hydrogen concentration in the insulating film 224A can be reduced. The hydrogen concentration in the insulating film 224A is preferably reduced because the insulating film 224A is in contact with the oxide 230a in a later step.

Next, an oxide film 230A and an oxide film 230B are deposited in this order over the insulating film 224A (see FIG. 7A to FIG. 7D). Note that it is preferable to deposit the oxide film 230A and the oxide film 230B successively without exposure to the air. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like. An ALD method is preferably employed for the deposition of the oxide film 230A and the oxide film 230B, in which case a film with a uniform thickness can be formed even in a groove or an opening portion having a high aspect ratio. Employing a PEALD method is preferable because the oxide film 230A and the oxide film 230B can be formed at a lower temperature than that in the case of employing a thermal ALD method. In this embodiment, the oxide film 230A and the oxide film 230B are deposited by a sputtering method.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target or the like can be used.

In particular, when the oxide film 230A is deposited, part of oxygen contained in the sputtering gas is supplied to the insulating film 224A in some cases. Thus, the proportion of oxygen contained in the sputtering gas is higher than or equal to 70%, preferably higher than or equal to 80%, further preferably 100%.

In the case where the oxide film 230B is deposited by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor including an oxygen-excess oxide semiconductor for its channel formation region, relatively high reliability can be obtained. Note that one embodiment of the present invention is not limited thereto. In the case where the oxide film 230B is deposited by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor including an oxygen-deficient oxide semiconductor for its channel formation region, relatively high field-effect mobility can be obtained. Furthermore, when the deposition is performed while the substrate is being heated, the crystallinity of the oxide film can be improved.

In this embodiment, the oxide film 230A is deposited by a sputtering method using an oxide target with In:Ga:Zn=1:3:4 [atomic ratio]. In addition, the oxide film 230B is deposited by a sputtering method using an oxide target with In:Ga:Zn=4:2:4.1 [atomic ratio], an oxide target with In:Ga:Zn=1:1:1 [atomic ratio], or an oxide target with In:Ga:Zn=1:1:2 [atomic ratio]. Note that each of the oxide films is preferably formed so as to have characteristics required for the oxide 230a and the oxide 230b by selecting the deposition conditions and the atomic ratios as appropriate.

The insulating film 224A, the oxide film 230A, and the oxide film 230B are preferably deposited by a sputtering method without exposure to the air. For example, a multichamber deposition apparatus is used. As a result, entry of hydrogen into the insulating film 224A, the oxide film 230A, and the oxide film 230B in intervals between deposition steps can be inhibited.

Next, heat treatment is preferably performed. The heat treatment can be performed in a temperature range where the oxide film 230A and the oxide film 230B do not become polycrystals, i.e., at higher than or equal to 250° C. and lower than or equal to 650° C., preferably higher than or equal to 400° C. and lower than or equal to 600° C. Note that the heat treatment is performed in a nitrogen gas or inert gas atmosphere, or an atmosphere containing an oxidizing gas at 10 ppm or more, 1% or more, or 10% or more. For example, in the case where the heat treatment is performed in a mixed atmosphere of a nitrogen gas and an oxygen gas, the proportion of the oxygen gas may be approximately 20%. The heat treatment may be performed under reduced pressure. Alternatively, the heat treatment may be performed in an atmosphere containing an oxidizing gas at 10 ppm or more, 1% or more, or 10% or more in order to compensate for released oxygen, after heat treatment is performed in a nitrogen gas or inert gas atmosphere.

The gas used in the above heat treatment is preferably highly purified. For example, the amount of moisture contained in the gas used in the above heat treatment is 1 ppb or less, preferably 0.1 ppb or less, and further preferably 0.05 ppb or less. The heat treatment using a highly purified gas can prevent entry of moisture or the like into the oxide film 230A, the oxide film 230B, and the like as much as possible.

In this embodiment, the heat treatment is performed at 400° ° C. for one hour with the flow rate ratio of nitrogen gas to oxygen gas being 4:1. By the heat treatment using the oxygen gas, impurities such as carbon, water, and hydrogen in the oxide film 230A and the oxide film 230B can be reduced, for example. Furthermore, the reduction of impurities in the films improves the crystallinity of the oxide film 230B, thereby offering a dense structure with higher density. Thus, crystalline regions in the oxide film 230A and the oxide film 230B are expanded, so that in-plane variations of the crystalline regions in the oxide film 230A and the oxide film 230B can be reduced. Accordingly, an in-plane variation of electrical characteristics of the transistor 200 can be reduced.

By performing heat treatment, hydrogen in the insulator 216, the insulating film 224A, the oxide film 230A, and the oxide film 230B moves into the insulator 222 and is absorbed by the insulator 222. In other words, hydrogen in the insulator 216, the insulating film 224A, the oxide film 230A, and the oxide film 230B diffuses into the insulator 222. Accordingly, the hydrogen concentration in the insulator 222 increases, and the hydrogen concentrations in the insulator 216, the insulating film 224A, the oxide film 230A, and the oxide film 230B decrease.

In particular, the insulating film 224A functions as a gate insulator of the transistor 200, and the oxide film 230A and the oxide film 230B function as a channel formation region of the transistor 200. Thus, the transistor 200 preferably includes the insulating film 224A, the oxide film 230A, and the oxide film 230B with reduced hydrogen concentrations because favorable reliability can be obtained.

Next, a conductive film 242A is deposited over the oxide film 230B (see FIG. 7A to FIG. 7D). The conductive film 242A can be deposited by a sputtering method, a CVD method, an MBE method, a PLD method, an ALD method, or the like. For example, for the conductive film 242A, tantalum nitride is deposited by a sputtering method. Note that heat treatment may be performed before the deposition of the conductive film 242A. This heat treatment may be performed under reduced pressure, and the conductive film 242A may be successively deposited without exposure to the air. The treatment can remove moisture and hydrogen adsorbed onto the surface of the oxide film 230B, and further can reduce the moisture concentration and the hydrogen concentration in the oxide film 230A and the oxide film 230B. The heat treatment is preferably performed at a temperature higher than or equal to 100° C. and lower than or equal to 400° C. In this embodiment, the heat treatment is performed at 200° C.

Next, an insulating film 271A is deposited over the conductive film 242A (see FIG. 7A to FIG. 7D). The insulating film 271A can be deposited by a sputtering method, a CVD method, an MBE method, a PLD method, an ALD method, or the like. As the insulating film 271A, an insulating film having a function of inhibiting passage of oxygen is preferably used. For example, for the insulating film 271A, aluminum oxide or silicon nitride may be deposited by a sputtering method.

Note that the conductive film 242A and the insulating film 271A are preferably deposited by a sputtering method without exposure to the air. For example, a multi-chamber deposition apparatus is used. As a result, the amounts of hydrogen in the conductive film 242A and the insulating film 271A can be reduced, and furthermore, entry of hydrogen into the films in intervals between deposition steps can be inhibited. In the case where a hard mask is provided over the insulating film 271A, a film to be the hard mask is preferably successively deposited without exposure to the air.

Next, the insulating film 224A, the oxide film 230A, the oxide film 230B, the conductive film 242A, and the insulating film 271A are processed into island shapes by a lithography method to form the insulator 224, the oxide 230*a*, the oxide 230*b*, a conductive layer 242B, and an insulating layer 271B (see FIG. 8A to FIG. 8D). Here, the insulator 224, the oxide 230*a*, the oxide 230*b*, the conductive layer 242B, and the insulating layer 271B are formed to at least partly overlap with the conductor 205. A dry etching method or a wet etching method can be used for the processing. A dry etching method is suitable for microfabrication. The insulating film 224A, the oxide film 230A, the oxide film 230B, the conductive film 242A, and the insulating film 271A may be processed under different conditions.

Note that in the lithography method, first, a resist is exposed to light through a mask. Next, a region exposed to light is removed or left using a developing solution, so that a resist mask is formed. Then, etching process through the resist mask is conducted, whereby a conductor, a semiconductor, an insulator, or the like can be processed into a desired shape. The resist mask may be formed through, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by a dry etching process such as ashing, a wet etching process, a wet etching process after a dry etching process, or a dry etching process after a wet etching process.

In addition, a hard mask formed of an insulator or a conductor may be used under the resist mask. In the case of using a hard mask, a hard mask with a desired shape can be formed in the following manner: an insulating film or a conductive film that is the material of the hard mask is formed over the conductive film 242A, a resist mask is formed thereover, and then the hard mask material is etched. The etching of the conductive film 242A and the like may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps. In this embodiment, the insulating layer 271B is used as a hard mask.

Here, the insulating layer 271B functions as a mask for the conductive layer 242B; thus, as illustrated in FIG. 8B to FIG. 8D, the conductive layer 242B does not have a curved surface between the side surface and the top surface. Thus, end portions at the intersections of the side surfaces and the top surfaces of the conductor 242*a* and the conductor 242*b* illustrated in FIG. 1B and FIG. 1D are angular. The cross-sectional area of the conductor 242 in the case where the end portion at the intersection of the side surface and the top surface of the conductor 242 is angular is larger than that in the case where the end portion is rounded. Accordingly, the resistance of the conductor 242 is reduced, so that the on-state current of the transistor 200 can be increased.

Furthermore, as illustrated in FIG. 8B to FIG. 8D, the side surfaces of the insulator 224, the oxide 230*a*, the oxide 230*b*, the conductive layer 242B, and the insulating layer 271B may have tapered shapes. In this specification and the like, a tapered shape indicates a shape in which at least part of a side surface of a structure is inclined to a substrate surface. For example, the angle formed between the inclined side surface and the substrate surface (the angle is also referred to as a taper angle) is preferably less than 90°. Each of the insulator 224, the oxide 230*a*, the oxide 230*b*, the conductive layer 242B, and the insulating layer 271B may have a taper angle greater than or equal to 60° and less than 90°. With such tapered shapes of the side surfaces, the coverage with the insulator 275 and the like can be improved in a later step, so that defects such as a void can be reduced.

Not being limited to the above, the insulator 224, the oxide 230*a*, the oxide 230*b*, the conductive layer 242B, and the insulating layer 271B may be processed to have side surfaces that are substantially perpendicular to the top surface of the insulator 222. With such a structure, a plurality of the transistors 200 can be provided with high density in a small area.

A by-product generated in the above etching step is sometimes formed in a layered manner on the side surfaces of the insulator 224, the oxide 230*a*, the oxide 230*b*, the conductive layer 242B, and the insulating layer 271B. In this case, the layered by-product is formed between the insulator 275 and the insulator 224, the oxide 230*a*, the oxide 230*b*, the conductive layer 242B, and the insulating layer 271B. Hence, the layered by-product formed in contact with the top surface of the insulator 222 is preferably removed.

Next, the insulator 275 is deposited to cover the insulator 224, the oxide 230*a*, the oxide 230*b*, the conductive layer 242B, and the insulating layer 271B (see FIG. 9A to FIG. 9D). Here, it is preferable that the insulator 275 be in close contact with the top surface of the insulator 222 and the side surface of the insulator 224. The insulator 275 can be deposited by a sputtering method, a CVD method, an MBE method, a PLD method, an ALD method, or the like. The insulator 275 is preferably formed using an insulating film having a function of inhibiting passage of oxygen. For example, as the insulator 275, aluminum oxide may be deposited by a sputtering method, and silicon nitride may be deposited thereover by a PEALD method. When the insulator 275 has such a stacked-layer structure, the function of inhibiting diffusion of impurities such as water or hydrogen and oxygen is improved in some cases.

In this manner, the oxide 230a, the oxide 230b, and the conductive layer 242B can be covered with the insulator 275 and the insulating layer 271B, which have a function of inhibiting diffusion of oxygen. This structure can suppress direct diffusion of oxygen from the insulator 280 or the like into the insulator 224, the oxide 230a, the oxide 230b, and the conductive layer 242B in a later step.

Next, an insulating film to be the insulator 280 is deposited over the insulator 275. The insulating film can be deposited by a sputtering method, a CVD method, an MBE method, a PLD method, an ALD method, or the like. A silicon oxide film may be deposited by a sputtering method as the insulating film, for example. When the insulating film is deposited by a sputtering method in an oxygen-containing atmosphere, the insulator 280 containing excess oxygen can be formed. Since a molecule containing hydrogen is not used as a deposition gas in the sputtering method, the concentration of hydrogen in the insulator 280 can be reduced. Note that heat treatment may be performed before the insulating film is deposited. The heat treatment may be performed under reduced pressure, and the insulating film may be successively deposited without exposure to the air. The treatment can remove moisture and hydrogen adsorbed onto the surface of the insulator 275 and the like, and further can reduce the moisture concentration and the hydrogen concentration in the oxide 230a, the oxide 230b, and the insulator 224. For the heat treatment, the above heat treatment conditions can be used.

Next, the insulating film to be the insulator 280 is subjected to CMP treatment, so that the insulator 280 with a flat top surface is formed (see FIG. 9A to FIG. 9D). Note that, for example, silicon nitride may be deposited over the insulator 280 by a sputtering method and CMP treatment may be performed on the silicon nitride until the insulator 280 is reached.

Then, part of the insulator 280, part of the insulator 275, part of the insulating layer 271B, and part of the conductive layer 242B are processed to form an opening reaching the oxide 230b. The opening is preferably formed to overlap with the conductor 205. The insulator 271a, the insulator 271b, the conductor 242a, and the conductor 242b are formed through the formation of the opening (see FIG. 10A to FIG. 10D).

Figure 10A:
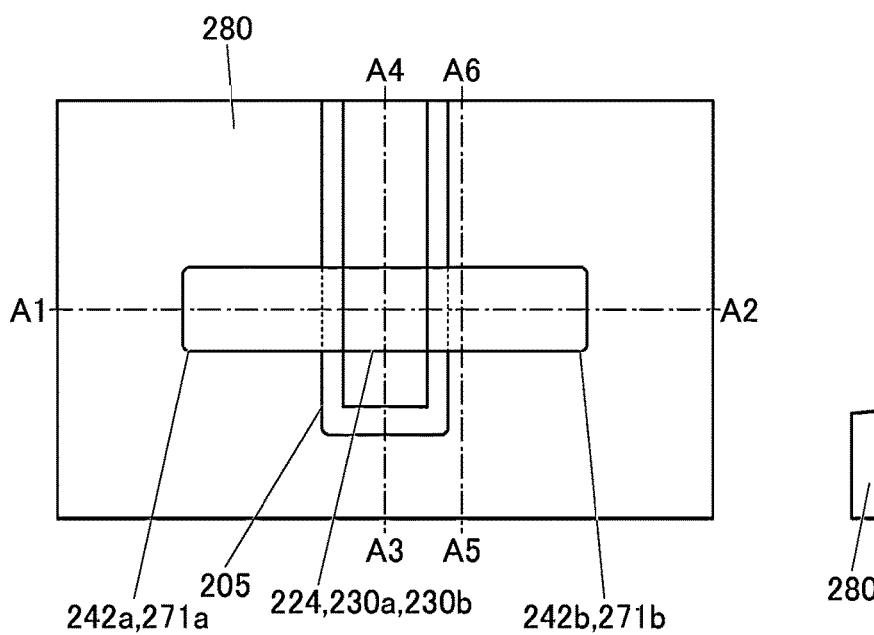
FIG. 10A is a top view illustrating the method for manufacturing a semiconductor device of one embodiment of the present invention.
Figure 10C:
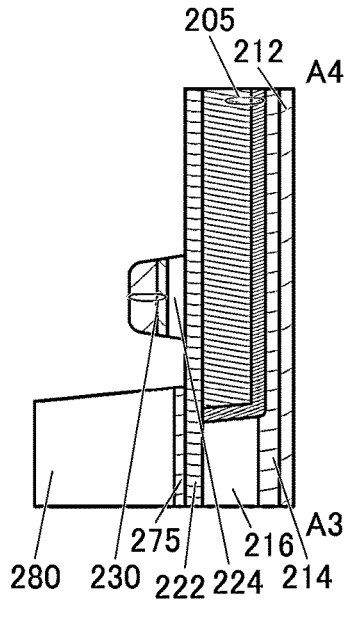
FIG. 10B and FIG. 10D are cross-sectional views illustrating the method for manufacturing a semiconductor device of one embodiment of the present invention.
Figure 10B:
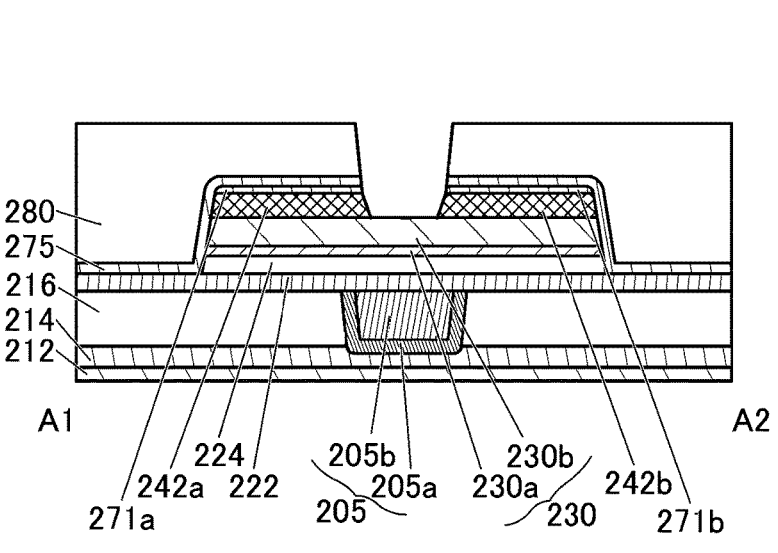
Figure 10D:
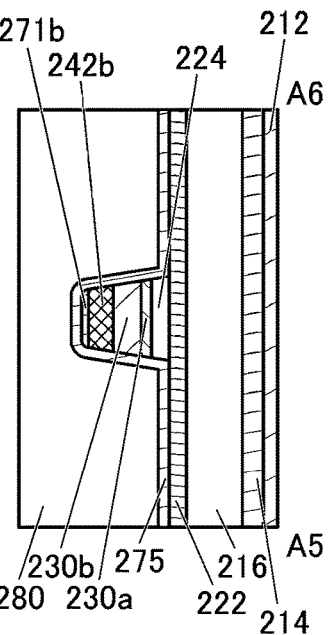

As illustrated in FIG. 10B and FIG. 10C, the side surfaces of the insulator 280, the insulator 275, the insulator 271, and the conductor 242 may be tapered. The taper angle of the insulator 280 is larger than that of the conductor 242 in some cases. Although not illustrated in FIG. 10A to FIG. 10C, the upper portion of the oxide 230b is removed in some cases when the opening is formed.

The part of the insulator 280, the part of the insulator 275, the part of the insulating layer 271B, and the part of the conductive layer 242B can be processed by a dry etching method or a wet etching method. A dry etching method is suitable for microfabrication. The processing may be performed under different conditions. For example, the part of the insulator 280 may be processed by a dry etching method, the part of the insulator 275 and the part of the insulating layer 271B may be processed by a wet etching method, and the part of the conductive layer 242B may be processed by a dry etching method.

Here, impurities might be attached onto the side surface of the oxide 230a, the top surface and the side surface of the oxide 230b, the side surface of the conductor 242, the side surface of the insulator 280, and the like or the impurities might be diffused thereinto. A step of removing the impurities may be performed. In addition, a damaged region might be formed on the surface of the oxide 230b by the above dry etching. The damaged region may be removed. The impurities come from components contained in the insulator 280, the insulator 275, part of the insulating layer 271B, and the conductive layer 242B; components contained in a member of an apparatus used to form the opening; and components contained in a gas or a liquid used for etching, for instance. Examples of the impurities include hafnium, aluminum, silicon, tantalum, fluorine, and chlorine.

In particular, impurities such as aluminum and silicon might reduce the crystallinity of the oxide 230b. Thus, it is preferable that impurities such as aluminum and silicon be removed from the surface of the oxide 230b and the vicinity thereof. The concentration of the impurities is preferably reduced. For example, the concentration of aluminum atoms of the oxide 230b and the vicinity thereof is lower than or equal to 5.0 atomic %, preferably lower than or equal to 2.0 atomic %, further preferably lower than or equal to 1.5 atomic %, still further preferably lower than or equal to 1.0 atomic %, and yet further preferably lower than 0.3 atomic %.

Note that since the density of a low-crystallinity region of the oxide 230b is reduced owing to impurities such as aluminum and silicon, a large amount of VoH is formed; thus, the transistor is likely to be normally on. Hence, the low-crystallinity region of the oxide 230b is preferably reduced or removed.

In contrast, the oxide 230b preferably has a layered CAAC structure. In particular, the CAAC structure preferably reaches a lower edge portion of a drain in the oxide 230b. Here, in the transistor 200, the conductor 242a or the conductor 242b, and its vicinity function as a drain. In other words, the oxide 230b in the vicinity of the lower edge portion of the conductor 242a (conductor 242b) preferably has a CAAC structure. In this manner, the low-crystallinity region of the oxide 230b is removed and the CAAC structure is formed also in the edge portion of the drain, which significantly affects the drain breakdown voltage, so that a variation in electrical characteristics of the transistor 200 can be further suppressed. In addition, the reliability of the transistor 200 can be improved.

In order to remove impurities and the like attached to the surface of the oxide 230b in the above etching step, cleaning treatment is performed. Examples of the cleaning method include wet cleaning using a cleaning solution (also can be referred to as wet etching process), plasma treatment using plasma, and cleaning by heat treatment, and any of these cleanings may be performed in combination as appropriate. Note that the cleaning treatment sometimes makes the groove portion deeper.

The wet cleaning may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Alternatively, such cleaning methods may be performed in combination as appropriate.

Note that in this specification and the like, in some cases, an aqueous solution in which hydrofluoric acid is diluted with pure water is referred to as diluted hydrofluoric acid, and an aqueous solution in which ammonia water is diluted with pure water is referred to as diluted ammonia water. The concentration, temperature, and the like of the aqueous solution may be adjusted as appropriate in accordance with an impurity to be removed, the structure of a semiconductor device to be cleaned, or the like. The concentration of ammonia in the diluted ammonia water is higher than or equal to 0.01% and lower than or equal to 5%, preferably higher than or equal to 0.1% and lower than or equal to 0.5%. The concentration of hydrogen fluoride in the diluted hydrofluoric acid is higher than or equal to 0.01 ppm and lower than or equal to 100 ppm, preferably higher than or equal to 0.1 ppm and lower than or equal to 10 ppm.

For the ultrasonic cleaning, a frequency higher than or equal to 200 kHz is preferable, higher than or equal to 900 kHz is further preferable. Damage to the oxide $230b$ and the like can be reduced with this frequency.

The cleaning treatment may be performed a plurality of times, and the cleaning solution may be changed in every cleaning treatment. For example, the first cleaning treatment may use diluted hydrofluoric acid or diluted ammonia water and the second cleaning treatment may use pure water or carbonated water.

As the cleaning treatment in this embodiment, wet cleaning using diluted ammonia water is performed. The cleaning treatment can remove impurities that are attached onto the surfaces of the oxide $230a$, the oxide $230b$, and the like or diffused into the oxide $230a$, the oxide $230b$, and the like. Furthermore, the crystallinity of the oxide $230b$ can be increased.

After the etching or the cleaning treatment, heat treatment may be performed. The heat treatment is performed at higher than or equal to 100° C. and lower than or equal to 450° C., preferably higher than or equal to 350° C. and lower than or equal to 400° C. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide $230a$ and the oxide $230b$ to reduce oxygen vacancies. In addition, the crystallinity of the oxide $230b$ can be improved by the heat treatment. The heat treatment may be performed under reduced pressure. Alternatively, heat treatment may be performed in an oxygen atmosphere, and then heat treatment may be successively performed in a nitrogen atmosphere without exposure to the air.

Next, an insulating film $252A$ is deposited (see FIG. 11A to FIG. 11D). The insulating film $252A$ can be deposited by a sputtering method, a CVD method, an MBE method, a PLD method, an ALD method, or the like. The insulating film $252A$ is preferably deposited by an ALD method. As described above, it is preferable to deposit the insulating film $252A$ to have a small thickness, and an unevenness of the thickness needs to be reduced. In contrast, an ALD method is a deposition method in which a precursor and a reactant (e.g., oxidizer) are alternately introduced, and the film thickness can be adjusted with the number of repetition times of the cycle; thus, accurate control of the film thickness is possible. Furthermore, as illustrated in FIG. 11B and FIG. 11C, the insulating film $252A$ needs to be deposited on the bottom surface and the side surface of the opening formed in the insulator $280$ and the like so as to have good coverage. In particular, it is preferable that the insulating film $252A$ be deposited on the top surface and the side surface of the oxide $230$ and the side surface of the conductor $242$ so as to have good coverage. An atomic layer can be deposited one by one on the bottom surface and the side surface of the opening, whereby the insulating film $252A$ can be formed in the opening with good coverage.

When the insulating film $252A$ is deposited by an ALD method, ozone ($O_3$), oxygen ($O_2$), water ($H_2O$), or the like can be used as the oxidizer. When an oxidizer without containing hydrogen, such as ozone ($O_3$) or oxygen ($O_2$), is used, the amount of hydrogen diffusing into the oxide $230b$ can be reduced.

In this embodiment, aluminum oxide is deposited for the insulating film $252A$ by a thermal ALD method.

Next, it is preferable to perform microwave treatment in an atmosphere containing oxygen (see FIG. 11A to FIG. 11D). Here, the microwave treatment refers to, for example, treatment using an apparatus including a power source that generates high-density plasma with the use of a microwave. Note that in this specification and the like, a microwave refers to an electromagnetic wave having a frequency greater than or equal to 300 MHz and less than or equal to 300 GHz.

Here, dotted lines in FIG. 11B to FIG. 11D indicate high-frequency waves such as microwaves or RF, oxygen plasma, oxygen radicals, or the like. The microwave treatment is preferably performed with a microwave treatment apparatus including a power source for generating high-density plasma using microwaves, for example. Here, the frequency of the microwave treatment apparatus is set to greater than or equal to 300 MHz and less than or equal to 300 GHz, preferably greater than or equal to 2.4 GHz and less than or equal to 2.5 GHZ, for example, 2.45 GHz. Oxygen radicals at a high density can be generated with high-density plasma. The electric power of the power source that applies microwaves of the microwave treatment apparatus is set to higher than or equal to 1000 W and lower than or equal to 10000 W, preferably higher than or equal to 2000 W and lower than or equal to 5000 W. A power source may be provided to the microwave treatment apparatus to apply RF to the substrate side. Furthermore, application of RF to the substrate side allows oxygen ions generated by the high-density plasma to be introduced into the oxide $230b$ efficiently.

The microwave treatment is preferably performed under reduced pressure, and the pressure may be higher than or equal to 10 Pa and lower than or equal to 1000 Pa, preferably higher than or equal to 300 Pa and lower than or equal to 700 Pa. The treatment temperature may be lower than or equal to 750° C., preferably lower than or equal to 500° C., and is approximately 400° C., for example. The oxygen plasma treatment can be followed successively by heat treatment without exposure to air. For example, the heat treatment may be performed at higher than or equal to 100° C. and lower than or equal to 750° C., preferably higher than or equal to 300° C. and lower than or equal to 500° C.

Furthermore, the microwave treatment is performed using an oxygen gas and an argon gas, for example. Here, the oxygen flow rate ratio ($O_2/(O_2+Ar)$) is higher than 0% and lower than or equal to 100%. The oxygen flow rate ratio ($O_2/(O_2+Ar)$) is preferably higher than 0% and lower than or equal to 50%. The oxygen flow rate ratio ($O_2/(O_2+Ar)$) is further preferably higher than or equal to 10% and lower than or equal to 40%. The oxygen flow rate ratio ($O_2/(O_2+Ar)$) is still further preferably higher than or equal to 10% and lower than or equal to 30%. The carrier concentration in the region $230bc$ can be reduced by thus performing the microwave treatment in an atmosphere containing oxygen. In addition, the carrier concentrations in the region $230ba$ and the region 230bb can be prevented from being excessively reduced by preventing an excess amount of oxygen from being introduced into the chamber in the microwave treatment.

As illustrated in FIG. 11B to FIG. 11D, the microwave treatment in an oxygen-containing atmosphere can convert an oxygen gas into plasma using a high-frequency wave such as a microwave or RF, and apply the oxygen plasma to a region of the oxide 230b which is between the conductor 242a and the conductor 242b. At this time, the region 230bc can also be irradiated with the high-frequency wave such as the microwave or RF. In other words, the high-frequency oxygen plasma such as a microwave or RF, or the like can be applied to the region 230bc illustrated in FIG. 2A. The effect of the plasma, the microwave, or the like enables VoH in the region 230bc to be cut, and hydrogen to be removed from the region 230bc. That is, VoH contained in the region 230bc can be reduced. As a result, oxygen vacancies and VoH in the region 230bc can be reduced to lower the carrier concentration. In addition, oxygen radicals generated by the oxygen plasma or oxygen contained in the insulator 250 can be supplied to oxygen vacancies formed in the region 230bc, thereby further reducing oxygen vacancies and lowering the carrier concentration in the region 230bc.

Meanwhile, the conductor 242a and the conductor 242b are provided over the region 230ba and the region 230bb illustrated in FIG. 2A. The conductor 242 preferably functions as a blocking film preventing the effect caused by the high-frequency wave such as the microwave or RF, the oxygen plasma, or the like in the microwave treatment in an atmosphere containing oxygen. Therefore, the conductor 242 preferably has a function of blocking an electromagnetic wave greater than or equal to 300 MHz and less than or equal to 300 GHz, for example, greater than or equal to 2.4 GHz and less than or equal to 2.5 GHz.

As illustrated in FIG. 11B to FIG. 11D, the effect of the high-frequency oxygen plasma such as a microwave or RF, or the like is blocked by the conductor 242a and the conductor 242b, and thus does not reach the region 230ba nor the region 230bb. Hence, a reduction in VoH and supply of an excess amount of oxygen due to the microwave treatment do not occur in the region 230ba or the region 230bb, preventing a decrease in carrier concentration.

Furthermore, the insulator 252 having a barrier property against oxygen is provided in contact with the side surfaces of the conductor 242a and the conductor 242b. Thus, formation of oxide films on the side surfaces of the conductor 242a and the conductor 242b by the microwave treatment can be inhibited.

Furthermore, the film quality of the insulator 252 can be improved, leading to higher reliability of the transistor 200.

In the above manner, oxygen vacancies and VoH can be selectively removed from the region 230bc in the oxide semiconductor, whereby the region 230bc can be an i-type or substantially i-type region. Furthermore, supply of an excess amount of oxygen to the region 230ba and the region 230bb functioning as the source region and the drain region can be inhibited and the state of the n-type regions before the microwave treatment is performed can be maintained. As a result, a change in electrical characteristics of the transistor 200 can be inhibited, and thus a variation in electrical characteristics of the transistor 200 in the substrate plane can be inhibited.

In the microwave treatment, thermal energy is directly transmitted to the oxide 230b in some cases owing to an electromagnetic interaction between the microwave and a molecule in the oxide 230b. The oxide 230b might be heated by this thermal energy. Such heat treatment is sometimes referred to as microwave annealing. When microwave treatment is performed in an atmosphere containing oxygen, an effect equivalent to that of oxygen annealing is sometimes obtained. In the case where hydrogen is contained in the oxide 230b, it is probable that the thermal energy is transmitted to the hydrogen in the oxide 230b and the hydrogen activated by the energy is released from the oxide 230b.

Next, an insulating film 250A is deposited (see FIG. 12A to FIG. 12D). Heat treatment may be performed before the deposition of the insulating film 250A; the heat treatment may be performed under reduced pressure, and the insulating film 250A may be successively deposited without exposure to the air. The heat treatment is preferably performed in an oxygen-containing atmosphere. Such treatment can remove moisture and hydrogen adsorbed onto the surface of the insulating film 252A and the like, and further can reduce the moisture concentration and the hydrogen concentration in the oxide 230a and the oxide 230b. The heat treatment is preferably performed at a temperature higher than or equal to 100° C. and lower than or equal to 400° C.

The insulating film 250A can be deposited by a sputtering method, a CVD method, a PECVD method, an MBE method, a PLD method, an ALD method, or the like. The insulating film 250A is preferably deposited by a deposition method using a gas in which hydrogen atoms are reduced or removed. This can reduce the hydrogen concentration in the insulating film 250A. The hydrogen concentration in the insulating film 250A is preferably reduced because the insulating film 250A becomes the insulator 250 that faces the oxide 230b with the insulator 252 with a small thickness therebetween, in a later step.

In this embodiment, silicon oxynitride is deposited for the insulating film 250A by a PECVD method.

In the case where the insulator 250 has a two-layer structure as illustrated in FIG. 2B, an insulating film to be the insulator 250b may be deposited after the deposition of the insulating film 250A. The insulating film to be the insulator 250b can be deposited by a sputtering method, a CVD method, an MBE method, a PLD method, an ALD method, or the like. The insulating film to be the insulator 250b is preferably formed using an insulator having a function of inhibiting diffusion of oxygen. With such a structure, oxygen contained in the insulator 250a can be inhibited from diffusing into the conductor 260. That is, a reduction in the amount of oxygen supplied to the oxide 230 can be inhibited. In addition, oxidation of the conductor 260 due to oxygen contained in the insulator 250a can be inhibited. The insulating film to be the insulator 250b can be provided using a material similar to that for the insulator 222. For example, hafnium oxide may be deposited by a thermal ALD method for the insulating film to be the insulator 250b.

After the insulating film 250A is deposited, microwave treatment may be performed (see FIG. 12A to FIG. 12D). For the microwave treatment, the conditions for the microwave treatment performed after the deposition of the insulating film 252A may be used. Alternatively, microwave treatment may be performed after the deposition of the insulating film 250A, without the microwave treatment performed after the deposition of the insulating film 252A. In the case where the insulating film to be the insulator 250b is provided as described above, microwave treatment may be performed after the deposition of the insulating film to be the insulator 250b. For the microwave treatment, the conditions for the microwave treatment performed after the deposition of the insulating film 252A may be used. Alternatively, microwave treatment may be performed after the deposition of the insulating film to be the insulator 250*b*, without the microwave treatment performed after the deposition of the insulating film 252A or the insulating film 250A.

Heat treatment may be performed while the reduced pressure is maintained after each of microwave treatment after the deposited of the insulating film 252A and the insulating film 250A and microwave treatment after the deposited of the insulating film to be the insulator 250*b*. Such treatment enables hydrogen in the insulating film 252A, the insulating film 250A, the insulating film to be the insulator 250*b*, the oxide 230*b*, and the oxide 230*a* to be removed efficiently. Part of hydrogen is gettered by the conductor 242 (the conductor 242*a* and the conductor 242*b*) in some cases. Alternatively, the step of performing microwave treatment and then performing heat treatment with the reduced pressure being maintained may be repeated a plurality of cycles. The repetition of the heat treatment enables hydrogen in the insulating film 252A, the insulating film 250A, the insulating film to be the insulator 250*b*, the oxide 230*b*, and the oxide 230*a* to be removed more efficiently. Note that the temperature of the heat treatment is preferably higher than or equal to 300° ° C. and lower than or equal to 500° C. The microwave treatment, i.e., the microwave annealing may also serve as the heat treatment. The heat treatment is not necessarily performed in the case where the oxide 230*b* and the like are adequately heated by the microwave annealing.

Furthermore, the microwave treatment improves the film quality of the insulating film 252A, the insulating film 250A and the insulating film to be the insulator 250*b*, thereby inhibiting diffusion of hydrogen, water, impurities, and the like. Accordingly, hydrogen, water, impurities, and the like can be inhibited from diffusing into the oxide 230*b*, the oxide 230*a*, and the like through the insulator 252 in a later step such as formation of a conductive film to be the conductor 260 or later treatment such as heat treatment.

Next, an insulating film 254A is deposited (see FIG. 13A to FIG. 13D). The insulating film 254A can be deposited by a sputtering method, a CVD method, an MBE method, a PLD method, an ALD method, or the like. Like the insulating film 252A, the insulating film 254A is preferably deposited by an ALD method. By an ALD method, the insulating film 254A can be deposited to have small thickness and good coverage. In this embodiment, for the insulating film 254A, silicon nitride is deposited by a PEALD method.

Next, a conductive film to be the conductor 260*a* and a conductive film to be the conductor 260*b* are deposited in this order. The conductive film to be the conductor 260*a* and the conductive film to be the conductor 260*b* can be deposited by a sputtering method, a CVD method, an MBE method, a PLD method, an ALD method, or the like. In this embodiment, titanium nitride is deposited for the conductive film to be the conductor 260*a* by an ALD method, and tungsten is deposited for the conductive film to be the conductor 260*b* by a CVD method.

Then, the insulating film 252A, the insulating film 250A, the insulating film 254A, the conductive film to be the conductor 260*a*, and the conductive film to be the conductor 260*b* are polished by CMP treatment until the insulator 280 is exposed, whereby the insulator 252, the insulator 250, the insulator 254, and the conductor 260 (the conductor 260*a* and the conductor 260*b*) are formed (see FIG. 14A to FIG. 14D). Accordingly, the insulator 252 is placed to cover the opening reaching the oxide 230*b*. The conductor 260 is placed to fill the opening with the insulator 252, the insulator 250, and the insulator 254 therebetween.

Then, heat treatment may be performed under conditions similar to those for the above heat treatment. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be deposited successively without exposure to the air.

Next, the insulator 282 is formed over the insulator 252, the insulator 250, the insulator 254, the conductor 260, and the insulator 280 (see FIG. 14A to FIG. 14D). The insulator 282 can be deposited by a sputtering method, a CVD method, an MBE method, a PLD method, an ALD method, or the like. The insulator 282 is preferably deposited by a sputtering method. Since a molecule containing hydrogen is not needed to be used as a deposition gas in the sputtering method, the hydrogen concentration in the insulator 282 can be reduced.

In this embodiment, for the insulator 282, aluminum oxide is deposited by a pulsed DC sputtering method using an aluminum target in an atmosphere containing an oxygen gas. The use of the pulsed DC sputtering method can achieve more uniform film thickness and improve the sputtering rate and film quality.

The insulator 282 is deposited by a sputtering method in an oxygen-containing atmosphere, whereby oxygen can be added to the insulator 280 during the deposition. Thus, excess oxygen can be contained in the insulator 280. At this time, the insulator 282 is preferably deposited while the substrate is being heated.

Next, an etching mask is formed over the insulator 282 by a lithography method and part of the insulator 282, part of the insulator 280, part of the insulator 275, part of the insulator 222, and part of the insulator 216 are processed until the top surface of the insulator 214 is exposed (see FIG. 15A to FIG. 15D). Wet etching can be used for the processing; however, dry etching is preferably used for microfabrication.

Next, heat treatment may be performed. The heat treatment is performed at higher than or equal to 250° C. and lower than or equal to 650° C., preferably higher than or equal to 350° C. and lower than or equal to 600° C. The heat treatment is preferably performed at a temperature lower than that of the heat treatment performed after the deposition of the oxide film 230B. Note that the heat treatment is performed in an atmosphere of a nitrogen gas or an inert gas. By the heat treatment, part of oxygen added to the insulator 280 is diffused into the oxide 230 through the insulator 250 and the like.

By the heat treatment, oxygen contained in the insulator 280 and hydrogen bonded to the oxygen can be released to the outside from the side surface of the insulator 280 formed by the processing of the insulator 282, the insulator 280, the insulator 275, the insulator 222, and the insulator 216. Note that the hydrogen bonded to oxygen is released as water. Thus, unnecessary oxygen and hydrogen contained in the insulator 280 can be reduced.

In a region of the oxide 230 that overlaps with the conductor 260, the insulator 252 is provided to be in contact with the top surface and the side surface of the oxide 230. Since the insulator 252 has a barrier property against oxygen, diffusion of an excess amount of oxygen into the oxide 230 can be reduced. Thus, oxygen can be supplied to the region 230*bc* or in the vicinity of the region 230*bc*, without supply of an excess amount of oxygen. Accordingly, oxygen vacancies and VoH formed in the region 230bc can be reduced while oxidation of the side surface of the conductor 242 due to excess oxygen can be inhibited. Thus, the transistor 200 can have good electrical characteristics and higher reliability.

On the other hand, in the case where the transistors 200 are integrated at a high density, the volume of the insulator 280 becomes excessively small with respect to one transistor 200 in some cases. In this case, the amount of oxygen diffusing into the oxide 230 in the heat treatment becomes significantly small. When the oxide 230 is heated while being in contact with the oxide insulator (e.g., the insulator 250) which does not contain sufficient oxygen, oxygen contained in the oxide 230 might be released. However, in the transistor 200 described in this embodiment, the insulator 252 is provided in contact with the top surface and the side surface of the oxide 230 in the region of the oxide 230 that overlaps with the conductor 260. Since the insulator 252 has a barrier property against oxygen, release of the oxygen from the oxide 230 can be reduced also in the heat treatment. Thus, the amount of oxygen vacancies and VoH formed in the region 230bc can be reduced. Thus, the transistor 200 can have good electrical characteristics and higher reliability.

As described above, in either case of a large or small amount of oxygen supplied from the insulator 280 in the semiconductor device of this embodiment, a transistor having good electric characteristics and high reliability can be formed. Thus, a semiconductor device with a reduced variation in electrical characteristics of the transistors 200 in the substrate plane can be provided.

Next, the insulator 283 is formed over the insulator 282 (see FIG. 16A to FIG. 16D). The insulator 283 can be formed by a sputtering method, a CVD method, an MBE method, a PLD method, an ALD method, or the like. The insulator 283 is preferably formed by a sputtering method. By using a sputtering method that does not need to use a molecule containing hydrogen as a deposition gas, the hydrogen concentration in the insulator 283 can be reduced. The insulator 283 may be a multilayer. For example, silicon nitride may be deposited by a sputtering method and silicon nitride may be deposited over the silicon nitride by an ALD method. Surrounding the transistor 200 by the insulator 283 and the insulator 214 that have a high barrier property can prevent entry of moisture and hydrogen from the outside.

Next, the insulator 274 is deposited over the insulator 283. The insulator 274 can be deposited by a sputtering method, a CVD method, an MBE method, a PLD method, an ALD method, or the like. In this embodiment, for the insulator 274, silicon oxide is deposited by a CVD method.

Next, the insulator 274 is polished by CMP treatment until the insulator 283 is exposed, whereby the top surface of the insulator 274 is planarized (see FIG. 16A to FIG. 16D). The top surface of the insulator 283 is partly removed by the CMP treatment in some cases.

Next, the insulator 285 is formed over the insulator 274 and the insulator 283 (see FIG. 17A to FIG. 17D). The insulator 285 can be deposited by a sputtering method, a CVD method, an MBE method, a PLD method, an ALD method, or the like. The insulator 285 is preferably deposited by a sputtering method. By using a sputtering method that does not need to use a molecule containing hydrogen as a deposition gas, the hydrogen concentration in the insulator 285 can be reduced.

In this embodiment, for the insulator 285, silicon oxide is deposited by a sputtering method.

Subsequently, openings reaching the conductor 242 are formed in the insulator 271, the insulator 275, the insulator 280, the insulator 282, the insulator 283, and the insulator 285 (see FIG. 17A and FIG. 17B). The openings can be formed by a lithography method. Note that the openings in the top view in FIG. 17A have a circular shape; however, the shapes of the openings are not limited thereto. For example, the openings in the top view may have an almost circular shape such as an elliptical shape, a polygonal shape such as a quadrangular shape, or a polygonal shape such as a quadrangular shape with rounded corners.

Subsequently, an insulating film to be the insulator 241 is deposited and the insulating film is subjected to anisotropic etching, so that the insulator 241 is formed (see FIG. 17B). The insulating film can be deposited by a sputtering method, a CVD method, an MBE method, a PLD method, an ALD method, or the like. As the insulating film, an insulating film having a function of inhibiting passage of oxygen is preferably used. For example, preferably, aluminum oxide is deposited by an ALD method and silicon nitride is deposited thereover by a PEALD method. Silicon nitride is preferable because it has a high blocking property against hydrogen.

As an anisotropic etching for the insulating film to be the insulator 241, a dry etching method may be employed, for example. When the insulator 241 is provided on the sidewall portions of the openings, passage of oxygen from the outside can be inhibited and oxidation of the conductor 240a and the conductor 240b to be formed next can be prevented. Furthermore, impurities such as water and hydrogen contained in the insulator 280 or the like can be prevented from diffusing into the conductor 240a and the conductor 240b.

Next, a conductive film to be the conductor 240a and the conductor 240b is deposited. The conductive film desirably has a stacked-layer structure which includes a conductor having a function of inhibiting passage of impurities such as water and hydrogen. For example, a stacked layer of tantalum nitride, titanium nitride, or the like and tungsten, molybdenum, copper, or the like can be employed. The conductive film can be deposited by a sputtering method, a CVD method, an MBE method, a PLD method, an ALD method, or the like.

Then, part of the conductive film to be the conductor 240a and the conductor 240b is removed by CMP treatment to expose the top surface of the insulator 285. As a result, the conductive film remains only in the openings, so that the conductor 240a and the conductor 240b having flat top surfaces can be formed (see FIG. 17A to FIG. 17D). Note that part of the top surface of the insulator 285 is sometimes removed by the CMP treatment.

Next, a conductive film to be the conductor 246 is deposited. The conductive film can be deposited by a sputtering method, a CVD method, an MBE method, a PLD method, an ALD method, or the like.

Then, the conductive film to be the conductor 246 is processed by a lithography method, thereby forming the conductor 246a in contact with the top surface of the conductor 240a and the conductor 246b in contact with the top surface of the conductor 240b. At this time, part of the insulator 285 in a region where the insulator 285 does not overlap with the conductor 246a or the conductor 246b is sometimes removed.

Through the above process, the semiconductor device including the transistor 200 illustrated in FIG. 1A to FIG. 1D can be manufactured. As illustrated in FIG. 6A to FIG. 17D, the transistor 200 can be manufactured in accordance with the method for manufacturing the semiconductor device described in this embodiment.

<Microwave Treatment Apparatus>

A microwave treatment apparatus that can be used for the above method for manufacturing the semiconductor device is described below.

First, a structure of a manufacturing apparatus that hardly allows entry of impurities in manufacturing a semiconductor device or the like is described with reference to FIG. 18 to FIG. 21.

Figure 18:
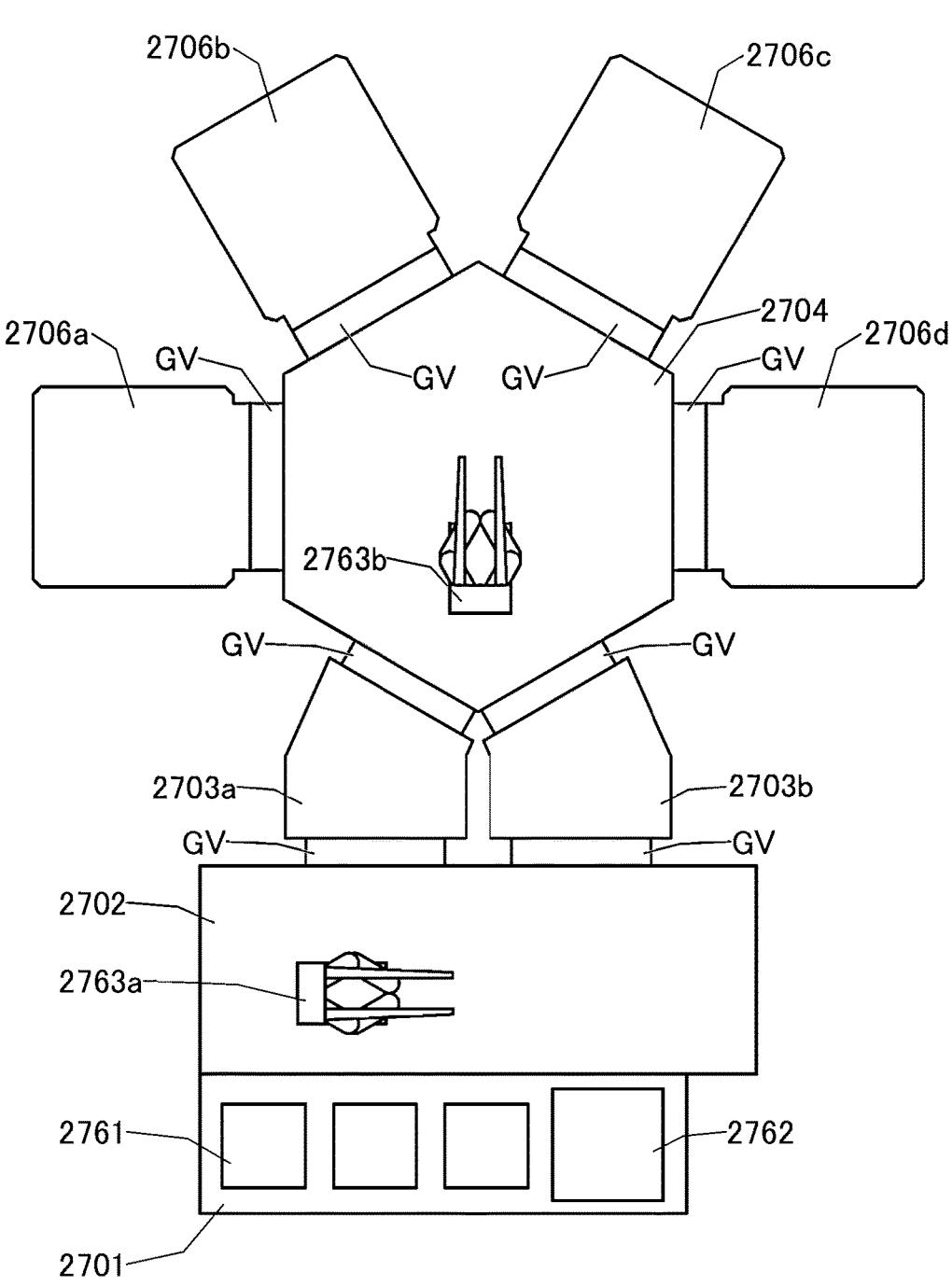
FIG. 18 is a top view illustrating a microwave treatment apparatus of one embodiment of the present invention.

FIG. 18 schematically illustrates a top view of a single wafer multi-chamber manufacturing apparatus 2700. The manufacturing apparatus 2700 includes an atmosphere-side substrate supply chamber 2701 including a cassette port 2761 for storing a substrate and an alignment port 2762 for performing alignment of a substrate; an atmosphere-side substrate transfer chamber 2702 for transferring a substrate from the atmosphere-side substrate supply chamber 2701; a load lock chamber 2703a for carrying in a substrate and switching the pressure inside the chamber from atmospheric pressure to reduced pressure or from reduced pressure to atmospheric pressure; an unload lock chamber 2703b for carrying out a substrate and switching the pressure inside the chamber from reduced pressure to atmospheric pressure or from atmospheric pressure to reduced pressure; a transfer chamber 2704 for transferring a substrate in a vacuum; a chamber 2706a; a chamber 2706b; a chamber 2706c; and a chamber 2706d.

Furthermore, the atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the chamber 2706a, the chamber 2706b, the chamber 2706c, and the chamber 2706d.

Note that gate valves GV are provided in connecting portions between the chambers so that the chambers other than the atmosphere-side substrate supply chamber 2701 and the atmosphere-side substrate transfer chamber 2702 can be each independently kept in a vacuum state. Furthermore, the atmosphere-side substrate transfer chamber 2702 is provided with a transfer robot 2763a, and the transfer chamber 2704 is provided with a transfer robot 2763b. With the transfer robot 2763a and the transfer robot 2763b, a substrate can be transferred inside the manufacturing apparatus 2700.

The back pressure (total pressure) in the transfer chamber 2704 and each of the chambers is, for example, lower than or equal to $1\times10^{-4}$ Pa, preferably lower than or equal to $3\times10^{-5}$ Pa, further preferably lower than or equal to $1\times10^{-5}$ Pa. Furthermore, the partial pressure of a gas molecule (atom) having a mass-to-charge ratio (m/z) of 18 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa. Furthermore, the partial pressure of a gas molecule (atom) having m/z of 28 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa. Furthermore, the partial pressure of a gas molecule (atom) having m/z of 44 in the transfer chamber 2704 and each of the chambers is, for example, lower than or equal to $3\times10^{-5}$ Pa, preferably lower than or equal to $1\times10^{-5}$ Pa, further preferably lower than or equal to $3\times10^{-6}$ Pa.

Note that the total pressure and the partial pressure in the transfer chamber 2704 and each of the chambers can be measured using an ionization vacuum gauge, a mass analyzer, or the like.

Furthermore, the transfer chamber 2704 and the chambers each desirably have a structure in which the amount of external leakage or internal leakage is small. For example, the leakage rate in the transfer chamber 2704 is less than or equal to $1\times10^{0}$ Pa/min, preferably less than or equal to $5\times10^{-1}$ Pa/min. Furthermore, the leakage rate in each chamber is less than or equal to $1\times10^{-1}$ Pa/min, preferably less than or equal to $5\times10^{-2}$ Pa/min.

Note that a leakage rate can be derived from the total pressure and partial pressure measured using the ionization vacuum gauge, the mass analyzer, or the like. For example, the leakage rate is preferably derived from the total pressure at the time when 10 minutes have passed from the start of evacuation to a vacuum using a vacuum pump such as a turbo molecular pump and the total pressure at the time when 10 minutes have passed from the operation of closing the valve. Note that the total pressure at the time when 10 minutes have passed from the start of evacuation to a vacuum is preferably an average value of the total pressures measured a plurality of times.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or released gas from an internal member. Measures need to be taken from both aspects of external leakage and internal leakage in order that the leakage rate can be set to less than or equal to the above-described value.

For example, open/close portions of the transfer chamber 2704 and each of the chambers are preferably sealed with a metal gasket. For the metal gasket, metal covered with iron fluoride, aluminum oxide, or chromium oxide is preferably used. The metal gasket achieves higher adhesion than an O-ring and can reduce the external leakage. Furthermore, with the use of passive metal covered with iron fluoride, aluminum oxide, chromium oxide, or the like, the release of gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of gas containing impurities, is used. Furthermore, an alloy containing iron, chromium, nickel, and the like covered with the above-described metal, which releases a small amount of gas containing impurities, may be used. The alloy containing iron, chromium, nickel, and the like is rigid, resistant to heat, and suitable for processing. Here, when surface unevenness of the member is reduced by polishing or the like to reduce the surface area, the release of gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of gas.

An adsorbed substance present in the transfer chamber 2704 and each of the chambers does not affect the pressure in the transfer chamber 2704 and each of the chambers because it is adsorbed onto an inner wall or the like; however, it causes a release of gas when the transfer chamber 2704 and each of the chambers are evacuated. Thus, although there is no correlation between the leakage rate and the exhaust rate, it is important that the adsorbed substance present in the transfer chamber 2704 and each of the chambers be desorbed as much as possible and exhaust be performed in advance with the use of a pump having high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure in the transfer chamber 2704 and each of the chambers. The introduction of the heated gas can desorb the adsorbed substance in the transfer chamber 2704 and each of the chambers, and impurities present in the transfer chamber 2704 and each of the chambers can be reduced. Note that this treatment is effective when repeated more than or equal to 2 times and less than or equal to 30 times, preferably more than or equal to 5 times and less than or equal to 15 times. Specifically, an inert gas, oxygen, or the like at a temperature higher than or equal to 40° C. and lower than or equal to 400° C., preferably higher than or equal to 50° ° C. and lower than or equal to 200° C. is introduced, so that the pressure in the transfer chamber 2704 and each of the chambers can be kept to be higher than or equal to 0.1 Pa and lower than or equal to 10 kPa, preferably higher than or equal to 1 Pa and lower than or equal to 1 kPa, further preferably higher than or equal to 5 Pa and lower than or equal to 100 Pa in the time range of 1 minute to 300 minutes, preferably 5 minutes to 120 minutes. After that, the transfer chamber 2704 and each of the chambers are evacuated in the time range of 5 minutes to 300 minutes, preferably 10 minutes to 120 minutes.

Figure 19:
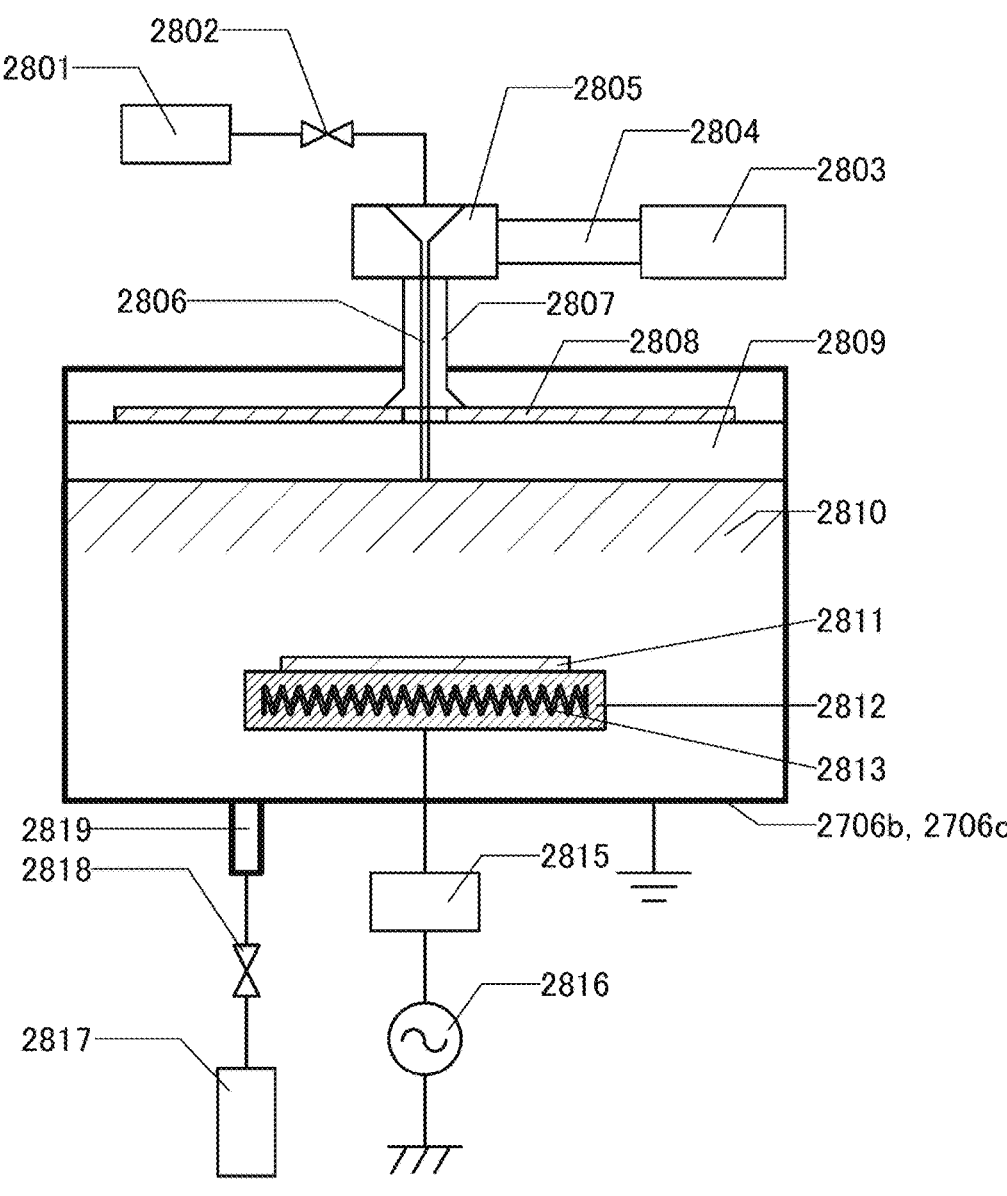
FIG. 19 is a cross-sectional view illustrating a microwave treatment apparatus of one embodiment of the present invention.

Next, the chamber 2706b and the chamber 2706c are described with reference to a schematic cross-sectional view illustrated in FIG. 19.

The chamber 2706b and the chamber 2706c are chambers in which microwave treatment can be performed on an object, for example. Note that the chamber 2706b is different from the chamber 2706c only in the atmosphere in performing the microwave treatment. The other structures are common and thus collectively described below.

The chamber 2706b and the chamber 2706c each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706b and the chamber 2706c, for example.

The high-frequency generator 2803 is connected to the mode converter 2805 through the waveguide 2804. The mode converter 2805 is connected to the slot antenna plate 2808 through the waveguide 2807. The slot antenna plate 2808 is placed in contact with the dielectric plate 2809.

Furthermore, the gas supply source 2801 is connected to the mode converter 2805 through the valve 2802. Then, gas is transferred to the chamber 2706b and the chamber 2706c through the gas pipe 2806 that runs through the mode converter 2805, the waveguide 2807, and the dielectric plate 2809. Furthermore, the vacuum pump 2817 has a function of exhausting gas or the like from the chamber 2706b and the chamber 2706c through the valve 2818 and the exhaust port 2819. Furthermore, the high-frequency power source 2816 is connected to the substrate holder 2812 through the matching box 2815.

The substrate holder 2812 has a function of holding a substrate 2811. For example, the substrate holder 2812 has a function of an electrostatic chuck or a mechanical chuck for holding the substrate 2811. Furthermore, the substrate holder 2812 has a function of an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2817, a cryotrap may be used. The use of the cryopump and the cryotrap is particularly preferable because water can be efficiently exhausted.

Furthermore, for example, the heating mechanism 2813 may be a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, preferably −100° C. or lower is preferably used. For example, an oxygen gas, a nitrogen gas, or a rare gas (an argon gas or the like) is used.

As the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high density region of high-density plasma 2810 described later; thus, provision of the protective layer can reduce the damage. Consequently, an increase in the number of particles or the like during the treatment can be suppressed.

The high-frequency generator 2803 has a function of generating a microwave at, for example, higher than or equal to 0.3 GHz and lower than or equal to 3.0 GHZ, higher than or equal to 0.7 GHz and lower than or equal to 1.1 GHZ, or higher than or equal to 2.2 GHz and lower than or equal to 2.8 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave passes through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF (Radio Frequency) power source with a frequency of 13.56 MHz, 27.12 MHz, or the like may be used, for example. The application of a bias to the substrate side allows ions in the high-density plasma 2810 to efficiently reach a deep portion of an opening portion of the film or the like over the substrate 2811.

For example, in the chamber 2706*b* or the chamber 2706*c*, oxygen radical treatment using the high-density plasma 2810 can be performed by introducing oxygen from the gas supply source 2801.

Figure 20:
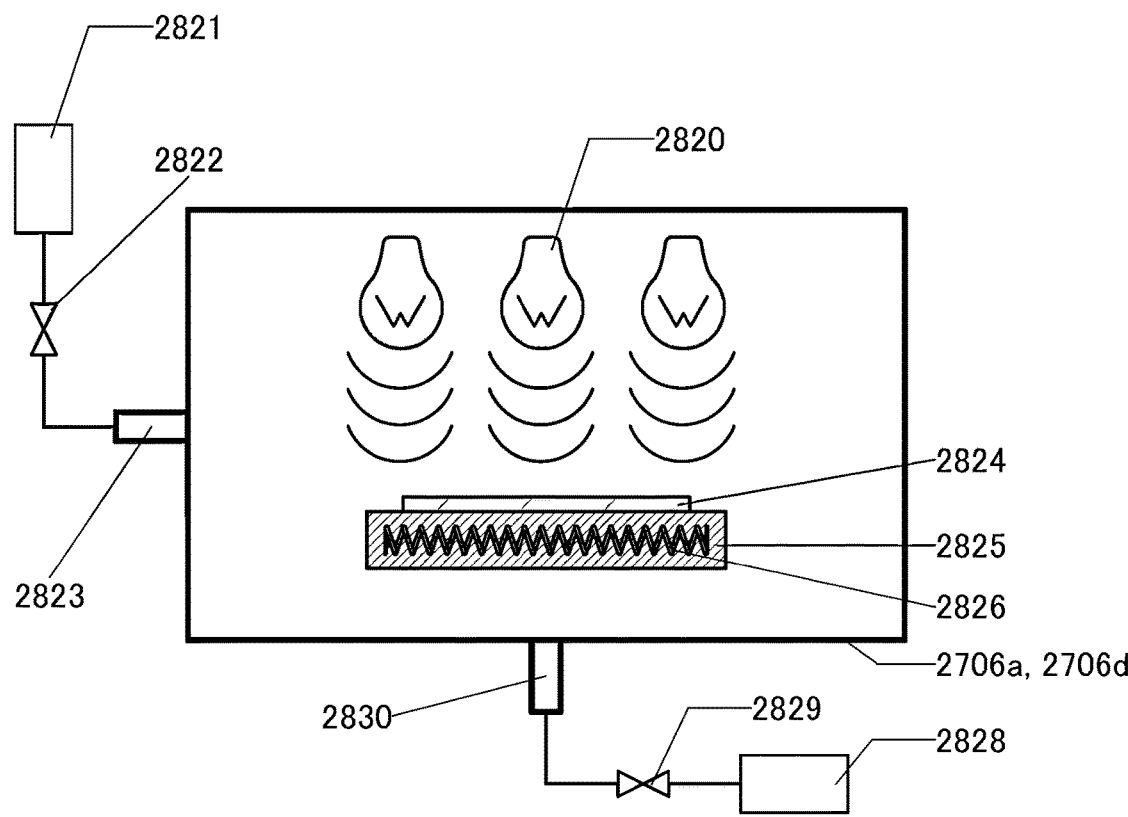
FIG. 20 is a cross-sectional view illustrating a microwave treatment apparatus of one embodiment of the present invention.
Figure 21:
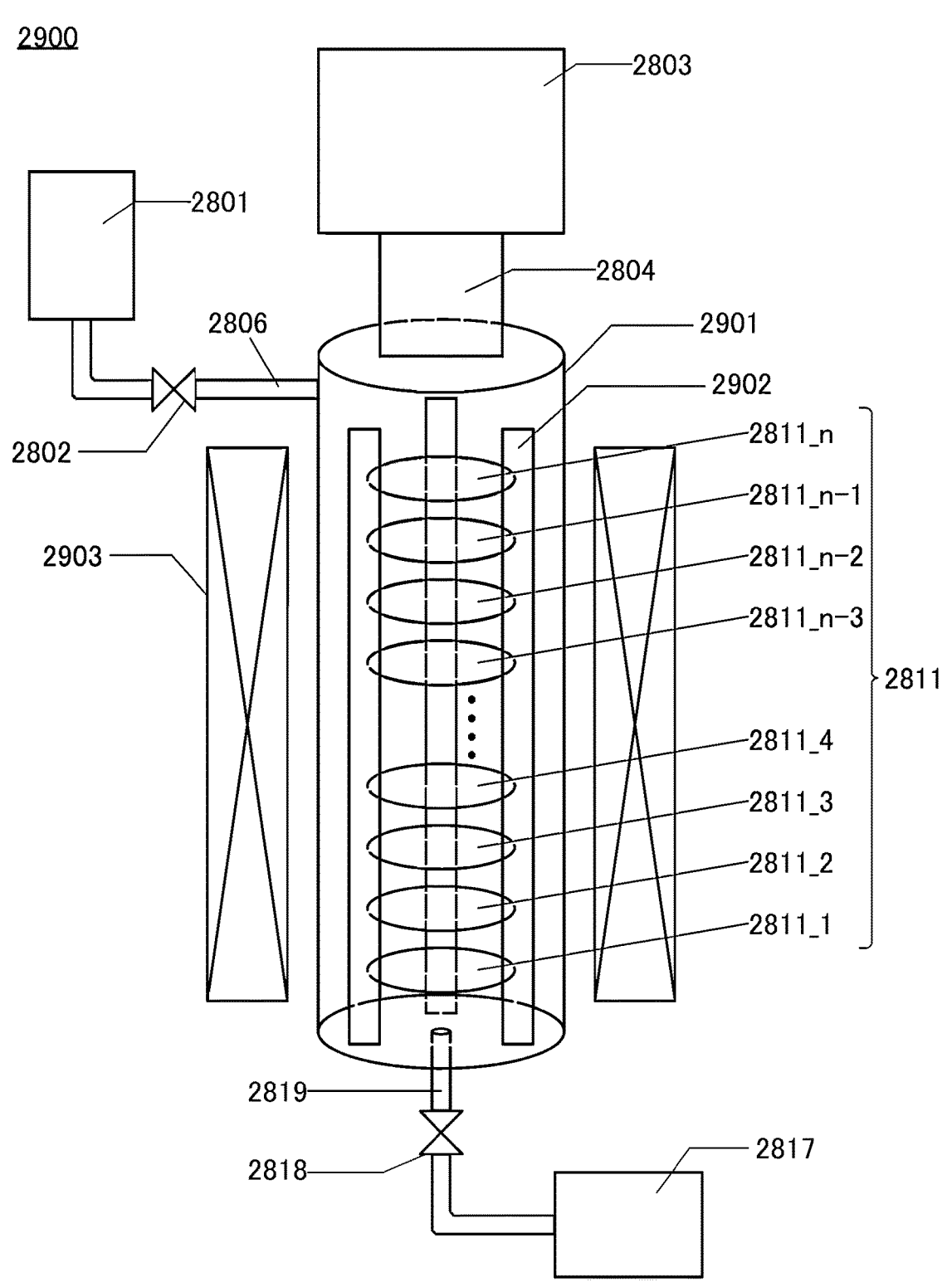
FIG. 21 is a cross-sectional view illustrating a microwave treatment apparatus of one embodiment of the present invention.

Next, the chamber 2706*a* and the chamber 2706*d* are described with reference to a schematic cross-sectional view illustrated in FIG. 20.

The chamber 2706*a* and the chamber 2706*d* are chambers in which an object can be irradiated with an electromagnetic wave, for example. Note that the chamber 2706*a* is different from the chamber 2706*d* only in the kind of the electromagnetic wave. The other structures have many common portions and thus are collectively described below.

The chamber 2706*a* and the chamber 2706*d* each include one or more lamps 2820, a substrate holder 2825, a gas inlet 2823, and an exhaust port 2830. Furthermore, a gas supply source 2821, a valve 2822, a vacuum pump 2828, and a valve 2829 are provided outside the chamber 2706*a* and the chamber 2706*d*, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of emitting an electromagnetic wave such as visible light or ultraviolet light may be used, for example. For example, a light source having a function of emitting an electromagnetic wave which has a peak at a wavelength longer than or equal to 10 nm and shorter than or equal to 2500 nm, longer than or equal to 500 nm and shorter than or equal to 2000 nm, or longer than or equal to 40 nm and shorter than or equal to 340 nm may be used.

As the lamp 2820, a light source such as a halogen lamp, a metal halide lamp, a xenon arc lamp, a carbon arc lamp, a high-pressure sodium lamp, or a high-pressure mercury lamp can used, for example.

For example, part or the whole of electromagnetic wave emitted from the lamp 2820 is absorbed by the substrate 2824, so that the quality of a film or the like over the substrate 2824 can be modified. For example, generation or reduction of defects or removal of impurities can be performed. Note that generation or reduction of defects, removal of impurities, or the like can be efficiently performed while the substrate 2824 is heated.

Alternatively, for example, the electromagnetic wave emitted from the lamp 2820 may generate heat in the substrate holder 2825 to heat the substrate 2824. In this case, the substrate holder 2825 does not need to include the heating mechanism 2826 therein.

For the vacuum pump 2828, refer to the description of the vacuum pump 2817. Furthermore, for the heating mechanism 2826, refer to the description of the heating mechanism 2813. Furthermore, for the gas supply source 2821, refer to the description of the gas supply source 2801.

A microwave treatment apparatus that can be used in this embodiment is not limited to the above. A microwave treatment apparatus 2900 illustrated in FIG. 21 can be used. The microwave treatment apparatus 2900 includes a quartz tube 2901, the exhaust port 2819, the gas supply source 2801, the valve 2802, the high-frequency generator 2803, the waveguide 2804, the gas pipe 2806, the vacuum pump 2817, and the valve 2818. Furthermore, the microwave treatment apparatus 2900 includes a substrate holder 2902 that holds a plurality of substrates 2811 (2811_1 to 2811_*n*, n is an integer greater than or equal to 2) in the quartz tube 2901. The microwave treatment apparatus 2900 may further include a heating means 2903 outside the quartz tube 2901.

The substrate provided in the quartz tube 2901 is irradiated with the microwave generated by the high-frequency generator 2803, through the waveguide 2804. The vacuum pump 2817 is connected to the exhaust port 2819 through the valve 2818 and can adjust the pressure inside the quartz tube 2901. The gas supply source 2801 is connected to the gas pipe 2806 through the valve 2802 and can introduce a desired gas into the quartz tube 2901. The heating means 2903 can heat the substrate 2811 in the quartz tube 2901 to a desired temperature. Alternatively, the heating means 2903 may heat the gas which is supplied from the gas supply source 2801. With the use of the microwave treatment apparatus 2900, the substrate 2811 can be subjected to heat treatment and microwave treatment at the same time. Alternatively, the substrate 2811 can be heated and then subjected to microwave treatment. Alternatively, the substrate 2811 can be subjected to microwave treatment and then heat treatment.

All of the substrate 2811_1 to the substrate 2811_*n* may be substrates to be treated where a semiconductor device or a storage device is to be formed, or some of the substrates may be dummy substrates. For example, the substrate 2811_1 and the substrate 2811_*n* may be dummy substrates and the substrate 2811_2 to the substrate 2811_*n*–1 may be substrates to be treated. Alternatively, the substrate 2811_1, the substrate 2811_2, the substrate 2811_*n*–1, and the substrate 2811_*n* may be dummy substrates and the substrate 2811_3 to the substrate 2811_*n*–2 may be substrates to be treated. A dummy substrate is preferably used, in which case a plurality of substrates to be treated can be uniformly treated at the time of microwave treatment or heat treatment and a variation between the substrates to be treated can be reduced. For example, a dummy substrate is preferably placed over the substrate to be treated which is the closest to the high-frequency generator 2803 and the waveguide 2804, in which case the substrate to be treated is inhibited from being directly exposed to a microwave.

With the use of the above-described manufacturing apparatus, the quality of a film or the like can be modified while the entry of impurities into an object is inhibited.

Modification Example of Semiconductor Device

Examples of the semiconductor device of one embodiment of the present invention are described below with reference to FIG. 3A to FIG. 5D.

A of each figure is a top view of the semiconductor device. Moreover, B of each figure is a cross-sectional view corresponding to a portion indicated by dashed-dotted line A1-A2 in A of each figure. Furthermore, C of each figure is a cross-sectional view corresponding to a portion indicated by dashed-dotted line A3-A4 in A of each figure. Furthermore, D of each figure is a cross-sectional view corresponding to a portion indicated by dashed-dotted line A5-A6 in A of each figure. Note that for clarity of the drawing, some components are omitted in the top view of A of each figure.

Note that in the semiconductor device illustrated in A to D of each figure, components having the same functions as the components included in the semiconductor device described in <Structure example of semiconductor device> are denoted by the same reference numerals. Note that the materials described in detail in <Structure example of semiconductor device> can also be used as component materials of the semiconductor devices in this section.

Modification Example 1 of Semiconductor Device

The semiconductor device shown in FIG. 3A to FIG. 3D is a modification example of the semiconductor device illustrated in FIG. 1A to FIG. 1D. The semiconductor device illustrated in FIG. 3A to FIG. 3D differs from the semiconductor device illustrated in FIG. 1A to FIG. 1D in that the insulator 282 is not provided. Thus, in the semiconductor device illustrated in FIG. 3A to FIG. 3D, the insulator 283 is in contact with the top surface of the conductor 260, the top surface of the insulator 280, the uppermost portion of the insulator 254, the uppermost portion of the insulator 250, and the uppermost portion of the insulator 252.

For example, in the case where oxygen can be supplied sufficiently to the oxide 230 by the microwave treatment or the like as illustrated in FIG. 11 or FIG. 12, the region 230$bc$ can be substantially i-type without the insulator 282 for adding oxygen to the insulator 280. In such a case, the structure without the insulator 282 as illustrated in FIG. 3A to FIG. 3D enables the simplification of the manufacturing process and the improvement in productivity of the semiconductor device.

Modification Example 2 of Semiconductor Device

The semiconductor device illustrated in FIG. 4A to FIG. 4D is a modification example of the semiconductor device illustrated in FIG. 1A to FIG. 1D. The semiconductor device illustrated in FIG. 4A to FIG. 4D differs from the semiconductor device illustrated in FIG. 1A to FIG. 1D in that an oxide 243 (an oxide 243$a$ and an oxide 243$b$) is provided. The oxide 243$a$ is provided between the oxide 230$b$ and the conductor 242$a$, and the oxide 243$b$ is provided between the oxide 230$b$ and the conductor 242$b$. The oxide 243$a$ is preferably in contact with the top surface of the oxide 230$b$ and the bottom surface of the conductor 242$a$. The oxide 243$b$ is preferably in contact with the top surface of the oxide 230$b$ and the bottom surface of the conductor 242$b$.

The oxide 243 preferably has a function of inhibiting passage of oxygen. The oxide 243 having a function of inhibiting passage of oxygen is preferably placed between the oxide 230$b$ and the conductor 242 functioning as the source electrode and the drain electrode, in which case the electric resistance between the conductor 242 and the oxide 230$b$ is reduced. Such a structure can improve the electrical characteristics, the field-effect mobility, and the reliability of the transistor 200 in some cases.

A metal oxide containing the element M may be used as the oxide 243. In particular, aluminum, gallium, yttrium, or tin is preferably used as the element M. The concentration of the element M in the oxide 243 is preferably higher than that in the oxide 230$b$. Furthermore, gallium oxide may be used for the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230$b$. The thickness of the oxide 243 is preferably greater than or equal to 0.5 nm and less than or equal to 5 nm, further preferably greater than or equal to 1 nm and less than or equal to 3 nm, still further preferably greater than or equal to 1 nm and less than or equal to 2 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

Modification Example 3 of Semiconductor Device

A semiconductor device illustrated in FIG. 5A to FIG. 5D is a modification example of the semiconductor device illustrated in FIG. 1A to FIG. 1D. The semiconductor device illustrated in FIG. 5A to FIG. 5D differs from the semiconductor device illustrated in FIG. 1A to FIG. 1D in that the insulator 283 is in contact with part of the top surface of the insulator 212. Accordingly, the transistor 200 is placed in a region sealed with the insulator 283 and the insulator 212. With the above structure, entry of hydrogen contained in a region outside the sealed region into the sealed region can be inhibited. Although FIG. 5A to FIG. 5D illustrate the transistor 200 having a structure in which the insulator 212 and the insulator 283 are each provided to have a single-layer structure, the present invention is not limited thereto. For example, the insulator 212 and the insulator 283 may each be provided to have a stacked-layer structure of two or more layers.

A change in electrical characteristics of an OS transistor such as the transistor 200 due to irradiation with radiation is small, i.e., an OS transistor has high tolerance to radiation; thus, an OS transistor can be suitably used even in an environment where radiation can enter. For example, OS transistors can be suitably used in outer space. Specifically, OS transistors can be used as transistors in semiconductor devices provided in a space shuttle, an artificial satellite, a space probe, and the like. Examples of radiation include X-rays and a neutron beam. Outer space refers to, for example, space at an altitude greater than or equal to 100 km, and outer space in this specification may also include thermosphere, mesosphere, and stratosphere.

Alternatively, for example, OS transistors can be used as transistors included in semiconductor devices provided in working robots in a nuclear power plant and a treatment plant or a disposal plant for radioactive wastes. In particular, OS transistors can be favorably used as transistors included in the semiconductor devices provided in remote control robots that are controlled remotely in demolishment of a reactor facility, taking out of a nuclear fuel or a fuel debris, a field investigation on a space with a large amount of radioactive substance, and the like.

Alternatively, for example, OS transistors can be favorably used as transistors included in semiconductor devices provided in electronic devices used for medical care with radial rays. Examples of the electronic device include an X-ray sensing panel in X-ray photography.

Application Example of Semiconductor Device

An example of the semiconductor device of one embodiment of the present invention is described below with reference to FIG. 22.

Figure 22A:
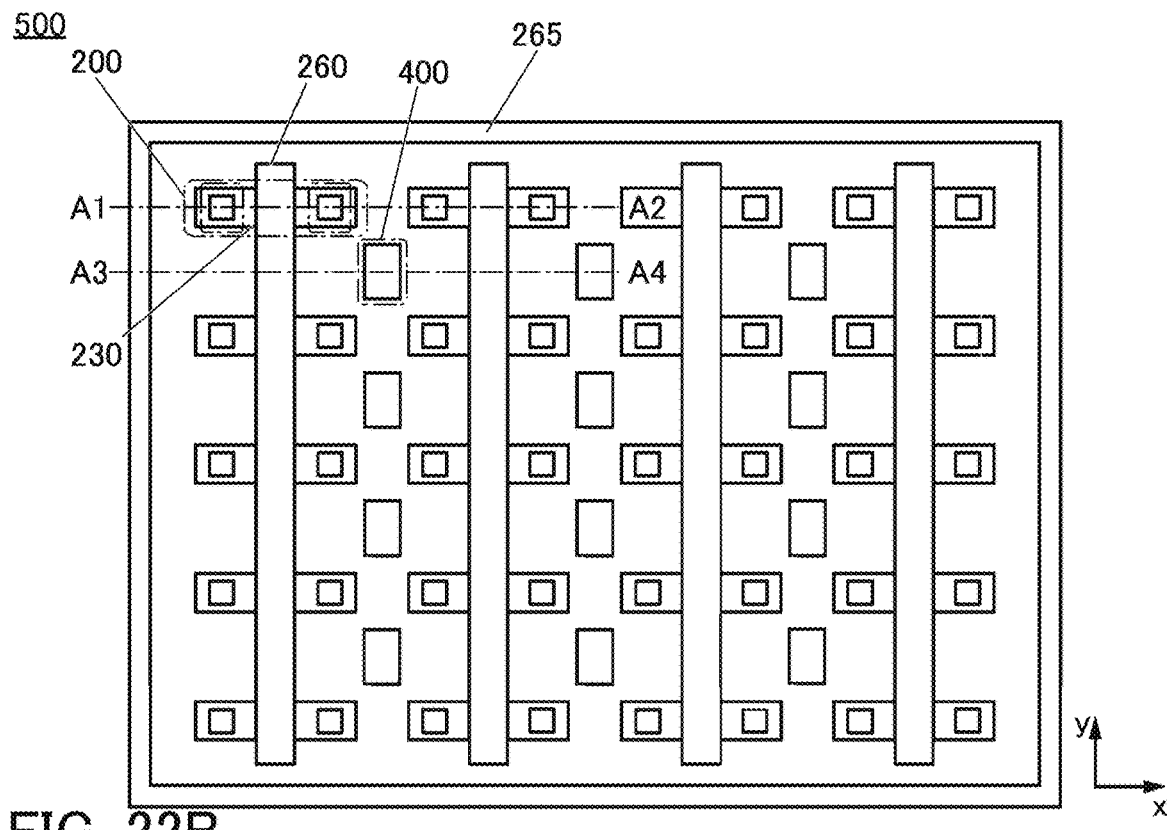
FIG. 22A is a plan view of a semiconductor device of one embodiment of the present invention.
Figure 22B:
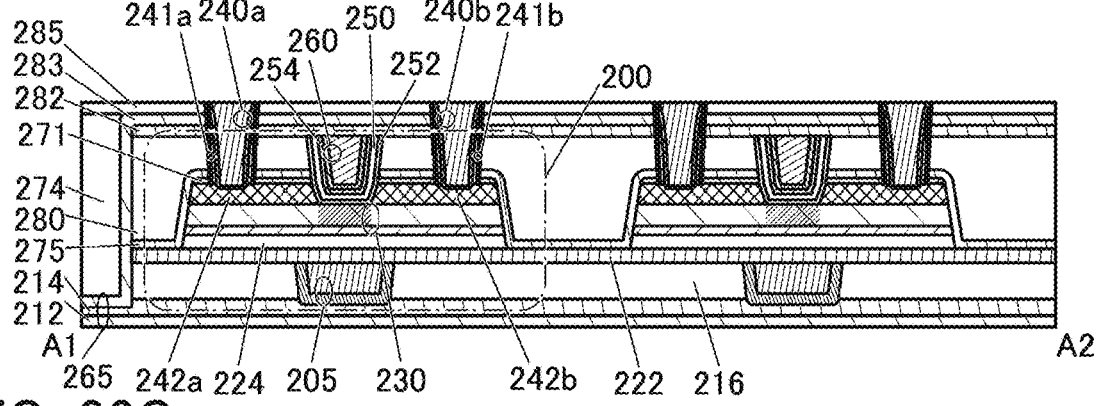
FIG. 22B and FIG. 22C are cross-sectional views of the semiconductor device of one embodiment of the present invention.
Figure 22C:
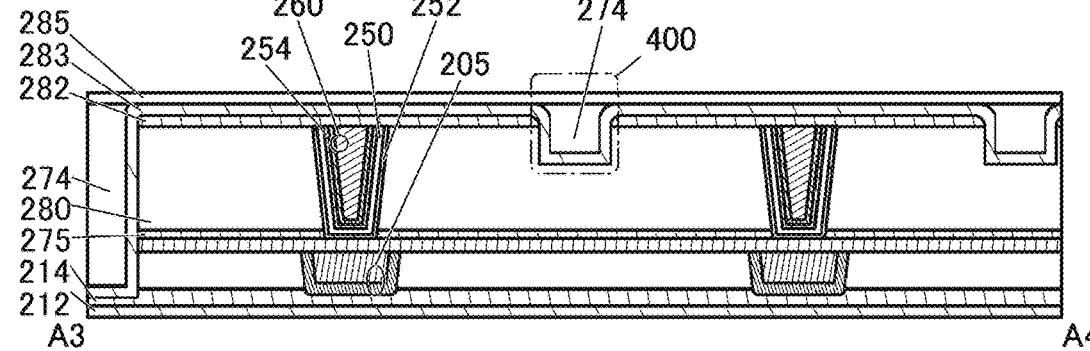

FIG. 22A is a top view of a semiconductor device 500. In FIG. 22A, the x-axis is parallel to the channel length direction of the transistor 200, and the y-axis is perpendicular to the x-axis. FIG. 22B is a cross-sectional view taken along the dashed-dotted line A1-A2 in FIG. 22A, which corresponds to a cross-sectional view in the channel length direction of the transistor 200. FIG. 22C is a cross-sectional view taken along the dashed-dotted line A3-A4 in FIG. 22A, which corresponds to a cross-sectional view of an opening region 400 and the vicinity thereof. Note that for clarity of the drawing, some components are omitted in the top view in FIG. 22A.

Note that in the semiconductor device illustrated in FIG. 22A to FIG. 22C, components having the same functions as the components in the semiconductor device described in <Structure example of semiconductor device> are denoted by the same reference numerals. Note that also in this section, the materials described in detail in <Structure example of semiconductor device> can be used as component materials of the semiconductor device.

The semiconductor device 500 illustrated in FIG. 22A to FIG. 22C is a modification example of the semiconductor device illustrated in FIG. 1A to FIG. 1D. The semiconductor device 500 illustrated in FIG. 22A to FIG. 22C differs from the semiconductor device in FIG. 1A to FIG. 1D in that the opening region 400 is formed in the insulator 282 and the insulator 280. Moreover, a sealing portion 265 is formed to surround a plurality of transistors 200, which is a different point from the semiconductor device illustrated in FIG. 1A to FIG. 1D.

The semiconductor device 500 includes a plurality of transistors 200 and a plurality of opening regions 400 arranged in a matrix. In addition, a plurality of conductors 260 functioning as gate electrodes of the transistors 200 are provided to extend in the y-axis direction. The opening regions 400 are provided in regions not overlapping with the oxide 230 or the conductor 260. The sealing portion 265 is formed so as to surround the plurality of transistors 200, the plurality of conductors 260, and the plurality of opening regions 400. Note that the number, the position, and the size of the transistors 200, the conductors 260, and the opening regions 400 are not limited to those illustrated in FIG. 22 and may be set as appropriate in accordance with the design of the semiconductor device 500.

As illustrated in FIG. 22B and FIG. 22C, the sealing portion 265 is provided to surround the plurality of transistors 200 and the insulator 216, the insulator 222, the insulator 275, the insulator 280, and the insulator 282. In other words, the insulator 283 is provided to cover the insulator 216, the insulator 222, the insulator 275, the insulator 280, and the insulator 282. In the sealing portion 265, the insulator 283 is in contact with the top surface of the insulator 214. Over the sealing portion 265, the insulator 274 is provided between the insulator 283 and the insulator 285. The top surface of the insulator 274 is substantially level with the uppermost surface of the insulator 283. As the insulator 274, an insulator similar to the insulator 280 can be used.

Such a structure enables the plurality of transistors 200 to be surrounded by the insulator 283, the insulator 214, and the insulator 212. One or more of the insulator 283, the insulator 214, and the insulator 212 preferably function as a barrier insulating film against hydrogen. Accordingly, entry of hydrogen contained in the region outside the sealing portion 265 into a region in the sealing portion 265 can be inhibited.

As illustrated in FIG. 22C, the insulator 282 in the opening region 400 has an opening portion. In the opening region 400, the insulator 280 may have a groove to overlap with the opening portion in the insulator 282. The depth of the groove portion of the insulator 280 is less than or equal to the depth at which the top surface of the insulator 275 is exposed and is, for example, approximately greater than or equal to ¼ and less than or equal to ½ of the maximum thickness of the insulator 280.

As illustrated in FIG. 22C, the insulator 283 inside the opening region 400 is in contact with the side surface of the insulator 282, the side surface of the insulator 280, and the top surface of the insulator 280. Part of the insulator 274 is formed in the opening region 400 to fill the depressed portion formed in the insulator 283, in some cases. At this time, the top surface of the insulator 274 formed in the opening region 400 is substantially level with the uppermost surface of the insulator 283, in some cases.

When heat treatment is performed in such a state that the opening region 400 is formed and the insulator 280 is exposed in the opening portion of the insulator 282, part of oxygen contained in the insulator 280 can be made to diffuse outwardly from the opening region 400 while oxygen is supplied to the oxide 230. This enables oxygen to be sufficiently supplied to the region functioning as the channel formation region and its vicinity in the oxide semiconductor from the insulator 280 containing oxygen to be released by heating, and also prevents an excess amount of oxygen from being supplied thereto.

At this time, hydrogen contained in the insulator 280 can be bonded to oxygen and released to the outside through the opening region 400. The hydrogen bonded to oxygen is released as water. Thus, the amount of hydrogen contained in the insulator 280 can be reduced, and hydrogen contained in the insulator 280 can be prevented from entering the oxide 230.

In FIG. 22A, the shape of the opening region 400 in the top view is substantially rectangular; however, the present invention is not limited to the shape. For example, the shape of the opening region 400 in the top view can be a rectangular shape, an elliptical shape, a circular shape, a rhombus shape, or a shape obtained by combining any of the above shapes. The area and arrangement interval of the opening regions 400 can be set as appropriate in accordance with the design of the semiconductor device including the transistor 200. For example, in the region where the density of the transistors 200 is low, the area of the opening region 400 may be increased or the arrangement interval of the opening regions 400 may be narrowed. For example, in the region where the density of the transistors 200 is high, the area of the opening region 400 may be decreased, or the arrangement interval of the opening regions 400 may be increased.

According to one embodiment of the present invention, a novel transistor can be provided. According to another embodiment of the present invention, a semiconductor device with a small variation in transistor characteristics can be provided. According to another embodiment of the present invention, a semiconductor device with favorable electrical characteristics can be provided. According to another embodiment of the present invention, a highly reliable semiconductor device can be provided. According to another embodiment of the present invention, a semiconductor device with a high on-state current can be provided. According to another embodiment of the present invention, a semiconductor device with a high field-effect mobility can be provided. According to another embodiment of the present invention, a semiconductor device with high frequency characteristics can be provided. According to another embodiment of the present invention, a semiconductor device that can be miniaturized or highly integrated can be provided. According to another embodiment of the present invention, a semiconductor device with low power consumption can be provided.

At least part of the structure, method, and the like described in this embodiment can be implemented in appropriate combination with any of those in the other embodiments, the other examples, and the like described in this specification.

Embodiment 2

In this example, one embodiment of a semiconductor device is described with reference to FIG. 23 and FIG. 24. The semiconductor device described in this embodiment is an evaluation element (also referred to as a TEG) that can be subjected to multipoint measurement.

Figure 23:
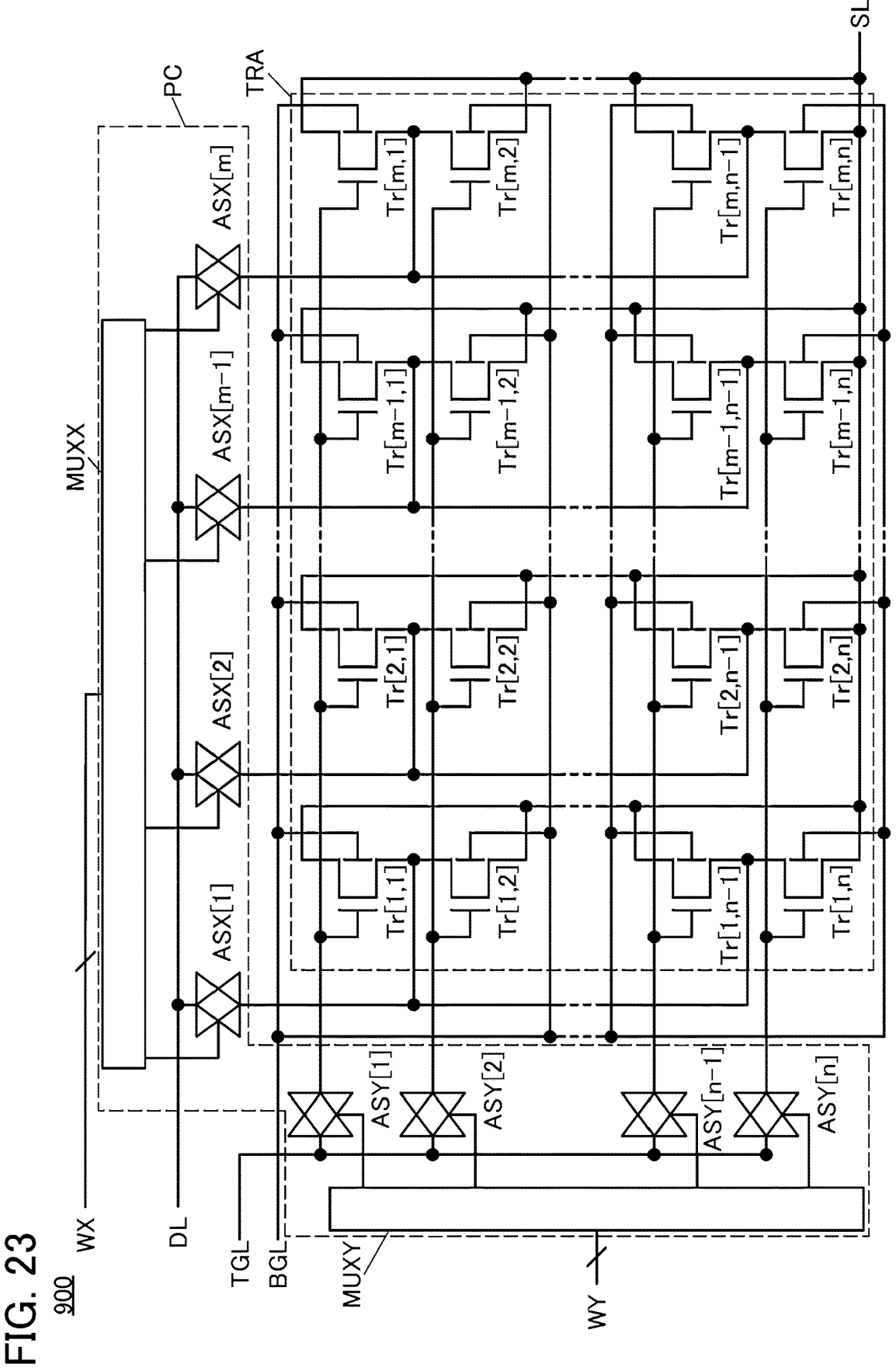
FIG. 23 shows a circuit diagram of a semiconductor device.

FIG. 23 is a circuit diagram of a TEG 900 that is an example of the semiconductor device of one embodiment of the present invention.

The TEG 900 includes a transistor group TRA and a peripheral circuit PC.

The transistor group TRA includes m×n (m and n are each independently an integer of 1 or more) transistors (a transistor Tr[1,1] to a transistor Tr[m,n] illustrated in FIG. 23).

The peripheral circuit PC includes two multiplexers (a multiplexer MUXX and a multiplexer MUXY), m analog switches (an analog switch ASX[1] to an analog switch ASX[m]), and n analog switches (an analog switch ASY[1] to an analog switch ASY[n]). Note that an analog switch is an electronic component that switches on/off of an analog signal in accordance with an input control signal. Here, a control signal refers to a digital potential (a voltage condition with two levels) and the analog signal refers to an analog potential (a voltage condition with two or more levels). An analog switch is also referred to as a transmission gate.

The TEG 900 is electrically connected to a wiring WX, a wiring WY, a wiring DL, a wiring TGL, a wiring BGL, and a wiring SL.

The wiring WX is electrically connected to the multiplexer MUXX. The wiring WY is electrically connected to the multiplexer MUXY. The wiring BGL is electrically connected to a second gate of each of the transistor Tr[1,1] to the transistor Tr[m,n]. The wiring SL is electrically connected to one of a source and a drain of each of the transistor Tr[1,1] to the transistor Tr[m,n].

In the case where a first gate and the second gate are electrically connected to each other in each of the transistor Tr[1,1] to the transistor Tr[m,n], the TEG 900 does not necessarily include the wiring BGL. In the case where the transistor Tr[1,1] to the transistor Tr[m,n] are single-gate transistors, i.e., transistors having no second gate, the TEG 900 does not necessarily include the wiring BGL.

A control signal to be used in the multiplexer MUXX is supplied to the wiring WX. A control signal to be used in the multiplexer MUXY is supplied to the wiring WY.

A first terminal of each of the analog switch ASX[1] to the analog switch ASX[m] is electrically connected to the multiplexer MUXX. A second terminal of each of the analog switch ASX[1] to the analog switch ASX[m] is electrically connected to the wiring DL. A third terminal of the analog switch ASX[i] (i is an integer greater than or equal to 1 and less than or equal to m) is electrically connected to the other of the source and the drain of each of the transistor Tr[i, 1] to the transistor Tr[i,n].

The multiplexer MUXX has a function of controlling on/off of each of the analog switch ASX[1] to the analog switch ASX[m]. Specifically, the multiplexer MUXX has a function of turning on any one of the m analog switches ASX or turning off all the analog switches ASX on the basis of the control signal received from the wiring WX. For example, the analog switch ASX is turned off when the signal supplied from the multiplexer MUXX has a high-level potential, and the analog switch ASX is turned on when the signal supplied from the multiplexer MUXX has a low-level potential. When the analog switch ASX[i] is turned on, the wiring DL and the other of the source and the drain of each of the transistor Tr[i, 1] to the transistor Tr[i,n] are brought into conduction. At this time, the potential of the wiring DL is supplied to the other of the source and the drain of each of the transistor Tr[i, 1] to the transistor Tr[i,n].

A first terminal of each of the analog switch ASY[1] to the analog switch ASY[n] is electrically connected to the multiplexer MUXY. A second terminal of each of the analog switch ASY[1] to the analog switch ASY[n] is electrically connected to the wiring TGL. A third terminal of the analog switch ASY[j] (j is an integer greater than or equal to 1 and less than or equal to n) is electrically connected to the first gate of each of the transistor Tr[j, 1] to the transistor Tr[j,n].

The multiplexer MUXY has a function of controlling on/off of each of the analog switch ASY[1] to the analog switch ASY[n]. Specifically, the multiplexer MUXY has a function of turning on any one of the n analog switches ASY or turning off all the analog switches ASY on the basis of the control signal received from the wiring WY. For example, the analog switch ASY is turned on when the signal supplied from the multiplexer MUXY has a high-level potential, and the analog switch ASY is turned off when the signal supplied from the multiplexer MUXY has a low-level potential. Alternatively, the analog switch ASY is turned off when the signal supplied from the multiplexer MUXY has a high-level potential, and the analog switch ASY is turned on when the signal supplied from the multiplexer MUXY has a low-level potential. When the analog switch ASY[j] is turned on, the wiring TGL and the first gate of each of the transistor Tr[1,j] to the transistor Tr[m,j] are brought into conduction. At this time, the potential of the wiring DL is supplied to the first gate of each of the transistor Tr[1,j] to the transistor Tr[n,j].

When the TEG 900 illustrated in FIG. 23 is used, measurement target transistors among the m×n transistors can be selected, and the electrical characteristics can be measured. In other words, the TEG 900 can be referred to as a TEG that can be subjected to multipoint measurement.

It is preferable that the multiplexer MUXX, the multiplexer MUXY, the analog switches ASX, and the analog switches ASY be each independently composed of a CMOS (Complementary Metal Oxide Semiconductor) circuit or a single-polarity circuit, and it is further preferable that the multiplexer MUXX, the multiplexer MUXY, the analog switches ASX, and the analog switches ASY be composed of CMOS circuits or single-polarity circuits.

In addition, it is preferable that a layer including the peripheral circuit PC and a layer including the transistor group TRA be stacked.

Figure 24A:
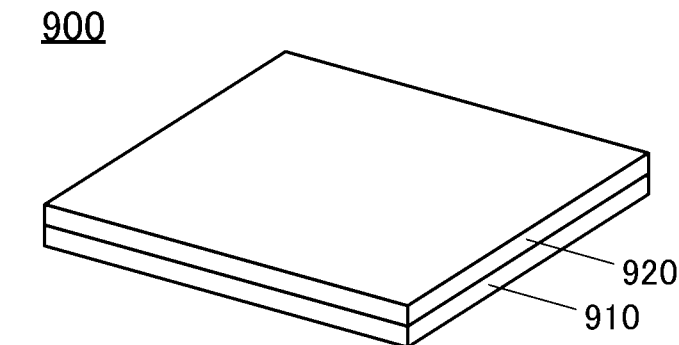
FIG. 24A is a perspective view of a semiconductor device.
Figure 24B:
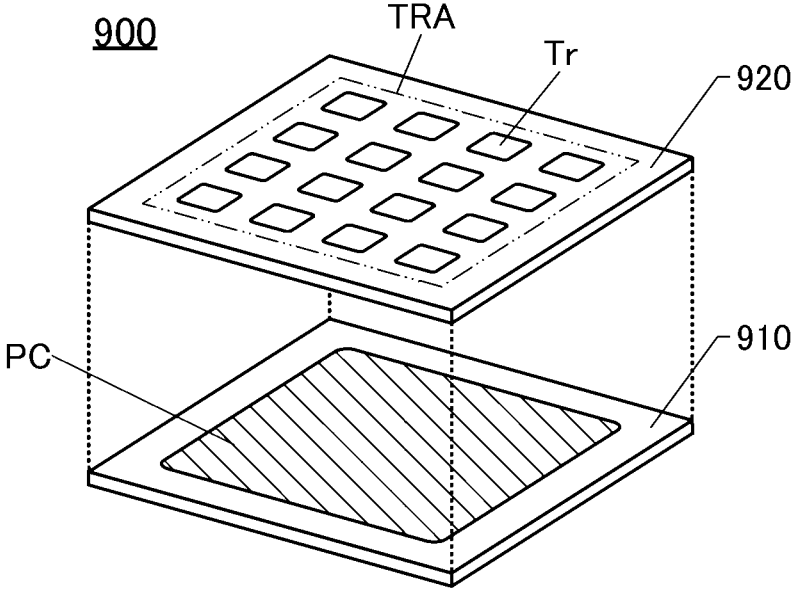
FIG. 24B is a perspective view illustrating the structure of the semiconductor device.

FIG. 24A is a perspective view of the TEG 900. The TEG 900 includes a layer 910 and a layer 920. FIG. 24B is a perspective view for explaining the structure of the TEG 900, illustrating the layer 910 and the layer 920 separately.

The layer 910 includes the peripheral circuit PC. In other words, the layer 910 includes the multiplexer MUXX, the multiplexer MUXY, the analog switches ASX, and the analog switches ASY. The layer 920 includes the transistor group TRA.

The layer 910 can be formed using a single crystal semiconductor, a polycrystalline semiconductor, a microcrystalline semiconductor, an amorphous semiconductor, or the like alone or in combination. As a semiconductor material, silicon, germanium, or the like can be used, for example. Alternatively, a compound semiconductor such as silicon germanium, silicon carbide, gallium arsenide, an oxide semiconductor, or a nitride semiconductor may be used. Note that a transistor including silicon in a channel formation region is referred to as a Si transistor in some cases.

Alternatively, gallium arsenide, aluminum gallium arsenide, indium gallium arsenide, gallium nitride, indium phosphide, silicon germanium, or the like that can be used for a HEMT (High Electron Mobility Transistor) may be used.

The layer 920 can be provided using a semiconductor material that can be formed thin, such as an oxide semiconductor or a silicon. With the use of a technique of forming a thin film, the peripheral circuit PC included in the layer 910 and the transistor group TRA included in the layer 920 can be provided three-dimensionally. Thus, the area occupied by the TEG 900 can be reduced.

The layer 920 may be formed over another substrate and attached to the layer 910.

For example, the peripheral circuit PC is composed of a CMOS circuit, and the transistor group TRA is composed of the transistors 200 described in Embodiment 1. Specifically, the peripheral circuit PC is composed of Si transistors and the transistor group TRA is composed of OS transistors. The layer including Si transistors and the layer including OS transistors can be formed monolithically; thus, in the structure, wirings connecting the peripheral circuit and the OS transistors can be shortened, and the electrical characteristics of the plurality of OS transistors can be measured at a short TAT (Turn Around Time). Moreover, the pitch width between the OS transistors can be narrowed.

Alternatively, for example, the peripheral circuit PC and the transistor group TRA are composed of the transistors 200 described in Embodiment 1. Specifically, the peripheral circuit PC and the transistor group TRA are composed of OS transistors. Note that it is possible to stack the layers including OS transistors. Thus, when the layer including OS transistors that is used for the peripheral circuit PC and the layer including OS transistors that is used for the transistor group TRA are stacked, the wirings connecting the peripheral circuit and the OS transistors can be shortened, and the electrical characteristics of the plurality of OS transistors can be measured at a short TAT. Moreover, the pitch width between the OS transistors can be narrowed.

Note that the peripheral circuit PC and the transistor group TRA may be formed in three or more layers. For example, some of the plurality of transistors included in the peripheral circuit PC may be composed of Si transistors, the others of the plurality of transistors included in the peripheral circuit PC may be composed of OS transistors, and the transistor group TRA may be composed of OS transistors. In this case, the TEG 900 may include a layer including Si transistors, a first layer including OS transistors over the layer, and a second layer including OS transistors over the first layer. Note that the OS transistors included in the first layer are preferably used as the others of the plurality of transistors included in the peripheral circuit PC, and the OS transistors included in the second layer are preferably used as the transistor group TRA. Such a structure can further reduce the area occupied by the TEG 900.

Alternatively, the peripheral circuit PC and the transistor group TRA may be formed in the same layer.

<Layout of Transistor Group TRA>

Next, the layout of the transistor group TRA included in the TEG 900 illustrated in FIG. 23 is described with reference to FIG. 25A to FIG. 28B.

Figure 25A:
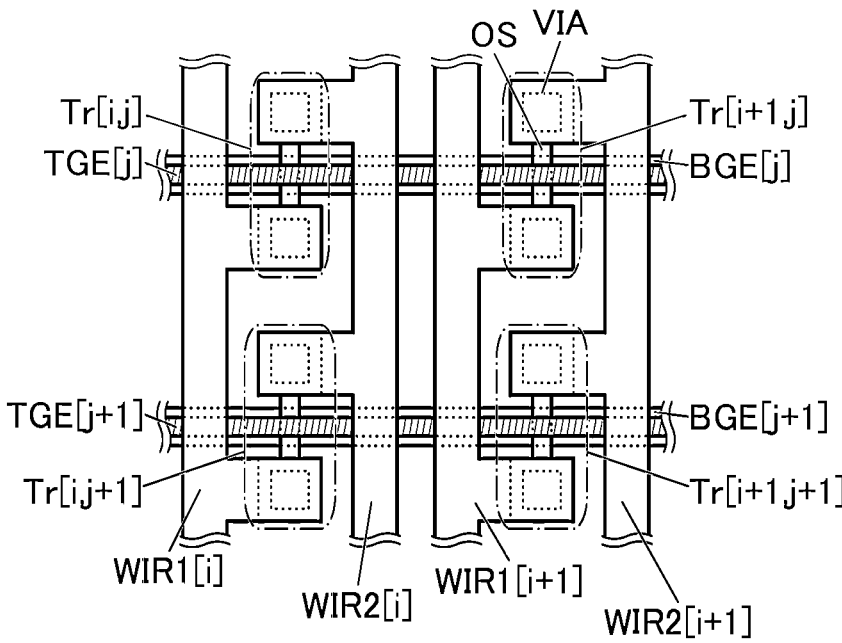
FIG. 25A and FIG. 25B are top views each illustrating the layout of a transistor group included in a semiconductor device of one embodiment of the present invention.

FIG. 25A illustrates an example of a top view of part of the transistor group TRA illustrated in FIG. 23. FIG. 25A is also a diagram illustrating the layout of the transistor group TRA illustrated in FIG. 23. In FIG. 25A, the transistor Tr[i,j], the transistor Tr[i,j+1], the transistor Tr[i+1,j], and the transistor Tr[i+1,j+1] of the transistor group TRA illustrated in FIG. 23 are shown. Note that for clarity of the drawing, some components are not illustrated in the top view of FIG. 25A.

An oxide OS is a metal oxide including a channel formation region. Note that in FIG. 25A, an oxide OS included in a transistor is separated from an oxide OS included in a transistor adjacent to the transistor in the channel length direction. An oxide OS included in a transistor is separated from an oxide OS included in a transistor adjacent to the transistor in the channel width direction.

A conductor VIA functions as a wiring or a plug. The conductor VIA is electrically connected to the source or the drain of the transistor and a conductor WIR1 or a conductor WIR2. For example, in FIG. 25A, a conductor VIA connected to one of the source and the drain of the transistor Tr[i,j] is connected to a conductor WIR1[i], and a conductor VIA connected to the other of the source and the drain of the transistor Tr[i,j] is connected to a conductor WIR2[i].

A conductor TGE functions as the first gate of the transistor. In FIG. 25A, a conductor TGE[j] includes regions overlapping with the oxides OS included in the transistor Tr[i,j] and the transistor Tr[i+1,j]. Similarly, a conductor TGE[j+1] includes regions overlapping with the oxides OS included in the transistor Tr[i,j+1] and the transistor Tr[i+1,j+1].

A conductor BGE functions as the second gate of the transistor. In FIG. 25A, a conductor BGE[j] includes regions overlapping with the oxides OS included in the transistor Tr[i,j] and the transistor Tr[i+1,j]. Similarly, a conductor BGE[j+1] includes regions overlapping with the oxides OS included in the transistor Tr[i,j+1] and the transistor Tr[i+1,j+1]. The conductor BGE[j] includes a region overlapping with the conductor TGE[j] with the oxides OS included in the transistor Tr[i,j] and the transistor Tr[i+1,j] therebetween. Similarly, the conductor BGE[j+1] includes a region overlapping with the conductor TGE[j+1] with the oxides OS included in the transistor Tr[i,j+1] and the transistor Tr[i+1,j+1] therebetween.

The conductor WIR1 functions as a wiring. In FIG. 25A, the conductor WIR1[i] is electrically connected to one of the source and the drain of each of the transistor Tr[i,j] and the transistor Tr[i,j+1] through the conductor VIA. Similarly, the conductor WIR1[i+1] is electrically connected to one of the source and the drain of each of the transistor Tr[i+1,j] and the transistor Tr[i+1,j+1] through the conductor VIA.

The conductor WIR2 functions as a wiring. In FIG. 25A, the conductor WIR2[$i$] is electrically connected to the other of the source and the drain of each of the transistor Tr[i,j] and the transistor Tr[i,j+1] through the conductor VIA. Similarly, the conductor WIR2[$i$+1] is electrically connected to the other of the source and the drain of each of the transistor Tr[i+1,j] and the transistor Tr[i+1,j+1] through the conductor VIA.

The transistor 200 described in Embodiment 1 can be used as the transistor Tr, for example. In this case, the oxide OS corresponds to the oxide 230 described in Embodiment 1, the conductor TGE corresponds to the conductor 260 described in Embodiment 1, the conductor BGE corresponds to the conductor 205 described in Embodiment 1, and the conductor VIA corresponds to the conductor 240 described in Embodiment 1. Furthermore, the conductor WIR1 corresponds to one of the conductor 246a and conductor 246b described in Embodiment 1, and the conductor WIR2 corresponds to the other of the conductor 246a and the conductor 246b described in Embodiment 1, for example.

Moreover, the conductor WIR2[$i$] corresponds to a wiring electrically connected to the analog switch ASX[i], and the conductor WIR1[$i$] corresponds to the wiring SL or a wiring electrically connected to the wiring SL, for example.

Note that the structural example of the transistor group TRA included in the TEG 900 is not limited to the above. Other examples of the transistor group TRA included in the TEG 900 are described with reference to FIG. 25B, FIG. 26A, FIG. 26B, FIG. 27A, FIG. 27B, FIG. 28A, and FIG. 28B. Note that for simplification of the drawings, some components are not illustrated in each drawing.

Figure 25B:
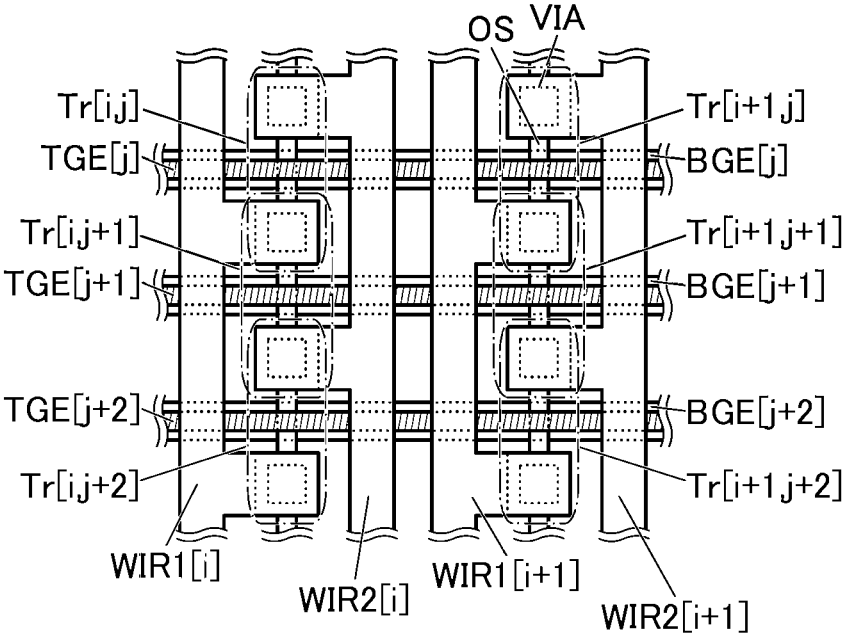

FIG. 25B illustrates another example of the top view of part of the transistor group TRA included in the TEG 900. FIG. 25B is also a diagram illustrating the layout of the transistor group TRA illustrated in FIG. 23. In FIG. 25B, the transistor Tr[i,j] to the transistor Tr[i,j+2] and the transistor Tr[i+1,j] to the transistor Tr[i+1,j+2] of the transistor group TRA illustrated in FIG. 23 are shown.

The transistor group TRA illustrated in FIG. 25B differs from the transistor group TRA illustrated in FIG. 25A in the structure or shape of the oxide OS.

As illustrated in FIG. 25B, the oxide OS extends in the channel length direction of the transistors. Thus, some or all of the plurality of transistors arranged in the channel length direction of the transistors include and share one oxide OS. For example, the channels of the transistor Tr[i,j] to the transistor Tr[i,j+2] are formed in one oxide OS. Similarly, for example, the channels of the transistor Tr[i+1,j] to the transistor Tr[i+1,j+2] are formed in one oxide OS different from the above-mentioned oxide OS.

In the structure, a source or a drain of a transistor also serves as a source or a drain of a transistor adjacent to the transistor in the channel length direction. For example, one of the source and the drain of the transistor Tr[i,j+1] also serves as one of the source and the drain of the transistor Tr[i,j]. The other of the source and the drain of the transistor Tr[i,j+1] also serves as the other of the source and the drain of the transistor Tr[i,j+2].

A conductor VIA connected to a source or a drain of a transistor is also connected to a source or a drain of a transistor adjacent to the transistor in the channel length direction. For example, the conductor VIA connected to one of the source and the drain of the transistor Tr[i,j+1] is connected to one of the source and the drain of the transistor Tr[i,j] and the conductor WIR1 [i]. The conductor VIA connected to the other of the source and the drain of the transistor Tr[i,j+1] is connected to the other of the source and the drain of the transistor Tr[i,j+2] and the conductor WIR2[$i$].

Note that a conductor TGE[j+2] includes regions overlapping with the oxides OS included in the transistor Tr[i, j+2] and the transistor Tr[i+1,j+2]. A conductor BGE[j+2] includes regions overlapping with the oxides OS included in the transistor Tr[i,j+2] and the transistor Tr[i+1,j+2].

The structure illustrated in FIG. 25B can have increased transistor density of the transistor group TRA. Accordingly, high integration of the semiconductor device can be achieved.

Figure 26A:
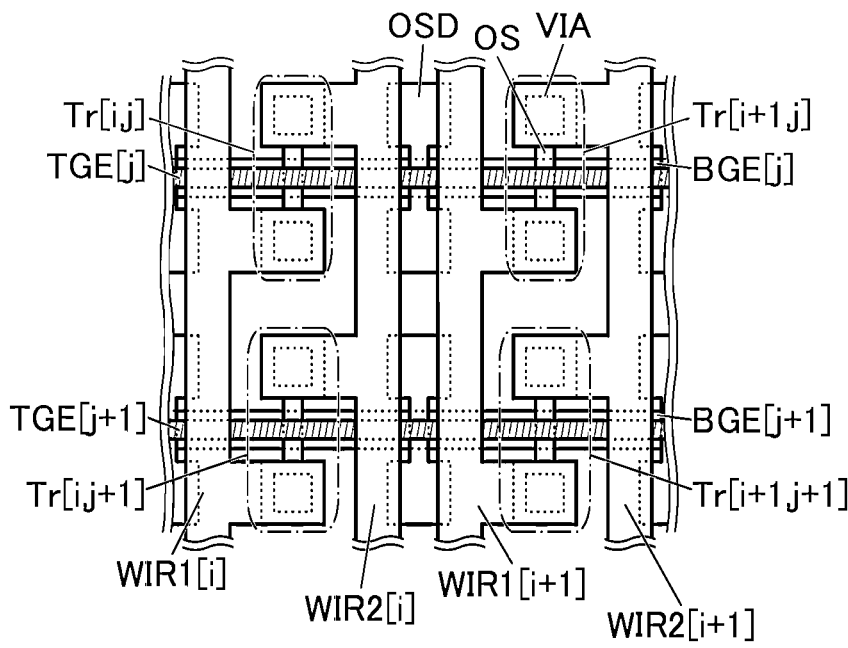
FIG. 26A and FIG. 26B are top views each illustrating the layout of a transistor group included in a semiconductor device of one embodiment of the present invention.

FIG. 26A illustrates another example of the top view of part of the transistor group TRA included in the TEG 900. FIG. 26A is also a diagram illustrating the layout of the transistor group TRA illustrated in FIG. 23. In FIG. 26A, the transistor Tr[i,j], the transistor Tr[i,j+1], the transistor Tr[i+1,j], and the transistor Tr[i+1,j+1] of the transistor group TRA illustrated in FIG. 23 are shown.

The transistor group TRA illustrated in FIG. 26A differs from the transistor group TRA illustrated in FIG. 25A in including an oxide OSD.

As illustrated in FIG. 26A, the oxide OSD is positioned between two oxides OS adjacent to each other in the channel width direction of the transistors. The oxide OSD is electrically connected to neither the conductor WIR1 nor the conductor WIR2.

The oxide OS and the oxide OSD are formed of the same oxide film. Therefore, the oxide OS and the oxide OSD are formed using the same material. In other words, the composition elements of the oxide OS are the same as the composition elements of the oxide OSD.

The oxide OSD illustrated in FIG. 26A has the same shape as the oxide OS illustrated in FIG. 26A; however, one embodiment of the present invention is not limited thereto. The oxide OSD may have a rectangle shape, an elliptical shape, a circular shape, a rhombus shape, a substantially rectangular shape, a shape extending in the channel length direction of the transistor like the oxide OS illustrated in FIG. 25B, or a shape of a combination thereof.

With the oxide OSD provided, the pattern density of oxides formed by processing an oxide film can be adjusted. The adjustment of the pattern density can inhibit a loading effect that causes a change in etching rate and etched shape.

Note that in this specification, the pattern density is the area ratio of a component formed in a given region. In the case where an oxide film is deposited on an entire surface in a given region, for example, the pattern density is 100%. On the other hand, in the case where part of the oxide film is removed to form a plurality of oxides, the pattern density of the oxides can be obtained by dividing the area of the remaining oxides by the area of the given region.

With the oxide OSD provided, part of oxygen added to the oxide OS at the time of manufacturing the transistor is added to the oxide OSD. That is to say, the amount of oxygen added to the oxide OS can be controlled by adjusting the size of the oxide OSD and the number of oxides OSD to be provided. Thus, oxygen vacancies and VoH in the channel formation region of the oxide OS can be reduced, and excess oxidation of the source and the drain can be inhibited. Thus, the transistors can have favorable electrical characteristics and higher reliability.

In FIG. 26A, the oxide OSD includes a region overlapping with the conductor WIR1 and a region overlapping with the conductor WIR2. With the structure, the semiconductor device can be more highly integrated. Note that the oxide OSD does not necessarily overlap with the conductor WIR1 and does not necessarily overlap with the conductor WIR2.

Figure 26B:
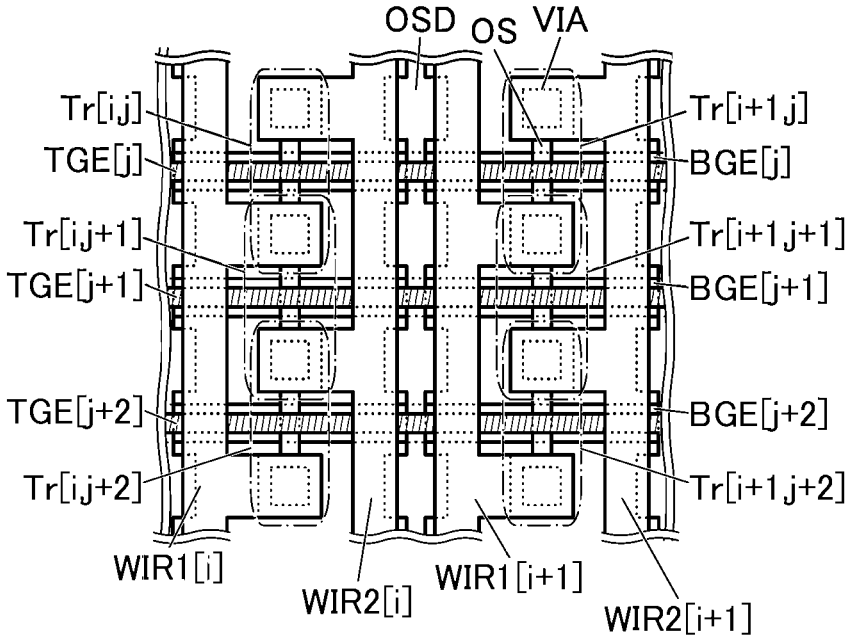

FIG. 26B illustrates another example of the top view of part of the transistor group TRA included in the TEG 900. FIG. 26B is also a diagram illustrating the layout of the transistor group TRA illustrated in FIG. 23. In FIG. 26B, the transistor Tr[i,j] to the transistor Tr[i,j+2] and the transistor Tr[i+1,j] to the transistor Tr[i+1,j+2] of the transistor group TRA illustrated in FIG. 23 are shown.

The transistor group TRA illustrated in FIG. 26B differs from the transistor group TRA illustrated in FIG. 25B in including the oxide OSD. Furthermore, the transistor group TRA illustrated in FIG. 26B differs from the transistor group TRA illustrated in FIG. 26A in the structures or shapes of the oxide OS and the oxide OSD.

For details of the structure or shape of the oxide OS included in the transistor group TRA illustrated in FIG. 26B, the description with reference to FIG. 25B can be referred to.

The oxide OSD illustrated in FIG. 26B has the same shape as the oxide OS illustrated in FIG. 26B; however, one embodiment of the present invention is not limited thereto. The oxide OSD may have a rectangle shape, an elliptical shape, a circular shape, a rhombus shape, a substantially rectangular shape, or a shape of a combination thereof.

With the structure illustrated in FIG. 26B, the semiconductor device can be more highly integrated. In addition, a loading effect can be inhibited. Moreover, the transistors can have favorable electrical characteristics and higher reliability.

Figure 27A:
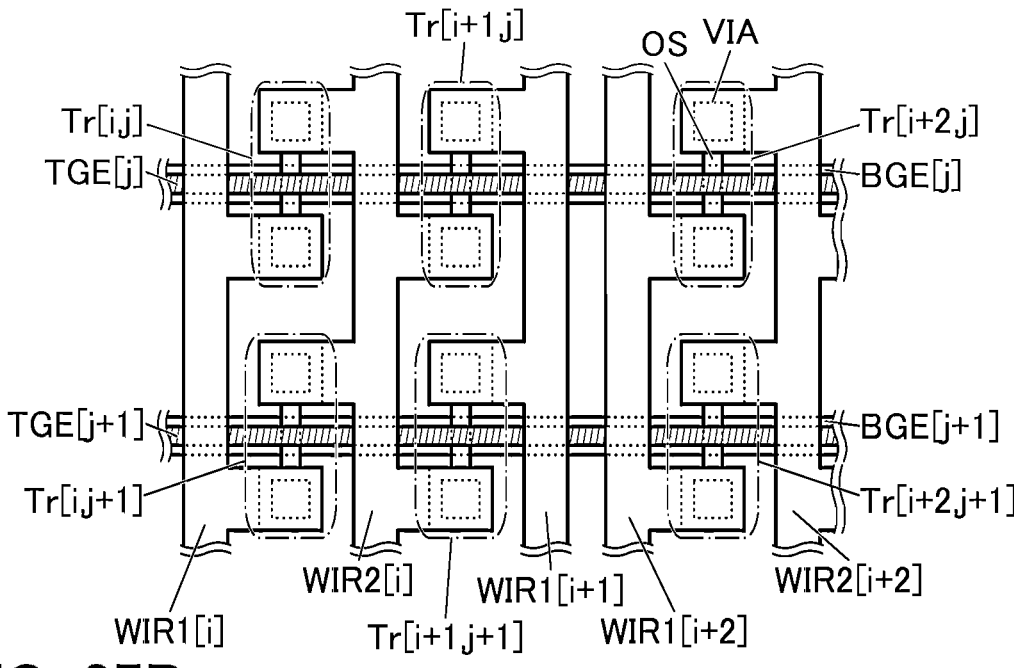
FIG. 27A and FIG. 27B are top views each illustrating the layout of a transistor group included in a semiconductor device of one embodiment of the present invention.

FIG. 27A illustrates another example of the top view of part of the transistor group TRA included in the TEG 900. FIG. 27A is also a diagram illustrating the layout of the transistor group TRA illustrated in FIG. 23. In FIG. 27A, the transistor Tr[i,j], the transistor Tr[i,j+1], the transistor Tr[i+1,j], the transistor Tr[i+1,j+1], the transistor Tr[i+2,j], and the transistor Tr[i+2,j+1] of the transistor group TRA illustrated in FIG. 23 are shown.

The transistor group TRA illustrated in FIG. 27A differs from the transistor group TRA illustrated in FIG. 25A in the structure or shape of the conductor WIR2.

As illustrated in FIG. 27A, the conductor WIR2[i] is electrically connected to the other of the source and the drain of each of the transistor Tr[i+1,j] and the transistor Tr[i+1,j+1] in addition to the other of the source and the drain of each of the transistor Tr[i,j] and the transistor Tr[i,j+1]. That is, the conductor WIR2[i] also serves as a conductor WIR2[i+1].

The structure illustrated in FIG. 27A can narrow the interval between transistors adjacent to each other in the channel width direction of the transistors. Accordingly, high integration of the semiconductor device can be achieved.

Figure 27B:
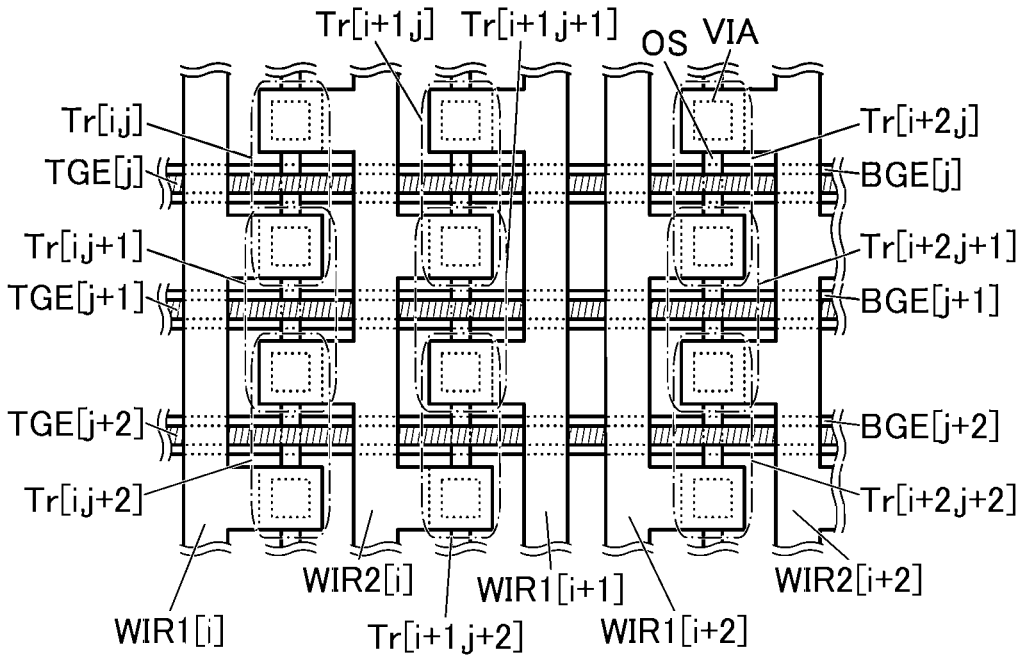

FIG. 27B illustrates another example of the top view of part of the transistor group TRA included in the TEG 900. FIG. 27B is also a diagram illustrating the layout of the transistor group TRA illustrated in FIG. 23. In FIG. 27B, the transistor Tr[i,j] to the transistor Tr[i,j+2], the transistor Tr[i+1,j] to the transistor Tr[i+1,j+2], and the transistor Tr[i+2,j] to the transistor Tr[i+2,j+2] of the transistor group TRA illustrated in FIG. 23 are shown.

The transistor group TRA illustrated in FIG. 27B differs from the transistor group TRA illustrated in FIG. 25B in the structure or shape of the conductor WIR2. The transistor group TRA illustrated in FIG. 27B differs from the transistor group TRA illustrated in FIG. 27A in the structure or shape of the oxide OS.

For details of the structure or shape of the conductor WIR2 included in the transistor group TRA illustrated in FIG. 27B, the description with reference to FIG. 27A can be referred to. For details of the structure or shape of the oxide OS included in the transistor group TRA illustrated in FIG. 27B, the description with reference to FIG. 25B can be referred to.

Figure 28A:
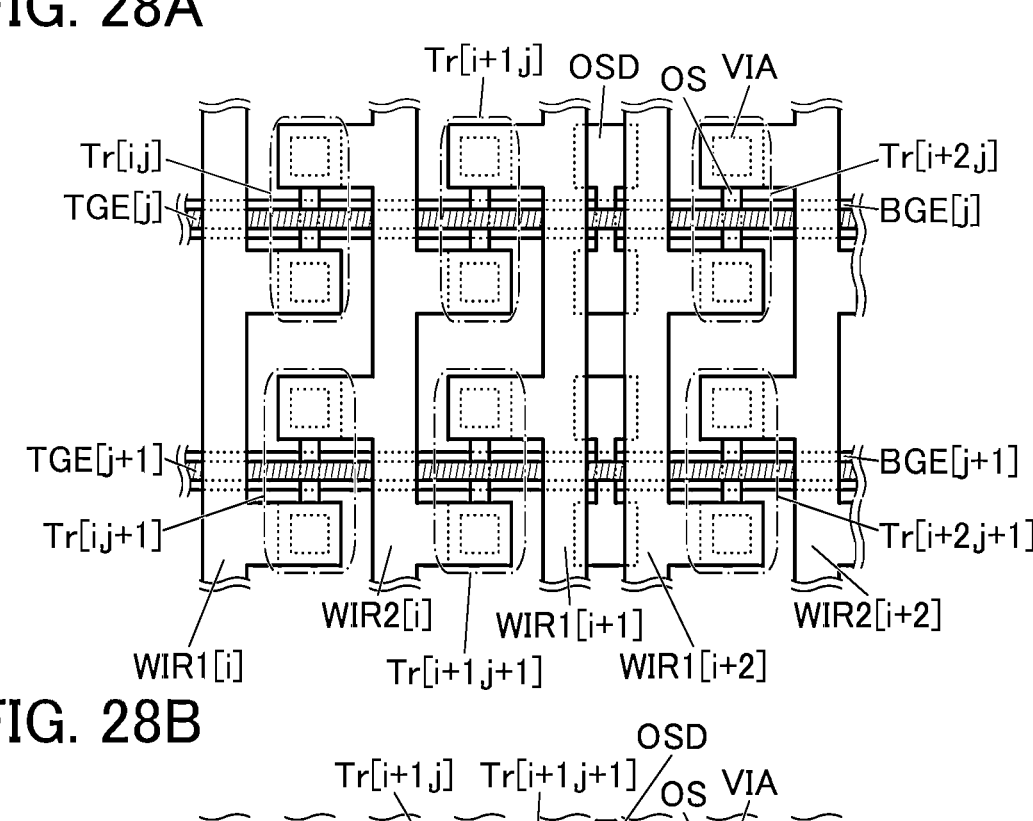
FIG. 28A and FIG. 28B are top views each illustrating the layout of a transistor group included in a semiconductor device of one embodiment of the present invention.

FIG. 28A illustrates another example of the top view of part of the transistor group TRA included in the TEG 900. FIG. 28A is also a diagram illustrating the layout of the transistor group TRA illustrated in FIG. 23. In FIG. 28A, the transistor Tr[i,j], the transistor Tr[i,j+1], the transistor Tr[i+1,j], the transistor Tr[i+1,j+1], the transistor Tr[i+2,j], and the transistor Tr[i+2,j+1] of the transistor group TRA illustrated in FIG. 23 are shown.

The transistor group TRA illustrated in FIG. 28A differs from the transistor group TRA illustrated in FIG. 27A in including the oxide OSD.

For details of the oxide OSD included in the transistor group TRA illustrated in FIG. 28A, the description with reference to FIG. 26A can be referred to.

Figure 28B:
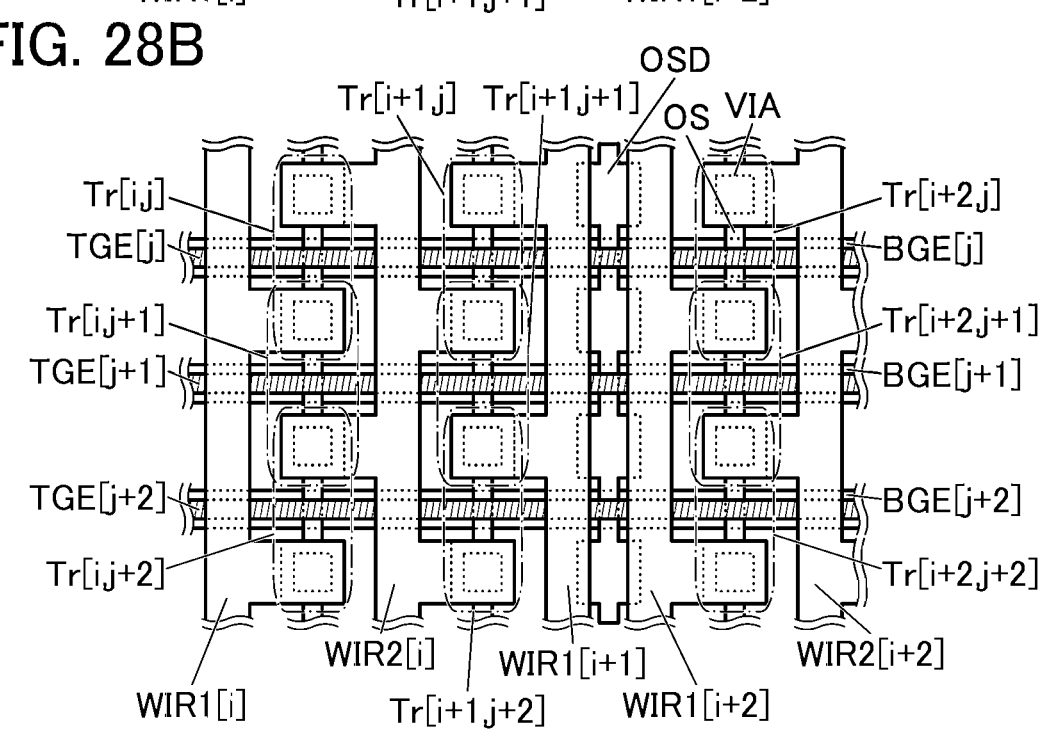

FIG. 28B illustrates another example of the top view of part of the transistor group TRA included in the TEG 900. FIG. 28B is also a diagram illustrating the layout of the transistor group TRA illustrated in FIG. 23. In FIG. 28B, the transistor Tr[i,j] to the transistor Tr[i,j+2], the transistor Tr[i+1,j] to the transistor Tr[i+1,j+2], and the transistor Tr[i+2,j] to the transistor Tr[i+2,j+2] of the transistor group TRA illustrated in FIG. 23 are shown.

The transistor group TRA illustrated in FIG. 28B differs from the transistor group TRA illustrated in FIG. 27B in including the oxide OSD. Furthermore, the transistor group TRA illustrated in FIG. 28B differs from the transistor group TRA illustrated in FIG. 28A in the structures or shapes of the oxide OS and the oxide OSD.

For details of the structures or shapes of the oxide OS and the oxide OSD included in the transistor group TRA illustrated in FIG. 28B, the description with reference to FIG. 26B can be referred to.

The above is the description of the layout of the transistor group TRA included in the TEG 900 illustrated in FIG. 23.

At least part of the structure, method, and the like described in this embodiment can be implemented in appropriate combination with any of those in the other embodiments, the other examples, and the like described in this specification.

Embodiment 3

In this embodiment, embodiments of a semiconductor device are described with reference to FIG. 29 to FIG. 33.
[Storage Device 1]

Figure 29:
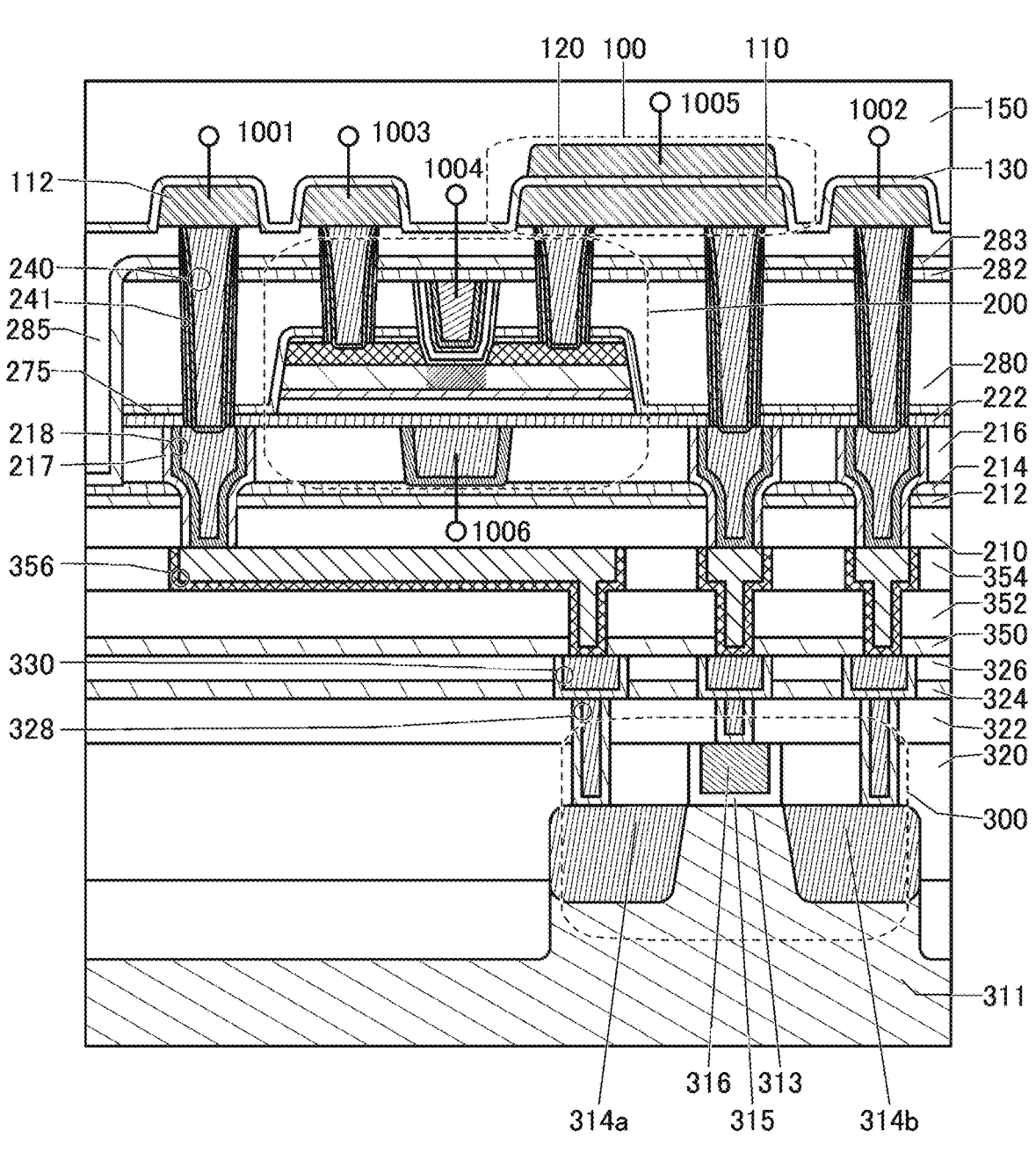
FIG. 29 is a cross-sectional view illustrating a structure of a storage device of one embodiment of the present invention.

FIG. 29 illustrates an example of a semiconductor device (a storage device) of one embodiment of the present invention. In the semiconductor device of one embodiment of the present invention, the transistor 200 is provided above a transistor 300, and a capacitor 100 is provided above the transistor 300 and the transistor 200. The transistor 200 described in the above embodiment can be used as the transistor 200.

The transistor 200 is a transistor in which a channel is formed in a semiconductor layer including an oxide semiconductor. Since the transistor 200 has a low off-state current, a storage device that uses the transistor 200 can retain stored data for a long time. In other words, such a storage device does not require refresh operation or has extremely low frequency of the refresh operation, which leads to a sufficient reduction in power consumption of the storage device.

In the semiconductor device illustrated in FIG. 29, a wiring 1001 is electrically connected to a source of the transistor 300, and a wiring 1002 is electrically connected to a drain of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

The storage device illustrated in FIG. 29 can form a memory cell array when arranged in a matrix.

<Transistor 300>

The transistor 300 is provided on a substrate 311 and includes a conductor 316 functioning as a gate, an insulator 315 functioning as a gate insulator, a semiconductor region 313 formed of part of the substrate 311, and a low-resistance region 314a and a low-resistance region 314b functioning as a source region and a drain region. The transistor 300 may be a p-channel transistor or an n-channel transistor.

Here, in the transistor 300 illustrated in FIG. 29, the semiconductor region 313 (part of the substrate 311) where a channel is formed has a protruding shape. In addition, the conductor 316 is provided to cover the side surface and the top surface of the semiconductor region 313 with the insulator 315 therebetween. Note that a material adjusting the work function may be used for the conductor 316. Such a transistor 300 is also referred to as a FIN-type transistor because it utilizes a protruding portion of a semiconductor substrate. Note that an insulator functioning as a mask for forming the protruding portion may be included in contact with an upper portion of the protruding portion. Furthermore, although the case where the protruding portion is formed by processing part of the semiconductor substrate is described here, a semiconductor film having a protruding shape may be formed by processing an SOI substrate.

Note that the transistor 300 illustrated in FIG. 29 is an example and the structure is not limited thereto; an appropriate transistor is used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, for the insulator 130, the insulator that can be used as the insulator 283 described in the above embodiment is preferably used.

For example, a conductor 112 and the conductor 110 provided over the conductor 240 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 29, a stacked-layer structure of two or more layers may be employed without being limited to the single-layer structure. For example, between a conductor having a barrier property and a conductor having high conductivity, a conductor that is highly adhesive to the conductor having a barrier property and the conductor having high conductivity may be formed.

The insulator 130 can be provided as stacked layers or a single layer using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, or hafnium nitride.

For example, for the insulator 130, a stacked-layer structure of a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

Examples of the high permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of a material with high dielectric strength (a material having a low dielectric constant) include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

<Wiring Layer>

Wiring layers provided with an interlayer film, a wiring, a plug, and the like may be provided between the components. A plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and part of a conductor functions as a plug.

For example, an insulator 320, an insulator 322, an insulator 324, and an insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 29, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (the conductor 205) included in the transistor 200, and the like are embedded in an insulator 210, the insulator 212, the insulator 214, and the insulator 216. Note that the conductor 218 has a function of a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with the side surface of the conductor 218 functioning as a plug. The insulator 217 is provided in contact with an inner wall of an opening formed in the insulator 210, the insulator 212, the insulator 214, and the insulator 216. That is, the insulator 217 is provided between the conductor 218 and each of the insulator 210, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used, for example. Since the insulator 217 is provided in contact with the insulator 210, the insulator 212, the insulator 214, and the insulator 222, entry of impurities such as water and hydrogen into the oxide 230 through the conductor 218 from the insulator 210, the insulator 216, or the like can be inhibited. In particular, silicon nitride is suitable because of its high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride can be deposited by a PEALD method and an opening reaching the conductor 356 can be formed by anisotropic etching.

Examples of an insulator that can be used as an interlayer film include an insulating oxide, an insulating nitride, an insulating oxynitride, an insulating nitride oxide, an insulating metal oxide, an insulating metal oxynitride, and an insulating metal nitride oxide.

For example, when a material having a low dielectric constant is used for the insulator functioning as an interlayer film, parasitic capacitance generated between wirings can be reduced. Thus, a material is preferably selected depending on the function of an insulator.

For example, as the insulator 150, the insulator 210, the insulator 352, the insulator 354, and the like, an insulator having a low dielectric constant is preferably included. For example, the insulator preferably includes silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low dielectric constant. Examples of the resin include polyester, polyolefin, polyamide (e.g., nylon and aramid), polyimide, polycarbonate, and acrylic.

When a transistor including an oxide semiconductor is surrounded by an insulator having a function of inhibiting passage of oxygen and impurities such as hydrogen, the electrical characteristics of the transistor can be stable. Thus, the insulator having a function of inhibiting passage of oxygen and impurities such as hydrogen can be used for the insulator 214, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum may be used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

As the conductor that can be used for a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single layer or stacked layers of conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Provided with Oxide Semiconductor>

In the case where an oxide semiconductor is used in the transistor 200, an insulator including an excess-oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, in FIG. 29, the insulator 241 is preferably provided between the insulator 280 containing excess oxygen and the conductor 240. Since the insulator 241 is provided in contact with the insulator 222, the insulator 282, and the insulator 283, the transistor 200 can be sealed with the insulators having a barrier property.

That is, the insulator 241 can inhibit excess oxygen contained in the insulator 280 from being absorbed by the conductor 240. In addition, providing the insulator 241 can inhibit diffusion of hydrogen, which is an impurity, into the transistor 200 through the conductor 240.

The insulator 241 is preferably formed using an insulating material having a function of inhibiting diffusion of oxygen and impurities such as water and hydrogen. For example, silicon nitride, silicon nitride oxide, aluminum oxide, hafnium oxide, or the like is preferably used. In particular, silicon nitride is preferable because of its high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As described in the above embodiment, the transistor 200 may be sealed with the insulator 212, the insulator 214, the insulator 282, and the insulator 283. Such a structure can inhibit entry of hydrogen contained in the insulator 274, the insulator 150, or the like into the insulator 280 or the like.

Here, the conductor 240 penetrates the insulator 283 and the insulator 282, and the conductor 218 penetrates the insulator 214 and the insulator 212; however, as described above, the insulator 241 is provided in contact with the conductor 240, and the insulator 217 is provided in contact with the conductor 218. This can reduce the amount of hydrogen entering the inside of the insulator 212, the insulator 214, the insulator 282, and the insulator 283 through the conductor 240 and the conductor 218. In this manner, the transistor 200 is sealed with the insulator 212, the insulator 214, the insulator 282, the insulator 283, the insulator 241, and the insulator 217, so that impurities such as hydrogen contained in the insulator 274 or the like can be inhibited from entering from the outside.

<Dicing Line>

A dicing line (sometimes referred to as a scribe line, a dividing line, or a cutting line) which is provided when a large-sized substrate is divided into semiconductor elements so that a plurality of semiconductor devices are each taken as a chip is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 29, a region in which the insulator 283 and the insulator 214 are in contact with each other is preferably designed to overlap with the dicing line. That is, an opening is provided in the insulator 282, the insulator 280, the insulator 275, the insulator 222, and the insulator 216 in the vicinity of a region to be the dicing line that is provided on an outer edge of the memory cell including the plurality of transistors 200.

That is, in the opening provided in the insulator 282, the insulator 280, the insulator 275, the insulator 222, and the insulator 216, the insulator 214 is in contact with the insulator 283.

For example, an opening may be provided in the insulator 282, the insulator 280, the insulator 275, the insulator 222, the insulator 216, and the insulator 214. With such a structure, in the opening provided in the insulator 282, the insulator 280, the insulator 275, the insulator 222, the insulator 216, and the insulator 214, the insulator 212 is in contact with the insulator 283. Here, the insulator 212 and the insulator 283 may be formed using the same material and the same method. When the insulator 212 and the insulator 283 are formed using the same material and the same method, the adhesion therebetween can be increased. For example, silicon nitride is preferably used.

With the structure, the transistors 200 can be surrounded by the insulator 212, the insulator 214, the insulator 282, and the insulator 283. Since at least one of the insulator 212, the insulator 214, the insulator 282, and the insulator 283 has a function of inhibiting diffusion of oxygen, hydrogen, and water, even when the substrate is divided into circuit regions each of which is provided with the semiconductor elements described in this embodiment to be processed into a plurality of chips, entry and diffusion of impurities such as hydrogen and water from the side surface direction of the divided substrate into the transistor 200 can be prevented.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 30:
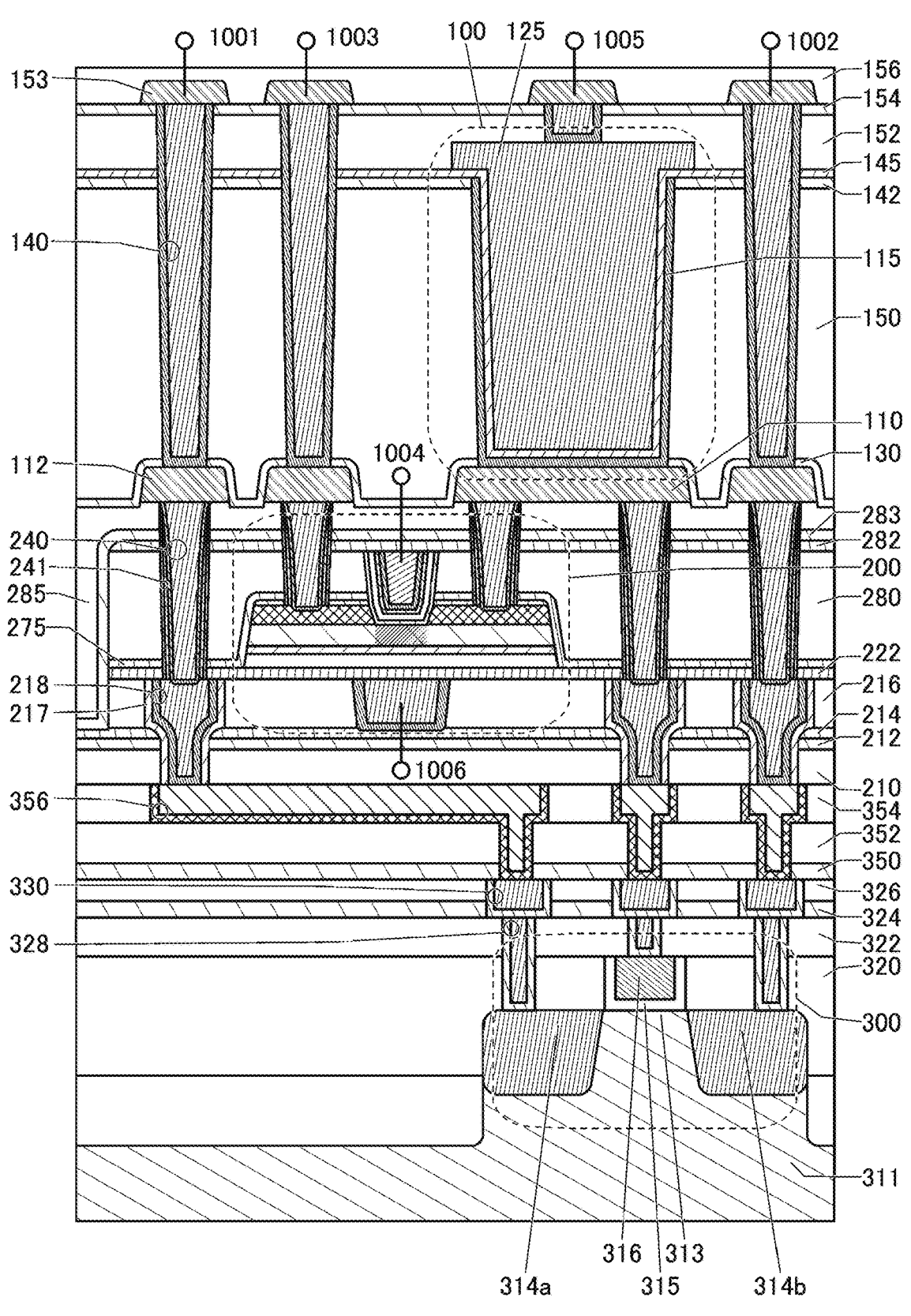
FIG. 30 is a cross-sectional view illustrating a structure of a storage device of one embodiment of the present invention.

Note that although the capacitor 100 of the storage device illustrated in FIG. 29 has a planar shape, the storage device described in this embodiment is not limited thereto. For example, the capacitor 100 may have a cylindrical shape as illustrated in FIG. 30. Note that the structure below and including the insulator 150 of a storage device illustrated in FIG. 30 is similar to that of the semiconductor device illustrated in FIG. 29.

The capacitor 100 illustrated in FIG. 30 includes the insulator 150 over the insulator 130, an insulator 142 over the insulator 150, a conductor 115 placed in an opening formed in the insulator 150 and the insulator 142, an insulator 145 over the conductor 115 and the insulator 142, a conductor 125 over the insulator 145, and an insulator 152 over the conductor 125 and the insulator 145. Here, at least parts of the conductor 115, the insulator 145, and the conductor 125 are placed in the opening formed in the insulator 150 and the insulator 142.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric interposed therebetween on the side surface as well as the bottom surface of the opening in the insulator 150 and the insulator 142; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used as the insulator 280 can be used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 115 is placed in contact with the opening formed in the insulator 142 and the insulator 150. The top surface of the conductor 115 is preferably substantially level with the top surface of the insulator 142. Furthermore, the bottom surface of the conductor 115 is in contact with the conductor 110 through an opening in the insulator 130. The conductor 115 is preferably deposited by an ALD method, a CVD method, or the like; for example, a conductor that can be used for the conductor 205 is used.

The insulator 145 is placed to cover the conductor 115 and the insulator 142. The insulator 145 is preferably deposited by an ALD method or a CVD method, for example. The insulator 145 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with high dielectric strength, such as silicon oxynitride, or a high permittivity (high-k) material is preferably used. Alternatively, a stacked-layer structure of a material with high dielectric strength and a high permittivity (high-k) material may be used.

Examples of the high permittivity (high-k) material (a material having a high dielectric constant) include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium. The use of such a high-k material can ensure sufficient capacitance of the capacitor 100 even when the insulator 145 has a large thickness. When the insulator 145 has a large thickness, generation of a leakage current between the conductor 115 and the conductor 125 can be inhibited.

Examples of the material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by a PEALD method, silicon oxide ($SiO_x$) deposited by a PEALD method, and silicon nitride ($SiN_x$) deposited by a PEALD method are stacked in this order. Alternatively, an insulating film in which zirconium oxide, silicon oxide deposited by an ALD method, and zirconium oxide are stacked in this order can be used. The use of such an insulator with high dielectric strength can increase the dielectric strength and inhibit electrostatic breakdown of the capacitor 100.

The conductor 125 is placed to fill the opening formed in the insulator 142 and the insulator 150. The conductor 125 is electrically connected to the wiring 1005 through a conductor 140 and a conductor 153. The conductor 125 is preferably formed by an ALD method, a CVD method, or the like and may be formed using a conductor that can be used as the conductor 205, for example.

The conductor 153 is provided over an insulator 154 and is covered with an insulator 156. The conductor 153 can be formed using a conductor that can be used as the conductor 112, and the insulator 156 can be formed using an insulator that can be used as the insulator 152. Here, the conductor 153 is in contact with the top surface of the conductor 140 and functions as a terminal of the capacitor 100, the transistor 200, or the transistor 300.

[Storage Device 2]

Figure 31:
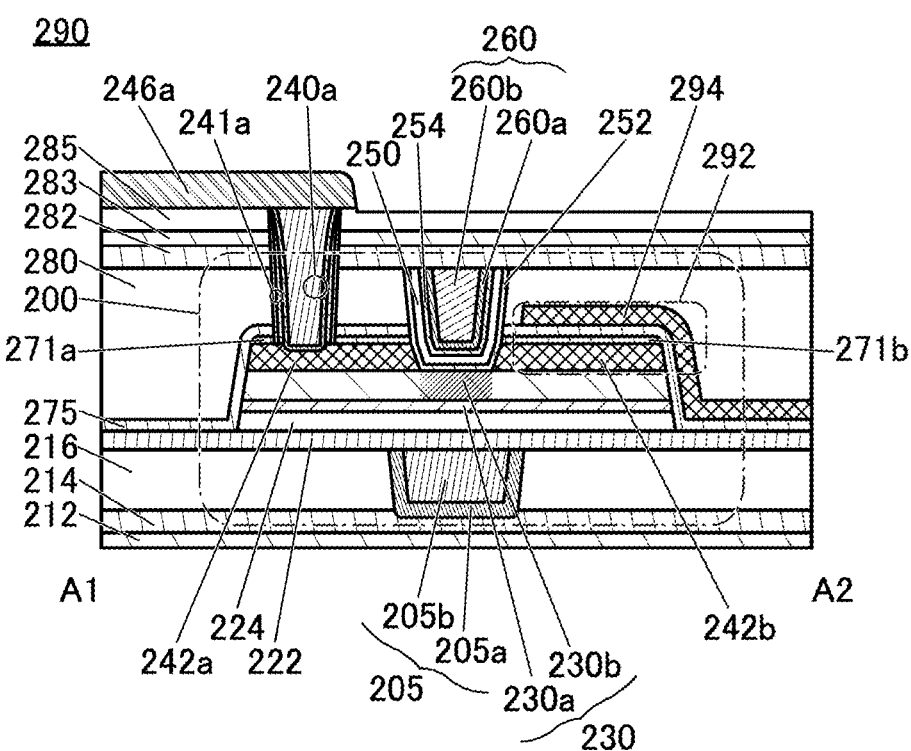
FIG. 31 is a cross-sectional view of a semiconductor device of one embodiment of the present invention.

FIG. 31 illustrates an example of a semiconductor device (a storage device) of one embodiment of the present invention.

Structure Example of Memory Device

FIG. 31 is a cross-sectional view of a semiconductor device including a memory device 290. The memory device 290 illustrated in FIG. 31 includes a capacitor device 292 besides the transistor 200 illustrated in FIG. 1A to FIG. 1D.

FIG. 31 corresponds to a cross-sectional view of the transistor 200 in the channel length direction.

The capacitor device 292 includes the conductor 242b; the insulator 271b provided over the conductor 242b; the insulator 275 provided in contact with the top surface of the insulator 271b, the side surface of the insulator 271b, and the side surface of the conductor 242b; and a conductor 294 over the insulator 275. In other words, the capacitor device 292 forms a MIM (Metal-Insulator-Metal) capacitor. Note that one of a pair of electrodes included in the capacitor device 292, i.e., the conductor 242b, can also serve as the source electrode of the transistor. The dielectric layer included in the capacitor device 292 can also serve as a protective layer provided in the transistor, i.e., the insulator 271 and the insulator 275. Thus, the manufacturing process of the capacitor device 292 can also serve as part of the manufacturing process of the transistor, improving the productivity of the semiconductor device. Furthermore, one of a pair of electrodes included in the capacitor device 292, that is, the conductor 242b, also serves as the source electrode of the transistor; therefore, the area in which the transistor and the capacitor device are placed can be reduced.

Note that the conductor 294 can be formed using, for example, a material that can be used for the conductor 242.

Modification Example of Memory Device

Examples of a semiconductor device of one embodiment of the present invention including the transistor 200 and the capacitor device 292, which are different from the example described above in <Structure example of memory device>, are described below with reference to FIG. 32A, FIG. 32B, and FIG. 33. Note that in the semiconductor devices illustrated in FIG. 32A, FIG. 32B, and FIG. 33, structures having the same function as those included in the semiconductor devices described in the above embodiment and <Structure example of memory device> (see FIG. 31) are denoted by the same reference numerals. Note that the materials described in detail in the above embodiment and <Structure example of memory device> can be used as component materials of the transistor 200 and the capacitor device 292 in this section. The memory devices in FIG. 32A, FIG. 32B, FIG. 33, and the like are, but not limited to, the memory device illustrated in FIG. 31.

Modification Example 1 of Memory Device

An example of a semiconductor device 600 of one embodiment of the present invention including a transistor 200a, a transistor 200b, a capacitor device 292a, and a capacitor device 292b is described below with reference to FIG. 32A.

Figures 32A, 32B:
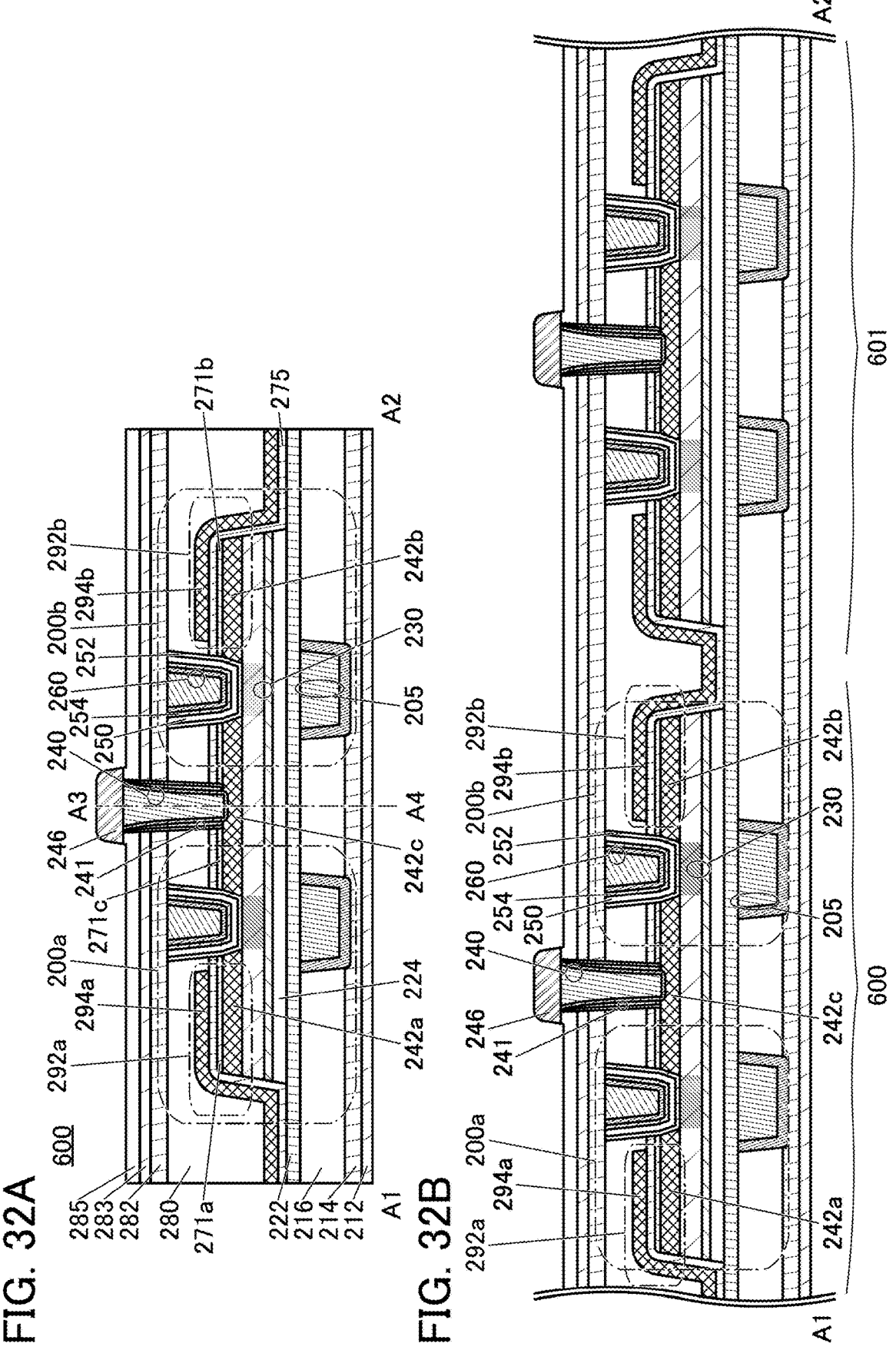
FIG. 32A and FIG. 32B are cross-sectional views of semiconductor devices of one embodiment of the present invention.
Figure 33:
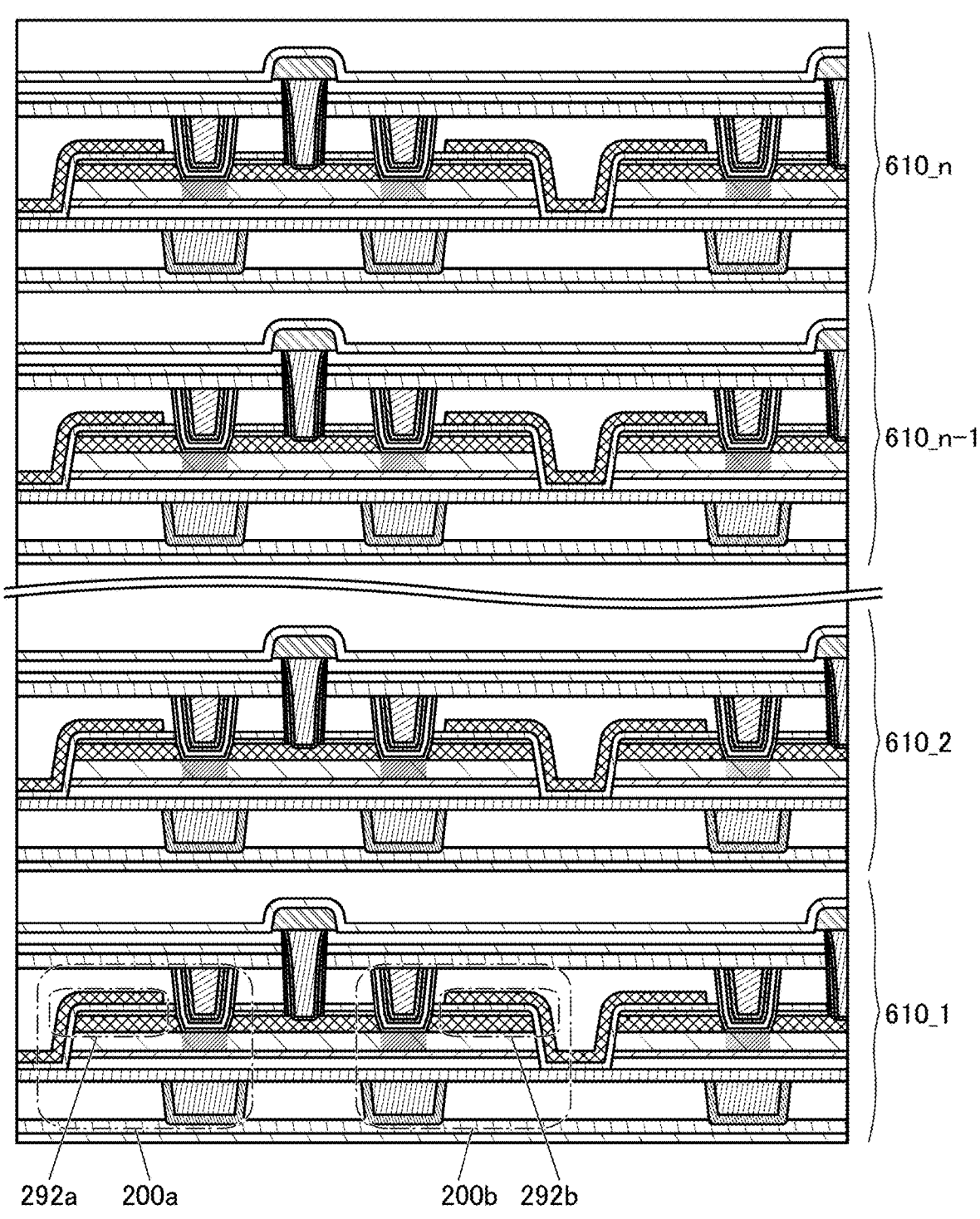
FIG. 33 is a cross-sectional view of a semiconductor device of one embodiment of the present invention.

FIG. 32A is a cross-sectional view of the semiconductor device 600 including the transistor 200a, the transistor 200b, the capacitor device 292a, and the capacitor device 292b in the channel length direction. Here, the capacitor device 292a includes the conductor 242a; the insulator 271a over the conductor 242a; the insulator 275 in contact with the top surface of the insulator 271a, the side surface of the insulator 271a, and the side surface of the conductor 242a; and a conductor 294a over the insulator 275. The capacitor device 292b includes the conductor 242b; the insulator 271b over the conductor 242b; the insulator 275 in contact with the top surface of the insulator 271b, the side surface of the insulator 271b, and the side surface of the conductor 242b; and a conductor 294b over the insulator 275.

The semiconductor device 600 has a line-symmetric structure with respect to dashed-dotted line A3-A4 as illustrated in FIG. 32A. A conductor 242c serves as one of a source electrode and a drain electrode of the transistor 200a and one of a source electrode and a drain electrode of the transistor 200b. An insulator 271c is provided over the conductor 242c. The conductor 240 functioning as a plug connects the conductor 246 functioning as a wiring and the transistor 200a to each other, and also connects the conductor 246 functioning as a wiring and the transistor 200b to each other. With the above connection structure between the two transistors, the two capacitor devices, the wiring, and the plug, a semiconductor device that can be miniaturized or highly integrated can be provided.

The structure examples of the semiconductor device illustrated in FIG. 31 can be referred to for the structures and the effects of the transistor 200a, the transistor 200b, the capacitor device 292a, and the capacitor device 292b.

Variation Example 2 of Memory Device

In the above description, the transistor 200a, the transistor 200b, the capacitor device 292a, and the capacitor device 292b are given as examples of components of the semiconductor device; however, the semiconductor device described in this embodiment is not limited thereto. For example, as illustrated in FIG. 32B, a structure may be employed in which the semiconductor device 600 and a semiconductor device having a structure similar to that of the semiconductor device 600 are connected through a capacitor portion. In this specification, the semiconductor device including the transistor 200a, the transistor 200b, the capacitor device 292a, and the capacitor device 292b is referred to as a cell. For the structures of the transistor 200a, the transistor 200b, the capacitor device 292a, and the capacitor device 292b, the above description of the transistor 200a, the transistor 200b, the capacitor device 292a, and the capacitor device 292b can be referred to.

FIG. 32B is a cross-sectional view in which the semiconductor device 600 including the transistor 200a, the transistor 200b, the capacitor device 292a, and the capacitor device 292b, and a cell having a structure similar to that of the semiconductor device 600 are connected through a capacitor portion.

As illustrated in FIG. 32B, the conductor 294b functioning as one electrode of the capacitor device 292b included in the semiconductor device 600 also serves as one electrode of a capacitor device included in a semiconductor device 601 having a structure similar to that of the semiconductor device 600. Although not illustrated, the conductor 294a functioning as one electrode of the capacitor device 292a included in the semiconductor device 600 also serves as one electrode of a capacitor device included in a semiconductor device on the left side of the semiconductor device 600, that is, a semiconductor device adjacent to the semiconductor device 600 in the A1 direction in FIG. 32B. The cell on the right side of the semiconductor device 601, that is, the cell in the A2 direction in FIG. 32B, has a similar structure. That is, a cell array (also referred to as a memory device layer) can be formed. With such a structure of the cell array, space between adjacent cells can be reduced; thus, the projected area of the cell array can be reduced and high integration can be achieved. When the cells illustrated in FIG. 32B are arranged in a matrix, a matrix-shape cell array can be formed.

When the transistor 200a, the transistor 200b, the capacitor device 292a, and the capacitor device 292b are formed to have the structures described in this embodiment as described above, the area of the cell can be reduced and the semiconductor device including a cell array can be miniaturized or highly integrated.

Furthermore, the cell array may have a stacked-layer structure instead of a single-layer structure. FIG. 33 illustrates a cross-sectional view of n layers of cell arrays 610 that are stacked. When a plurality of cell arrays (a cell array 610_1 to a cell array 610_n) are stacked as illustrated in FIG. 33, cells can be integrally placed without increasing the area occupied by the cell arrays. In other words, a 3D cell array can be formed.

At least part of the structure, method, and the like described in this embodiment can be implemented in appropriate combination with any of those in the other embodiments, the other examples, and the like described in this specification.

Embodiment 4

In this embodiment, a storage device including a transistor in which an oxide is used as a semiconductor (hereinafter, sometimes referred to as an OS transistor) and a capacitor (hereinafter, sometimes referred to as an OS memory apparatus) of one embodiment of the present invention is described with reference to FIG. 34A, FIG. 34B, and FIG. 35A to FIG. 35H. The OS memory apparatus is a storage device that includes at least a capacitor and an OS transistor that controls the charging and discharging of the capacitor. Since the OS transistor has an extremely low off-state current, the OS memory apparatus has excellent retention characteristics and thus can function as a nonvolatile memory.

Structure Example of Storage Device

Figures 34A, 34B:
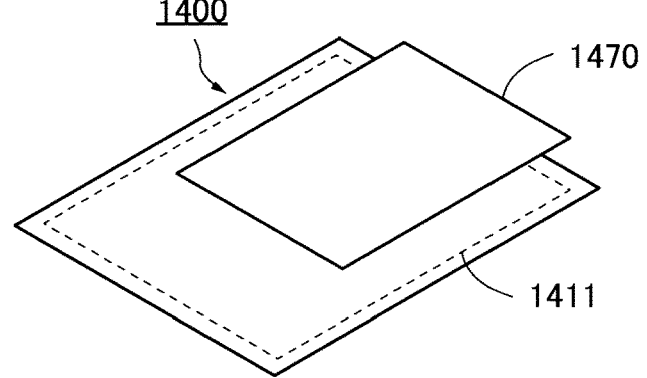
FIG. 34A is a block diagram illustrating a structure example of a storage device of one embodiment of the present invention.
FIG. 34B is a perspective view illustrating a structure example of the storage device of one embodiment of the present invention.

FIG. 34A illustrates a structure example of the OS memory apparatus. A storage device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the storage device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the storage device 1400. Control signals (CE, WE, and RES), an address signal ADDR, and a data signal WDATA are also input to the storage device 1400 from the outside. The address signal ADDR is input to the row decoder and the column decoder, and the data signal WDATA is input to the write circuit.

The control logic circuit 1460 processes the control signals (CE, WE, and RES) input from the outside, and generates control signals for the row decoder and the column decoder. The control signal CE is a chip enable signal, the control signal WE is a write enable signal, and the control signal RES is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of wirings that connect the memory cell array 1470 to the row circuit 1420 depends on the structure of the memory cell MC, the number of memory cells MC in a column, and the like. The number of wirings that connect the memory cell array 1470 to the column circuit 1430 depends on the structure of the memory cell MC, the number of memory cells MC in a row, and the like.

Note that FIG. 34A illustrates an example where the peripheral circuit 1411 and the memory cell array 1470 are formed on the same plane; however, this embodiment is not limited to the example. For example, as illustrated in FIG. 34B, the memory cell array 1470 may be provided to overlap with part of the peripheral circuit 1411. For example, the sense amplifier may be provided below the memory cell array 1470 so that they overlap with each other.

FIG. 35A to FIG. 35H illustrate structure examples of a memory cell that can be used as the memory cell MC.

[DOSRAM]

FIG. 35A to FIG. 35C illustrate circuit structure examples of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 35A includes a transistor M1 and a capacitor CA. Note that the transistor M1 includes a gate (sometimes referred to as a top gate) and a back gate.

A first terminal of the transistor M1 is connected to a first terminal of the capacitor CA. A second terminal of the transistor M1 is connected to a wiring BIL. The gate of the transistor M1 is connected to a wiring WOL. The back gate of the transistor M1 is connected to a wiring BGL. A second terminal of the capacitor CA is connected to a wiring LL.

The wiring BIL functions as a bit line, and the wiring WOL functions as a word line. The wiring LL functions as a wiring for applying a predetermined potential to the second terminal of the capacitor CA. In the time of data writing and data reading, the wiring LL may be at a ground potential or a low-level potential. The wiring BGL functions as a wiring for applying a potential to the back gate of the transistor M1. When a given potential is applied to the wiring BGL, the threshold voltage of the transistor M1 can be increased or decreased.

Here, a memory cell 1471 illustrated in FIG. 35A corresponds to the storage device illustrated in FIG. 31. That is, the transistor M1 and the capacitor CA correspond to the transistor 200 and the capacitor device 292, respectively.

The circuit structure of the memory cell MC is not limited to that of the memory cell 1471, and the circuit structure can be changed. For example, as in a memory cell 1472 illustrated in FIG. 35B, the back gate of the transistor M1 may be connected not to the wiring BGL but to the wiring WOL in the memory cell MC. Alternatively, for example, the transistor M1 may be a single-gate transistor, that is, a transistor without a back gate in the memory cell MC as in a memory cell 1473 illustrated in FIG. 35C.

In the case where the semiconductor device described in any of the above embodiments is used in the memory cell 1471 and the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long time, and thus the frequency of the refresh operation for the memory cell can be decreased. Alternatively, refresh operation for the memory cell can be unnecessary. In addition, since the transistor M1 has an extremely low leakage current, multi-level data or analog data can be retained in the memory cell 1471, the memory cell 1472, and the memory cell 1473.

In the DOSRAM, when the sense amplifier is provided below the memory cell array 1470 so that they overlap with each other as described above, the bit line can be shortened. This reduces bit line capacitance, which can reduce the storage capacitance of the memory cell.

[NOSRAM]

FIG. 35D to FIG. 35G each illustrate a circuit structure example of a gain-cell memory cell including two transistors and one capacitor. A memory cell 1474 illustrated in FIG. 35D includes a transistor M2, a transistor M3, and a capacitor CB. Note that the transistor M2 includes a top gate (simply referred to as a gate in some cases) and a back gate. In this specification and the like, a storage device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB. A second terminal of the transistor M2 is connected to a wiring WBL. The gate of the transistor M2 is connected to the wiring WOL. The back gate of the transistor M2 is connected to the wiring BGL. A second terminal of the capacitor CB is connected to the wiring CAL. A first terminal of the transistor M3 is connected to a wiring RBL. A second terminal of the transistor M3 is connected to a wiring SL. A gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. In the time of data writing and data reading, a high-level potential is preferably applied to the wiring CAL. In the time of data retaining, a low-level potential is preferably applied to the wiring CAL. The wiring BGL functions as a wiring for applying a potential to the back gate of the transistor M2. The threshold voltage of the transistor M2 can be increased or decreased by applying a given potential to the wiring BGL.

Here, the memory cell 1474 illustrated in FIG. 35D corresponds to the storage device illustrated in FIG. 29 and FIG. 30. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

The circuit structure of the memory cell MC is not limited to that of the memory cell 1474 and can be changed as appropriate. For example, as in a memory cell 1475 illustrated in FIG. 35E, the back gate of the transistor M2 may be connected not to the wiring BGL but to the wiring WOL in the memory cell MC. Alternatively, for example, the transistor M2 may be a single-gate transistor, that is, a transistor without a back gate in the memory cell MC as in a memory cell 1476 illustrated in FIG. 35F. For example, the memory cell MC may have a structure in which the wiring WBL and the wiring RBL are combined into one wiring BIL as in a memory cell 1477 illustrated in FIG. 35G.

In the case where the semiconductor device described in any of the above embodiments is used in the memory cell 1474 and the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, with the use of the transistor M2, written data can be retained for a long time, and thus the frequency of the refresh operation for the memory cell can be decreased. Alternatively, refresh operation for the memory cell can be unnecessary. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter, sometimes referred to as a Si transistor). The Si transistor may be either an n-channel transistor or a p-channel transistor. A Si transistor has higher field-effect mobility than an OS transistor in some cases. Therefore, a Si transistor may be used as the transistor M3 functioning as a reading transistor. Furthermore, the transistor M2 can be stacked over the transistor M3 when a Si transistor is used as the transistor M3, in which case the area occupied by the memory cell can be reduced, leading to high integration of the storage device.

Alternatively, the transistor M3 may be an OS transistor. When an OS transistor is used as each of the transistor M2 and the transistor M3, the circuit of the memory cell array 1470 can be formed using only n-channel transistors.

FIG. 35H illustrates an example of a gain-cell memory cell including three transistors and one capacitor. A memory cell 1478 illustrated in FIG. 35H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor with a back gate, and the back gate is electrically connected to the wiring BGL. Note that the back gate and the gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors. In this case, the circuit of the memory cell array 1470 can be formed using only n-channel transistors.

In the case where the semiconductor device described in any of the above embodiments is used in the memory cell 1478, the transistor 200 can be used as the transistor M4, the transistors 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

The structure, method, and the like described in this embodiment can be used in an appropriate combination with any of other structures, methods, and the like described in this embodiment or the other embodiments.

Embodiment 5

In this embodiment, an example of a chip 1200 on which the semiconductor device of the present invention is mounted is described with reference to FIG. 36A and FIG. 36B. A plurality of circuits (systems) are mounted on the chip 1200. A technique for integrating a plurality of circuits (systems) into one chip is referred to as system on chip (SoC) in some cases.

Figure 36A:
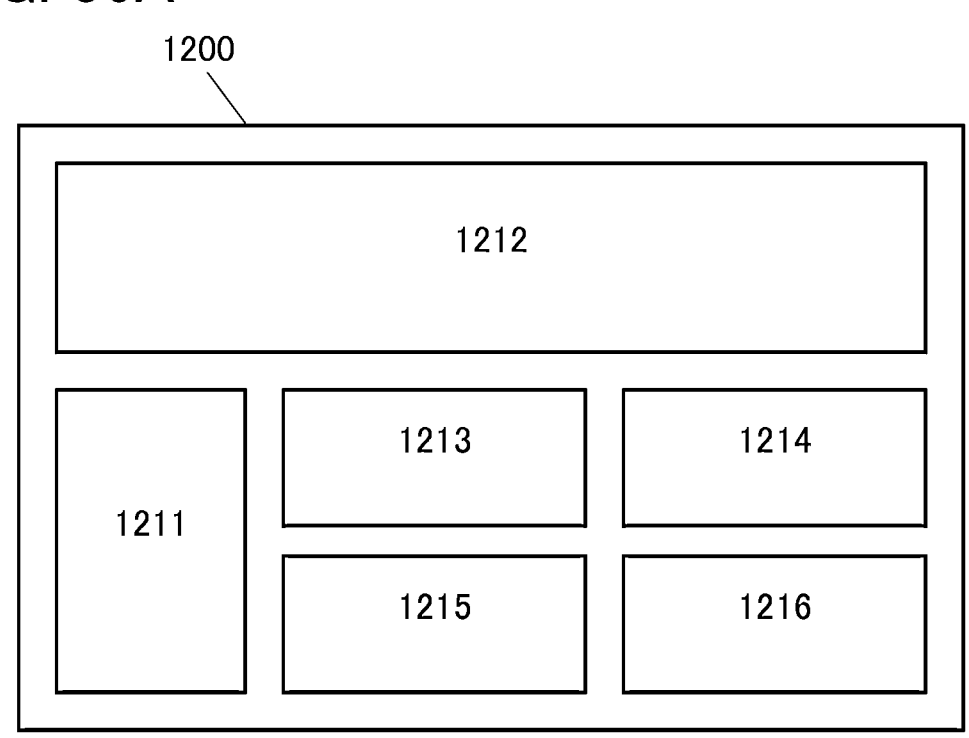
FIG. 36A and FIG. 36B are schematic views of semiconductor devices of one embodiment of the present invention.

As illustrated in FIG. 36A, the chip 1200 includes a CPU 1211, a GPU 1212, one or more analog arithmetic units 1213, one or more memory controllers 1214, one or more interfaces 1215, one or more network circuits 1216, and the like.

Figure 36B:
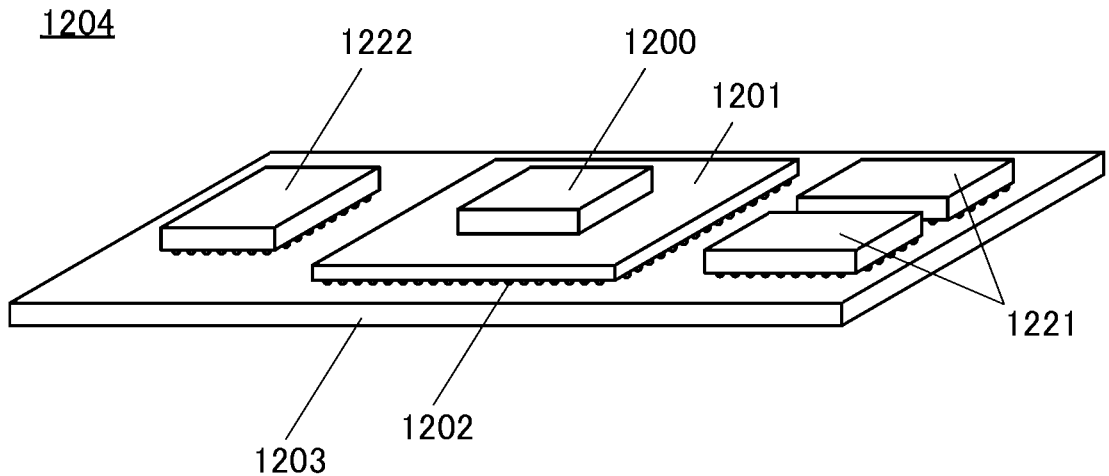

A bump (not illustrated) is provided on the chip 1200, and as illustrated in FIG. 36B, the chip 1200 is connected to a first surface of a package board 1201. In addition, a plurality of bumps 1202 are provided on a rear side of the first surface of the package board 1201, and the package board 1201 is connected to a motherboard 1203.

Storage devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit including an oxide semiconductor of the present invention is provided in the GPU 1212, image processing or product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of steps in the manufacturing process; thus, the chip 1200 can be manufactured at low cost.

The motherboard 1203 provided with the package board 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

At least part of the structure, method, and the like described in this embodiment can be implemented in appropriate combination with any of those in the other embodiments, the other examples, and the like described in this specification.

Embodiment 6

In this embodiment, a semiconductor device functioning as the CPU described in the above embodiment is described. The semiconductor device described in this embodiment is a semiconductor device that functions as a CPU capable of operating with ultra-low power consumption.

An example of a CPU 3310 including a CPU core 3311 capable of power gating is described.

Figure 37:
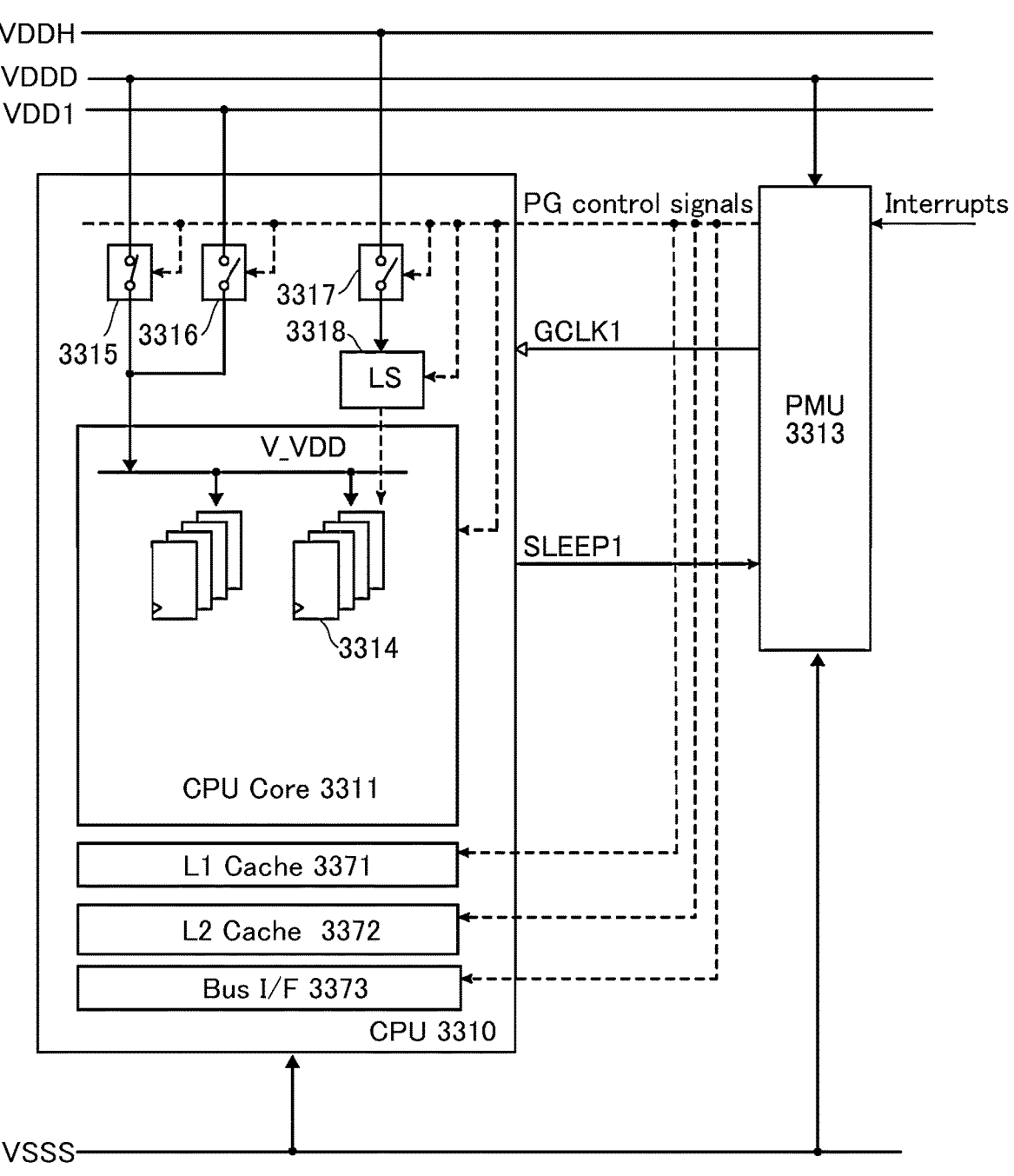
FIG. 37 is a diagram illustrating a structure example of a CPU.

FIG. 37 shows a structure example of the CPU 3310. The CPU 3310 includes the CPU core 3311, an L1 (level 1) cache memory device (L1 Cache) 3371, an L2 cache memory device (L2 Cache) 3372, a bus interface portion (Bus I/F) 3373, a power switch 3315 to a power switch 3317, and a level shifter (LS) 3318. The CPU core 3311 includes a flip-flop 3314.

Through the bus interface portion 3373, the CPU core 3311, the L1 cache memory device 3371, and the L2 cache memory device 3372 are mutually connected to one another.

A PMU 3313 generates a clock signal GCLK1 and various PG (power gating) control signals in response to signals such as an interrupt signal (Interrupts) input from the outside and a signal SLEEP1 issued from the CPU 3310. The clock signal GCLK1 and the PG control signal are input to the CPU 3310. The PG control signal controls the power switch 3315 to the power switch 3317 and the flip-flop 3314.

The power switch 3315 and the power switch 3316 control application of voltages VDDD and VDD1 to a virtual power supply line V_VDD (hereinafter referred to as a V_VDD line), respectively. The power switch 3317 controls application of a voltage VDDH to the level shifter (LS) 3318. A voltage VSSS is input to the CPU 3310 and the PMU 3313 not through the power switches. The voltage VDDD is input to the PMU 3313 not through the power switches.

The voltage VDDD and the voltage VDD1 are drive voltages for a CMOS circuit. The voltage VDD1 is lower than the voltage VDDD and is a drive voltage in a sleep state. The voltage VDDH is a drive voltage for an OS transistor and is higher than the voltage VDDD.

The L1 cache memory device 3371, the L2 cache memory device 3372, and the bus interface portion 3373 each include at least a power domain capable of power gating. The power domain capable of power gating is provided with one or a plurality of power switches. These power switches are controlled by the PG control signal.

The flip-flop 3314 is used for a register. The flip-flop 3314 is provided with a backup circuit. The flip-flop 3314 is described below.

Figure 38A:
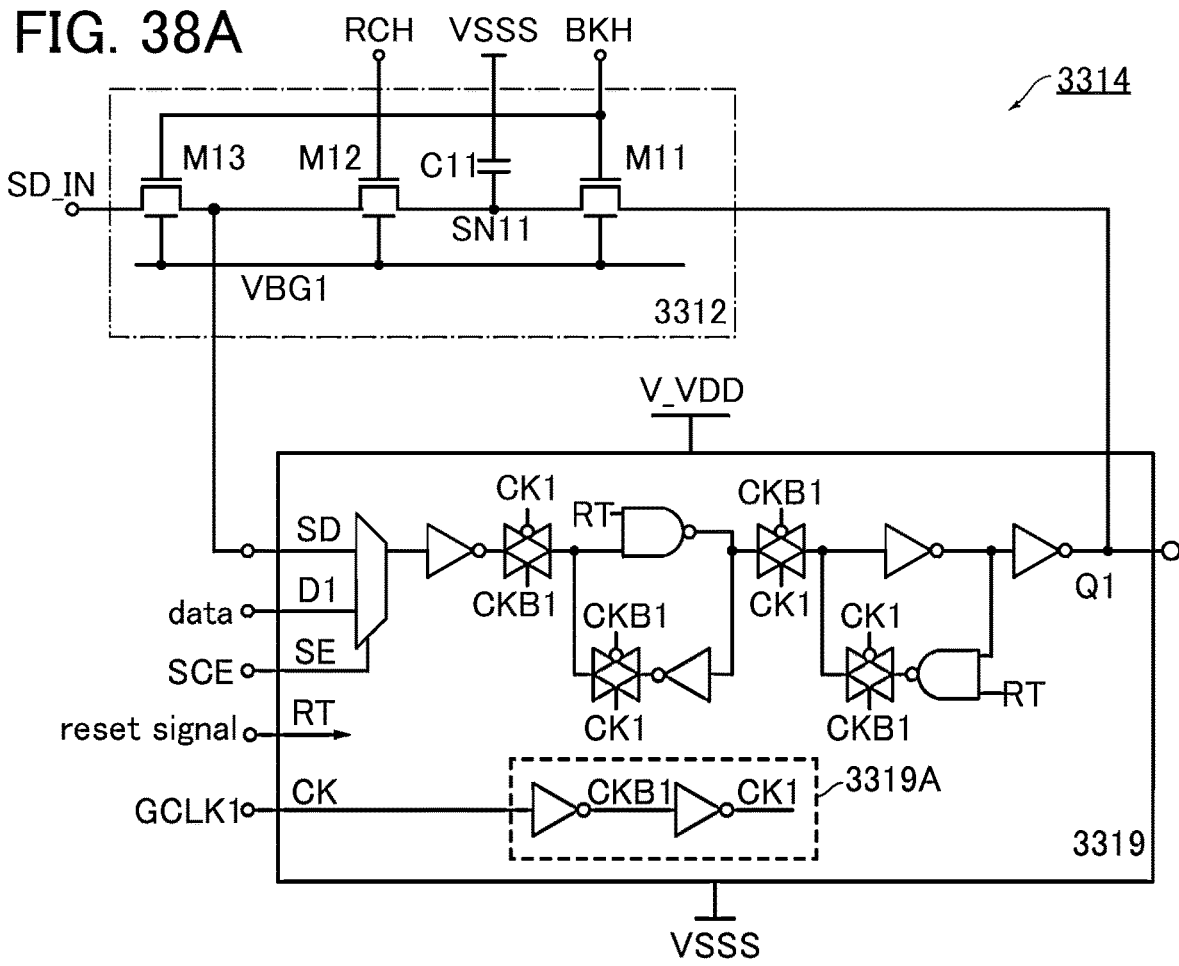
FIG. 38A and FIG. 38B are diagrams each illustrating a structure example of a CPU.

FIG. 38A shows a circuit structure example of the flip-flop 3314. The flip-flop 3314 includes a scan flip-flop 3319 and a backup circuit 3312.

The scan flip-flop 3319 includes a node D1, a node Q1, a node SD, a node SE, a node RT, and a node CK and a clock buffer circuit 3319A.

The node D1 is a data input node, the node Q1 is a data output node, and the node SD is a scan test data input node. The node SE is a signal SCE input node. The node CK is a clock signal GCLK1 input node. The clock signal GCLK1 is input to the clock buffer circuit 3319A. Respective analog switches in the scan flip-flop 3319 are connected to a node CK1 and a node CKB1 of the clock buffer circuit 3319A. The node RT is a reset signal input node.

The signal SCE is a scan enable signal, which is generated in the PMU 3313. The PMU 3313 generates a signal BK and a signal RC. The level shifter 3318 level-shifts the signal BK and the signal RC to generate a signal BKH and a signal RCH. The signal BK is a backup signal and the signal RC is a recovery signal.

The circuit configuration of the scan flip-flop 3319 is not limited to that in FIG. 38A. A scan flip-flop prepared in a standard circuit library can be applied.

The backup circuit 3312 includes a node SD_IN, a node SN11, a transistor M11 to a transistor M13, and a capacitor C11.

The node SD_IN is a scan test data input node and is connected to the node Q1 of the scan flip-flop 3319. The node SN11 is a retention node of the backup circuit 3312. The capacitor C11 is a storage capacitor for retaining the voltage of the node SN11.

The transistor M11 controls continuity between the node Q1 and the node SN11. The transistor M12 controls continuity between the node SN11 and the node SD. The transistor M13 controls continuity between the node SD_IN and the node SD. The on/off of the transistor M11 and the transistor M13 is controlled by the signal BKH, and the on/off of the transistor M12 is controlled by the signal RCH.

The transistor M11 to the transistor M13 are OS transistors. The transistor M11 to the transistor M13 have back gates in the illustrated structure. The back gates of the transistor M11 to the transistor M13 are connected to a power supply line for supplying a voltage VBG1.

At least the transistor M11 and the transistor M12 are preferably OS transistors. Because of extremely low off-state current, which is a feature of the OS transistor, a decrease in the voltage of the node SN11 can be suppressed and almost no power is consumed to retain data; therefore, the backup circuit 3312 has a nonvolatile characteristic. Data is rewritten by charging and discharging of the capacitor C11; hence, there is theoretically no limitation on rewrite cycles of the backup circuit 3312, and data can be written and read out with low energy.

Figure 38B:
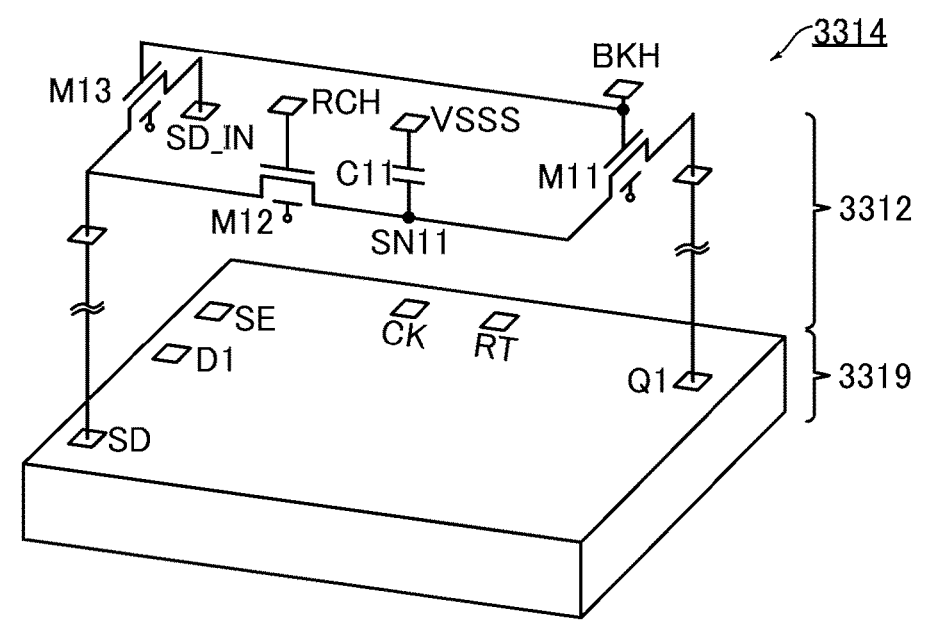

It is very preferable that all of the transistors in the backup circuit 3312 be OS transistors. As shown in FIG. 38B, the backup circuit 3312 can be stacked on the scan flip-flop 3319 configured with a silicon CMOS circuit.

The number of elements in the backup circuit 3312 is much smaller than the number of elements in the scan flip-flop 3319; thus, there is no need to change the circuit structure and layout of the scan flip-flop 3319 in order to stack the backup circuit 3312. That is, the backup circuit 3312 is a backup circuit that has very broad utility. In addition, the backup circuit 3312 can be provided in a region where the scan flip-flop 3319 is formed; thus, even when the backup circuit 3312 is incorporated, the area overhead of the flip-flop 3314 can be zero. Thus, the backup circuit 3312 is provided in the flip-flop 3314, whereby power gating of the CPU core 3311 is enabled. The power gating of the CPU core 3311 is enabled with high efficiency owing to little power necessary for the power gating.

When the backup circuit 3312 is provided, parasitic capacitance due to the transistor M11 is added to the node Q1. However, the parasitic capacitance is lower than parasitic capacitance due to a logic circuit connected to the node Q1; thus, there is no influence of the parasitic capacitance on the operation of the scan flip-flop 3319. That is, even when the backup circuit 3312 is provided, the performance of the flip-flop 3314 does not substantially decrease.

The CPU core 3311 can be set to a clock gating state, a power gating state, or a resting state as a low power consumption state. The PMU 3313 selects the low power consumption mode of the CPU core 3311 on the basis of the interrupt signal, the signal SLEEP1, and the like. For example, in the case of transition from a normal operation state to a clock gating state, the PMU 3313 stops generation of the clock signal GCLK1.

For example, in the case of transition from a normal operation state to a resting state, the PMU 3313 performs voltage and/or frequency scaling. For example, when the voltage scaling is performed, the PMU 3313 turns off the power switch 3315 and turns on the power switch 3316 to input the voltage VDD1 to the CPU core 3311. The voltage VDD1 is a voltage at which data in the scan flip-flop 3319 is not lost. When the frequency scaling is performed, the PMU 3313 reduces the frequency of the clock signal GCLK1.

In the case where the CPU core 3311 transitions from a normal operation state to a power gating state, data in the scan flip-flop 3319 is backed up to the backup circuit 3312. When the CPU core 3311 is returned from the power gating state to the normal operation state, recovery operation of writing back data in the backup circuit 3312 to the scan flip-flop 3319 is performed.

Figure 39:
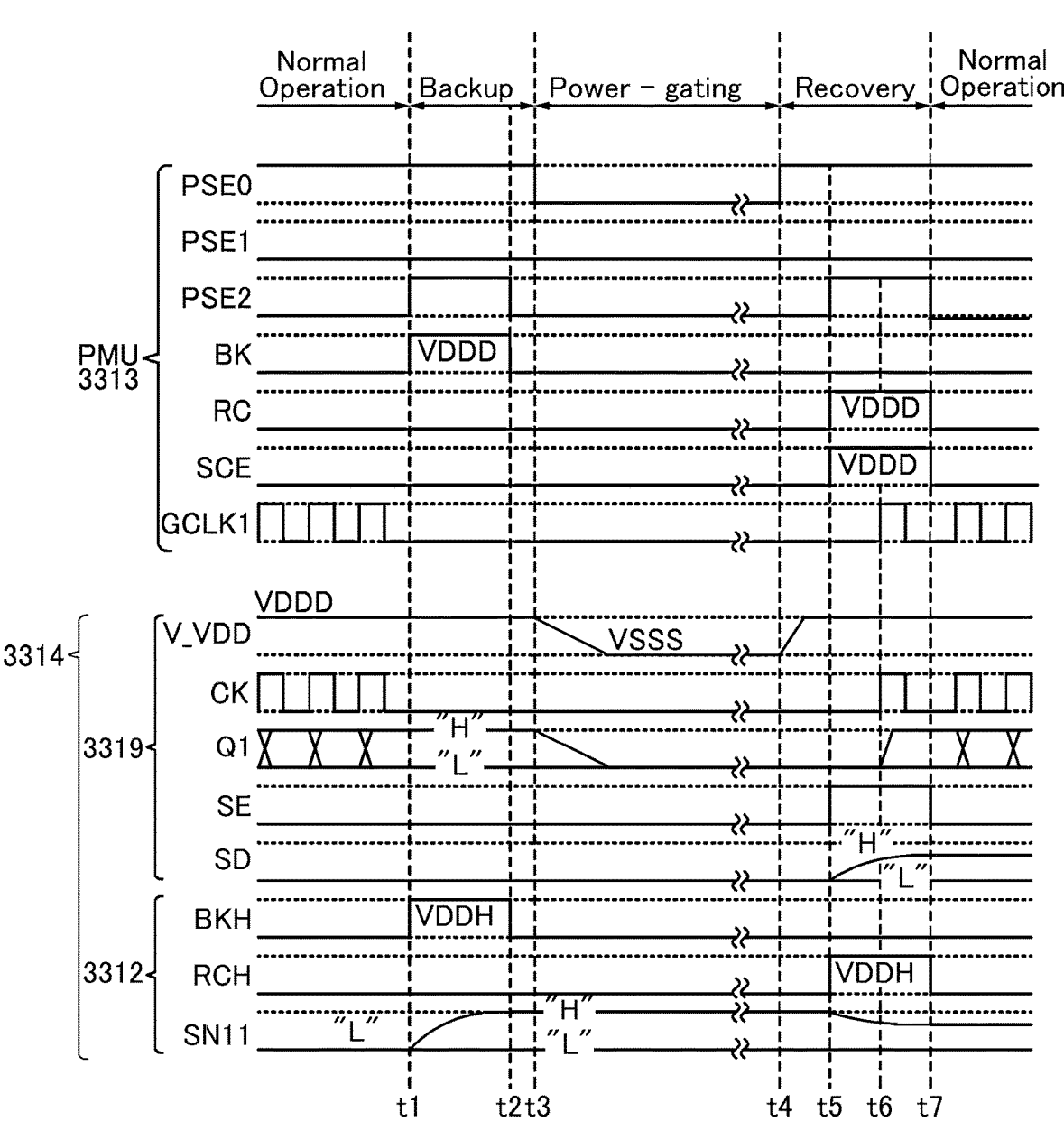
FIG. 39 is a diagram illustrating a structure example of a CPU.

FIG. 39 illustrates an example of the power gating sequence of the CPU core 3311. Note that in FIGS. 39, t1 to t7 represent the time. A signal PSE0 to a signal PSE2 are control signals of the power switch 3315 to the power switch 3317, which are generated in the PMU 3313. When the signal PSE0 is at "H"/"L", the power switch 3315 is on/off. The same applies also to the signal PSE1 and the signal PSE2.

Until Time t1, a normal operation is performed. The power switch 3315 is on, and the voltage VDDD is input to the CPU core 3311. The scan flip-flop 3319 performs the normal operation. At this time, the level shifter 3318 does not need to be operated; thus, the power switch 3317 is off and the signal SCE, the signal BK, and the signal RC are each at "L". The node SE is at "L"; thus, the scan flip-flop 3319 stores data in the node D1. Note that in the example of FIG. 39, the node SN11 of the backup circuit 3312 is at "L" at Time t1.

A backup operation is described. At the operation time t1, the PMU 3313 stops the clock signal GCLK1 and sets the signal PSE2 and the signal BK at "H". The level shifter 3318 becomes active and outputs the signal BKH at "H" to the backup circuit 3312.

The transistor M11 in the backup circuit 3312 is turned on, and data in the node Q1 of the scan flip-flop 3319 is written to the node SN11 of the backup circuit 3312. When the node Q1 of the scan flip-flop 3319 is at "L", the node SN11 remains at "L", whereas when the node Q1 is at "H", the node SN11 becomes "H".

The PMU 3313 sets the signal PSE2 and the signal BK at "L" at Time t2 and sets the signal PSE0 at "L" at Time t3. The state of the CPU core 3311 transitions to a power gating state at Time t3. Note that at the timing when the signal BK falls, the signal PSE0 may fall.

A power-gating operation is described. When the signal PSE0 is set at "L", data in the node Q1 is lost because the voltage of the V_VDD line decreases. The node SN11 retains data that is stored in the node Q1 at Time t3.

A recovery operation is described. When the PMU 3313 sets the signal PSE0 at "H" at Time t4, the power gating state transitions to a recovery state. Charging of the V_VDD line starts, and the PMU 3313 sets the signal PSE2, the signal RC, and the signal SCE at "H" in a state where the voltage of the V_VDD line becomes VDDD (at Time t5).

The transistor M12 is turned on, and electric charge in the capacitor C11 is distributed to the node SN11 and the node SD. When the node SN11 is at "H", the voltage of the node SD increases. The node SE is at "H", and thus, data in the node SD is written to a latch circuit on the input side of the scan flip-flop 3319. When the clock signal GCLK1 is input to the node CK at Time t6, data in the latch circuit on the input side is written to the node Q1. That is, data in the node SN11 is written to the node Q1.

When the PMU 3313 sets the signal PSE2, the signal SCE, and the signal RC at "L" at Time t7, the recovery operation is terminated.

The backup circuit 3312 using an OS transistor is extremely suitable for normally-off computing because both dynamic power consumption and static power consumption are low. Note that the CPU 3310 including the CPU core 3311 including the backup circuit 3312 using an OS transistor can be referred to as NoffCPU (registered trademark). The NoffCPU includes a backup circuit with a nonvolatile property, and power supply to the NoffCPU can be stopped during the time when the NoffCPU does not need to operate. Even when the flip-flop 3314 is mounted, a decrease in the performance and an increase in the dynamic power of the CPU core 3311 can be made hardly to occur.

Note that the CPU core 3311 may include a plurality of power domains capable of power gating. In the plurality of power domains, one or a plurality of power switches for controlling voltage input are provided. In addition, the CPU core 3311 may include one or a plurality of power domains where power gating is not performed. For example, the power domain where power gating is not performed may be provided with a power gating control circuit for controlling the flip-flop 3314 and the power switch 3315 to the power switch 3317.

Note that the application of the flip-flop 3314 is not limited to the CPU 3310. In the CPU 3310, the flip-flop 3314 can be used as the register provided in a power domain capable of power gating.

As described in the above embodiment, a change in electrical characteristics of an OS transistor due to irradiation with radiation is small, i.e., an OS transistor has high tolerance to radiation. Therefore, it can be said that the NoffCPU including a CPU core with a backup circuit using an OS transistor has high tolerance to radiation. The NoffCPU that has high tolerance to radiation and is capable of operating with extremely low power consumption can be favorably used in outer space, for example.

Alternatively, for example, the NoffCPU can be used in semiconductor devices provided in working robots in a nuclear power plant and a treatment plant or a disposal plant for radioactive wastes. In particular, the NoffCPU can be favorably used in the semiconductor devices provided in remote control robots that are controlled remotely in demolishment of a reactor facility, taking out of a nuclear fuel or a fuel debris, a field investigation on a space with a large amount of radioactive substance, and the like.

This embodiment can be combined with the description of the other embodiments as appropriate.

Embodiment 7

In this embodiment, examples of electronic components and electronic devices in which the storage device or the like described in the above embodiment is incorporated are described.

<Electronic Component>

First, examples of an electronic component including a storage device 720 are described with reference to FIG. 40A and FIG. 40B.

Figures 40A, 40B:
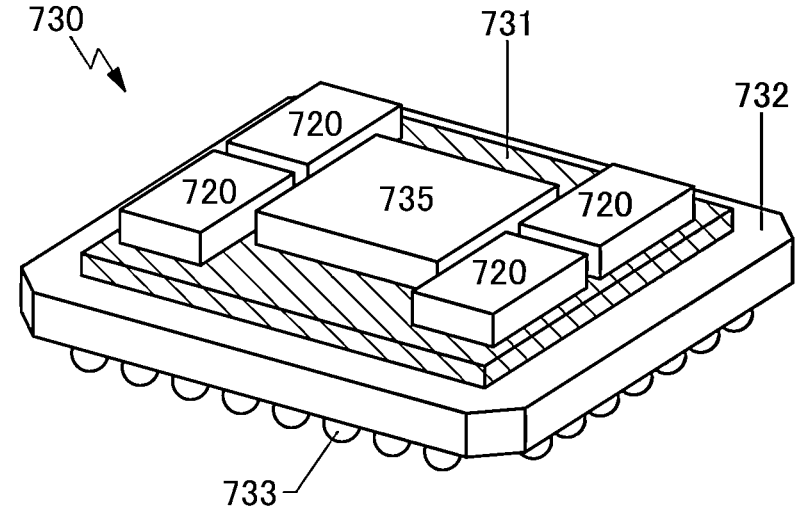
FIG. 40A and FIG. 40B are diagrams illustrating examples of electronic components.

FIG. 40A is a perspective view of an electronic component 700 and a substrate (circuit board 704) on which the electronic component 700 is mounted. The electronic component 700 illustrated in FIG. 40A includes the storage device 720 in a mold 711. FIG. 40A omits part of the electronic component to show the inside of the electronic component 700. The electronic component 700 includes a land 712 outside the mold 711. The land 712 is electrically connected to an electrode pad 713, and the electrode pad 713 is electrically connected to the storage device 720 via a wire 714. The electronic component 700 is mounted on a printed circuit board 702, for example. A plurality of such electronic components are combined and electrically connected to each other on the printed circuit board 702, which forms the circuit board 704.

The storage device 720 includes a driver circuit layer 721 and a storage circuit layer 722.

FIG. 40B is a perspective view of an electronic component 730. The electronic component 730 is an example of a SiP (System in package) or an MCM (Multi Chip Module). In the electronic component 730, an interposer 731 is provided over a package board 732 (printed circuit board) and a semiconductor device 735 and a plurality of storage devices 720 are provided over the interposer 731.

The electronic component 730 using the storage device 720 as a high bandwidth memory (HBM) is illustrated as an example. An integrated circuit (a semiconductor device) such as a CPU, a GPU, or an FPGA can be used as the semiconductor device 735.

As the package board 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package board 732. Accordingly, the interposer is sometimes referred to as a "redistribution substrate" or an "intermediate substrate". A through electrode may be provided in the interposer 731 to be used for electrically connecting the integrated circuit and the package board 732. In the case of using a silicon interposer, a through-silicon via (TSV) can also be used as the through electrode.

A silicon interposer is preferably used as the interposer 731. The silicon interposer can be manufactured at lower cost than an integrated circuit because it is not necessary to provide an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In a SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided on the silicon interposer is less likely to occur. It is particularly preferable to use a silicon interposer for a 2.5D package (2.5-dimensional mounting) in which a plurality of integrated circuits are arranged side by side on the interposer.

A heat sink (radiator plate) may be provided to overlap with the electronic component 730. In the case of providing a heat sink, the heights of integrated circuits provided on the interposer 731 are preferably the same. In the electronic component 730 of this embodiment, the heights of the storage device 720 and the semiconductor device 735 are preferably the same, for example.

An electrode 733 may be provided on the bottom portion of the package board 732 to mount the electronic component 730 on another substrate. FIG. 40B illustrates an example where the electrode 733 is formed of a solder ball. Solder balls are provided in a matrix on the bottom portion of the package board 732, whereby a BGA (Ball Grid Array) can be achieved. Alternatively, the electrode 733 may be formed of a conductive pin. When conductive pins are provided in a matrix on the bottom portion of the package board 732, a PGA (Pin Grid Array) can be achieved.

The electronic component 730 can be mounted on another substrate by various mounting methods not limited to BGA and PGA. For example, a mounting method such as SPGA (Staggered Pin Grid Array), LGA (Land Grid Array), QFP (Quad Flat Package), QFJ (Quad Flat J-leaded package), or QFN (Quad Flat Non-leaded package) can be employed.

The structure, method, and the like described in this embodiment can be used in an appropriate combination with any of other structures, methods, and the like described in this embodiment or the other embodiments.

Embodiment 8

In this embodiment, application examples of the storage device using the semiconductor device described in the above embodiment are described. The semiconductor device described in the above embodiment can be applied to, for example, storage devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable storage devices such as memory cards (e.g., SD cards), USB memories, and SSDs (solid state drives). FIG. 41A to FIG. 41E schematically illustrate some structure examples of removable storage devices. The semiconductor device described in the above embodiment is processed into a packaged memory chip and used in a variety of storage devices and removable memories, for example.

FIG. 41A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

FIG. 41B is a schematic external view of an SD card, and FIG. 41C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. This enables data reading and writing of the memory chip 1114 by wireless communication between a host device and the SD card 1110. The semiconductor device described in the above embodiment can be incorporated in the memory chip 1114 or the like.

FIG. 41D is a schematic external view of an SSD, and FIG. 41E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

At least part of the structure, method, and the like described in this embodiment can be implemented in appropriate combination with any of those in the other embodiments, the other examples, and the like described in this specification.

Embodiment 9

The semiconductor device of one embodiment of the present invention can be used as a processor such as a CPU and a GPU or a chip. FIG. 42A to FIG. 42H illustrate specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. When the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on a display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 42A to FIG. 42H illustrate examples of electronic devices.

[Information Terminal]

Figure 42A:
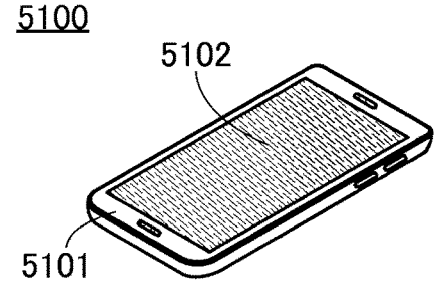
FIG. 42A to FIG. 42H are diagrams illustrating electronic devices of one embodiment of the present invention.

FIG. 42A illustrates a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 42B:
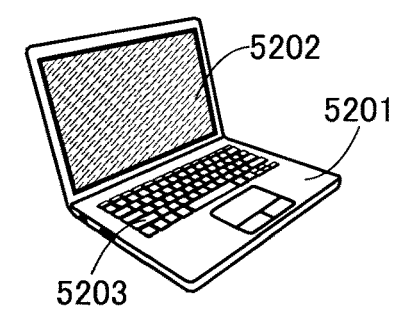

FIG. 42B illustrates a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with the use of the notebook information terminal 5200, novel artificial intelligence can be developed.

Note that although FIG. 42A and FIG. 42B illustrate a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 42C:
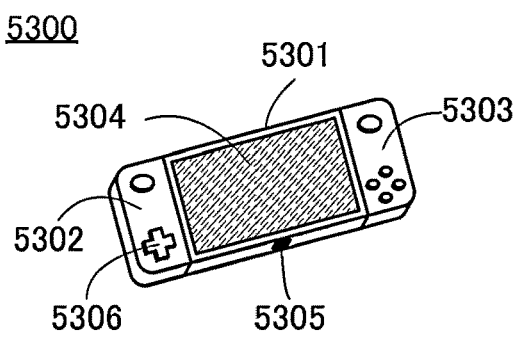

FIG. 42C illustrates a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not illustrated), an image to be output to the display portion 5304 can be output to another video device (not illustrated). In this case, the housing 5302 and the housing 5303 can each function as an operating unit. Thus, a plurality of players can play a game at the same time. The chip described in the above embodiment can be incorporated into the chip provided on a substrate in the housing 5301, the housing 5302 and the housing 5303.

Figure 42D:
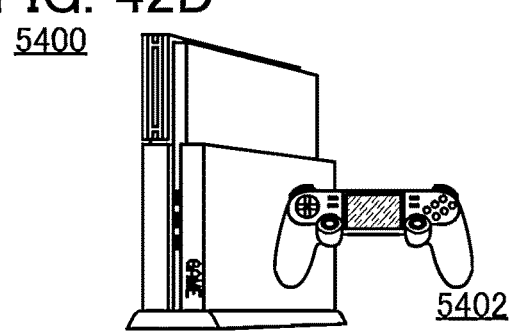

FIG. 42D illustrates a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including AI can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are illustrated as examples of game machines in FIG. 42C and FIG. 42D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 42E:
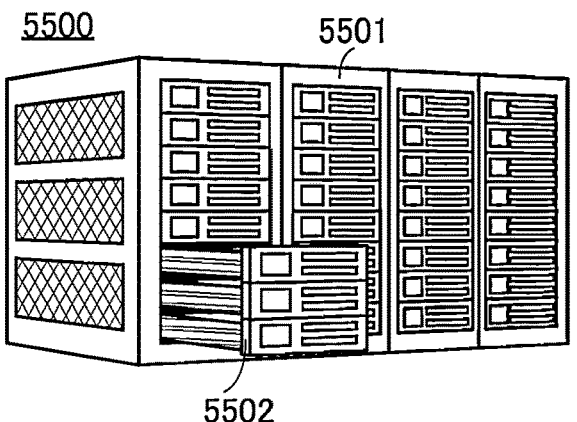
Figure 42F:
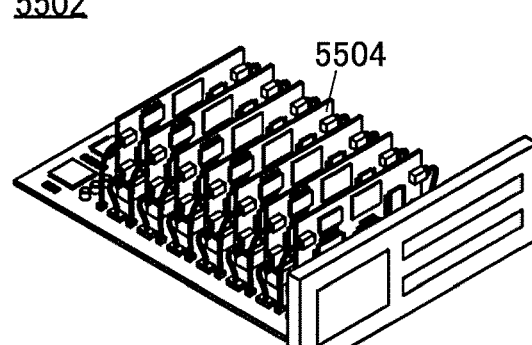

FIG. 42E illustrates a supercomputer 5500 as an example of a large computer. FIG. 42F illustrates a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip described in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is illustrated as an example of a large computer in FIG. 42E and FIG. 42F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 42G:
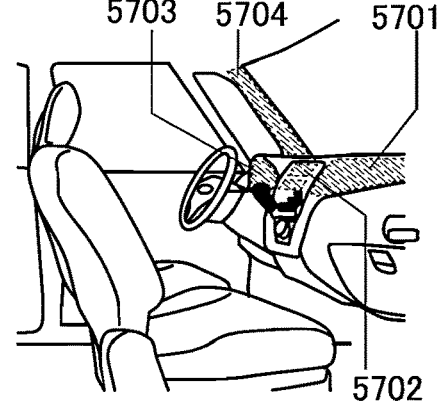

FIG. 42G illustrates an area around a windshield inside an automobile, which is an example of a moving vehicle. FIG. 42G illustrates a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not illustrated) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a system for navigation, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 42H:
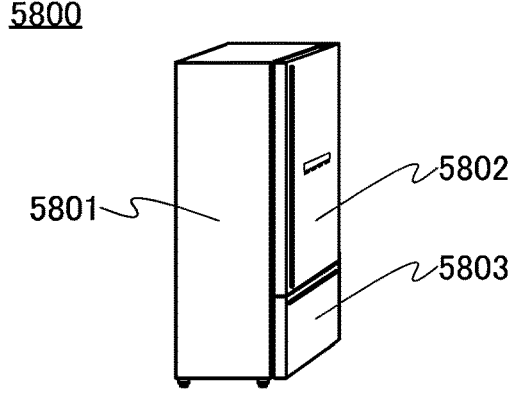

FIG. 42H illustrates an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described as an example of a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

At least part of the structure, method, and the like described in this embodiment can be implemented in appropriate combination with any of those in the other embodiments, the other examples, and the like described in this specification.

Example 1

In this example, in a stack in which a conductor was provided over an oxide, the sheet resistance of the oxide in the depth direction was measured. Sample A used for the measurement is described.

First, a method of fabricating Sample A is described. A quartz substrate was prepared, and a 500-nm-thick oxide was formed over the quartz substrate by a sputtering method using a target with In:Ga:Zn=1:1:1 [atomic ratio]. Next, heat treatment in a nitrogen atmosphere was performed at 400° C. for one hour, and then heat treatment in an oxygen atmosphere was successively performed at 400° C. for one hour.

Then, a 20-nm-thick tantalum nitride film was formed over the oxide by a sputtering method. The tantalum nitride film was formed using a target containing Ta in an atmosphere containing argon and nitrogen at room temperature.

Sample A was divided into four, Sample A1 to Sample A4. Sample A2 to Sample A4 were subjected to heat treatment in a nitrogen atmosphere for one hour. Note that the temperature of the heat treatment in a nitrogen atmosphere performed on Sample A2 was set to 250° C., the temperature of the heat treatment in a nitrogen atmosphere performed on Sample A3 was set to 300° C., and the temperature of the heat treatment in a nitrogen atmosphere performed on Sample A4 was set to 400° C. Note that Sample A1 was not subjected to heat treatment in a nitrogen atmosphere.

Next, the tantalum nitride films of Sample A1 to Sample A4 were removed by a dry etching method. Subsequently, a step of measuring the sheet resistance of the oxide (Step 1) was performed on each sample. Then, a step of etching part of the oxide (Step 2) was performed. Next, a step of measuring the remaining thickness of the oxide (Step 3) was performed. Then, Step 1 to Step 3 were repeated until the sheet resistance became $6 \times 10^6$ $\Omega$/square, which is an over range. Note that in Sample A3 and Sample A4, the sheet resistances were not over range even when the thickness of the etched oxide was approximately 450 nm.

Figure 43:
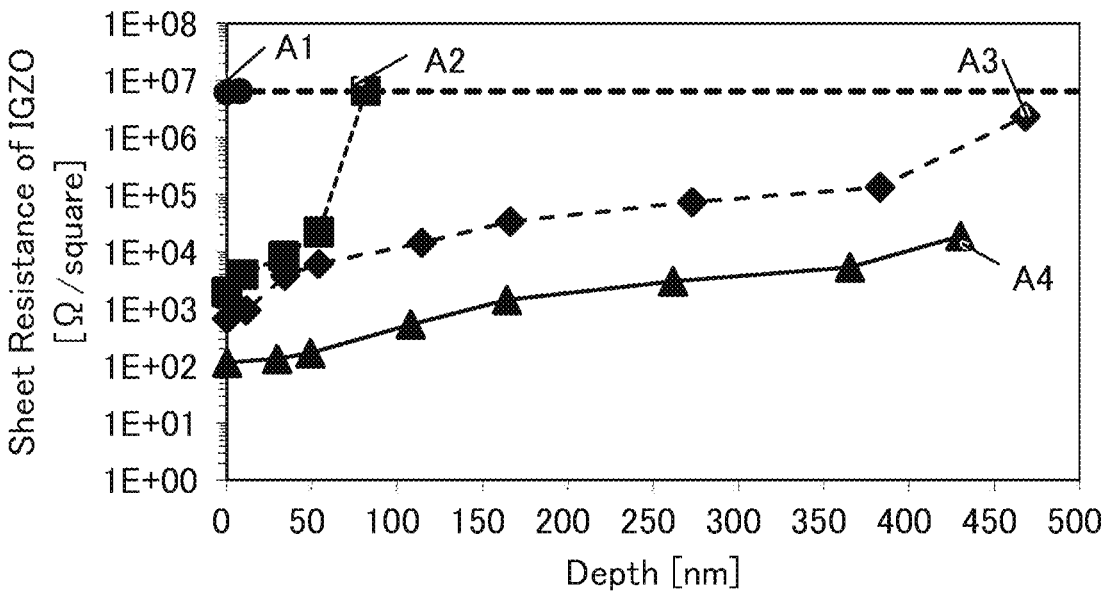
FIG. 43 is a diagram illustrating a correlation between heat treatment temperature and sheet resistance of an oxide.

FIG. 43 is a diagram showing the correlation between the heat treatment temperature and the sheet resistance of the oxide. In FIG. 43, the horizontal axis represents a depth from the surface of the oxide (Depth) [nm], and the vertical axis represents the sheet resistance of the oxide (Sheet Resistance of IGZO) [$\Omega$/square].

It was found from FIG. 43 that when heat treatment was performed in the state where the oxide and the tantalum nitride film were in contact with each other, the sheet resistance of the oxide was lowered and the carrier concentration was increased.

This example can be used in an appropriate combination with the structures, configurations, methods, and the like described in other embodiments and the other examples.

Example 2

In this example, the transistor described in this embodiment was fabricated, and electrical characteristics of the transistor were measured. Note that the designed values of the fabricated transistor were a channel length of 60 nm and a channel width of 60 nm. In addition, the transistor includes an In—Ga—Zn oxide (CAAC-IGZO) having a CAAC structure in its channel formation region.

Figure 44A:
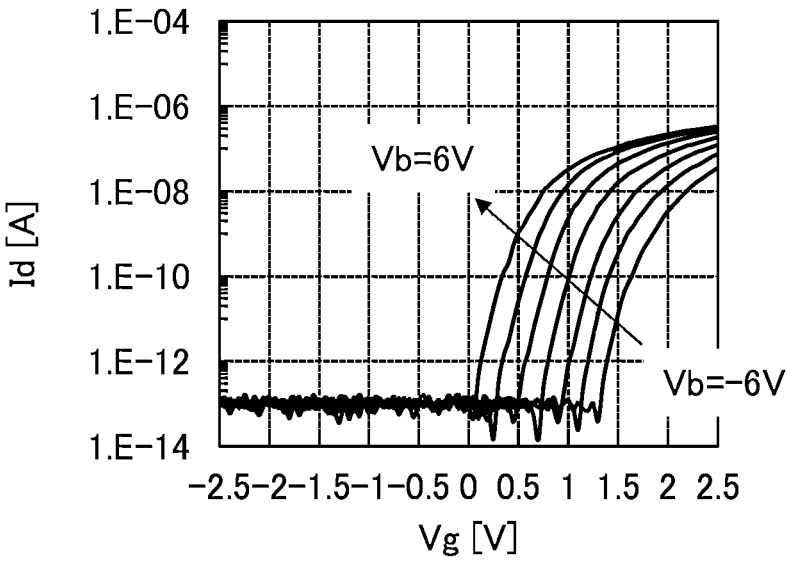
FIG. 44A and FIG. 44B are diagrams each showing Id-Vg characteristics of a fabricated transistor.
Figure 44B:
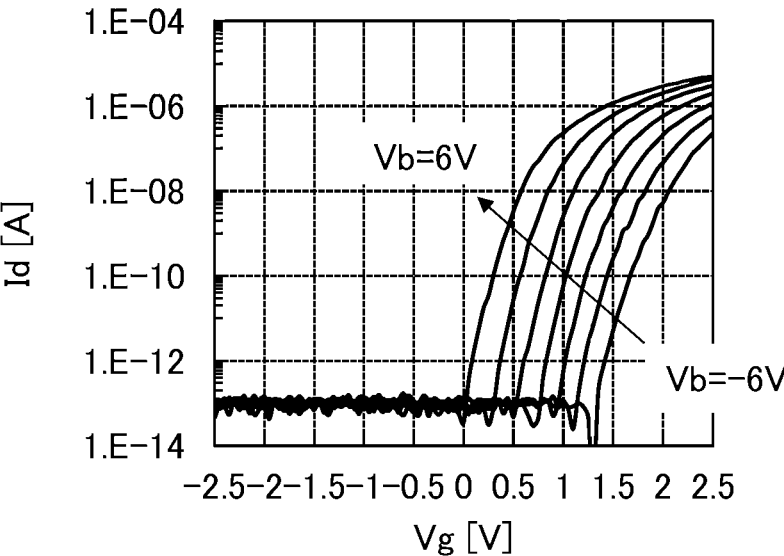

FIG. 44A and FIG. 44B show top gate voltage (denoted as "Vg" in the graph)-drain current (denoted as "Id" in the graph) characteristics of the fabricated transistor.

FIG. 44A shows the measurement results of the top gate voltage-drain current characteristics; the measurement was performed every 2 V from +6 V to −6 V of the back gate voltage with respect to the source (denoted as "Vb" in the graph) when the drain voltage with respect to the source was 0.1 V and the measurement environment temperature was 27° C.

FIG. 44B shows the measurement results of the top gate voltage-drain current characteristics; the measurement was performed every 2 V from +6 V to −6 V of the back gate voltage with respect to the source when the drain voltage with respect to the source was 2.5 V and the measurement environment temperature was 27° ° C.

The state in which the threshold voltage of the fabricated transistor increases or decreases in accordance with the back gate voltage with respect to the source can be observed in FIG. 44A and FIG. 44B.

Next, gate voltage-capacitance characteristics of the fabricated transistor are described with reference to FIG. 45A1 to FIG. 45D2.

FIG. 45A1, FIG. 45B1, FIG. 45C1, and FIG. 45D1 are diagrams illustrating capacitance. In FIG. 45A1, FIG. 45B1, FIG. 45C1, and FIG. 45D1, G indicates a first gate (also referred to as a top gate), S indicates a source, D indicates a drain, and BG indicates a second gate (also referred to as a back gate).

FIG. 45A2 and FIG. 45B2 are diagrams showing top gate voltage (denoted as "Vg" in the diagrams)-capacitance characteristics of the fabricated transistor. FIG. 45C2 and FIG. 45D2 are diagrams showing back gate voltage (denoted as "Vbg" in the diagrams)-capacitance characteristics of the fabricated transistor.

The capacitance illustrated in FIG. 45A1 and FIG. 45A2 (denoted as "Cgsd (Cgc)" in the diagrams) is combined capacitance of the top gate-source capacitance and the top gate-drain capacitance. The capacitance illustrated in FIG. 45B1 and FIG. 45B2 (denoted as "Cgb" in the diagrams) is the top gate-back gate capacitance.

FIG. 45A2 and FIG. 45B2 show the measurement results of the top gate voltage-capacitance characteristics; the measurement was performed with the back gate voltage with respect to the source changed from +6 V to −6 V when the drain voltage with respect to the source was 0.0 V, the measurement frequency was 100 kHz, and the measurement environment temperature was 27° C.

The capacitance illustrated in FIG. 45C1 and FIG. 45C2 (denoted as "Cbsd (Cbc)" in the diagrams) is combined capacitance of the back gate-source capacitance and the back gate-drain capacitance. The capacitance illustrated in FIG. 45D1 and FIG. 45D2 (denoted as "Cbg" in the diagrams) is the back gate-top gate capacitance.

FIG. 45C2 and FIG. 45D2 show the measurement results of the back gate voltage-capacitance characteristics; the measurement was performed with the top gate voltage with respect to the source changed from +2.5 V to −2.5 V when the drain voltage with respect to the source was 0.0 V, the measurement frequency was 100 kHz, and the measurement environment temperature was 27° C.

It is found from FIG. 45A2, FIG. 45B2, FIG. 45C2, and FIG. 45D2 that the channel path changes with the top gate voltage with respect to the source.

Figure 46:
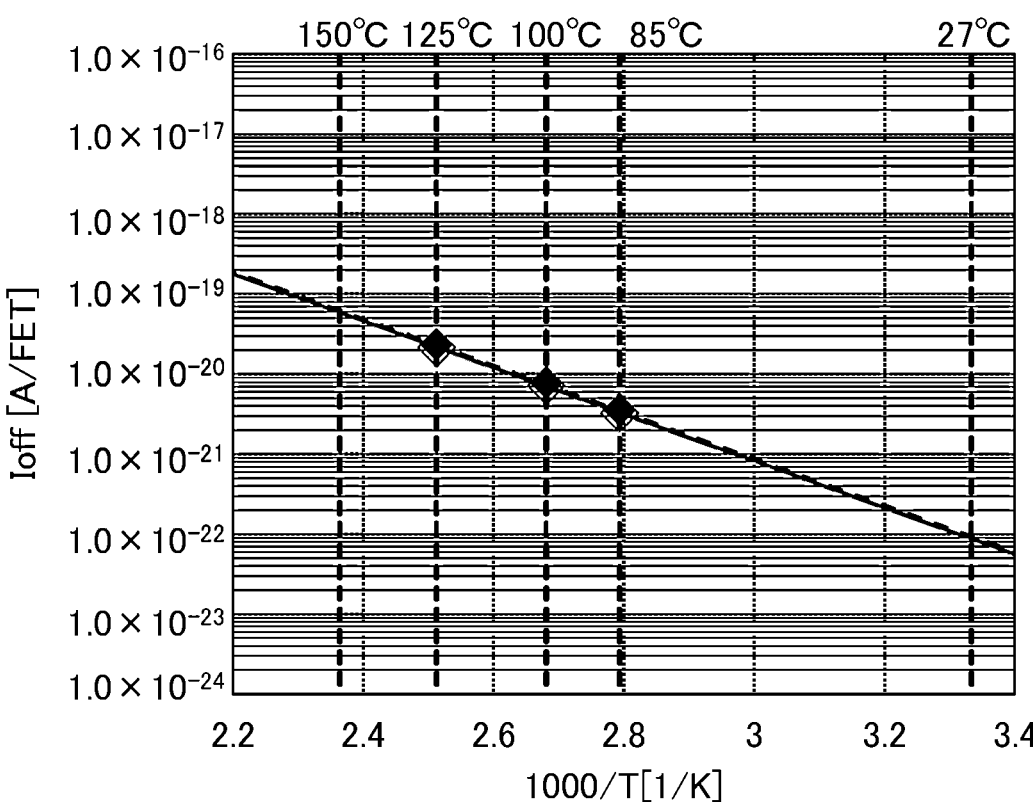
FIG. 46 is a diagram showing measurement environment temperature-off-state current characteristics of a fabricated transistor.

FIG. 46 shows measurement environment temperature-off-state current (denoted as "Ioff" in the diagram) characteristics of the fabricated transistor. FIG. 46 shows the measurement results of the measurement environment temperature-off-state current characteristics under the conditions where the drain voltage with respect to the source was 1.2 V, the top gate voltage was −2 V, the back gate voltage with respect to the source was −3 V, and the measurement environment temperature was 85° C., 100° C., and 125° C. Furthermore, 20000 transistors connected in parallel were used for the measurement.

In FIG. 46, the off-state current value of the transistor fabricated in this example was 3 zA/FET (3×10$^{-21}$ A/FET) at 85° C., which shows that the off-state current was small.

The composition, structure, method, and the like described in this example can be used in combination as appropriate with the compositions, structures, methods, and the like described in the other embodiments and the like.

Example 3

In this example, a TEG that can be subjected to multipoint measurement and described in Embodiment 2 was fabricated, and a variation in electrical characteristics of transistors was evaluated Note that in this example, the multiplexer MUXX, the multiplexer MUXY, the analog switches ASX, and the analog switches ASY were each composed of a CMOS circuit. In other words, the peripheral circuit including the multiplexer MUXX, the multiplexer MUXY, the analog switches ASX, and the analog switches ASY was formed using Si transistors.

Furthermore, in this example, the transistors 200 described in Embodiment 1 were formed as the transistor Tr[1,1] to the transistor Tr[m,n]. That is, the transistor Tr[1,1] to the transistor Tr[m,n] each include a metal oxide in the channel formation region. Specifically, the first gate of the transistor Tr corresponds to the conductor 260 described in Embodiment 1, the second gate of the transistor Tr corresponds to the conductor 205 described in Embodiment 1, and the source or the drain of the transistor Tr corresponds to the conductor 242a, the conductor 242b, the region 230ba, or the region 230bb described in Embodiment 1.

In this example, m and n were each 128. The design values of each transistor were a channel length of 60 nm and a channel width of 60 nm.

Figure 47:
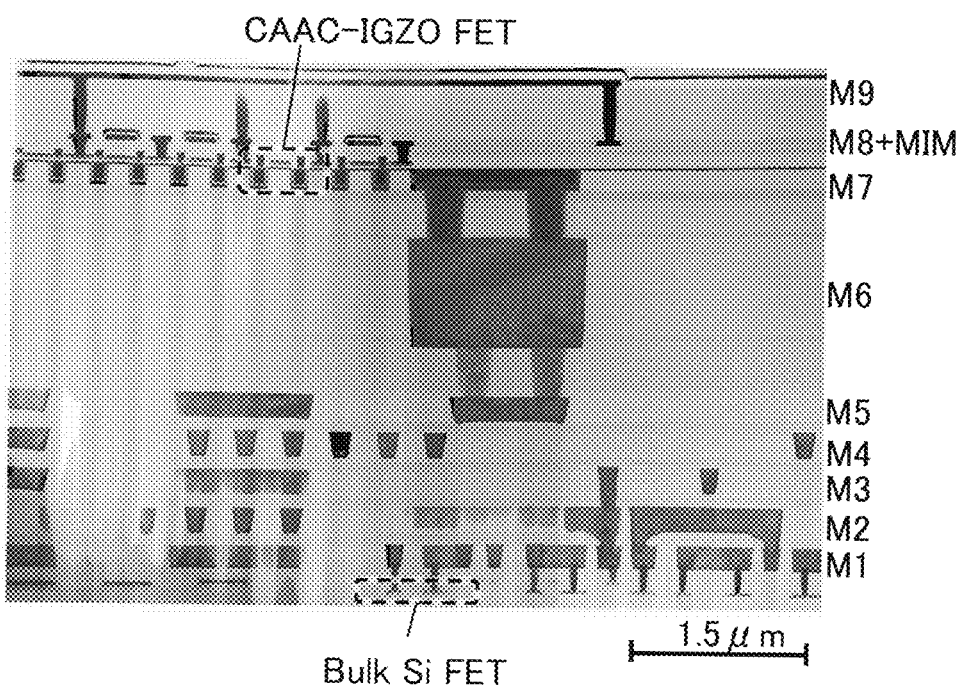
FIG. 47 is a cross-sectional TEM image of a semiconductor device.

FIG. 47 shows an enlarged cross-sectional TEM image of part of the TEG 900 fabricated in this example. The TEG 900 includes a layer M1 to a layer M9. Note that the layer M1 to the layer M9 are layers including conductors such as wirings or electrodes. FIG. 47 shows that an OS transistor (CAAC-IGZO FET) and a capacitor (MIM) with an MIM (Metal-Insulator-Metal) structure are provided above a Si transistor (Bulk Si FET).

The above is the description of the TEG 900 used in this example.

<Evaluation of Variation in Electrical Characteristics of Transistors (1)>

Here, evaluation results of a variation in electrical characteristics of transistors formed over a substrate are described.

Figure 48:
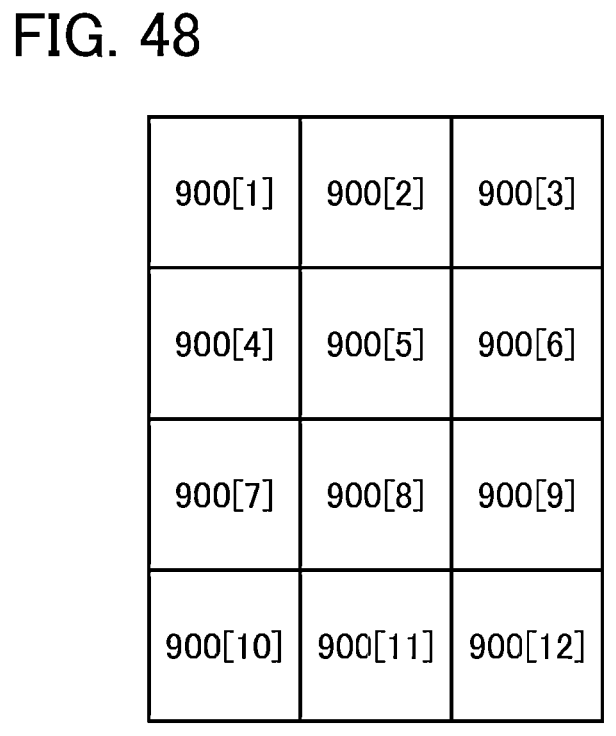

First, 12 TEGs 900 described above were placed in a 5-inch-square (12.7 cm×12.7 cm) silicon substrate. FIG. 48 shows the layout of the 12 TEGs 900 (a TEG 900[1] to a TEG 900[12]). Note that a variation in electrical characteristics of transistors in each of the TEG 900[1] to the TEG 900[12] is referred to as a local variation in the following description.

In this example, the Id-Vg characteristics of the transistor Tr were measured, and the threshold voltage (Vth) and the field-effect mobility (u) were calculated from the measured Id-Vg characteristics. Note that in the Id-Vg characteristic measurement, a potential applied to the source electrode of the transistor Tr was set to 0 V, a potential applied to the drain electrode of the transistor Tr was set to 0.1 V, and a potential applied to the second gate electrode of the transistor Tr was set to 0 V.

FIG. 49A to FIG. 50F are diagrams showing variations in threshold voltages (Vth) of the transistors that were calculated from the TEG 900[1] to the TEG 900[12]. FIG. 49A to FIG. 49F are histograms of the threshold voltages calculated for 1024 transistors among the transistors Tr included in the TEG 900[1] to the TEG 900[6], respectively. FIG. 50A to FIG. 50F are histograms of the threshold voltages calculated for 1024 transistors among the transistors Tr included in the TEG 900[7] to the TEG 900[12], respectively. In FIG. 49A to FIG. 50F, the horizontal axis represents the threshold voltage (Vth) [V], and the vertical axis represents frequency (count).

Note that FIG. 49A to FIG. 50F show the threshold voltages (Vth) calculated by a root Id method. Here, the root Id method is a method in which, in the Id-Vg curve where the horizontal axis represents gate voltage Vg [V]) and the vertical axis represents the square root of drain current $Id^{1/2}$ [A], a gate voltage at the intersection of the tangent to the curve at a point where the slope of the curve is the steepest and the line of $Id^{1/2}=0$ (i.e., the Vg axis) is defined as a threshold voltage.

According to FIG. 49A to FIG. 50F, the median value of the threshold voltages was 1.32 V, and the deviation (σ) was 0.16 V. This shows that the OS transistors fabricated in this example had a small variation in threshold voltages.

FIG. 51A to FIG. 52F are diagrams showing variations in field-effect mobilities (μ) of the transistors that were calculated from the TEG 900[1] to the TEG 900[12]. FIG. 51A to FIG. 51F are histograms of the field-effect mobilities calculated for 1024 transistors among the transistors Tr included in the TEG 900[1] to the TEG 900[6], respectively. FIG. 52A to FIG. 52F are histograms of the field-effect mobilities calculated for 1024 transistors among the transistors Tr included in the TEG 900[7] to the TEG 900[12], respectively. In FIG. 51A to FIG. 52F, the horizontal axis represents field-effect mobility (mobility) [cm²/(V·s)], and the vertical axis represents frequency (count).

Note that FIG. 51A to FIG. 52F show the field-effect mobilities calculated with the equation of the linear region of gradual channel approximation.

It was found from FIG. 51A to FIG. 52F that the OS transistors fabricated in this example had a small variation in field-effect mobilities.

<Evaluation of Variation in Electrical Characteristics of Transistors (2)>

Here, an influence of an arrangement method of the transistor Tr[1,1] to the transistor Tr[m,n] on a variation in electrical characteristics of the transistors was evaluated.

Figure 53A:
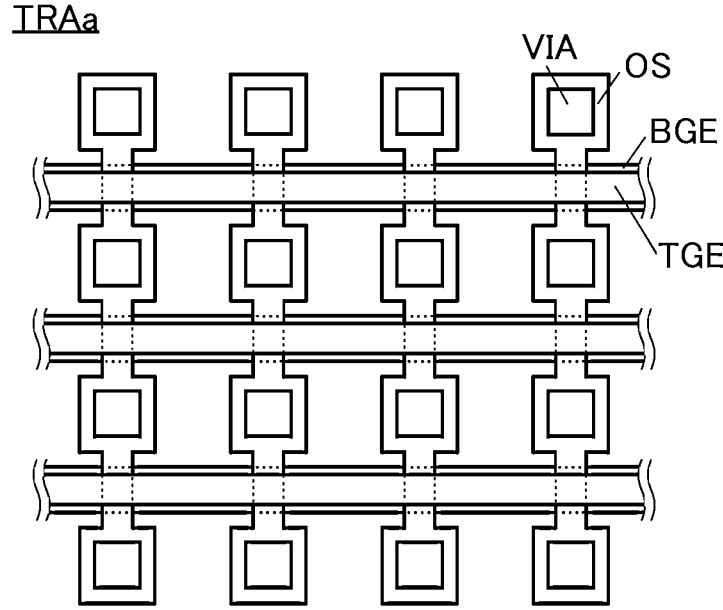
FIG. 53A and FIG. 53B are diagrams illustrating arrangement methods of transistors.
Figure 53B:
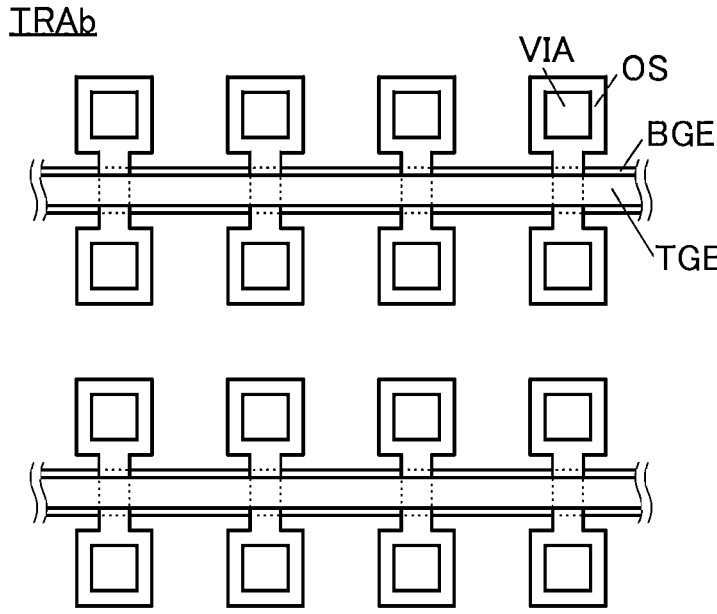

FIG. 53A and FIG. 53B are diagrams each illustrating the arrangement method of the transistor Tr[1,1] to the transistor Tr[m,n]. Here, the transistor Tr[1,1] to the transistor Tr[m,n] with the arrangement illustrated in FIG. 53A are referred to as a transistor group TRAa. The transistor Tr[1,1] to the transistor Tr[m,n] with the arrangement illustrated in FIG. 53B are referred to as a transistor group TRAb.

In FIG. 53A and FIG. 53B, an oxide OS is a metal oxide including a channel formation region and corresponds to the oxide 230 described in Embodiment 1. A conductor TGE is a first gate and corresponds to the conductor 260 described in Embodiment 1. A conductor BGE is a second gate and corresponds to the conductor 205 described in Embodiment 1. A conductor VIA is a conductor connected to a source electrode or a drain electrode and corresponds to the conductor 240 described in Embodiment 1.

The transistor group TRAa illustrated in FIG. 53A has a structure in which a source electrode or drain electrode of a transistor also serves as a source electrode or drain electrode of a transistor adjacent to the transistor in the channel length direction. The transistor group TRAb illustrated in FIG. 53B has a structure in which a source electrode or drain electrode of a transistor is separated from a source electrode or drain electrode of a transistor adjacent to the transistor in the channel length direction.

A variation in electrical characteristics of transistors was evaluated for the TEG 900 including the transistor group TRAa and the TEG 900 including the transistor group TRAb. Specifically, Id-Vg characteristics were measured for 1024 transistors among the transistors Tr included in the transistor group TRAa and 1024 transistors among the transistors Tr included in the transistor group TRAb. Note that in the Id-Vg characteristic measurement, a potential applied to the source electrode of the transistor Tr was set to 0 V, a potential applied to the drain electrode of the transistor Tr was set to 0.1 V, and a potential applied to the second gate electrode of the transistor Tr was set to 0 V.

Figure 54A:
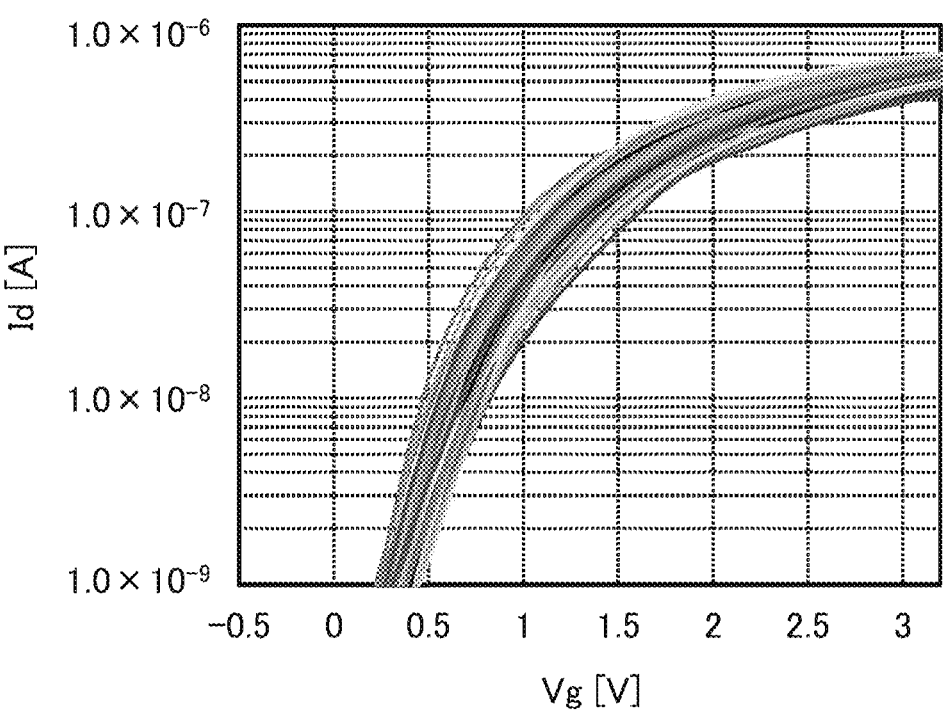
FIG. 54A and FIG. 54B are diagrams each showing Id-Vg characteristics of transistors.
Figure 54B:
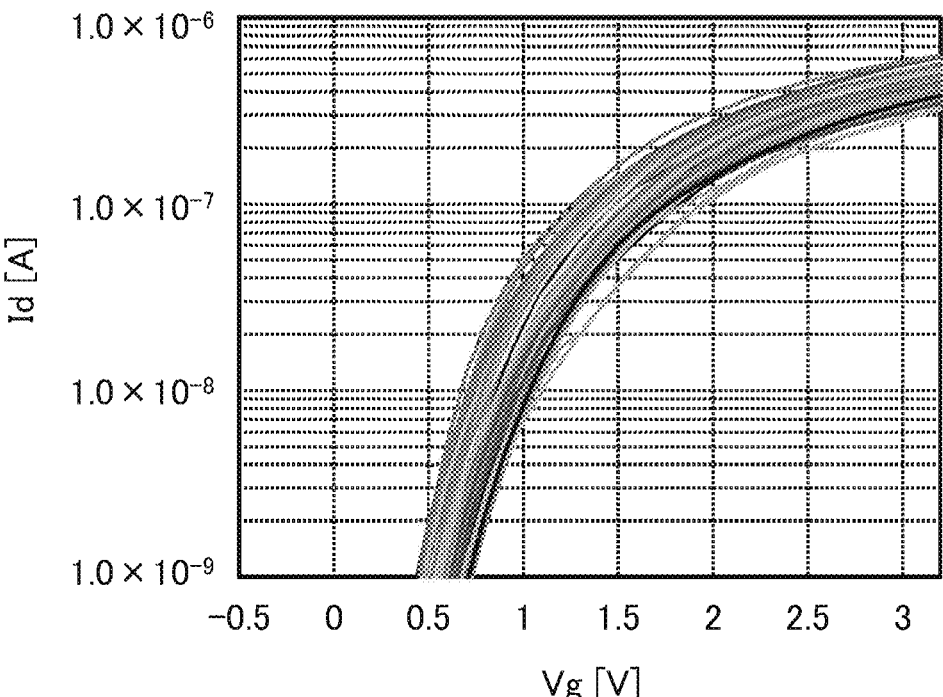

FIG. 54A and FIG. 54B are diagrams showing the Id-Vg characteristics of the transistors. FIG. 54A shows the Id-Vg characteristics of 192 transistors among the 1024 transistors Tr of the transistor group TRAa subjected to the measurement. FIG. 54B shows the Id-Vg characteristics of 192 transistors among the 1024 transistors Tr of the transistor group TRAb subjected to the measurement. In FIG. 54A and FIG. 54B, the horizontal axis represents gate potential (Vg) [V] and the vertical axis represents drain current (Id) [A].

Figure 55A:
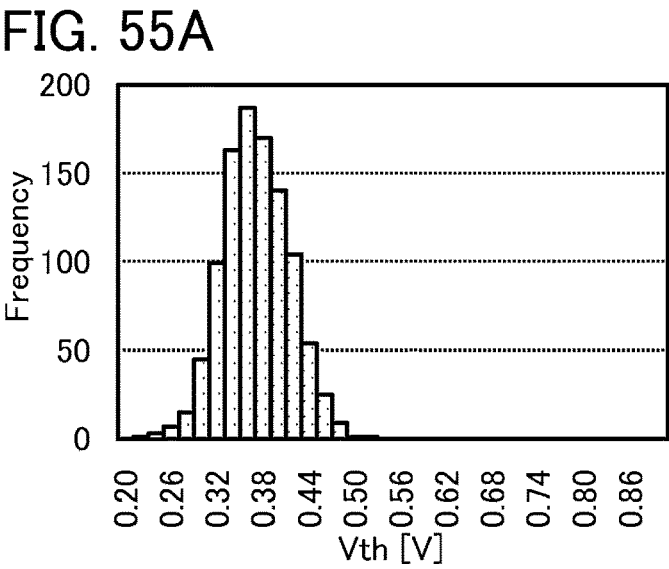
FIG. 55A to FIG. 55C are diagrams showing variations in threshold voltages of transistors.
Figure 55B:
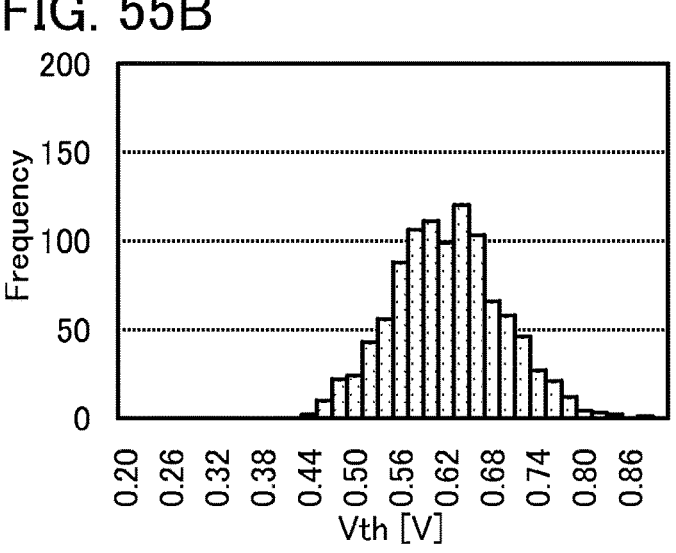
Figure 55C:
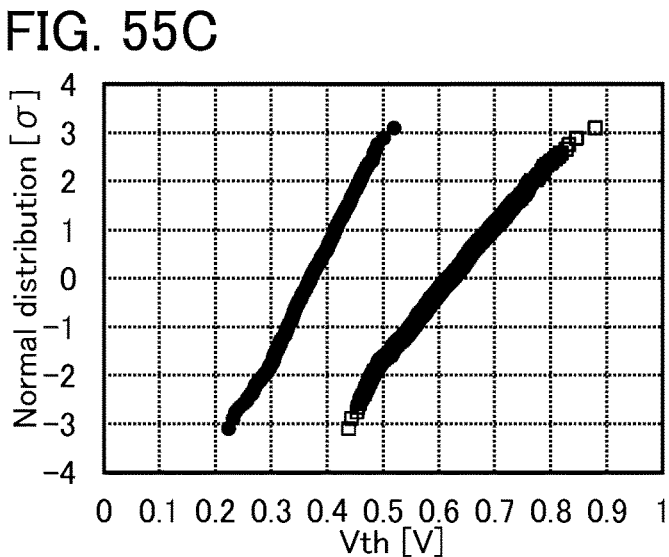

FIG. 55A to FIG. 55C are diagrams showing variations in threshold voltages (Vth) of the transistors included in the transistor group TRAa and the transistor group TRAb. Note that the threshold voltages (Vth) shown in FIG. 55A to FIG. 55C were calculated by a constant current method. Here, the constant current method is a method in which, from the results of Id-Vg characteristics, Vg in the case where a constant current (here, 1 nA) flows is set to a threshold voltage (Vth).

FIG. 55A is a histogram of the threshold voltages calculated for 1024 transistors among the transistors Tr included in the transistor group TRAa. FIG. 55B is a histogram of the threshold voltages calculated for 1024 transistors among the transistors Tr included in the transistor group TRAb. In FIG. 55A and FIG. 55B, the horizontal axis represents threshold voltage (Vth) [V], and the vertical axis represents frequency (Frequency).

It was found from FIG. 55A and FIG. 55B that the transistors included in the transistor group TRAa had a small median value of the threshold voltages and a small variation in threshold voltages as compared with the transistors included in the transistor group TRAb. Note that in the 1024 transistors among the transistors included in the transistor group TRAa, the median value of the threshold voltages was 0.37 V and the standard deviation of the threshold voltages was 43 mV.

FIG. 55C shows a normal quantile plot of the threshold voltages shown in FIG. 55A and FIG. 55B. In FIG. 55C, the horizontal axis represents threshold voltage (Vth) [V], and the vertical axis represents normal distribution [σ].

FIG. 55C shows that the normal quantile plot is approximately linear in both the cases of the transistor group TRAa and the transistor group TRAb, suggesting that the variations in threshold voltages exhibit normal distribution.

At least parts of the structure, the method, and the like shown in this example can be implemented in appropriate combination with other embodiments described in this specification.

Example 4

In this example, a semiconductor device illustrated in FIG. 56A to FIG. 56D was fabricated, the reliability of the transistor 200 was evaluated, and the stress time dependence was evaluated.

FIG. 56A is a top view of the semiconductor device. FIG. 56B is a cross-sectional view corresponding to a portion indicated by the dashed-dotted line A1-A2 in FIG. 56A. FIG. 56C is a cross-sectional view corresponding to a portion indicated by the dashed-dotted line A3-A4 in FIG. 56A. FIG. 56D is a cross-sectional view corresponding to a portion indicated by the dashed-dotted line A5-A6 in FIG. 56A. For clarity of the drawing, some components are not shown in the top view of FIG. 56A.

The semiconductor device illustrated in FIG. 56A to FIG. 56D is a modification example of the semiconductor device illustrated in FIG. 1A to FIG. 1D. The semiconductor device illustrated in FIG. 56A to FIG. 56D differs from the semiconductor device illustrated in FIG. 1A to FIG. 1D in that the insulator 252 and the insulator 254 are not provided. Another difference is that the insulator 250 and the insulator 283 each have a stacked-layer structure and the insulator 241 has a single-layer structure.

In the transistor 200 included in the semiconductor device illustrated in FIG. 56A to FIG. 56D, the oxide 230*a* was formed using an In—Ga—Zn oxide film deposited by a sputtering method using an oxide target with In:Ga:Zn=1: 3:4 [atomic ratio]. The oxide 230*b* was formed using an In—Ga—Zn oxide film deposited by a sputtering method using an oxide target with In:Ga:Zn=4:2:4.1 [atomic ratio]. Note that the oxide 230*a* and the oxide 230*b* were formed by successive deposition.

For the conductor 242, tantalum nitride was formed. For the insulator 250*a*, silicon oxynitride was formed. For the insulator 250*b*, hafnium oxide was formed by an ALD method.

For the conductor 260*a*, titanium nitride was formed. For the conductor 260*b*, tungsten was formed. Note that a film to be the conductor 260*a* and a film to be the conductor 260*b* were formed by successive deposition.

Note that the transistor 200 fabricated in this example was subjected to heat treatment in a nitrogen atmosphere at 400° C. for eight hours before the reliability evaluation.

The transistor 200 formed in this example had a size with a channel length of 60 nm and a channel width of 60 nm.

The reliability was evaluated by a +GBT (Gate Bias Temperature) stress test at a stress temperature of 150° C. The set temperature was 150° C.; the drain potential Vd, the source potential Vs, and the bottom gate potential Vbg were set to 0 V; and the top gate potential Vg was set to +3.63 V.

In this example, a change in ΔVsh with stress time was evaluated by the +GBT stress test. Note that ΔVsh is the amount of change in shift voltage (Vsh). Here, the shift voltage (Vsh) is, in the Id-Vg transistor characteristics curve of the transistor 200, a value of Vg at the intersection of the tangent having the maximum slope with Id=$1.0 \times 10^{-12}$ A.

Figure 57:
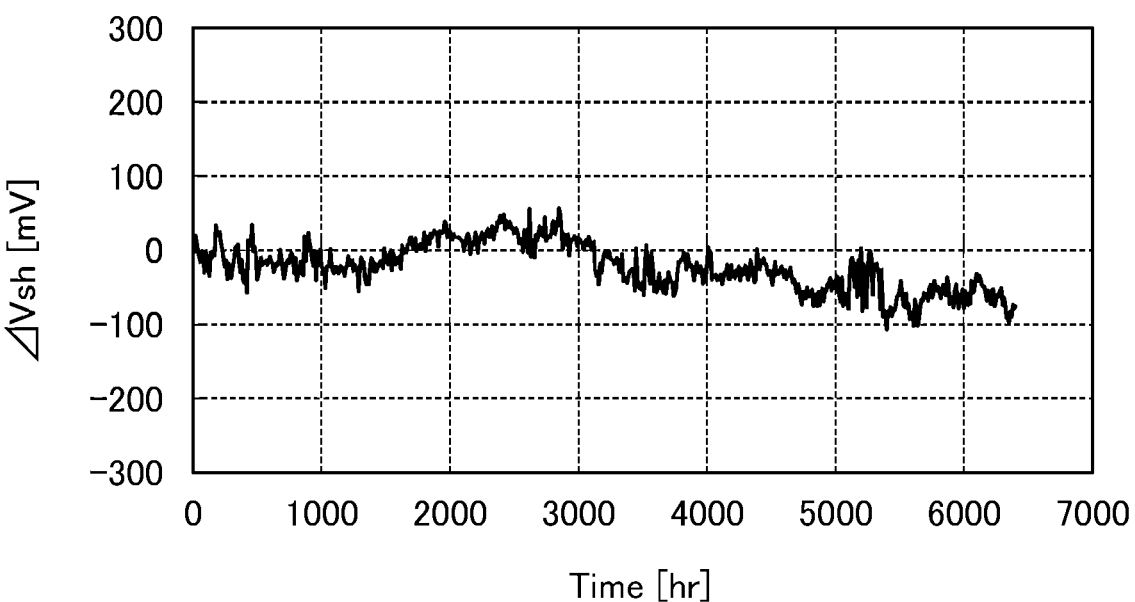
FIG. 57 is a diagram showing stress time dependence of ΔVsh in a +GBT stress test in this example.

FIG. 57 is a graph showing stress time dependence of ΔVsh. In FIG. 57, the horizontal axis represents stress time (Time) [hr], and the vertical axis represents ΔVsh [mV].

In a period until a stress time of 5390 hours, ΔVsh of the transistor 200 fabricated in this example changed within the range from −100 mV to +100 mV. In addition, also in a period from 5390 hours to 6400 hours, ΔVsh of the transistor 200 fabricated in this example changed within the range from −110 mV to +100 mV. The above results demonstrated that the transistor 200 of one embodiment of the present invention had high reliability.

At least part of the structure, method, and the like described in this example can be implemented in appropriate combination with any of those in the other embodiments, the other examples, and the like described in this specification.

Example 5

In this example, the OS transistors described in Embodiment 1 with reference to FIG. 1 were fabricated, and the OS transistors were subjected to an X-ray irradiation test. Note that the designed values of the fabricated OS transistors were a channel length of 200 nm and a channel width of 60 nm.

Note that two OS transistors with the above-described structure were fabricated in this example. To differentiate the fabricated two OS transistors, one of them is referred to as an OS transistor OSTr1, and the other is referred to as an OS transistor OSTr2. Note that in this example, the OS transistor OSTr1 and the OS transistor OSTr2 are collectively referred to as OS transistors in some cases.

Figure 74:
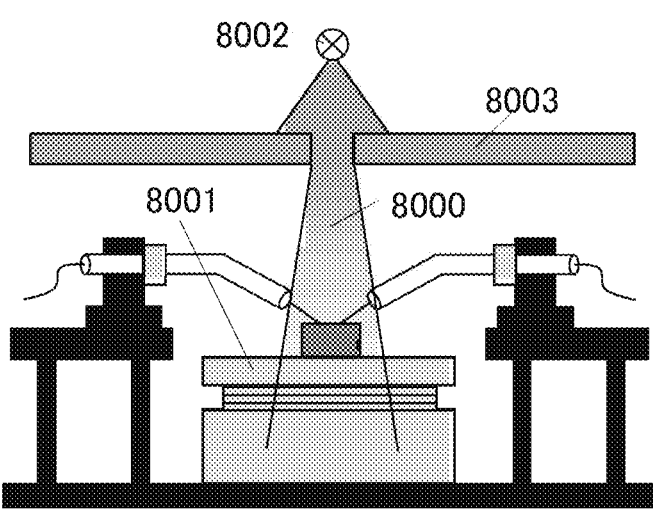
FIG. 74 is a diagram illustrating evaluation surroundings of an X-ray irradiation test.

Evaluation surroundings of the X-ray irradiation test used in this example are shown in FIG. 74. An elevating table was provided in a chamber where irradiation with X-rays 8000 was performed, and probes and a stage 8001 were set over the elevating table. Note that a diaphragm plate 8003 was located between an X-ray source 8002 and the stage 8001. The diaphragm plate 8003 makes it possible to block a recoil X-ray. In addition, it is possible to reduce X-ray irradiation on coaxial arms of the probes, inhibiting irregular current from flowing in the probes. An exposure dose rate was measured with Accu-Dose radiation measurement system 2186 produced by Radcal corporation. For evaluation of the electrical characteristics of the OS transistors, 4156C produced by Keysight Technologies Inc. was used.

In this example, MX-160Labo produced by mediXtec Corporation was used as an X-ray irradiation apparatus used for the X-ray irradiation test. The X-ray source is tungsten, the tube voltage range is greater than or equal to 30 kV and less than or equal to 160 kV, and the tube current range is greater than or equal to 0.3 mA and less than or equal to 3.0 mA.

Here, the procedure of the X-ray irradiation test is described.

First, the substrate was set in the X-ray irradiation apparatus and subjected to static eliminating treatment with an ionizer for five minutes.

Next, Id-Vg measurement was performed on the OS transistor before X-ray irradiation. For the Id-Vg measurement, the substrate temperature was set to room temperature, the drain voltage Vd was set to 0.1 V or 1.2 V, the source voltage Vs and the back gate voltage Vbg were each set to 0 V, and the drain current Id was measured with the gate voltage Vg swept from −4 V to +4 V.

Next, probing was performed in the X-ray irradiation apparatus, and then the OS transistor was irradiated with X-rays for approximately 25 hours. In the X-ray irradiation, all the terminals (source, drain, gate, and back gate) of the OS transistor were grounded. The total X-ray exposure dose of the OS transistor was equal to 1000 Gy.

Next, Id-Vg measurement was performed on the OS transistor after the X-ray irradiation. The conditions for the Id-Vg measurement were the same as those for the Id-Vg measurement on the OS transistor before the X-ray irradiation.

Note that Id-Vg measurement was also performed on the OS transistor at the timing when the total X-ray exposure dose of the OS transistor was equal to 100 Gy or 200 Gy. The total X-ray dose before X-ray irradiation can be said as 0 Gy.

Note that for the Id-Vg measurement performed on the OS transistor after the X-ray irradiation, two or more times of measurement were performed with a time interval. During a period when Id-Vg measurement was not performed, the OS transistor was controlled under room temperature. It is possible to examine room temperature annealing by performing two or more times of Id-Vg measurement with a time interval.

The X-ray irradiation test was performed by following the above procedure.

The threshold voltage (Vth) of the OS transistor was calculated by a constant current method from the Id-Vg characteristics of the OS transistor measured before and after the X-ray irradiation. Here, the constant current method is a method in which, from the results of Id-Vg characteristics, gate voltage Vg in the case where a constant current (here, 1 pA) flows is set to a threshold voltage (Vth).

Figure 58:
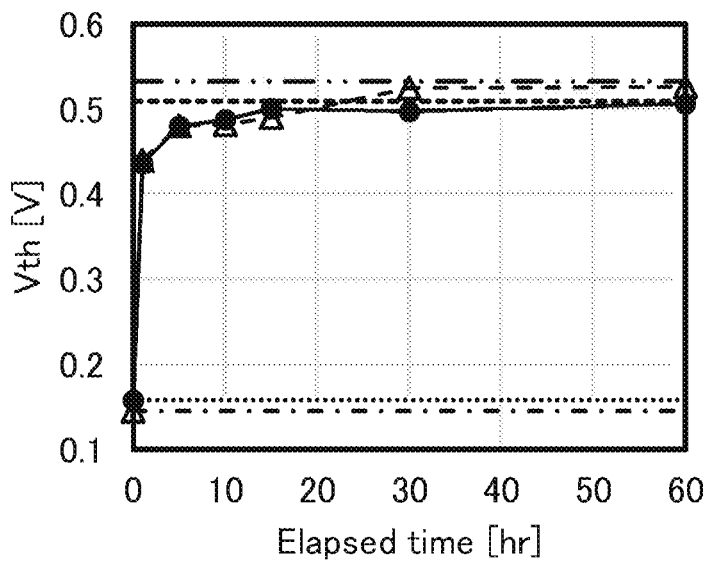
FIG. 58 is a diagram showing Vth time dependence of an OS transistor after X-ray irradiation.

FIG. 58 is a diagram showing Vth time dependence of the OS transistors after the X-ray irradiation. In FIG. 58, the horizontal axis represents elapsed time [hr] from the termination of the X-ray irradiation, and the vertical axis represents Vth [V]. Note that a graph shown with black dots and a solid line in FIG. 58 represents a change in Vth of the OS transistor OSTr1 with respect to the elapsed time. A dashed line shown in FIG. 58 represents Vth of the OS transistor OSTr1 before the X-ray irradiation. A dotted line shown in FIG. 58 represents Vth of the OS transistor OSTr1 immediately after the termination of the X-ray irradiation. A graph shown with white triangles and a dashed line in FIG. 58 represents a change in Vth of the OS transistor OSTr2 with respect to the elapsed time. A dashed double-dotted line shown in FIG. 58 represents Vth of the OS transistor OSTr2 before the X-ray irradiation. A dashed dotted line shown in FIG. 58 represents Vth of the OS transistor OSTr2 immediately after the termination of the X-ray irradiation.

According to FIG. 58, Vth of the OS transistor OSTr1 before the X-ray irradiation was 0.51 V and Vth thereof immediately after the termination of the X-ray irradiation was 0.16 V. Furthermore, Vth of the OS transistor OSTr2 before the X-ray irradiation was 0.53 V and Vth thereof immediately after the termination of the X-ray irradiation was 0.15 V.

FIG. 58 demonstrated that Vth of each of the OS transistor OSTr1 and the OS transistor OSTr2 was shifted in the negative direction owing to the X-ray irradiation. Note that the difference between Vth before the X-ray irradiation and Vth immediately after the termination of the X-ray irradiation was 0.35 V in the OS transistor OSTr1 and 0.38 V in the OS transistor OSTr2. In addition, it was found that Vth of each of the OS transistors OSTr1 and the OS transistor OSTr2 was shifted in the positive direction with time elapsed after the X-ray irradiation. Furthermore, when the elapsed time from the termination of the X-ray irradiation was 5 hours or more, specifically, 15 hours or more, the value of Vth hardly changed and became closer to the value of Vth before the X-ray irradiation.

The subthreshold swing values (S value) of the OS transistors were calculated from the Id-Vg characteristics of the OS transistors measured before and after the X-ray irradiation. Here, the S value is the amount of change in gate voltage in the subthreshold region, which makes the drain current change by one digit at a constant drain voltage.

Figure 59:
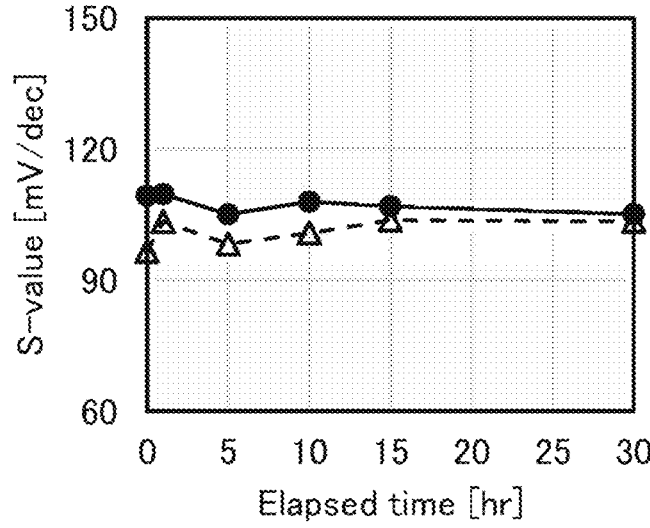
FIG. 59 is a diagram showing S-value time dependence of an OS transistor after X-ray irradiation of 1000 Gy.

FIG. 59 is a diagram showing S-value time dependence of the OS transistors after an X-ray irradiation of 1000 Gy. In FIG. 59, the horizontal axis represents elapsed time [hr] from the termination of the X-ray irradiation, and the vertical axis represents S-value [mV/dec]. Note that a graph shown with black dots and a solid line in FIG. 59 represents a change in S-value of the OS transistor OSTr1 with respect to the elapsed time. A graph shown with white triangles and a dashed line in FIG. 59 represents a change in S-value of the OS transistor OSTr2 with respect to the elapsed time.

FIG. 59 demonstrated that the S-values of the OS transistor OSTr1 and the OS transistor OSTr2 were both substantially constant even with the time elapsed from the 1000-Gy X-ray irradiation.

Figures 60A, 60B, 60C, 60D:
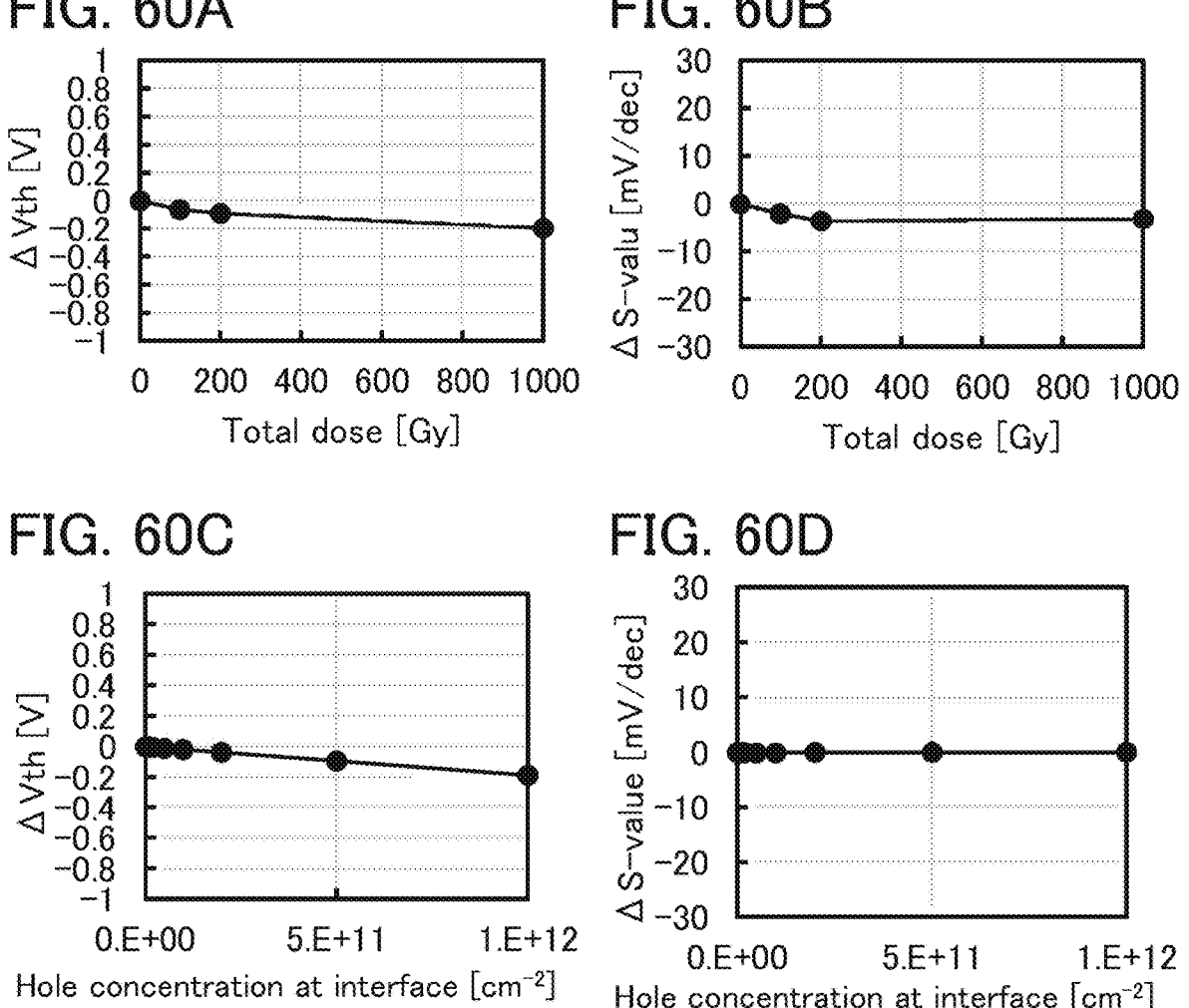
FIG. 60A is a diagram showing total X-ray dose dependence of Vth of an OS transistor.
FIG. 60B is a diagram showing total X-ray dose dependence of an S-value of an OS transistor.
FIG. 60C and FIG. 60D show calculation results.

FIG. 60A is a diagram showing total X-ray dose dependence of Vth of the OS transistor. In FIG. 60A, the horizontal axis represents total X-ray dose [Gy], and the vertical axis represents $\Delta$Vth [V]. Here, $\Delta$Vth is the amount of change in Vth, the value obtained by subtracting Vth before X-ray irradiation from Vth after X-ray irradiation.

As observed from FIG. 60A, Vth tended to decrease as the total dose increased with the OS transistor irradiated with X-rays. In addition, $\Delta$Vth was approximately −0.2 V at the time of X-ray irradiation with a total dose of 1000 Gy.

FIG. 60B is a diagram showing total X-ray dose dependence of the S-value of the OS transistor. In FIG. 60B, the horizontal axis represents total X-ray dose [Gy], and the vertical axis represents $\Delta$S-value [mV/dec]. Here, $\Delta$S-value is the amount of change in S-value, a value obtained by subtracting the S-value before X-ray irradiation from the S-value after X-ray irradiation.

It was found from FIG. 60B that the S-value was substantially constant even when the total dose increased with the OS transistor irradiated with X-rays.

<Calculation>

In this section, the change tendency of Vth and the S-value with the OS transistor irradiated with X-rays was evaluated by calculation.

In a Si transistor, a defect generated in the gate insulator or at the interface between the channel formation region and the gate insulator is thought as one of factors of a change in the threshold voltage due to radiation. For example, a physical process that results in generation of a defect due to radiation irradiation on a silicon oxide ($SiO_2$) film in a Si transistor is as follows.

Irradiation of the $SiO_2$ film with radiation generates electron-hole pairs. Most of the generated electron-hole pairs are recombined to disappear. In some of the electron-hole pairs that are not recombined, electrons having higher mobility than holes are released into the gate electrode or Si owing to a few bias. Furthermore, some holes in the electron-hole pairs that are not recombined move to the vicinity of the interface between Si and $SiO_2$ owing to shallow defect states to be trapped by deep defect states in the $SiO_2$ film. In addition, other holes in the electron-hole pairs that are not recombined move to the interface between Si and $SiO_2$ through hydrogen to form interface states.

In the above-described process, in the case where holes are accumulated in the $SiO_2$ film or at the interface between Si and $SiO_2$, Vth of the Si transistor is presumed to be shifted in the negative direction.

In view of this, the change tendency of Vth and the S-value of the OS transistor in the case where holes are trapped by defects generated by X-ray irradiation of the OS transistor was evaluated by calculation. Specifically, device simulation with varied hole concentrations was performed on the assumption that a positive fixed charge was made at the interface between the metal oxide including the channel formation region and the gate insulator of the OS transistor owing to X-ray irradiation.

FIG. 61A to FIG. 61C illustrate the structures of the OS transistor used for the calculation. FIG. 61A is a cross-sectional view of the OS transistor in the channel length direction. FIG. 61B is a cross-sectional view in the channel width direction, including the source region and the drain region of the OS transistor. FIG. 61C is a cross-sectional view in the channel width direction, including the channel formation region of the OS transistor.

As illustrated in FIG. 61A to FIG. 61C, the OS transistor used for the calculation includes a conductor 805, an insulator 822 over the conductor 805, an insulator 824 over the insulator 822, an oxide 830a over the insulator 824, an oxide 830b over the oxide 830a, a conductor 842a and a conductor 842b over the oxide 830b, an insulator 871al over the conductor 842a, an insulator 871a2 over the insulator 871al, an insulator 871b1 over the conductor 842b, an insulator 871b2 over the insulator 871b1, an insulator 875a over the insulator 871a2 and the insulator 871b2, an insulator 875b over the insulator 875a, an insulator 852 over the oxide 830b, an insulator 850 over the insulator 852, an insulator 854 over the insulator 850, and a conductor 860 over the insulator 854. Note that an upper portion of the oxide 830b includes a removed region in a region overlapping with the insulator 852, the insulator 850, the insulator 854, and the conductor 860.

Hereinafter, the oxide 830a and the oxide 830b are collectively referred to as an oxide 830 in some cases.

The conductor 860 functions as a first gate electrode and corresponds to the conductor 260 described in Embodiment 1. The conductor 805 functions as a second gate electrode and corresponds to the conductor 205 described in Embodiment 1. The insulator 852, the insulator 850, and the insulator 854 function as a first gate insulator and correspond to the insulator 252, the insulator 250, and the insulator 254 described in Embodiment 1, respectively. The insulator 822 and the insulator 824 function as a second gate insulator and correspond to the insulator 222 and the insulator 224 described in Embodiment 1, respectively. The conductor 842a functions as one of a source electrode and a drain electrode and corresponds to the conductor 242a described in Embodiment 1. The conductor 842b functions as the other of the source electrode and the drain electrode and corresponds to the conductor 242b described in Embodiment 1. At least part of a region of the oxide 830 that overlaps with the conductor 860 functions as a channel formation region. The oxide 830a corresponds to the oxide 230a described in Embodiment 1, and the oxide 830b corresponds to the oxide 230b described in Embodiment 1.

The interface between the metal oxide including the channel formation region and the gate insulator of the above-described OS transistor corresponds to the interface between the oxide 230b and the insulator 252. Note that the channel formation region is simply referred to as a channel in some cases.

As a calculation software, Sentaurus 3D produced by Synopsys, Inc. was used. Table 1 and Table 2 show detailed parameters used for the calculation.

TABLE 1

| Software | Sentaurus 3D | | |
| --- | --- | --- | --- |
| Channel | L (SD) | 200 | nm |
| | L (Gate) | 186 | nm |
| | W | 60 | nm |
| 822 | Dielectric constant | 16.4 | |
| | Film thickness | 20 | nm |
| 824 | Dielectric constant | 4.1 | |
| | Film thickness | 20 | nm |
| 822, 824 | H | 25 | nm |

TABLE 1-continued

| Software | Sentaurus 3D | | |
| --- | --- | --- | --- |
| 852 | Dielectric constant | 8.5 | |
| | Film thickness | 1 | nm |
| 850 | Dielectric constant | 4.1 | |
| | Film thickness | 3 | nm |
| 854 | Dielectric constant | 7.8 | |
| | Film thickness | 3 | nm |
| 860 | Work function | 4.7 | eV |
| 842a, 842b | Work function | 4.5 | eV |
| | Film thickness | 20 | nm |
| 805 | Work function | 5 | eV |
| | Film thickness | 40 | nm |
| 871a1, 871b1 | Dielectric constant | 7.8 | |
| | Film thickness | 5 | nm |
| 871a2, 871b2 | Dielectric constant | 4.1 | |
| | Film thickness | 10 | nm |
| 275a | Dielectric constant | 8.5 | |
| | Film thickness | 5 | nm |
| 275b | Dielectric constant | 7.8 | |
| | Film thickness | 5 | nm |

TABLE 2

| Software | Sentaurus 3D | | |
| --- | --- | --- | --- |
| 830a | Electron affinity | 4.5 | eV |
| | Eg | 3.4 | eV |
| | Dielectric constant | 15 | |
| | Electron mobility | 1.5 | $cm^2/Vs$ |
| | Hole mobility | 0.01 | $cm^2/Vs$ |
| | Nc | 5.0E+18 | $cm^{-3}$ |
| | Nv | 5.0E+18 | $cm^{-3}$ |
| | Film thickness | 10 | nm |
| 830b | Electron affinity | 4.7 | eV |
| | Eg | 3.2 | eV |
| | Dielectric constant | 15 | |
| | Electron mobility | 6 | $cm^2/Vs$ |
| | Hole mobility | 0.01 | $cm^2/Vs$ |
| | Nc | 5.0E+18 | $cm^{-3}$ |
| | Nv | 5.0E+18 | $cm^{-3}$ |
| | Film thickness | 15 | nm |
| | Thickness of removed region | 4 | nm |
| Interface between 830b and 852 | Hole concentration condition | 1E+10, 2E+10, 5E+10, 1E+11, 2E+11, 5E+11, 1E+12 2E+12, 5E+12, 1E+13, 2E+13, 5E+13 | $cm^{-2}$ |

L (SD) shown in Table 1 is the distance between a side surface of the conductor 842a and a side surface of the conductor 842b, which face each other with the conductor 860 therebetween, and is also the shortest distance from the conductor 842a to the conductor 842b. In addition, L (Gate) shown in Table 1 is the distance between the conductor 842a and the conductor 842b in a region where the oxide 830b and the conductor 860 overlap with each other in the top view of the OS transistor. Moreover, L (Gate) shown in Table 1 is the width of the conductor 860 in the cross-sectional view of the OS transistor in the channel length direction. H shown in Table 1 is the distance from the top surface of the insulator 824 to the top surface of the insulator 822 in a region not overlapping with the oxide 830 in the cross-sectional view of the OS transistor in the channel width direction (see FIG. 61B and FIG. 61C).

As shown in Table 1, the L length and W length of the OS transistor used for the calculation are 200 nm and 60 nm, respectively.

FIG. 60C and FIG. 60D show calculation results. FIG. 60C is a diagram showing hole concentration dependence of ΔVth of the OS transistor. In FIG. 60C, the horizontal axis represents the hole concentration [$cm^{-2}$] at the interface between the oxide 830*b* and the insulator 852, and the vertical axis represents ΔVth [V]. FIG. 60D is a diagram showing hole concentration dependence of an ΔS-value of the OS transistor. In FIG. 60D, the horizontal axis represents the hole concentration [cm$^{-2}$] at the interface between the oxide 830*b* and the insulator 852, and the vertical axis represents ΔS-value [mV/dec].

It was found from FIG. 60A to FIG. 60D that the actually measured results (see FIG. 60A) and the calculation results of the OS transistor (see FIG. 60C) of the OS transistor were similar to each other in change tendency of Vth. It was also found that the actually measured results (see FIG. 60B) and the calculation results (FIG. 60D) of the OS transistor were similar to each other in change tendency of the S-value. Therefore, it was suggested that a factor that makes Vth of the OS transistor shifted in the negative direction owing to X-ray irradiation was an increase in positive fixed charge at the interface between the metal oxide including the channel formation region and the gate insulator of the OS transistor.

At the time of the X-ray irradiation with a total dose of 1000 Gy, ΔVth was approximately −0.2 V. This corresponds to ΔVth at the time when the hole concentration at the interface between the oxide 830*b* and the insulator 852 is approximately 1×10$^{12}$ cm$^{-2}$. Therefore, it is presumed that the hole concentration at the interface between the oxide 830*b* and the insulator 852 is increased by approximately 1×10$^{12}$ cm$^{-2}$ when the OS transistor is subjected to the X-ray irradiation of 1000 Gy.

The composition, structure, method, and the like described in this example can be used in combination as appropriate with the compositions, structures, methods, and the like described in the other embodiments and the like.

Example 6

In this example, a chip including the above-described NoffCPU was fabricated and X-ray resistance of the chip was evaluated.

Figure 62:
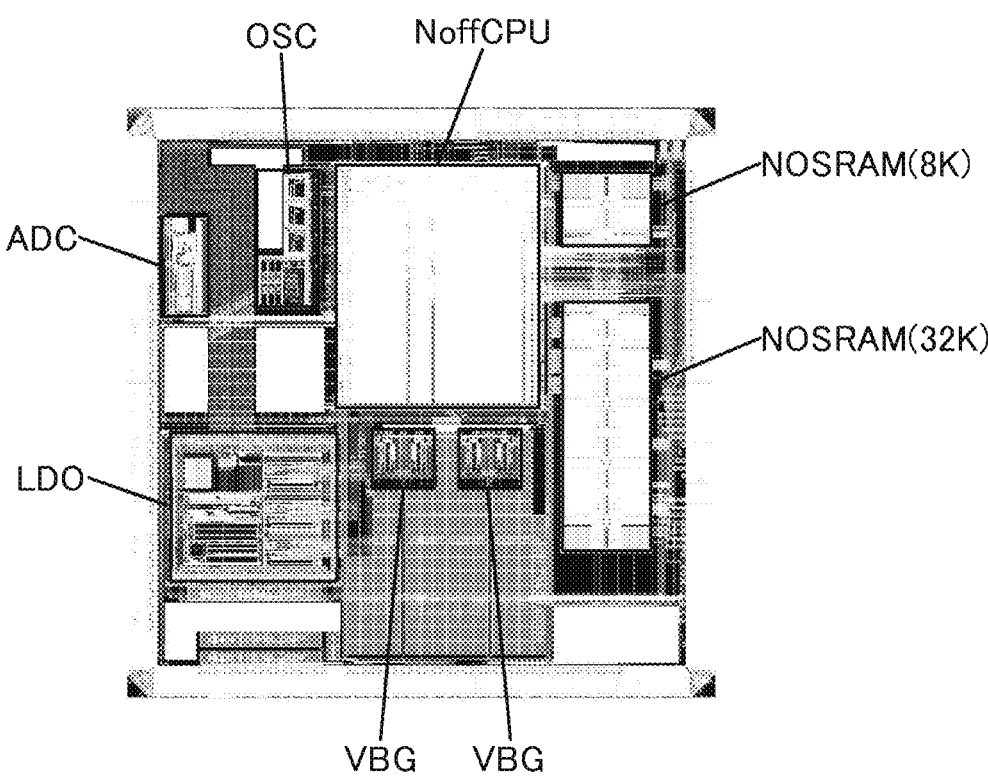
FIG. 62 is an optical micrograph of a fabricated chip.

FIG. 62 is an optical micrograph of the fabricated chip. As shown in FIG. 62, the chip includes an NoffCPU, a data memory, a program memory, a power generation circuit, an A/D converter (ADC), a oscillator (OSC) for clock generation, a back gate retention circuit (VBG), and the like. The power generation circuit includes a bandgap reference circuit, a low drop-out regulator (LDO), and the like. In addition, an 8K-byte NOSRAM is mounted as the data memory, and a 32K-byte NOSRAM is mounted as the program memory.

The NoffCPU includes a first logic circuit and a second logic circuit.

Transistors included in the first logic circuit are composed of Si transistors.

The second logic circuit includes a flip-flop including OS transistors (hereinafter an OSFF).

Figure 63:
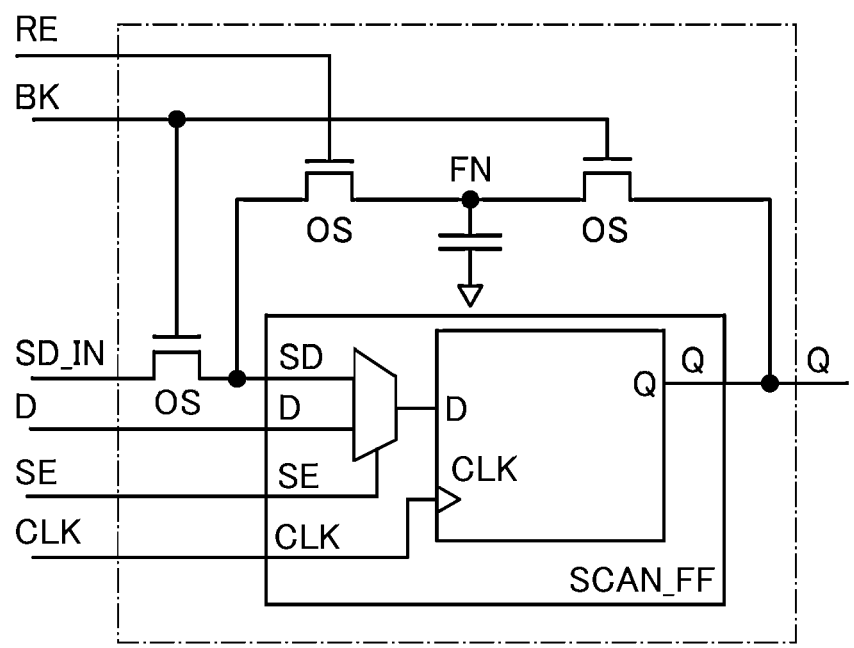
FIG. 63 is a circuit diagram of a fabricated OS flip-flop.

FIG. 63 is a circuit diagram of the OSFF. As shown in FIG. 63, three OS transistors and one capacitor are added to a scan flip-flop (SCAN_FF). A signal BK is a backup signal, and an signal RC is a recovery signal. Backup and recovery of the OSFF are performed using the signal BK and a signal RE transmitted from a PMU (not shown in FIG. 63).

Note that the scan flip-flop is composed of Si transistors. That is, the OSFF is composed of Si transistors and OS transistors.

Next, the X-ray resistance of the chip including the NoffCPU is described.

Evaluation of the X-ray resistance was performed by tester evaluation before and after X-ray irradiation on the whole fabricated chip. As the X-ray irradiation apparatus, MX-160Labo produced by mediXtec Corporation was used. For the X-ray irradiation conditions, the total X-ray dose is 1000 Gy and the X-ray tube voltage is 160 kV.

The tester evaluation refers to that for evaluating whether the chip executes an input instruction and performs a desired operation, with the use of a tester device. In this example, T2000 produced by ADVANTEST CORPORATION was used as the tester device.

In this example, X-ray resistance evaluation was performed by inputting an Noff instruction to the chip before and after the X-ray irradiation.

The Noff instruction refers to an instruction to supply pulse signals (signals supplied in the order of "L", "H", and "L") to the signal BK, stop the chip for a certain period (keep the state of not supplying a signal after the signal BK for a certain period), and then supply pulse signals to the signal RE to terminate the operation. A region where data is retained is changed by the Noff instruction, whereby data can be retained even when power supply to the chip is stopped. Note that a period for stopping the chip, which is changeable, was set to 10 msec in this example.

With the Noff instruction executed in the chip before and after the X-ray irradiation, the X-ray resistance of the Si transistors and the OS transistors can be evaluated. It is known that Vth of each of an Si transistor and an OS transistor is shifted in the negative direction after X-ray irradiation. When an Noff instruction is executed in the state where Vth is shifted in the negative direction excessively, data in the OSFF might be converted. It is possible to evaluate the X-ray resistance of the Si transistor and that of the OS transistor by checking whether the data is converted or not.

First, tester evaluation was performed on the NoffCPU before X-ray irradiation. Next, the chip including the NoffCPU in a floating state was irradiated with X-rays with the X-ray irradiation apparatus under the above-descried conditions. After approximately a half day from the X-ray irradiation, tester evaluation was performed on the NoffCPU.

Table 3 shows the results of the tester evaluation on the NoffCPU. Note that circle marks shown in Table 3 each indicate that the logic circuit performs an output normally.

TABLE 3

| | Before X-ray irradiation | After X-ray irradiation |
|---|---|---|
| First logic circuit | ○ | ○ |
| Second logic circuit | ○ | ○ |

It was verified from Table 3 that both the first logic circuit including the Si transistors and the second logic circuit including the OSFF operated normally before and after the X-ray irradiation. It was thus found that the NoffCPU had high X-ray resistance.

The composition, structure, method, and the like described in this example can be used in combination as appropriate with the compositions, structures, methods, and the like described in the other embodiments and the like.

Example 7

In this example, the OS transistors described in Embodiment 1 with reference to FIG. 1 were fabricated, and the OS transistors were subjected to an X-ray irradiation test. Note that the designed values of the fabricated OS transistors were a channel length of 200 nm and a channel width of 60 nm.

In this example, the evaluation surroundings of the X-ray irradiation test described with reference to FIG. 74 were used. In this example, MX-160Labo produced by mediXtec Corporation was used as an X-ray irradiation apparatus used for the X-ray irradiation test. The X-ray source is tungsten, the tube voltage range is greater than or equal to 30 kV and less than or equal to 160 kV, and the tube current range is greater than or equal to 0.3 mA and less than or equal to 3.0 mA.

<Evaluation 1>

The X-ray dose rate was varied between the samples, and a change in electrical characteristics of the OS transistors with respect to X-ray irradiation were evaluated. Here, two OS transistors (an OS transistor OSTr3 and an OS transistor OSTr4) were used as the samples. Note that the OS transistor OSTr3 and the OS transistor OSTr4 are collectively referred to as an OS transistor in some cases.

First of all, the procedure of the X-ray irradiation test is described.

First, the substrate was set in the X-ray irradiation apparatus and subjected to static eliminating treatment with an ionizer for five minutes.

Next, Id-Vg measurement was performed on the OS transistor before X-ray irradiation. For the Id-Vg measurement, the drain voltage Vd was set to 0.1 V, the source voltage Vs and the back gate voltage Vbg were each set to 0 V, and the drain current Id was measured with the gate voltage Vg swept from −4 V to +4 V. Then, the drain voltage Vd was set to 1.2 V, the source voltage Vs and the back gate voltage Vbg were each set to 0 V, and the drain current Id was measured with the gate voltage Vg swept from −4 V to +4 V. The measurement at a drain voltage Vd of 0.1 V and the measurement at 1.2 V were repeated alternately to perform five sets of measurement in total (five times of measurement at a drain voltage Vd of 0.1 V and five times of measurement at 1.2 V). Note that the substrate temperature was room temperature through the Id-Vg measurement.

Next, probing was performed in the X-ray irradiation apparatus, and then the OS transistor was irradiated with X-rays. In the X-ray irradiation, all the terminals (the source, drain, gate, and back gate) of the OS transistor were grounded. The X-ray exposure dose was set to 100 Gy. The X-ray dose rate was varied between the samples: the dose rate of the OS transistor OSTr3 was set to 40.0 Gy/hr and the dose rate of the OS transistor OSTr4 was set to 13.3 Gy/hr.

Next, Id-Vg measurement was performed on the OS transistor. The conditions for the Id-Vg measurement were the same as those for the Id-Vg measurement before the X-ray irradiation.

In this evaluation, the X-ray irradiation and the Id-Vg measurement described above were repeated until the total X-ray exposure dose of the OS transistor reached 1000 Gy. Note that the total X-ray dose before X-ray irradiation can be said as 0 Gy.

The threshold voltage (Vth) of the OS transistor was calculated from the Id-Vg characteristics by a constant current method. In this example, a gate voltage Vg at which a current of 1 pA flows was regarded as a threshold voltage (Vth).

Figure 64A:
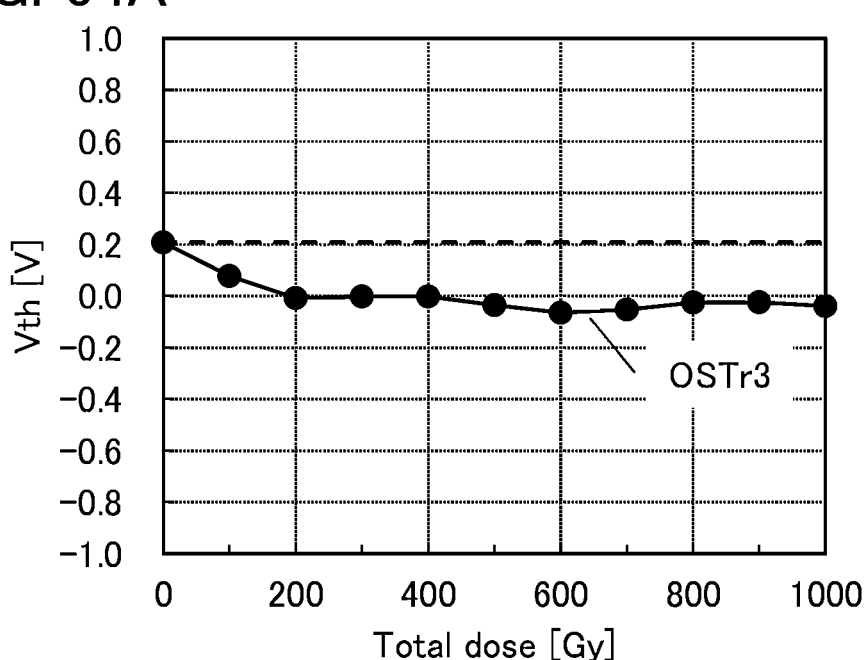
FIG. 64A and FIG. 64B are diagrams showing total X-ray dose dependence of threshold voltages of OS transistors.
Figure 64B:
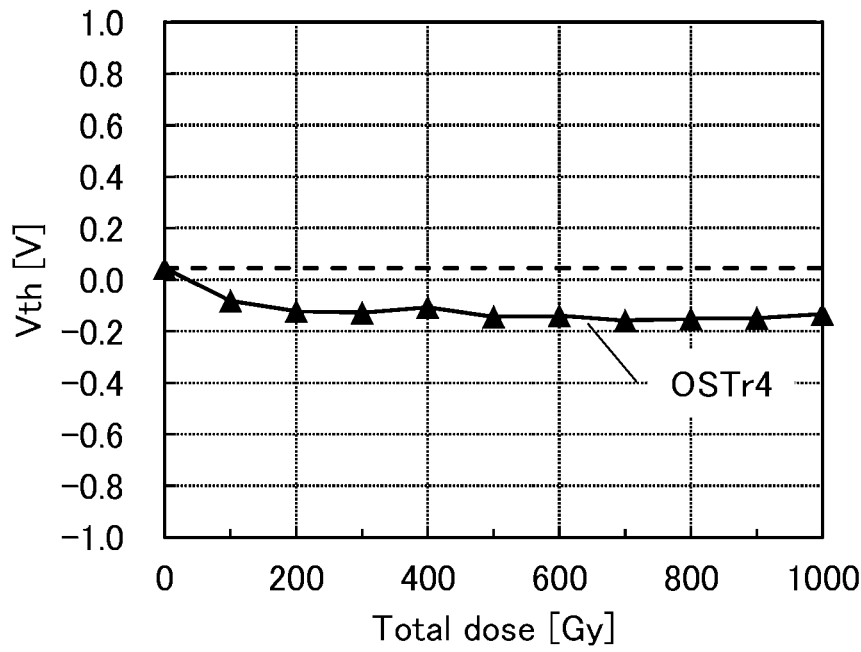

FIG. 64A shows the threshold voltage (Vth) of the OS transistor OSTr3. FIG. 64B shows the threshold voltage (Vth) of the OS transistor OSTr4. In FIG. 64A and FIG. 64B, the horizontal axis represents the total X-ray dose, and the vertical axis represents the threshold voltage (Vth).

Figure 65:
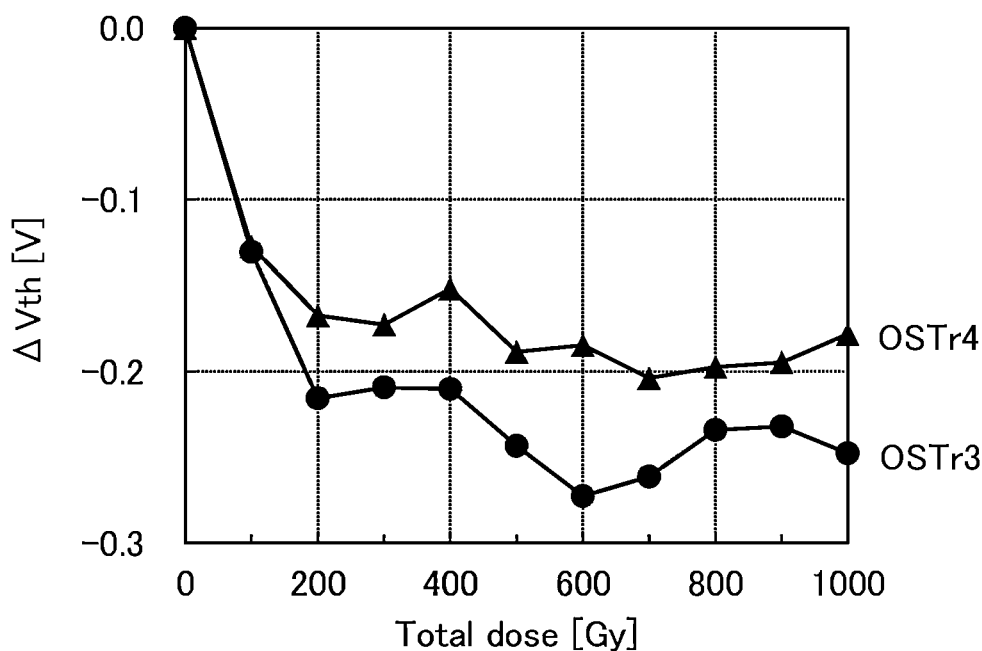
FIG. 65 is a diagram showing total X-ray dose dependence of threshold voltages of OS transistors.

FIG. 65 shows the amount of change in the threshold voltages (ΔVth) of the OS transistor OSTr3 and the OS transistor OSTr4. In FIG. 65, the horizontal axis represents the total X-ray dose, and the vertical axis represents the amount of change in threshold voltage (ΔVth). The amount of change in threshold voltage (ΔVth) is a value obtained by subtracting the threshold voltage before the X-ray irradiation from the threshold voltage after the X-ray irradiation. Note that FIG. 64A, FIG. 64B, and FIG. 65 each show data at a drain voltage Vd of 0.1 V.

As shown in FIG. 64A, FIG. 64B, and FIG. 65, it was found that the amount of change in threshold voltage tended to increase as the X-ray dose rate increased.

<Evaluation 2>

A change in electrical characteristics of OS transistors with respect to X-ray irradiation was evaluated in conditions for Id-Vg measurement and X-ray irradiation that were different from those in <Evaluation 1> described above. Here, three OS transistors (an OS transistor OSTr5 to an OS transistor OSTr7) were used as samples. Note that description of the same portions as those in <Evaluation 1> is omitted in some cases.

First of all, the procedure of an X-ray irradiation test is described.

First, the substrate was set in the X-ray irradiation apparatus and subjected to static eliminating treatment with an ionizer for five minutes.

Next, Id-Vg measurement was performed on the OS transistor before X-ray irradiation. For the Id-Vg measurement, the drain voltage Vd was set to 0.1 V, the source voltage Vs and the back gate voltage Vbg were each set to 0 V, and the drain current Id was measured with the gate voltage Vg swept from 0 V to +3 V. Then, the drain voltage Vd was set to 1.2 V, the source voltage Vs and the back gate voltage Vbg were each set to 0 V, and the drain current Id was measured with the gate voltage Vg swept from 0 V to +3 V. The measurement at a drain voltage Vd of 0.1 V and the measurement at 1.2 V were repeated alternately to perform five sets of measurement in total (five times of measurement at a drain voltage Vd of 0.1 V and five times of measurement at 1.2 V). Note that the substrate temperature was room temperature through the Id-Vg measurement.

Next, probing was performed in the X-ray irradiation apparatus, and then the OS transistor was irradiated with X-rays. In the X-ray irradiation, all the terminals (the source, drain, gate, and back gate) of the OS transistor were grounded. The X-ray exposure dose was set to 100 Gy, and the X-ray dose rate was set to 35.0 Gy/hr.

Next, Id-Vg measurement was performed on the OS transistor. The conditions for the Id-Vg measurement were the same as those of the Id-Vg measurement before the X-ray irradiation.

Figure 66A:
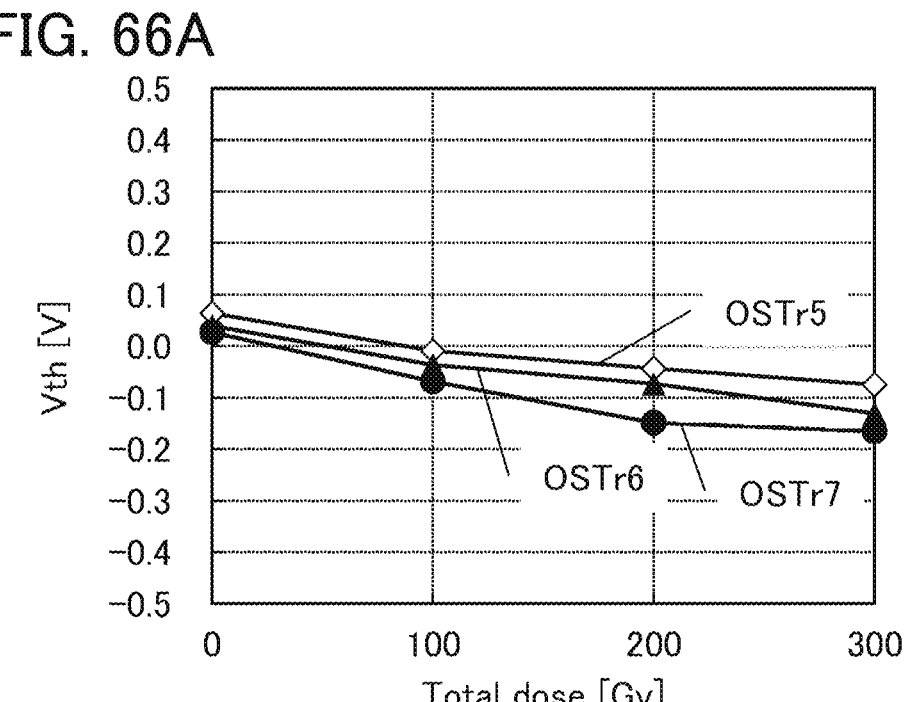
FIG. 66A and FIG. 66B are diagrams showing total X-ray dose dependence of threshold voltages of OS transistors.
Figure 66B:
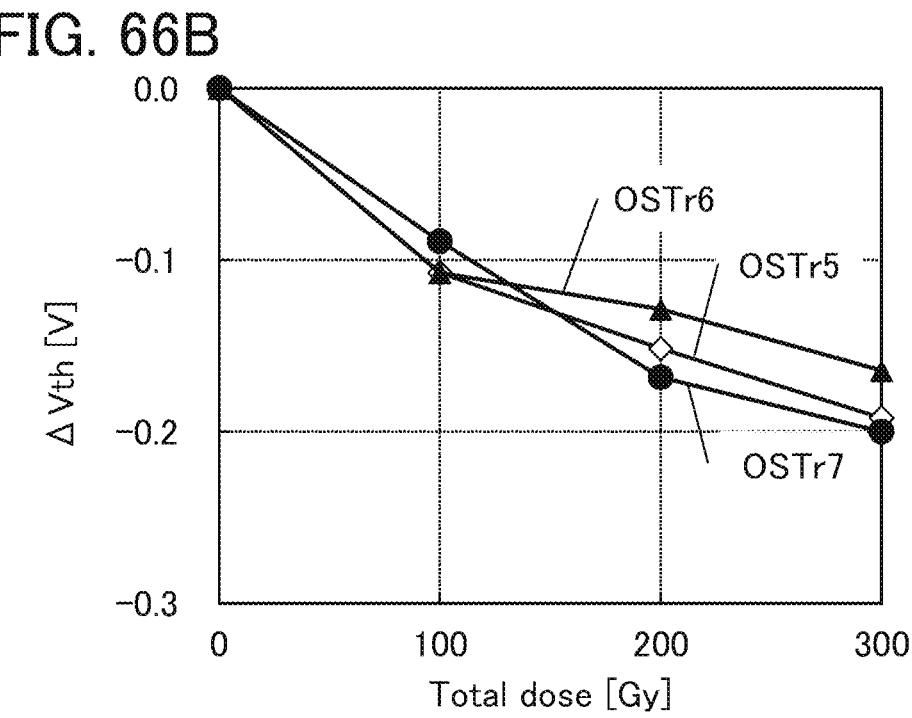

For the OS transistor OSTr5, the X-ray irradiation and the Id-Vg measurement described above were repeated until the total X-ray exposure dose reached 3200 Gy. For each of the OS transistor OSTr6 and the OS transistor OSTr7, the X-ray irradiation and the Id-Vg measurement described above were repeated until the total X-ray exposure dose reached 300 Gy FIG. 66A shows the threshold voltages (Vth) of the OS transistor OSTr5 to the OS transistor OSTr7 up to a total X-ray dose of 300 Gy. In FIG. 66A, the horizontal axis represents the total X-ray dose, and the vertical axis represents the threshold voltage (Vth). FIG. 66B shows the amount of change in the threshold voltages (ΔVth) of the OS transistor OSTr5 and the OS transistor OSTr7. In FIG. 66B, the horizontal axis represents the total X-ray dose, and the vertical axis represents the amount of change in threshold voltage (ΔVth).

Figure 67:
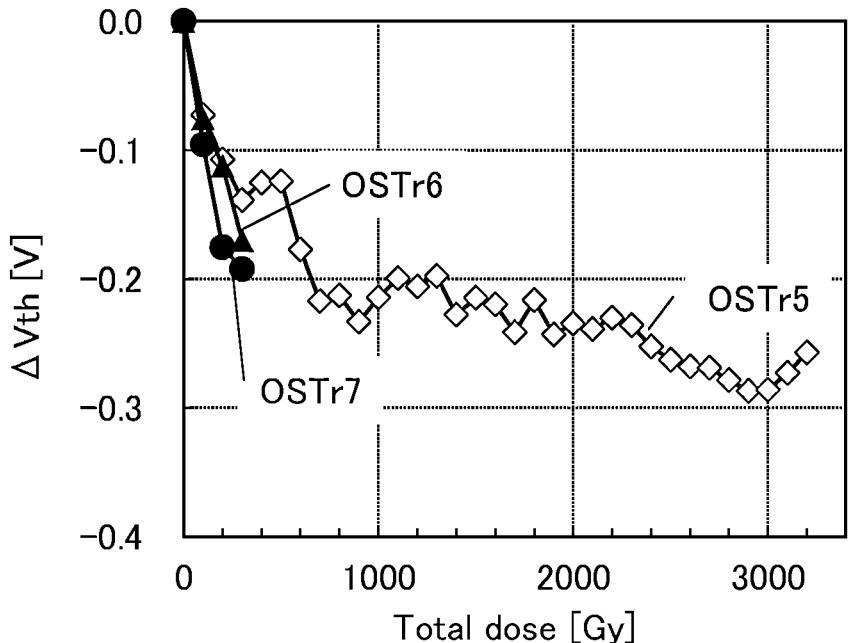
FIG. 67 is a diagram showing total X-ray dose dependence of threshold voltages of OS transistors.

FIG. 67 shows the amount of change in threshold voltage (ΔVth) of the OS transistor OSTr5 up to a total X-ray dose of 3200 Gy. In FIG. 67, the horizontal axis represents the total X-ray dose, and the vertical axis represents the amount of change in threshold voltage (ΔVth). Note that FIG. 67 also shows data of the OS transistor OSTr6 and the OS transistor OSTr7. Note that FIG. 66A, FIG. 66B, and FIG. 67 each show data at a drain voltage Vd of 1.2 V.

As shown in FIG. 66A, FIG. 66B, and FIG. 67, it was found that the amount of change in threshold voltage tended to increase as the X-ray dose rate increased.

<Evaluation 3>

A change in electrical characteristics of OS transistors with respect to X-ray irradiation was evaluated in conditions for Id-Vg measurement and X-ray irradiation that were different from those in <Evaluation 1> and <Evaluation 2> described above. Here, three OS transistors (an OS transistor OSTr8 to an OS transistor OSTr10) were used as samples. Note that description of the same portions as those in <Evaluation 1> or <Evaluation 2> is omitted in some cases.

Figure 68:
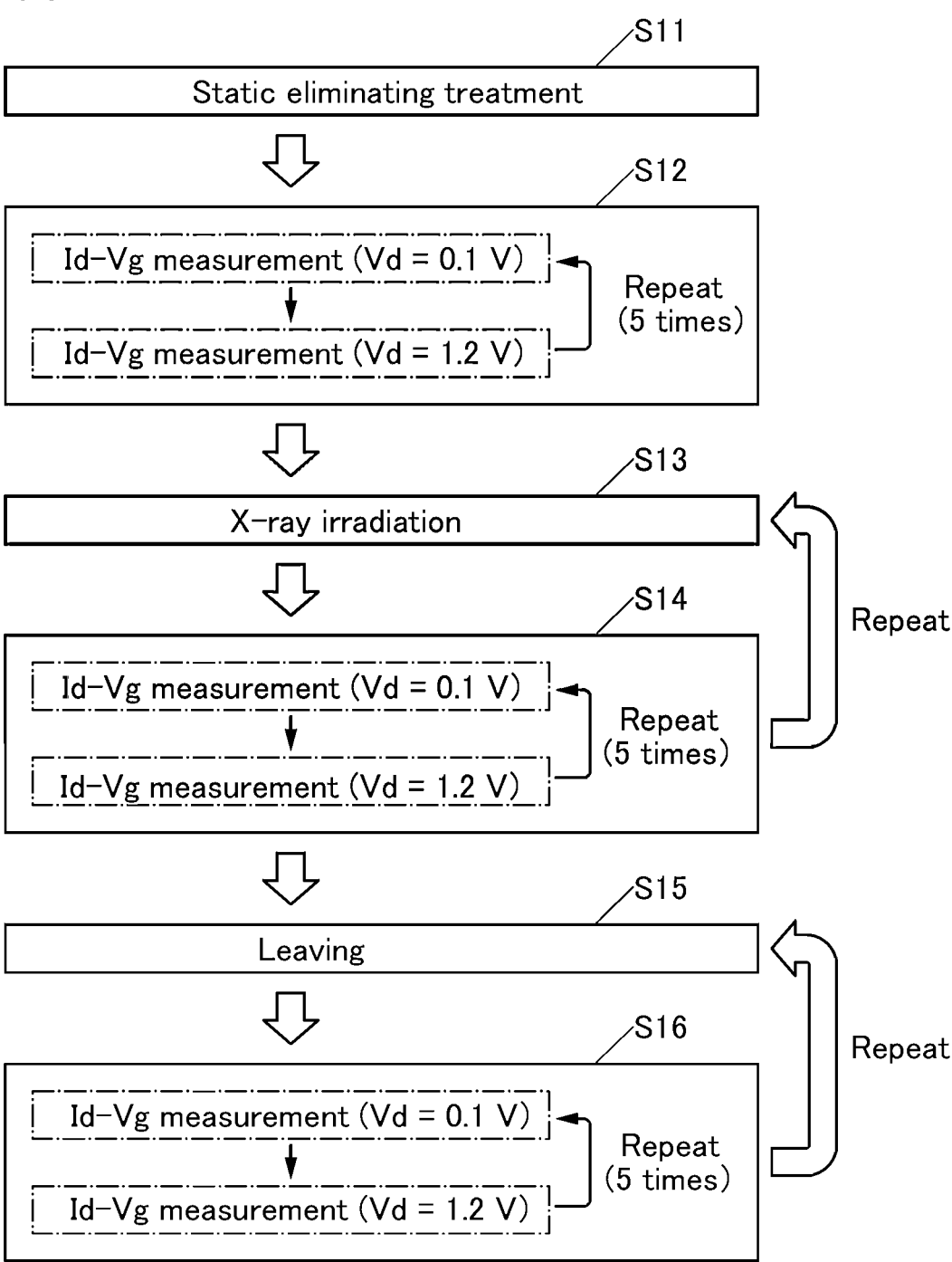
FIG. 68 shows a flow chart of an X-ray irradiation test.

First of all, the procedure of an X-ray irradiation test is described. FIG. 68 shows a flow chart of the X-ray irradiation test.

First, the substrate was set in the X-ray irradiation apparatus and subjected to static eliminating treatment with an ionizer for five minutes (Step S11 in FIG. 68).

Next, Id-Vg measurement was performed on the OS transistor before X-ray irradiation (Step S12 in FIG. 68). The Id-Vg measurement conditions were varied among the samples.

For each of the OS transistor OSTr8 and the OS transistor OSTr9, the drain voltage Vd was set to 0.1 V, the source voltage Vs and the back gate voltage Vbg were each set to 0 V, and the drain current Id was measured with the gate voltage Vg swept from 0 V to +3 V and then swept from +3 V to 0 V. Then, the drain voltage Vd was set to 1.2 V, the source voltage Vs and the back gate voltage Vbg were each set to 0 V, and the drain current Id was measured with the gate voltage Vg swept from 0 V to +3 V and then swept from +3 V to 0 V. The measurement at a drain voltage Vd of 0.1 V and the measurement at 1.2 V were repeated alternately to perform five sets of measurement in total (five times of measurement at a drain voltage Vd of 0.1 and five times of measurement at 1.2 V). Note that the substrate temperature was room temperature through the Id-Vg measurement.

For the OS transistor OSTr10, the drain voltage Vd was set to 0.1 V, the source voltage Vs and the back gate voltage Vbg were each set to 0 V, and the drain current Id was measured with the gate voltage Vg swept from −4 V to +4 V. Then, the drain voltage Vd was set to 1.2 V, the source voltage Vs and the back gate voltage Vbg were each set to 0 V, and the drain current Id was measured with the gate voltage Vg swept from −4 V to +4 V. The measurement at a drain voltage Vd of 0.1 V and the measurement at 1.2 V were repeated alternately to perform five sets of measurement in total (five times of measurement at a drain voltage Vd of 0.1 V and five times of measurement at 1.2 V). Note that the substrate temperature was room temperature through the Id-Vg measurement.

Next, probing was performed in the X-ray irradiation apparatus, and then the OS transistor was irradiated with X-rays (Step S13 in FIG. 68). In the X-ray irradiation, all the terminals (the source, drain, gate, and back gate) of the OS transistor were grounded. The X-ray exposure dose was set to 100 Gy, and the X-ray dose rate was set to 35.0 Gy/hr.

Next, Id-Vg measurement was performed on the OS transistor (Step S14 in FIG. 68). The conditions for the Id-Vg measurement were the same as those of the Id-Vg measurement before the X-ray irradiation (Step S12 in FIG. 68).

For each of the OS transistor OSTr8 and the OS transistor OSTr9, the X-ray irradiation (Step S13 in FIG. 68) and the Id-Vg measurement (Step S14 in FIG. 68) described above were repeated until the total X-ray exposure dose reached 3000 Gy. For the OS transistor OSTr10, the X-ray irradiation (Step S13 in FIG. 68) and the Id-Vg measurement (Step S14 in FIG. 68) described above were repeated until the total X-ray exposure dose reached 1000 Gy.

Next, the OS transistor was left in the X-ray irradiation apparatus at room temperature while probing was performed (Step S15 in FIG. 68). When the OS transistor was left, all the terminals (sources, drains, gates, and back gates) of the OS transistor were grounded.

Next, Id-Vg measurement was performed on the OS transistor (Step S16 in FIG. 68). The conditions for the Id-Vg measurement were the same as those of the Id-Vg measurement before the X-ray irradiation (Step S12 in FIG. 68). The leaving at room temperature (Step S15 in FIG. 68) and the Id-Vg measurement (Step S16 in FIG. 68) were performed repeatedly.

Figure 69A:
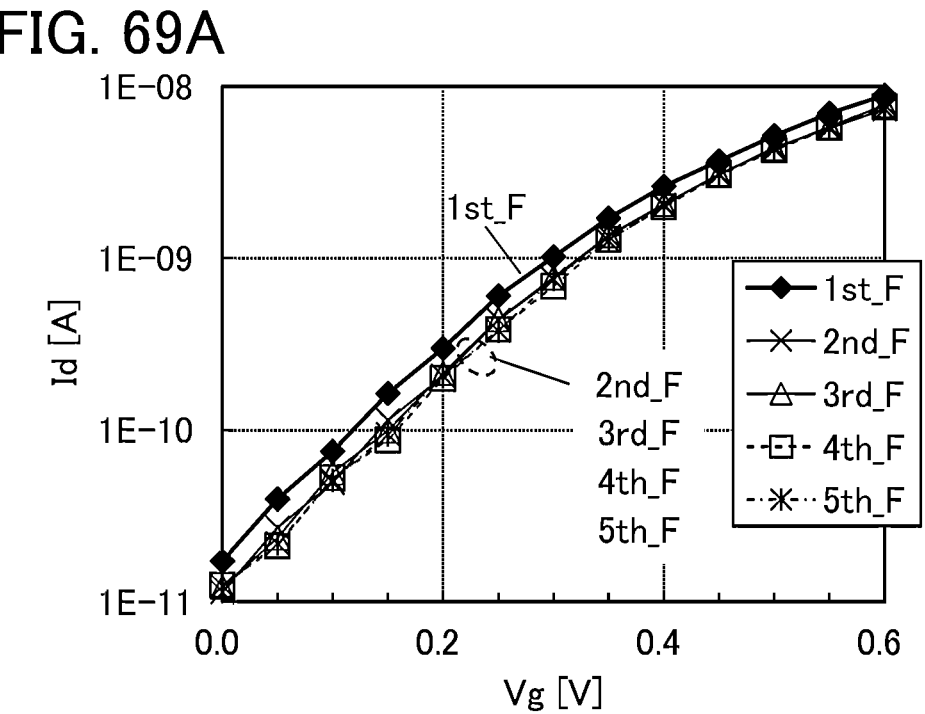
FIG. 69A and FIG. 69B are diagrams each showing Id-Vg characteristics of an OS transistor.
Figure 69B:
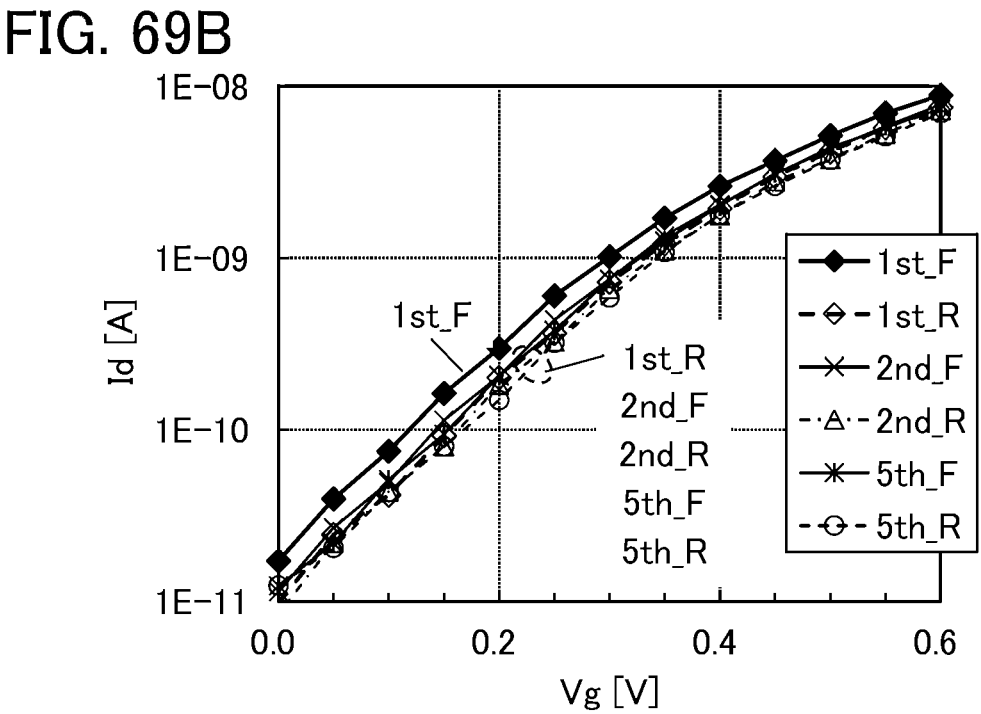

FIG. 69A and FIG. 69B show Id-Vg characteristics of the OS transistor OSTr8 at the time when the total X-ray exposure dose became 1000 Gy. In FIG. 69A and FIG. 69B, the horizontal axis represents gate potential (Vg), and the vertical axis represents drain current (Id).

The first-time measurement data to the fifth-time measurement data (1st_F, 2nd_F, 3rd_F, 4th_F, and 5th_F) obtained when the drain voltage Vd was set to 0.1 V and the gate voltage (Vg) was swept from 0 V to +3 V are shown together in FIG. 69A.

Measurement data obtained when the drain voltage Vd was set to 0.1 V and the gate voltage (Vg) was swept from 0 V to +3 V and measurement data obtained when the drain voltage Vd was set to 0.1 V and the gate voltage (Vg) was swept from +3 V to 0 V are shown together in FIG. 69B. Specifically, the first-time measurement data (1st_F) obtained when the gate voltage (Vg) was swept from 0 V to +3 V, first-time measurement data (1st_R) obtained when the gate voltage (Vg) was swept from +3 V to 0 V, the second-time measurement data (2nd_F) obtained when the gate voltage (Vg) was swept from 0 V to +3 V, second-time measurement data (2nd_R) obtained when the gate voltage (Vg) was swept from +3 V to 0 V, the fifth-time measurement data (5th_F) obtained when the gate voltage (Vg) was swept from 0 V to +3V, and fifth-time measurement data (5th_R) obtained when the gate voltage (Vg) was swept from +3 V to 0 V are shown together. Note that in FIG. 69A and FIG. 69B, the gate potential (Vg) of the horizontal axis is enlarged for the range of 0.0 V to 0.6 V.

As shown in FIG. 69A and FIG. 69B, in the measurement at a drain voltage Vd of 0.1 V, a change in OS transistor characteristics was found to be large in the first-time measurement with a sweep from 0 V to +3 V. Furthermore, it was verified that there was no particular difference in OS transistors characteristics among the first-time measurement with a sweep from +3 V to 0 V, the second-time and subsequent measurements with a sweep from 0 V to +3 V, and the second and subsequent measurements with a sweep from +3 V to 0 V.

Figure 70A:
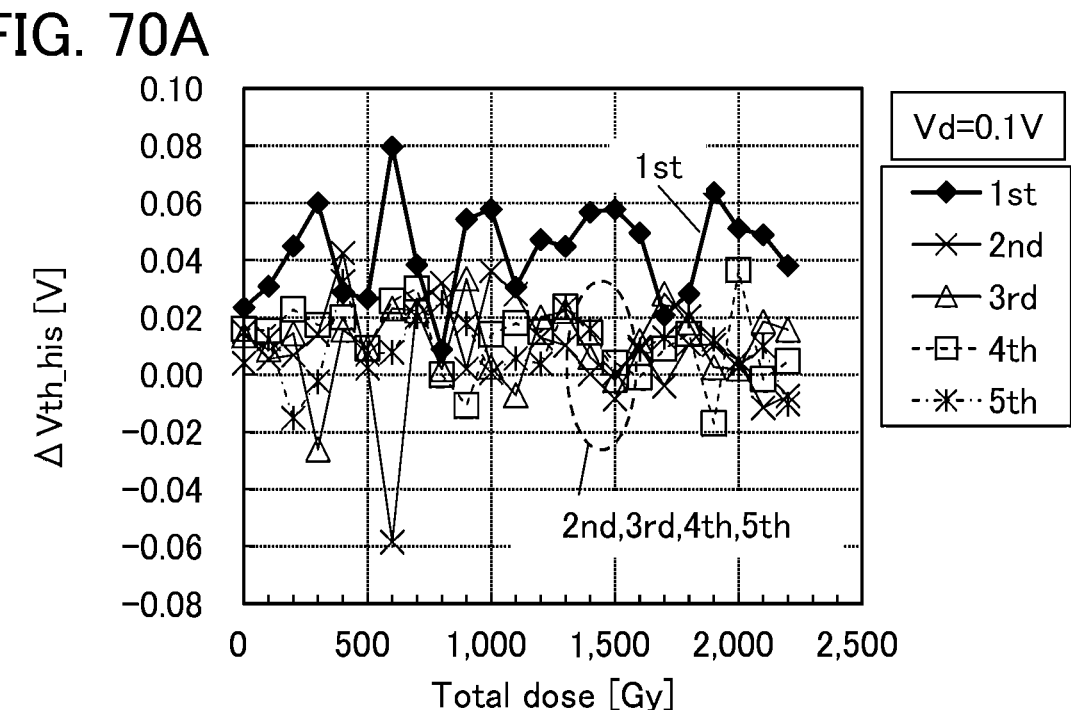
FIG. 70A and FIG. 70B are diagrams showing differences in threshold voltages of an OS transistor.
Figure 70B:
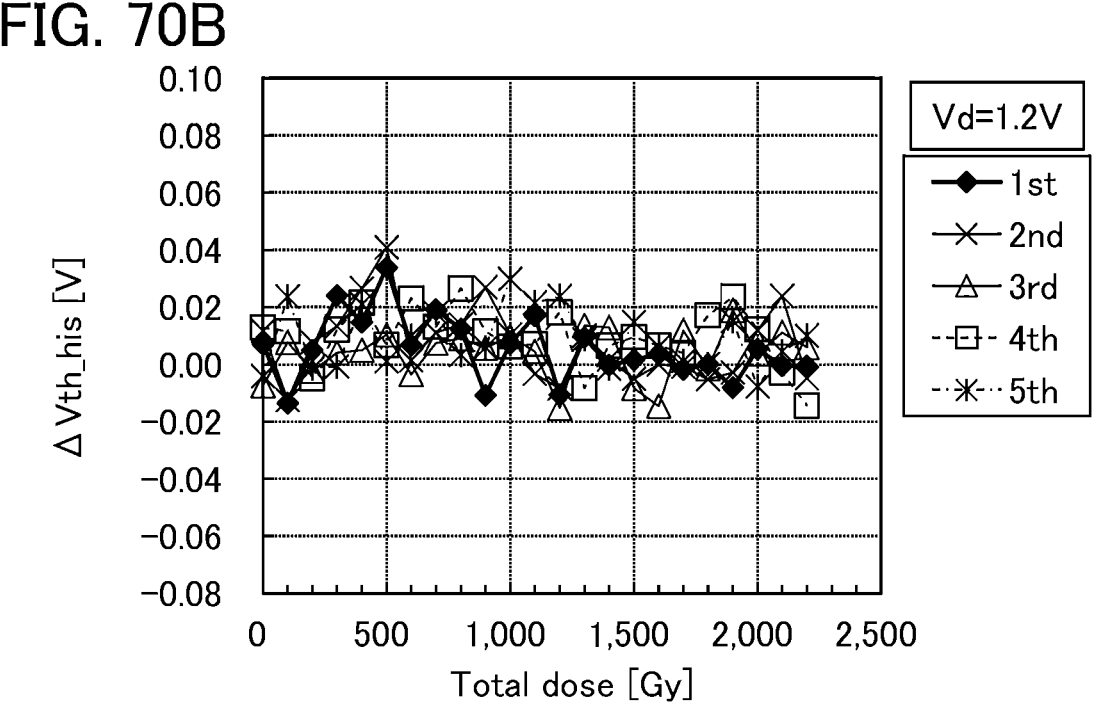

FIG. 70A and FIG. 70B each show a difference (ΔVth_his) between the threshold voltage at a sweep from 0 V to +3 V and the threshold voltage at a sweep from +3 V to 0 V in the OS transistor OSTr8. In FIG. 70A and FIG. 70B, the horizontal axis represents the total X-ray dose, and the vertical axis represents the difference in threshold voltage (ΔVth_his). The difference in threshold voltage (ΔVth_his) indicates the difference between the threshold voltage at a sweep from +3 V to 0 V and the threshold voltage at a sweep from 0 V to +3 V. FIG. 70A shows the data at a drain voltage Vd of 0.1 V, and FIG. 70B shows the data at a drain voltage Vd of 1.2 V.

As shown in FIG. 70A and FIG. 70B, a change in characteristics was found to tend to be large in the first-time measurement at a drain voltage Vd of 0.1 V. Furthermore, as indicated by a dotted circle in FIG. 70A, it was found that a change in characteristics tended to be small in the second-time to five-time measurements at a drain voltage Vd of 0.1 V as compared with the first-time measurement at a drain voltage Vd of 0.1 V. Moreover, a change in measurement was found to be tend to be small in the measurement at a drain voltage Vd of 1.2 V as compared with the first-time measurement at a drain voltage Vd of 0.1 V.

Figure 71A:
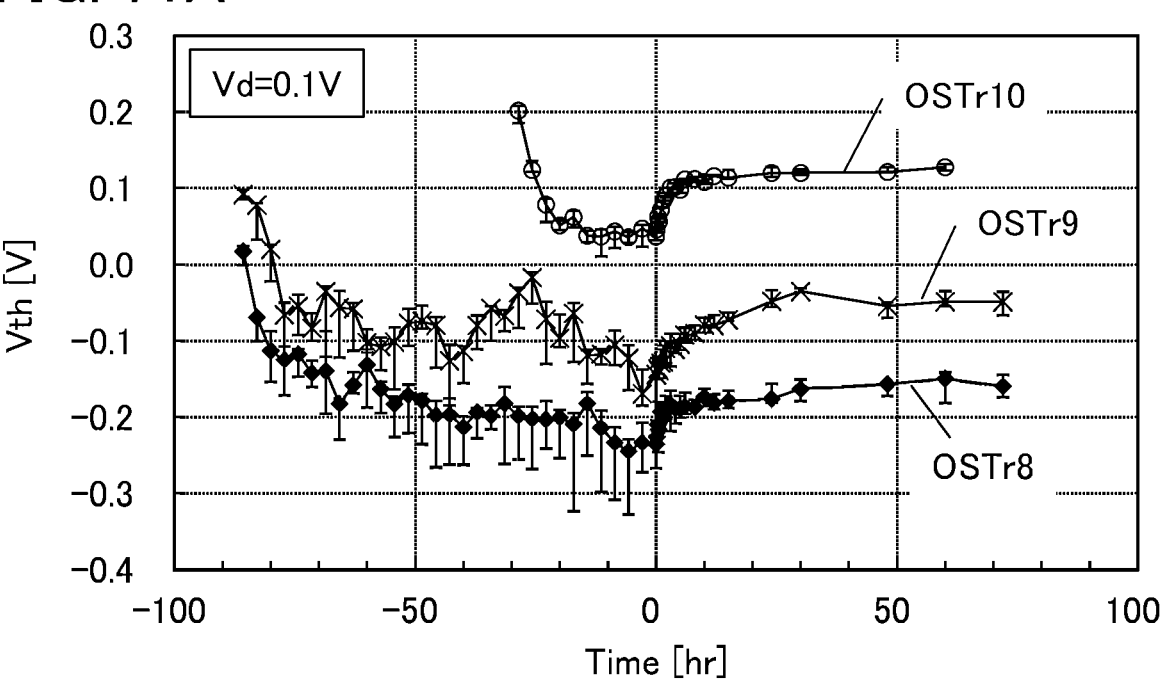
FIG. 71A and FIG. 71B are diagrams showing changes in threshold voltages of OS transistors.
Figure 71B:
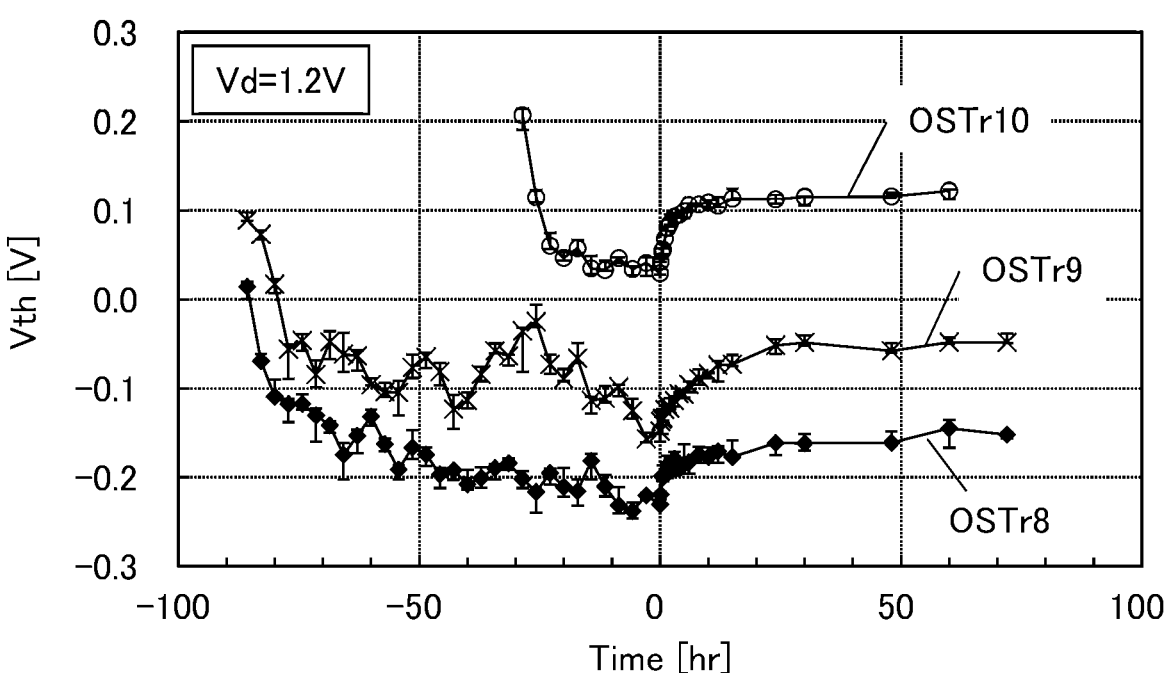

FIG. 71A and FIG. 71B show changes in threshold voltages of the OS transistors. In FIG. 71A and FIG. 71B, the horizontal axis represents time (Time), and the vertical axis represents threshold voltage (Vth). The time (Time) shown in FIG. 71A and FIG. 71B represents a relative time with the timing when the last X-ray irradiation was terminated regarded as 0, a negative value represents a period in which X-ray irradiation and Id-Vg measurement were performed repeatedly, and a positive value represents a period in which leaving at room temperature and Id-Vg measurement were performed repeatedly after the termination of X-ray irradiation. FIG. 71A shows the data at a drain voltage Vd of 0.1 V, and FIG. 71B shows the data at a drain voltage Vd of 1.2 V. Plots in FIG. 71A and FIG. 71B show the median values of the threshold voltages (Vth) obtained by five times of Id-Vg measurement, and error bars each show the maximum value and the minimum value.

As shown in FIG. 71A and FIG. 71B, it was found that the characteristics tended to vary greatly in the period when X-ray irradiation was performed, as compared with those in the period after the termination of X-ray irradiation. In addition, it was found that the characteristics tended to vary greatly in the measurement at a drain voltage Vd of 0.1 V, as compared with those in the measurement at a drain voltage Vd of 1.2 V.

Figure 72A:
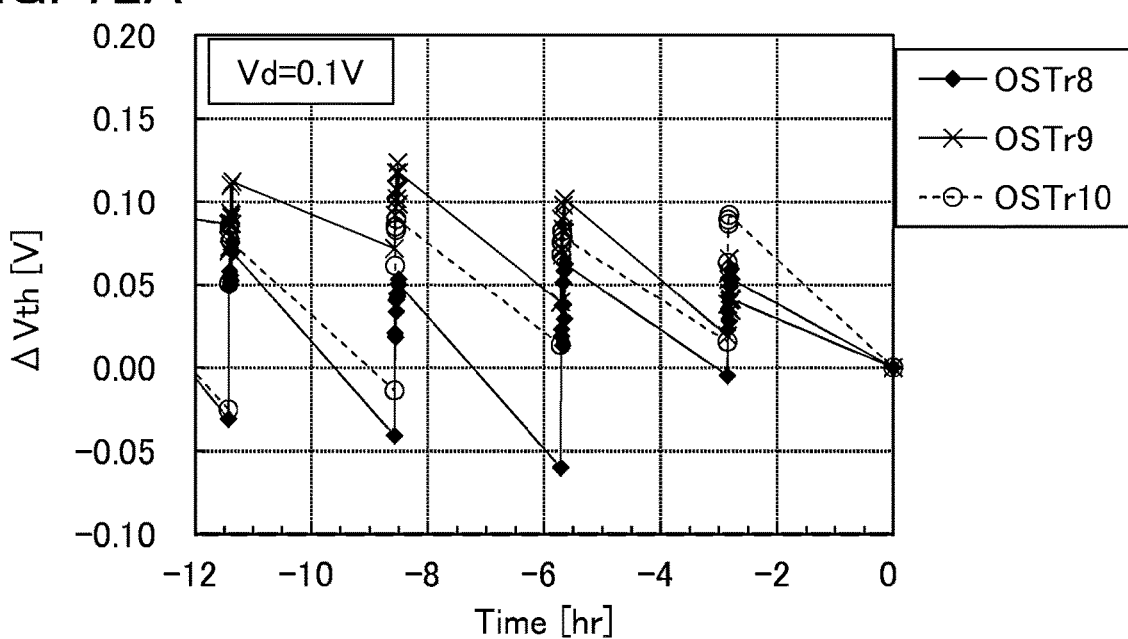
FIG. 72A and FIG. 72B are diagrams showing the amounts of change in threshold voltages of OS transistors.
Figure 73A:
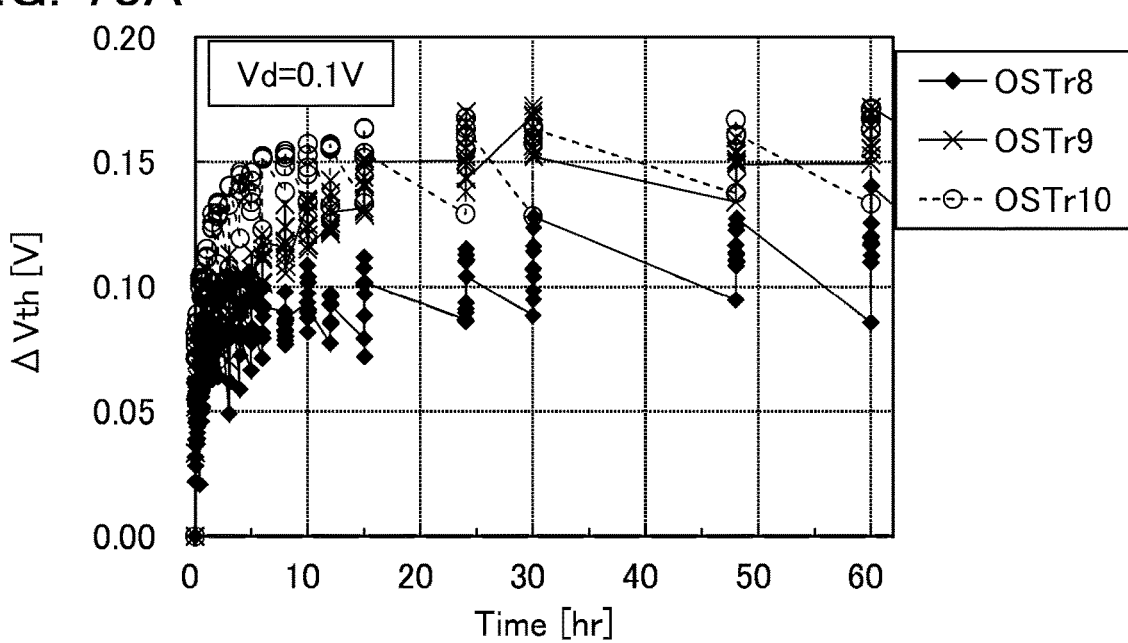
FIG. 73A and FIG. 73B are diagrams showing the amounts of change in threshold voltages of OS transistors.

FIG. 72A and FIG. 73A show the amounts of change in threshold voltage of the OS transistors at a drain voltage Vd of 0.1 V. In FIG. 72A and FIG. 73A, the horizontal axis represents time (Time), and the vertical axis represents the amount of change in the threshold voltage (ΔVth). In FIG. 72A, the horizontal axis is enlarged for a range of −12 hr to 0 hr, and the amount of change in the threshold voltage (ΔVth) in the period in which X-ray irradiation and Id-Vg measurement were performed repeatedly is shown. In FIG. 73A, the horizontal axis is enlarged for a range of 0 hr to 60 hr, and the amount of change in threshold voltage (ΔVth) in the period in which leaving at temperature and Id-Vg measurement were performed repeatedly after the termination of X-ray irradiation is shown. Note that the first-time data to the fifth-time data are shown together in each of FIG. 72A and FIG. 73A.

Figure 72B:
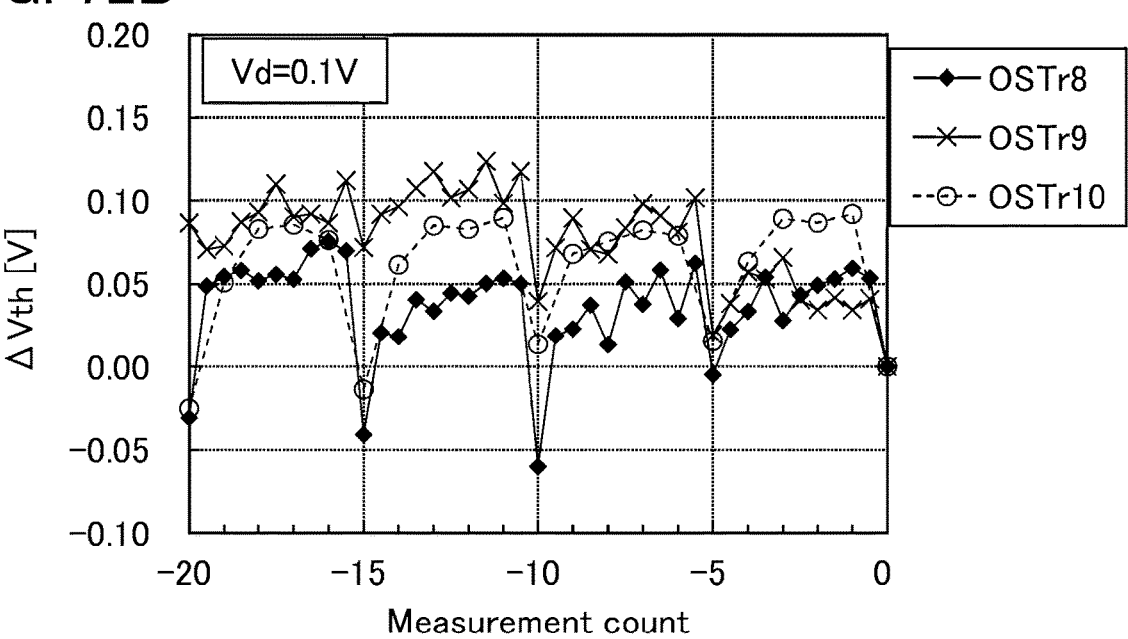
Figure 73B:
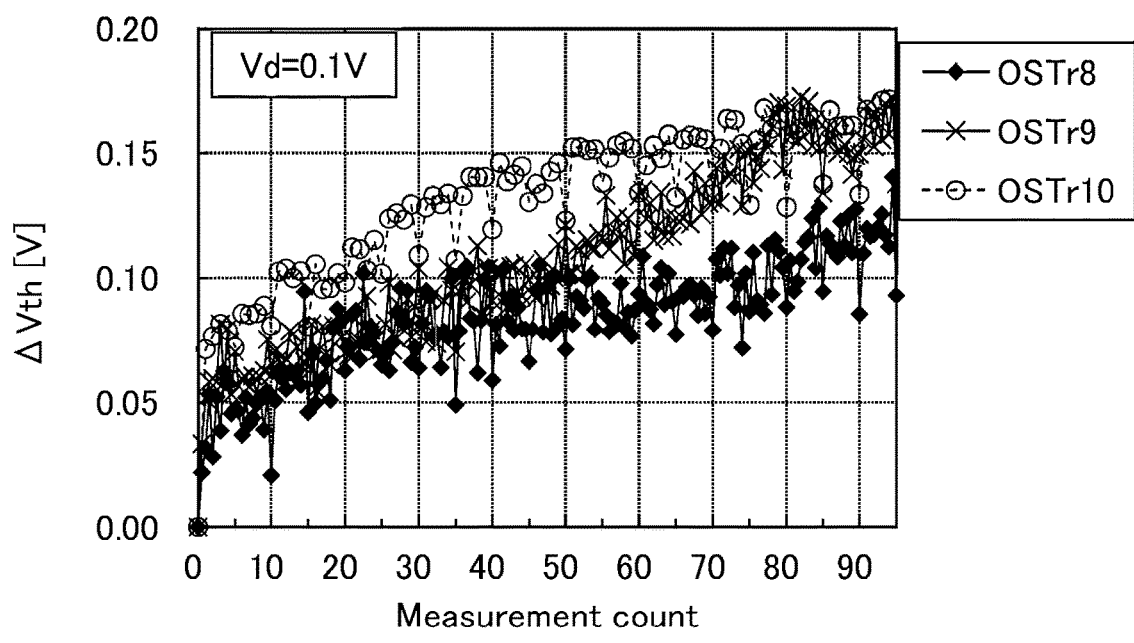

FIG. 72B is a graph obtained by converting the horizontal axis of FIG. 72A into the number of times of Id-Vg measurement. FIG. 73B is a graph obtained by converting the horizontal axis of FIG. 73A into the number of times of Id-Vg measurement. In FIG. 72B and FIG. 73B, the horizontal axis represents the number of times of Id-Vg measurement (Measurement count), and the vertical axis represents the amount of change in threshold voltage (ΔVth). The number of times (Measurement count) represents the relative number of times with the first Id-Vg measurement after the termination of X-ray irradiation (the first-time Id-Vg measurement in Step S16 in FIG. 68) regarded as 0, a negative value represents a period in which X-ray irradiation and Id-Vg measurement were performed repeatedly, and a positive value represents a period in which leaving at room temperature and Id-Vg measurement were performed repeatedly after the termination of X-ray irradiation. For the OS transistor OSTr8 and the OS transistor OSTr9, data obtained by sweeping the gate voltage (Vg) from 0 V to +3 V and data obtained by sweeping the gate voltage (Vg) from +3 V to 0 V are shown, respectively. Note that the number of times of measurement at a sweep of the gate voltage from +3 V to 0 V is a value obtained by adding 0.5 to the number of times of measurement with a sweep from 0 V to +3 V.

As shown in FIG. 72A and FIG. 72B, in the period in which X-ray irradiation and Id-Vg measurement were performed repeatedly, the amount of change in threshold voltage (ΔVth) was found to tend to be larger in the positive direction by the Id-Vg measurement. Furthermore, as shown in FIG. 73A and FIG. 73B, in the period in which leaving at room temperature and Id-Vg measurement were performed repeatedly after the termination of X-ray irradiation, the amount of change in threshold voltage (ΔVth) was found to tend to be larger in the positive direction immediately after the termination of X-ray irradiation.

Figure 75A:
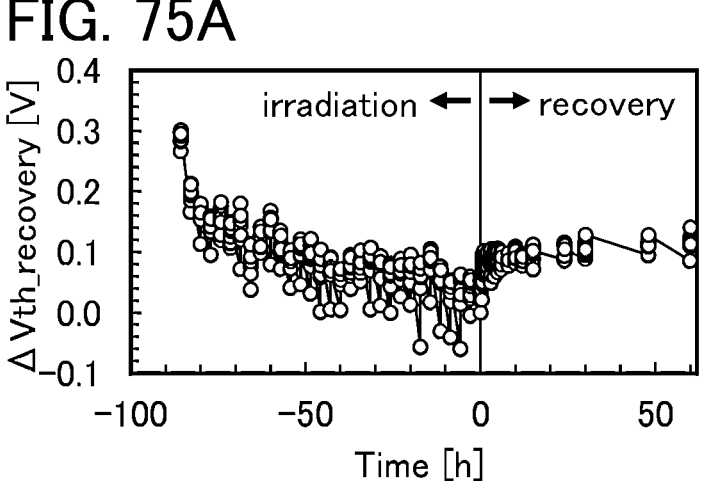
FIG. 75A and FIG. 75B are diagrams showing the amount of change in threshold voltage of an OS transistor.

As described above, the median values of the threshold voltages (Vth) obtained by five times of Id-Vg measurement are plotted in FIG. 71A. FIG. 75A shows the first-time data to the five-time data with respect to a change in threshold voltage of the OS transistor OSTr8 together.

In FIG. 75A, the horizontal axis represents time (Time) [h], and the vertical axis represents the amount of change in threshold voltage (ΔVth_recovery) [V]. The time (Time) shown in FIG. 75A represents a relative time with the timing when the last X-ray irradiation was terminated regarded as 0, a negative value represents a period (irradiation) in which X-ray irradiation and Id-Vg measurement were performed repeatedly, and a positive value represents a period (recovery) in which leaving at room temperature and Id-Vg measurement were performed repeatedly after the termination of X-ray irradiation. In addition, the vertical axis is adjusted such that ΔVth in the Id-Vg measurement at the termination of the last X-ray irradiation (at a point with 0 in the horizontal axis) is 0.

Figure 75B:
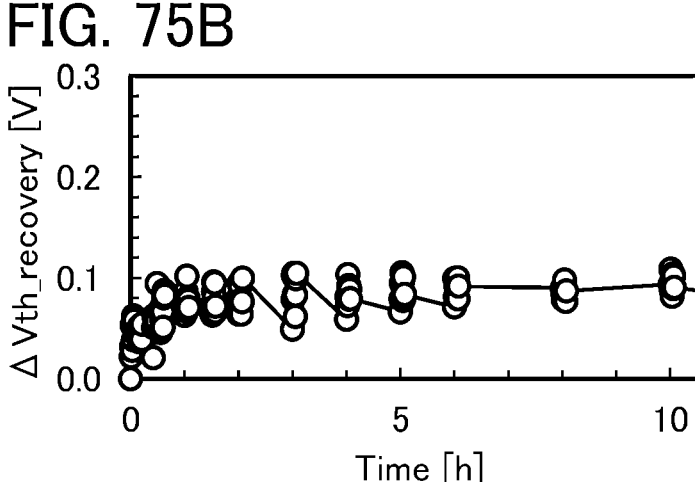

FIG. 75B shows results in the period in which leaving at room temperature and Id-Vg measurement were performed repeatedly after the termination of X-ray irradiation, among the results shown in FIG. 75A.

From FIG. 75A, Vth changes in the opposite directions were observed in the X-ray irradiation and the leaving after the X-ray irradiation. That is, it is suggested that deterioration due to a total ionizing dose effect (TID) is recovered. Furthermore, from FIG. 75B, a high recovery speed and saturation occurring at a leaving time of approximately five hours were observed. Finally, approximately 40% of the deterioration due to TID was recovered.

Note that in <Evaluation 3>, in addition to the threshold voltage Vth, a subthreshold slope SS and field-effect mobility μFE were extracted from Id-Vg characteristics obtained by the Id-Vg measurement.

Figure 76A:
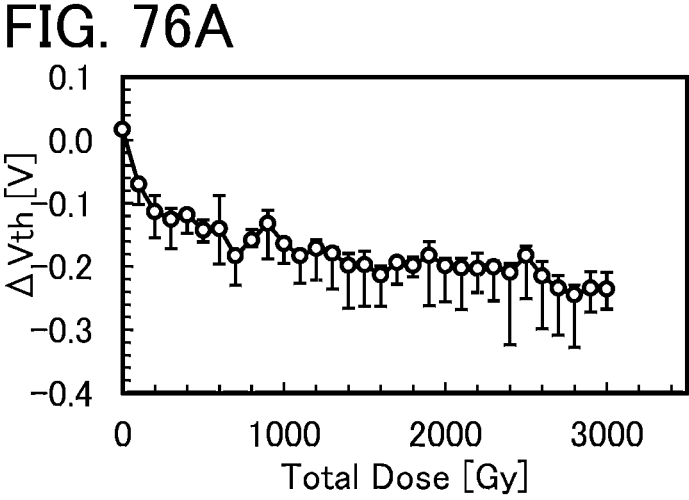
FIG. 76A is a diagram showing the amount of change in threshold voltage of an OS transistor.
Figure 76B:
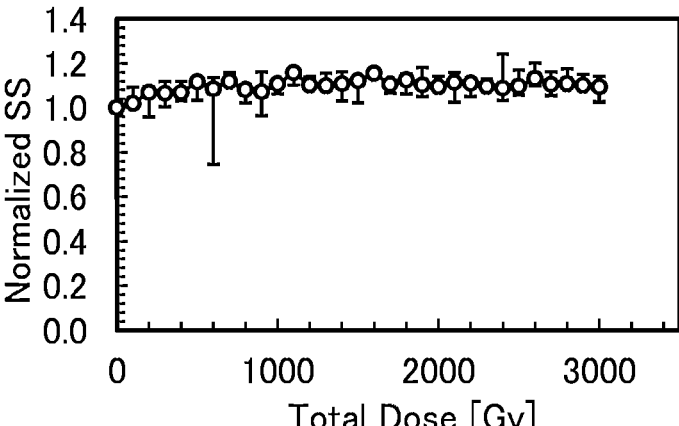
FIG. 76B is a diagram showing the amount of change in SS of the OS transistor.
Figure 76C:
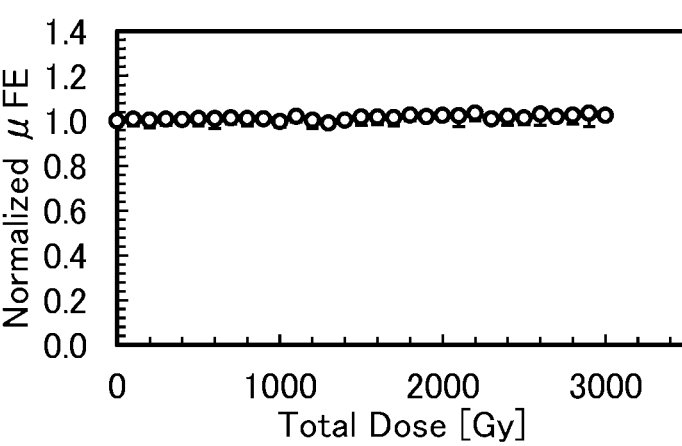
FIG. 76C is a diagram showing the amount of change in field-effect mobility of the OS transistor.

Changes in threshold voltage Vth, subthreshold slope SS, and field-effect mobility μFE of the OS transistor OSTr8 are shown in FIG. 76A to FIG. 76C, respectively.

FIG. 76A shows a plot of the amount of change in threshold voltage (ΔVth). In FIG. 76A, the horizontal axis represents total X-ray dose (Total Dose) [Gy], and the vertical axis represents ΔVth [V]. The plot in FIG. 76A shows the median value of ΔVth obtained by five times of Id-Vg measurement, and error bars each show the maximum value and the minimum value.

FIG. 76B shows a plot of a normalized subthreshold slope SS. In FIG. 76B, the horizontal axis represents total X-ray dose (Total Dose) [Gy], and the vertical axis represents normalized SS (Normalized SS). The plot in FIG. 76B shows the median value of the normalized SS obtained by five times of Id-Vg measurement, and error bars each show the maximum value and the minimum value.

FIG. 76C shows a plot of normalized field-effect mobility μFE. In FIG. 76C, the horizontal axis represents total X-ray dose (Total Dose) [Gy], and the vertical axis represents normalized field-effect mobility μFE (Normalized μFE). The plot in FIG. 76C shows the median value of the normalized μFE obtained by five times of Id-Vg measurement, and error bars each show the maximum value and the minimum value.

FIG. 76A demonstrated that the threshold voltage Vth was shifted in the negative direction by TID. In addition, FIG. 76A demonstrated that a change in the threshold voltage was slowing down at a total dose of 300 Gy or more. The amount of change in threshold voltage ΔVth was 300 mV when the total dose was 3000 Gy. In contrast, as shown in FIG. 76B and FIG. 76C, the subthreshold slop SS and the field-effect mobility μFE exhibited no or an extremely small change with respect to the total dose.

The above results suggest that accumulation of fixed charge occurs by TID but deterioration influencing on the driving force of the device, such as generation of impurity states at an interface, does not occur in the OS transistor.

Here, measurement results of the Id-Vg characteristics of the OS transistor OSTr8 before X-ray irradiation are also mentioned.

Figure 77A:
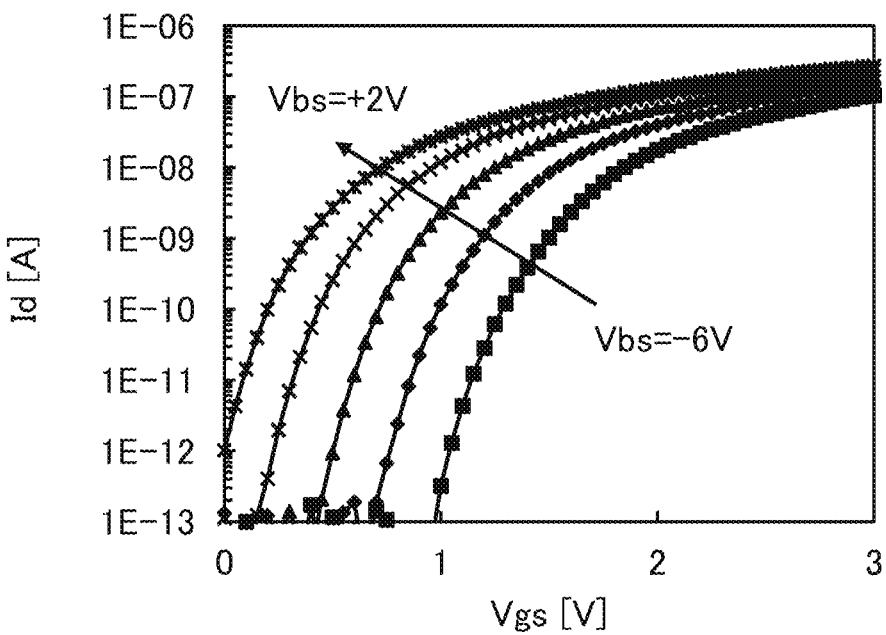
FIG. 77 and FIG. 77B are diagrams each showing Id-Vg characteristics of a fabricated transistor.
Figure 77B:
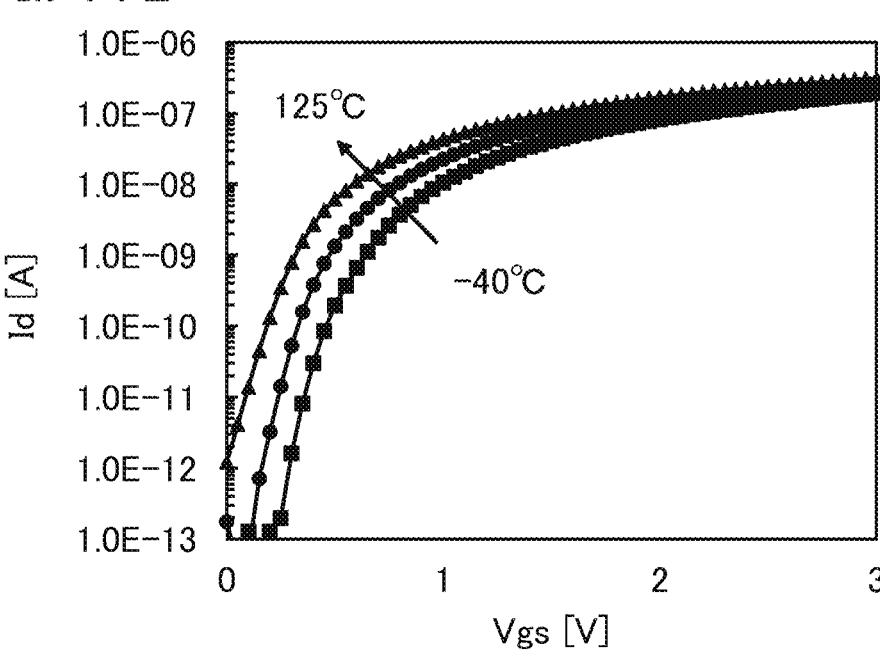

FIG. 77A and FIG. 77B are top gate voltage (denoted as "Vgs" in the diagram) drain current (denoted as "Id" in the diagram) characteristics of the OS transistor OSTr8.

For the measurement results of the top gate voltage-drain current characteristics shown in FIG. 77A, the measurement was performed every 2 V from +2 V to −6 V of the back gate voltage with respect to the source when the drain voltage with respect to the source was 0.1 V, the source voltage was 0 V, and the measurement environment temperature was 27° ° C.

For the measurement results of the top gate voltage-drain current characteristics shown in FIG. 77B, the measurement was performed when the drain voltage with respect to the source was 0.1 V, the source voltage and the back gate voltage were each 0 V, and the measurement environment temperature was 125° C., 27° C., or −40° C.

It was verified from FIG. 77A that the Id-Vg characteristics moved parallel in the horizontal axis direction at substantially equal intervals with respect to the back gate voltage Vbs. Therefore, it was found that it is possible to control the threshold voltage Vth of the OS transistor by application of a back gate voltage without a significant influence on the driving force of the device.

From FIG. 77B, a shift of Vth in the negative direction, a raise of SS, and an improvement in mutual conductance gm with an increase in the temperature were observed. However, the amounts of change in Vth, SS, and gm were small, which showed that the OS transistor was relatively stable with respect to temperature change.

The composition, structure, method, and the like described in this example can be used in combination as appropriate with the compositions, structures, methods, and the like described in the other embodiments and the like.

REFERENCE NUMERALS

ASX: analog switch, ASY: analog switch, BGE: conductor, BGL: wiring, DL: wiring, MUXX: multiplexer, MUXY: multiplexer, OS: oxide, OSD: oxide, PC: peripheral circuit, SL: wiring, TGE: conductor, TGL: wiring, Tr: transistor, TRA: transistor group, TRAa: transistor group, TRAb: transistor group, VIA: conductor, WIR1: conductor, WIR2: conductor, WX: wiring, WY: wiring, 100: capacitor, 110: conductor, 112: conductor, 115: conductor, 120: conductor, 125: conductor, 130: insulator, 140: conductor, 142: insulator, 145: insulator, 150: insulator, 152: insulator, 153: conductor, 154: insulator, 156: insulator, 200: transistor, 200a: transistor, 200b: transistor, 205: conductor, 205a: conductor, 205b: conductor, 210: insulator, 212: insulator, 214: insulator, 216: insulator, 217: insulator, 218: conductor, 222: insulator, 224: insulator, 224A: insulating film, 230: oxide, 230a: oxide, 230A: oxide film, 230b: oxide, 230B: oxide film, 230ba: region, 230bb: region, 230bc: region, 240: conductor, 240a: conductor, 240b: conductor, 241: insulator, 241a: insulator, 241b: insulator, 242: conductor, 242a: conductor, 242A: conductive film, 242b: conductor, 242B: conductive layer, 242c: conductor, 243: oxide, 243a: oxide, 243b: oxide, 246: conductor, 246a: conductor, 246b: conductor, 250: insulator, 250a: insulator, 250A: insulating film, 250b: insulator, 252: insulator, 252A: insulating film, 254: insulator, 254A: insulating film, 260: conductor, 260a: conductor, 260b: conductor, 265: sealing portion, 271: insulator, 271a: insulator, 271A: insulating film, 271b: insulator, 271B: insulating layer, 271c: insulator, 274: insulator, 275: insulator, 280: insulator, 282: insulator, 283: insulator, 285: insulator, 290: memory device, 292: capacitor device, 292a: capacitor device, 292b: capacitor device, 294: conductor, 294a: conductor, 294b: conductor, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 400: opening region, 500: semiconductor device, 600: semiconductor device, 601: semiconductor device, 610: cell array, 610_n: cell array, 610_1: cell array, 700: electronic component, 702: printed circuit board, 704: circuit board, 711: mold, 712: land, 713: electrode pad, 714: wire, 720: storage device, 721: driver circuit layer, 722: storage circuit layer, 730: electronic component, 731: interposer, 732: package board, 733: electrode, 735: semiconductor device, 805: conductor, 822: insulator, 824: insulator, 830a: oxide, 830b: oxide, 830: oxide, 842a: conductor, 842b: conductor, 850: insulator, 852: insulator, 854: insulator, 860: conductor, 871a1: insulator, 871a2: insulator, 871b1: insulator, 871b2: insulator, 875a: insulator, 875b: insulator, 900: TEG, 910: layer, 920: layer, 1001: wiring, 1002: wiring, 1003: wiring, 1004: wiring, 1005: wiring, 1006: wiring, 1100: USB memory, 1101: housing, 1102: cap, 1103: USB connector, 1104: substrate, 1105: memory chip, 1106: controller chip, 1110: SD card, 1111: housing, 1112: connector, 1113: substrate, 1114: memory chip, 1115: controller chip, 1150: SSD, 1151: housing, 1152: connector, 1153: substrate, 1154: memory chip, 1155: memory chip, 1156: controller chip, 1200: chip, 1201: package board, 1202: bump, 1203: motherboard, 1204: GPU module, 1211: CPU, 1212: GPU, 1213: analog arithmetic unit, 1214: memory controller, 1215: interface, 1216: network circuit, 1221: DRAM, 1222: flash memory, 1400: storage device, 1411: peripheral circuit, 1420: row circuit, 1430: column circuit, 1440: output circuit, 1460: control logic circuit, 1470: memory cell array, 1471: memory cell, 1472: memory cell, 1473: memory cell, 1474: memory cell, 1475: memory cell, 1476: memory cell, 1477: memory cell, 1478: memory cell, 2700: manufacturing apparatus, 2701: atmosphere-side substrate supply chamber, 2702: atmosphere-side substrate transfer chamber, 2703a: load lock chamber, 2703b: unload lock chamber, 2704: transfer chamber, 2706a: chamber, 2706b: chamber, 2706c: chamber, 2706d: chamber, 2761: cassette port, 2762: alignment port, 2763a: transfer robot, 2763b: transfer robot, 2801: gas supply source, 2802: valve, 2803: high-frequency generator, 2804: waveguide, 2805: mode converter, 2806: gas pipe, 2807: waveguide, 2808: slot antenna plate, 2809: dielectric plate, 2810: high-density plasma, 2811: substrate, 2811_n: substrate, 2811_n−1: substrate, 2811_n−2: substrate, 2811_1: substrate, 2811_2: substrate, 2811_3: substrate, 2812: substrate holder, 2813: heating mechanism, 2815: matching box, 2816: high-frequency power source, 2817: vacuum pump, 2818: valve, 2819: exhaust port, 2820: lamp, 2821: gas supply source, 2822: valve, 2823: gas inlet, 2824: substrate, 2825: substrate holder, 2826: heating mechanism, 2828: vacuum pump, 2829: valve, 2830: exhaust port, 2900: microwave treatment apparatus, 2901: quartz tube, 2902: substrate holder, 2903: heating means, 3310: CPU, 3311: CPU core, 3312: backup circuit, 3313: PMU, 3314: flip-flop, 3315: power switch, 3316: power switch, 3317: power switch, 3318: level shifter, 3319: scan flip-flop, 3319A: clock buffer circuit, 3371: cache memory device, 3372: cache memory device, 3373: bus interface portion, 5100: information terminal, 5101: housing, 5102: display portion, 5200: notebook information terminal, 5201: main body, 5202: display portion, 5203: keyboard, 5300: portable game machine, 5301: housing, 5302: housing, 5303: housing, 5304: display portion, 5305: connection portion, 5306: operation key, 5400: stationary game machine, 5402: controller, 5500: supercomputer, 5501: rack, 5502: computer, 5504: substrate, 5701: display panel, 5702: display panel, 5703: display panel, 5704: display panel, 5800: electric refrigerator-freezer, 5801: housing, 5802: refrigerator door, 5803: freezer door, 8000: X-ray, 8001: stage, 8002: X-ray source, 8003: diaphragm plate

The invention claimed is:

1. A semiconductor device comprising a first layer, a second layer over the first layer, a first wiring, a second wiring, and a third wiring, wherein the first layer comprises a first multiplexer, a second multiplexer, and first to fourth analog switches, wherein the second layer comprises first to fourth transistors, wherein each of the first to fourth transistors comprises a source, a drain, and a first gate, wherein the first wiring is electrically connected to one of the source and the drain of each of the first to fourth transistors, wherein a first terminal of each of the first analog switch and the second analog switch is electrically connected to the first multiplexer, wherein a second terminal of each of the first analog switch and the second analog switch is electrically connected to the second wiring, wherein a third terminal of the first analog switch is electrically connected to the other of the source and the drain of each of the first transistor and the second transistor, wherein a third terminal of the second analog switch is electrically connected to the other of the source and the drain of each of the third transistor and the fourth transistor, wherein a first terminal of each of the third analog switch and the fourth analog switch is electrically connected to the second multiplexer, wherein a second terminal of each of the third analog switch and the fourth analog switch is electrically connected to the third wiring, wherein a third terminal of the third analog switch is electrically connected to the first gate of each of the first transistor and the third transistor, and wherein a third terminal of the fourth analog switch is electrically connected to the first gate of each of the second transistor and the fourth transistor.

2. The semiconductor device according to claim 1, further comprising a fourth wiring, wherein each of the first to fourth transistors further comprises a second gate, and wherein the fourth wiring is electrically connected to the second gate of each of the first to fourth transistors.

3. The semiconductor device according to claim 1, wherein each of the first to fourth transistors comprises a metal oxide in a channel formation region.

4. The semiconductor device according to claim 3, wherein the metal oxide comprises indium, gallium, and zinc.

5. The semiconductor device according to claim 1, wherein each of the first to fourth analog switches comprises a CMOS circuit.

6. The semiconductor device according to claim 5, wherein a transistor included in the CMOS circuit comprises silicon in a channel formation region.

7. A semiconductor device comprising a first layer, a second layer over the first layer, a first wiring, a second wiring, and a third wiring, wherein the first layer comprises a first multiplexer, a second multiplexer, and first to third analog switches, wherein the second layer comprises a first transistor and a third transistor, wherein each of the first transistor and the third transistor comprises a source, a drain, and a first gate, wherein the first wiring is electrically connected to one of the source and the drain of each of the first transistor and the third transistor, wherein a first terminal of each of the first analog switch and the second analog switch is electrically connected to the first multiplexer, wherein a second terminal of each of the first analog switch and the second analog switch is electrically connected to the second wiring, wherein a third terminal of the first analog switch is electrically connected to the other of the source and the drain of the first transistor, wherein a third terminal of the second analog switch is electrically connected to the other of the source and the drain of the third transistor, wherein a first terminal of the third analog switch is electrically connected to the second multiplexer, wherein a second terminal of the third analog switch is electrically connected to the third wiring, and wherein a third terminal of the third analog switch is electrically connected to the first gate of each of the first transistor and the third transistor.

8. The semiconductor device according to claim 7, further comprising a fourth wiring, wherein each of the first transistor and the third transistor further comprises a second gate, and wherein the fourth wiring is electrically connected to the second gate of each of the first transistor and the third transistor.

9. The semiconductor device according to claim 7, wherein each of the first transistor and the third transistor comprises a metal oxide in a channel formation region.

10. The semiconductor device according to claim 9, wherein the metal oxide comprises indium, gallium, and zinc.

11. The semiconductor device according to claim 7, wherein each of the first to third analog switches comprises a CMOS circuit.

12. The semiconductor device according to claim 11, wherein a transistor included in the CMOS circuit comprises silicon in a channel formation region.

13. A semiconductor device comprising a first layer, a second layer over the first layer, a first wiring, a second wiring, and a third wiring, wherein the first layer comprises a first multiplexer, a second multiplexer, a first analog switch, a third analog switch, and a fourth analog switch, wherein the second layer comprises a first transistor and a second transistor, wherein each of the first transistor and the second transistor comprises a source, a drain, and a first gate, wherein the first wiring is electrically connected to one of the source and the drain of each of the first transistor and the second transistor, wherein a first terminal of the first analog switch is electrically connected to the first multiplexer, wherein a second terminal of the first analog switch is electrically connected to the second wiring, wherein a third terminal of the first analog switch is electrically connected to the other of the source and the drain of each of the first transistor and the second transistor, wherein a first terminal of each of the third analog switch and the fourth analog switch is electrically connected to the second multiplexer, wherein a second terminal of each of the third analog switch and the fourth analog switch is electrically connected to the third wiring, wherein a third terminal of the third analog switch is electrically connected to the first gate of the first transistor, and wherein a third terminal of the fourth analog switch is electrically connected to the first gate of the second transistor.

14. The semiconductor device according to claim 13, further comprising a fourth wiring, wherein each of the first transistor and the second transistor further comprises a second gate, and wherein the fourth wiring is electrically connected to the second gate of each of the first transistor and the second transistor.

15. The semiconductor device according to claim 13, wherein each of the first transistor and the second transistor comprises a metal oxide in a channel formation region.

16. The semiconductor device according to claim 15, wherein the metal oxide comprises indium, gallium, and zinc.

17. The semiconductor device according to claim 13, wherein each of the first analog switch, the third analog switch, and the fourth analog switch comprises a CMOS circuit.

18. The semiconductor device according to claim 17, wherein a transistor included in the CMOS circuit comprises silicon in a channel formation region.

* * * * *